(12) United States Patent
Schiffres et al.

(10) Patent No.: US 11,426,818 B2
(45) Date of Patent: Aug. 30, 2022

(54) ADDITIVE MANUFACTURING PROCESSES AND ADDITIVELY MANUFACTURED PRODUCTS

(71) Applicant: The Research Foundation for the State University of new York, Binghamton, NY (US)

(72) Inventors: Scott N. Schiffres, Vestal, NY (US); Arad Azizi, Karaj (IR)

(73) Assignee: The Research Foundation for The State University, Binghamton, NY (US)

( * ) Notice: Subject to any disclaimer, the term of this patent is extended or adjusted under 35 U.S.C. 154(b) by 127 days.

(21) Appl. No.: 16/537,361

(22) Filed: Aug. 9, 2019

(65) Prior Publication Data
US 2020/0047288 A1 Feb. 13, 2020

Related U.S. Application Data

(60) Provisional application No. 62/806,901, filed on Feb. 17, 2019, provisional application No. 62/717,444, filed on Aug. 10, 2018.

(51) Int. Cl.
| | |
|---|---|
| *B33Y 10/00* | (2015.01) |
| *B23K 26/342* | (2014.01) |
| *B33Y 70/00* | (2020.01) |
| *H01L 21/283* | (2006.01) |
| *H01L 23/367* | (2006.01) |
| *H01L 23/373* | (2006.01) |
| *B33Y 80/00* | (2015.01) |

(Continued)

(52) U.S. Cl.
CPC .............. *B23K 26/342* (2015.10); *B32B 7/12* (2013.01); *B32B 15/01* (2013.01); *B33Y 10/00* (2014.12); *B33Y 70/00* (2014.12); *B33Y 80/00* (2014.12); *F28D 15/00* (2013.01); *F28F 21/006* (2013.01); *F28F 21/02* (2013.01); *F28F 21/04* (2013.01); *F28F 21/081* (2013.01); *H01L 21/283* (2013.01); *H01L 23/367* (2013.01); *H01L 23/3735* (2013.01); *B32B 2457/00* (2013.01); *F28F 2210/00* (2013.01)

(58) Field of Classification Search
CPC combination set(s) only.
See application file for complete search history.

(56) References Cited

U.S. PATENT DOCUMENTS

| | | | |
|---|---|---|---|
| 2,338,574 | A | 1/1944 | Cunningham |
| 2,882,009 | A | 4/1959 | Bryant |

(Continued)

FOREIGN PATENT DOCUMENTS

| | | |
|---|---|---|
| EP | 1749315 B1 | 12/2009 |
| JP | 2010184852 A | 8/2010 |
| WO | WG2016175469 A1 | 11/2016 |

*Primary Examiner* — Ratisha Mehta
(74) *Attorney, Agent, or Firm* — Hoffberg & Associates; Steven M. Hoffberg

(57) ABSTRACT

A technique to additively print onto a dissimilar material, especially ceramics and glasses (e.g., semiconductors, graphite, diamond, other metals) is disclosed herein. The technique enables manufacture of heat removal devices and other deposited structures, especially on heat sensitive substrates. It also enables novel composites through additive manufacturing. The process enables rapid bonding, orders-of-magnitude faster than conventional techniques.

21 Claims, 24 Drawing Sheets

(51) Int. Cl.
  F28F 21/02    (2006.01)
  B32B 7/12     (2006.01)
  F28D 15/00    (2006.01)
  B32B 15/01    (2006.01)
  F28F 21/00    (2006.01)
  F28F 21/04    (2006.01)
  F28F 21/08    (2006.01)

(56) References Cited

U.S. PATENT DOCUMENTS

| | | |
|---|---|---|
| 3,220,815 A | 11/1965 | McMilllian et al. |
| 3,837,866 A | 9/1974 | Malmendier et al. |
| 4,026,677 A | 5/1977 | Galasso et al. |
| 4,030,989 A | 6/1977 | Atmore et al. |
| 4,034,454 A | 7/1977 | Galasso et al. |
| 4,034,906 A | 7/1977 | Carlson et al. |
| 4,038,455 A | 7/1977 | Wampetich |
| 4,065,302 A | 12/1977 | Turillon |
| 4,159,358 A | 6/1979 | Hench et al. |
| 4,171,339 A | 10/1979 | Lee et al. |
| 4,173,614 A | 11/1979 | Lee et al. |
| 4,234,661 A | 11/1980 | Lee et al. |
| 4,241,135 A | 12/1980 | Lee et al. |
| 4,358,506 A | 11/1982 | Intrater et al. |
| 4,380,574 A | 4/1983 | Gessinger et al. |
| 4,396,677 A | 8/1983 | Intrater et al. |
| 4,459,062 A | 7/1984 | Siebert |
| 4,483,700 A | 11/1984 | Forker, Jr. et al. |
| 4,510,171 A | 4/1985 | Siebert |
| 4,518,468 A | 5/1985 | Fotland et al. |
| 4,536,423 A | 8/1985 | Travis |
| 4,553,856 A | 11/1985 | Bierlein et al. |
| 4,640,816 A | 2/1987 | Atzmon et al. |
| 4,683,019 A | 7/1987 | Motoki |
| 4,699,310 A | 10/1987 | Kohno et al. |
| 4,714,624 A | 12/1987 | Naik |
| 4,725,509 A | 2/1988 | Ryan |
| 4,743,302 A | 5/1988 | Dumesnil et al. |
| 4,748,085 A | 5/1988 | Fukuda et al. |
| 4,818,628 A | 4/1989 | Alexander et al. |
| 4,861,751 A | 8/1989 | Tenhover |
| 4,863,538 A | 9/1989 | Deckard |
| 4,873,152 A | 10/1989 | Garg et al. |
| 4,880,614 A | 11/1989 | Strangman et al. |
| 4,883,745 A | 11/1989 | Mizuhara |
| 4,888,127 A | 12/1989 | Wada et al. |
| 4,911,987 A | 3/1990 | Sakata et al. |
| 4,916,022 A | 4/1990 | Solfest et al. |
| 4,938,816 A | 7/1990 | Beaman et al. |
| 4,944,817 A | 7/1990 | Bourell et al. |
| 4,956,011 A | 9/1990 | Nishida et al. |
| 4,985,313 A | 1/1991 | Penneck et al. |
| 4,985,750 A | 1/1991 | Hoshino |
| 5,006,265 A | 4/1991 | Kar et al. |
| 5,015,502 A | 5/1991 | Strangman et al. |
| 5,034,274 A | 7/1991 | Stevens et al. |
| 5,039,990 A | 8/1991 | Stevens et al. |
| 5,047,386 A | 9/1991 | Hed |
| 5,053,090 A | 10/1991 | Beaman et al. |
| 5,071,828 A | 12/1991 | Greuter et al. |
| 5,076,869 A | 12/1991 | Bourell et al. |
| 5,087,515 A | 2/1992 | Stevens et al. |
| 5,099,759 A | 3/1992 | Sonobe et al. |
| 5,104,849 A | 4/1992 | Shiga et al. |
| 5,132,143 A | 7/1992 | Deckard |
| 5,132,278 A | 7/1992 | Stevens et al. |
| 5,135,817 A | 8/1992 | Shimogori et al. |
| 5,147,587 A | 9/1992 | Marcus et al. |
| 5,154,425 A | 10/1992 | Niskanen et al. |
| 5,155,321 A | 10/1992 | Grube et al. |
| 5,155,324 A | 10/1992 | Deckard et al. |
| 5,156,697 A | 10/1992 | Bourell et al. |
| 5,182,170 A | 1/1993 | Marcus et al. |
| 5,188,164 A | 2/1993 | Kantner et al. |
| 5,194,161 A | 3/1993 | Heller et al. |
| 5,204,302 A | 4/1993 | Gorynin et al. |
| 5,207,371 A | 5/1993 | Prinz et al. |
| 5,209,987 A | 5/1993 | Penneck et al. |
| 5,224,969 A | 7/1993 | Chen et al. |
| 5,234,715 A | 8/1993 | Stevens et al. |
| 5,247,986 A | 9/1993 | Kantner et al. |
| 5,255,730 A | 10/1993 | Wall |
| 5,262,202 A | 11/1993 | Garg et al. |
| 5,266,357 A | 11/1993 | Preuss et al. |
| 5,270,296 A | 12/1993 | Hed |
| 5,281,789 A | 1/1994 | Merz et al. |
| 5,289,967 A | 3/1994 | Bampton et al. |
| 5,296,062 A | 3/1994 | Bourell et al. |
| 5,316,580 A | 5/1994 | Deckard |
| 5,326,525 A | 7/1994 | Ghosh |
| 5,328,717 A | 7/1994 | Stevens et al. |
| 5,338,598 A | 8/1994 | Ketcham |
| 5,342,812 A | 8/1994 | Niskanen et al. |
| 5,350,637 A | 9/1994 | Ketcham et al. |
| 5,352,519 A | 10/1994 | Stevens et al. |
| 5,362,523 A | 11/1994 | Gorynin et al. |
| 5,366,570 A | 11/1994 | Mazur et al. |
| 5,378,500 A | 1/1995 | Ward-Close et al. |
| 5,382,308 A | 1/1995 | Bourell et al. |
| 5,407,119 A | 4/1995 | Churchill et al. |
| 5,422,209 A | 6/1995 | Ono et al. |
| 5,429,843 A | 7/1995 | Masaki et al. |
| 5,431,967 A | 7/1995 | Manthiram et al. |
| 5,433,280 A | 7/1995 | Smith |
| 5,434,027 A | 7/1995 | Oshiba et al. |
| 5,458,480 A | 10/1995 | Newkirk et al. |
| 5,458,705 A | 10/1995 | Mazur et al. |
| 5,476,725 A | 12/1995 | Papich et al. |
| 5,490,911 A | 2/1996 | Makowiecki et al. |
| 5,498,298 A | 3/1996 | Wecker et al. |
| 5,503,703 A | 4/1996 | Dahotre et al. |
| 5,516,725 A | 5/1996 | Chang et al. |
| 5,526,914 A | 6/1996 | Dwivedi et al. |
| 5,538,674 A | 7/1996 | Nisper et al. |
| 5,544,550 A | 8/1996 | Smith |
| 5,580,403 A | 12/1996 | Mazur et al. |
| 5,597,589 A | 1/1997 | Deckard |
| 5,616,294 A | 4/1997 | Deckard |
| 5,620,791 A | 4/1997 | Dwivedi et al. |
| 5,622,577 A | 4/1997 | O'Connor |
| 5,624,505 A | 4/1997 | Mazur et al. |
| 5,628,945 A | 5/1997 | Riman et al. |
| 5,639,070 A | 6/1997 | Deckard |
| 5,648,177 A | 7/1997 | Fukui et al. |
| 5,669,436 A | 9/1997 | Papich et al. |
| 5,674,790 A | 10/1997 | Araujo |
| 5,683,825 A | 11/1997 | Bruce et al. |
| 5,686,178 A | 11/1997 | Stevens et al. |
| 5,694,184 A | 12/1997 | Yamada et al. |
| 5,709,958 A | 1/1998 | Toyoda et al. |
| 5,730,925 A | 3/1998 | Mattes et al. |
| 5,741,376 A | 4/1998 | Subramanian et al. |
| 5,747,111 A | 5/1998 | Fukui et al. |
| 5,761,787 A | 6/1998 | Kragle et al. |
| 5,770,273 A | 6/1998 | Offer et al. |
| 5,834,070 A | 11/1998 | Movchan et al. |
| 5,837,960 A | 11/1998 | Lewis et al. |
| 5,865,909 A | 2/1999 | Meyer et al. |
| 5,873,771 A | 2/1999 | Uesugi |
| 5,880,692 A | 3/1999 | Stevens et al. |
| 5,904,287 A | 5/1999 | Tashiro et al. |
| 5,939,201 A | 8/1999 | Boire et al. |
| 5,939,224 A | 8/1999 | Bito et al. |
| 5,948,541 A | 9/1999 | Inspektor |
| 5,952,253 A | 9/1999 | Dejneka et al. |
| 5,957,006 A | 9/1999 | Smith |
| 5,964,020 A | 10/1999 | Kragle et al. |
| 5,976,716 A | 11/1999 | Inspektor |
| 5,989,728 A | 11/1999 | Coffey et al. |
| 5,993,701 A | 11/1999 | Ando et al. |
| 5,993,979 A | 11/1999 | Figueroa et al. |
| 6,001,461 A | 12/1999 | Toyoda et al. |
| 6,017,628 A | 1/2000 | Stevens et al. |
| 6,019,878 A | 2/2000 | Nidola et al. |

(56) References Cited

U.S. PATENT DOCUMENTS

| | | |
|---|---|---|
| 6,046,426 A | 4/2000 | Jeantette et al. |
| 6,047,876 A | 4/2000 | Smith |
| 6,054,185 A | 4/2000 | Inspektor |
| 6,077,615 A | 6/2000 | Yada et al. |
| 6,085,122 A | 7/2000 | Manning |
| 6,086,959 A | 7/2000 | Inspektor |
| 6,096,436 A | 8/2000 | Inspektor |
| 6,117,533 A | 9/2000 | Inspektor |
| 6,119,483 A | 9/2000 | Takahashi et al. |
| 6,128,918 A | 10/2000 | Deaton et al. |
| 6,129,996 A | 10/2000 | Cordy |
| 6,143,378 A | 11/2000 | Harwell et al. |
| 6,144,008 A | 11/2000 | Rabinovich |
| 6,159,267 A | 12/2000 | Hampden-Smith et al. |
| 6,163,961 A | 12/2000 | McMeekin |
| 6,187,700 B1 | 2/2001 | Merkel |
| 6,202,734 B1 | 3/2001 | Sackinger et al. |
| 6,214,195 B1 | 4/2001 | Yadav et al. |
| 6,215,093 B1 | 4/2001 | Meiners et al. |
| 6,232,037 B1 | 5/2001 | Uesugi et al. |
| 6,249,055 B1 | 6/2001 | Dubin |
| 6,261,493 B1 | 7/2001 | Gaylo et al. |
| 6,267,864 B1 | 7/2001 | Yadav et al. |
| 6,277,169 B1 | 8/2001 | Hampden-Smith et al. |
| 6,300,263 B1 | 10/2001 | Merkel |
| 6,300,389 B1 | 10/2001 | Sato et al. |
| 6,322,897 B1 | 11/2001 | Borchert et al. |
| 6,341,952 B2 | 1/2002 | Gaylo et al. |
| 6,355,338 B1 | 3/2002 | Hilmas et al. |
| 6,360,562 B1 | 3/2002 | Kodas et al. |
| 6,372,346 B1 | 4/2002 | Toth |
| 6,377,729 B2 | 4/2002 | Merkel |
| 6,391,251 B1 | 5/2002 | Keicher et al. |
| 6,397,922 B1 | 6/2002 | Sachs et al. |
| 6,423,387 B1 | 7/2002 | Zollinger et al. |
| 6,427,489 B1 | 8/2002 | Eda et al. |
| 6,430,965 B2 | 8/2002 | Eda et al. |
| 6,454,811 B1 | 9/2002 | Sherwood et al. |
| 6,455,425 B1 | 9/2002 | Besser et al. |
| 6,459,069 B1 | 10/2002 | Rabinovich |
| 6,476,343 B2 | 11/2002 | Keicher et al. |
| 6,513,433 B2 | 2/2003 | Inoue et al. |
| 6,526,778 B2 | 3/2003 | Zollinger et al. |
| 6,528,145 B1 | 3/2003 | Berger et al. |
| 6,531,704 B2 | 3/2003 | Yadav et al. |
| 6,534,194 B2 | 3/2003 | Weihs et al. |
| 6,537,648 B1 | 3/2003 | Takahashi et al. |
| 6,537,689 B2 | 3/2003 | Schoop et al. |
| 6,540,800 B2 | 4/2003 | Sherman et al. |
| 6,541,695 B1 | 4/2003 | Mowles |
| 6,551,760 B2 | 4/2003 | Uesugi et al. |
| 6,555,299 B2 | 4/2003 | Hosokawa |
| 6,558,841 B1 | 5/2003 | Nakagiri et al. |
| 6,566,035 B1 | 5/2003 | Aoshima |
| 6,583,379 B1 | 6/2003 | Meiners et al. |
| 6,589,311 B1 | 7/2003 | Han et al. |
| 6,593,061 B2 | 7/2003 | Hotta |
| 6,596,150 B2 | 7/2003 | Nishino et al. |
| 6,596,224 B1 | 7/2003 | Sachs et al. |
| 6,607,844 B1 | 8/2003 | Araga et al. |
| 6,612,478 B2 | 9/2003 | Lee et al. |
| 6,613,697 B1 | 9/2003 | Faur et al. |
| 6,616,032 B1 | 9/2003 | Gasse et al. |
| 6,620,861 B1 | 9/2003 | Nakatuka et al. |
| 6,629,559 B2 | 10/2003 | Sachs et al. |
| 6,635,357 B2 | 10/2003 | Moxson et al. |
| 6,643,442 B2 | 11/2003 | Brambilla et al. |
| 6,663,982 B1 | 12/2003 | Stephens, Jr. et al. |
| 6,669,774 B1 | 12/2003 | Zhang et al. |
| 6,669,989 B2 | 12/2003 | Movchan et al. |
| 6,673,387 B1 | 1/2004 | Zhang et al. |
| 6,676,728 B2 | 1/2004 | Han et al. |
| 6,676,892 B2 | 1/2004 | Das et al. |
| 6,682,780 B2 | 1/2004 | Tzatzov et al. |
| 6,689,186 B1 | 2/2004 | Hampden-Smith et al. |
| 6,699,304 B1 | 3/2004 | Hampden-Smith et al. |
| 6,713,519 B2 | 3/2004 | Wang et al. |
| 6,723,279 B1 | 4/2004 | Withers et al. |
| 6,730,252 B1 | 5/2004 | Teoh et al. |
| 6,730,410 B1 | 5/2004 | Fritzemeier et al. |
| 6,740,464 B2 | 5/2004 | Maemoto |
| 6,745,758 B2 | 6/2004 | Minidis |
| 6,749,101 B1 | 6/2004 | Lee et al. |
| 6,750,023 B2 | 6/2004 | Tanner et al. |
| 6,756,561 B2 | 6/2004 | McGregor et al. |
| 6,765,151 B2 | 7/2004 | Fritzemeier et al. |
| 6,767,499 B1 | 7/2004 | Hory et al. |
| 6,771,009 B2 | 8/2004 | Nishikawa et al. |
| 6,779,951 B1 | 8/2004 | Vale et al. |
| 6,780,305 B2 | 8/2004 | Nishino et al. |
| 6,797,313 B2 | 9/2004 | Fritzemeier et al. |
| 6,797,449 B2 | 9/2004 | Nakamura et al. |
| 6,800,400 B2 | 10/2004 | Ota et al. |
| 6,800,417 B2 | 10/2004 | Kikuchi |
| 6,800,574 B2 | 10/2004 | Anderson |
| 6,806,478 B1 | 10/2004 | Hatfield |
| 6,811,744 B2 | 11/2004 | Keicher et al. |
| 6,814,823 B1 | 11/2004 | White |
| 6,824,689 B2 | 11/2004 | Wang et al. |
| 6,828,507 B1 | 12/2004 | Fritzemeier et al. |
| 6,830,643 B1 | 12/2004 | Hayes |
| 6,845,635 B2 | 1/2005 | Watanabe et al. |
| 6,847,699 B2 | 1/2005 | Rigali et al. |
| 6,852,010 B2 | 2/2005 | Takahashi et al. |
| 6,858,374 B2 | 2/2005 | Yanaka |
| 6,866,929 B2 | 3/2005 | Kodas et al. |
| 6,871,514 B2 | 3/2005 | Muschik et al. |
| 6,875,949 B2 | 4/2005 | Hall |
| 6,881,483 B2 | 4/2005 | McArdle et al. |
| 6,893,732 B1 | 5/2005 | Fritzemeier et al. |
| 6,899,777 B2 | 5/2005 | Vaidyanathan et al. |
| 6,909,173 B2 | 6/2005 | Hamamoto et al. |
| 6,909,192 B2 | 6/2005 | Yeoh |
| 6,913,184 B2 | 7/2005 | Dockus et al. |
| 6,914,024 B2 | 7/2005 | Anderson |
| 6,925,346 B1 | 8/2005 | Mazumder et al. |
| 6,929,865 B2 | 8/2005 | Myrick |
| 6,930,278 B1 | 8/2005 | Chung et al. |
| 6,939,505 B2 | 9/2005 | Musso et al. |
| 6,974,070 B2 | 12/2005 | Goretta et al. |
| 6,974,501 B1 | 12/2005 | Zhang et al. |
| 6,979,646 B2 | 12/2005 | Yeoh |
| 6,989,200 B2 | 1/2006 | Byers et al. |
| 6,995,334 B1 | 2/2006 | Kovacevic et al. |
| 7,004,994 B2 | 2/2006 | Hampden-Smith et al. |
| 7,005,191 B2 | 2/2006 | Perepezko et al. |
| 7,008,969 B2 | 3/2006 | Wang et al. |
| 7,011,760 B2 | 3/2006 | Wang et al. |
| 7,020,539 B1 | 3/2006 | Kovacevic et al. |
| 7,022,165 B2 | 4/2006 | Paglieri et al. |
| 7,022,198 B2 | 4/2006 | Bruce et al. |
| 7,034,246 B2 | 4/2006 | Muylaert et al. |
| 7,040,953 B2 | 5/2006 | Matsuno et al. |
| 7,043,330 B2 | 5/2006 | Toyserkani et al. |
| 7,045,738 B1 | 5/2006 | Kovacevic et al. |
| 7,052,241 B2 | 5/2006 | Decker |
| 7,060,222 B2 | 6/2006 | Sachs et al. |
| 7,076,959 B2 | 7/2006 | Lewis |
| 7,094,473 B2 | 8/2006 | Takayama et al. |
| 7,097,938 B2 | 8/2006 | Yamada et al. |
| 7,105,217 B2 | 9/2006 | Ohno et al. |
| 7,122,279 B2 | 10/2006 | Tamura et al. |
| 7,145,244 B2 | 12/2006 | Yeoh |
| 7,157,188 B2 | 1/2007 | Yamaguchi et al. |
| 7,159,916 B2 | 1/2007 | Stack et al. |
| 7,162,302 B2 | 1/2007 | Wang et al. |
| 7,169,478 B2 | 1/2007 | Kaiser et al. |
| 7,169,489 B2 | 1/2007 | Redmond |
| 7,172,663 B2 | 2/2007 | Hampden-Smith et al. |
| 7,174,637 B2 | 2/2007 | Johal et al. |
| 7,192,673 B1 | 3/2007 | Ikeda et al. |
| 7,195,842 B1 | 3/2007 | Fujimoto et al. |
| 7,212,095 B2 | 5/2007 | Sato et al. |
| 7,235,330 B1 | 6/2007 | Fujimoto et al. |

(56) References Cited

U.S. PATENT DOCUMENTS

| | | |
|---|---|---|
| 7,235,736 B1 | 6/2007 | Buller et al. |
| 7,241,416 B2 | 7/2007 | Sweetland |
| 7,241,533 B1 | 7/2007 | Ikeda et al. |
| 7,259,032 B2 | 8/2007 | Murata et al. |
| 7,282,444 B2 | 10/2007 | Tanida et al. |
| 7,285,337 B2 | 10/2007 | Narita et al. |
| 7,285,496 B2 | 10/2007 | Yeoh |
| 7,287,960 B2 | 10/2007 | Decker |
| 7,288,576 B2 | 10/2007 | Wang et al. |
| 7,299,749 B2 | 11/2007 | Tomita et al. |
| 7,300,559 B2 | 11/2007 | Gorokhovsky |
| 7,305,367 B1 | 12/2007 | Hollis et al. |
| 7,309,548 B2 | 12/2007 | Ota et al. |
| 7,311,944 B2 | 12/2007 | Sambasivan et al. |
| 7,312,168 B2 | 12/2007 | Anderson |
| 7,318,983 B2 | 1/2008 | Adachi et al. |
| 7,321,012 B2 | 1/2008 | Sotzing |
| 7,326,434 B2 | 2/2008 | Rupich et al. |
| 7,338,741 B2 | 3/2008 | Aoshima et al. |
| 7,351,773 B2 | 4/2008 | Fujimaki |
| 7,354,471 B2 | 4/2008 | Hampden-Smith et al. |
| 7,358,008 B2 | 4/2008 | Nanno et al. |
| 7,361,239 B2 | 4/2008 | Zahrah et al. |
| 7,381,517 B2 | 6/2008 | Fujimaki |
| 7,384,680 B2 | 6/2008 | Bi et al. |
| 7,393,559 B2 | 7/2008 | Groza et al. |
| 7,405,326 B2 | 7/2008 | Kawamura et al. |
| 7,410,728 B1 | 8/2008 | Fujimoto et al. |
| 7,413,109 B2 | 8/2008 | Goretta et al. |
| 7,416,835 B2 | 8/2008 | Fujimaki |
| 7,420,065 B2 | 9/2008 | Yoshida et al. |
| 7,432,014 B2 | 10/2008 | Konishiike et al. |
| 7,438,990 B2 | 10/2008 | Nanno et al. |
| 7,451,906 B2 | 11/2008 | Kisielius et al. |
| 7,455,458 B2 | 11/2008 | Johal et al. |
| 7,459,233 B2 | 12/2008 | Konishiike et al. |
| 7,476,469 B2 | 1/2009 | Ota et al. |
| 7,514,174 B2 | 4/2009 | Nanno et al. |
| 7,521,567 B2 | 4/2009 | Fujiwara et al. |
| 7,521,928 B2 | 4/2009 | Romalis et al. |
| 7,537,664 B2 | 5/2009 | O'Neill et al. |
| 7,560,138 B2 | 7/2009 | Perepezko et al. |
| 7,575,039 B2 | 8/2009 | Beals et al. |
| 7,597,769 B2 | 10/2009 | Hampden-Smith et al. |
| 7,604,897 B2 | 10/2009 | Matsuno et al. |
| 7,608,178 B2 | 10/2009 | De Jonghe et al. |
| 7,621,976 B2 | 11/2009 | Hampden-Smith et al. |
| 7,622,424 B2 | 11/2009 | Li et al. |
| 7,625,668 B2 | 12/2009 | Konishiike et al. |
| 7,626,665 B2 | 12/2009 | Koike |
| 7,629,058 B2 | 12/2009 | Takayanagi et al. |
| 7,629,480 B2 | 12/2009 | Wang et al. |
| 7,631,518 B2 | 12/2009 | Kodas et al. |
| 7,635,617 B2 | 12/2009 | Yamazaki |
| 7,642,468 B2 | 1/2010 | Nakada et al. |
| 7,645,543 B2 | 1/2010 | Visco et al. |
| 7,666,233 B2 | 2/2010 | Visco et al. |
| 7,666,511 B2 | 2/2010 | Ellison et al. |
| 7,666,568 B2 | 2/2010 | Gao et al. |
| 7,674,555 B2 | 3/2010 | Nanba et al. |
| 7,678,668 B2 | 3/2010 | Shimomura et al. |
| 7,691,279 B2 | 4/2010 | Koike |
| 7,695,248 B2 | 4/2010 | Mons et al. |
| 7,704,879 B2 | 4/2010 | Suzuki |
| 7,705,264 B2 | 4/2010 | Hoebel et al. |
| 7,716,802 B2 | 5/2010 | Stern et al. |
| 7,722,731 B2 | 5/2010 | Routbort et al. |
| 7,726,872 B2 | 6/2010 | Levingston |
| 7,727,846 B2 | 6/2010 | Ohnuma et al. |
| 7,736,542 B2 | 6/2010 | Shibata et al. |
| 7,736,794 B2 | 6/2010 | Kubota et al. |
| 7,745,050 B2 | 6/2010 | Kajita et al. |
| 7,759,007 B2 | 7/2010 | Tokunaga et al. |
| RE41,584 E | 8/2010 | Ying et al. |
| 7,771,547 B2 | 8/2010 | Bieler et al. |
| 7,777,155 B2 | 8/2010 | Twelves, Jr. et al. |
| 7,781,376 B2 | 8/2010 | Kodenkandath et al. |
| 7,782,433 B2 | 8/2010 | Koike |
| 7,794,881 B1 | 9/2010 | Fujimoto et al. |
| 7,820,332 B2 | 10/2010 | Badding et al. |
| 7,825,007 B2 | 11/2010 | Yamazaki et al. |
| 7,838,130 B2 | 11/2010 | Takashima et al. |
| 7,838,170 B2 | 11/2010 | Hommura et al. |
| 7,851,804 B2 | 12/2010 | Takahashi |
| 7,858,205 B2 | 12/2010 | Allen et al. |
| 7,867,907 B2 | 1/2011 | Shimomura et al. |
| 7,888,181 B2 | 2/2011 | Camacho et al. |
| 7,896,222 B2 | 3/2011 | Shaw et al. |
| 7,939,126 B2 | 5/2011 | Rupich et al. |
| 7,940,361 B2 | 5/2011 | Koike |
| 7,964,262 B2 | 6/2011 | Brocheton et al. |
| 7,968,026 B1 | 6/2011 | Teoh et al. |
| 7,976,985 B2 | 7/2011 | Kwon et al. |
| 7,977,405 B2 | 7/2011 | Ishino et al. |
| 7,989,068 B2 | 8/2011 | Rao et al. |
| 7,997,472 B2 | 8/2011 | Szymanski et al. |
| 8,007,178 B2 | 8/2011 | Perrin et al. |
| 8,007,557 B2 | 8/2011 | Merkel |
| 8,007,929 B2 | 8/2011 | Itoh et al. |
| 8,017,263 B2 | 9/2011 | Ogawa et al. |
| 8,021,138 B2 | 9/2011 | Green |
| 8,025,983 B2 | 9/2011 | Lee et al. |
| 8,025,984 B2 | 9/2011 | Stamm |
| 8,048,571 B2 | 11/2011 | Visco et al. |
| 8,063,489 B2 | 11/2011 | Shigihara et al. |
| 8,066,946 B2 | 11/2011 | Redmond |
| 8,071,007 B1 | 12/2011 | Teoh et al. |
| 8,071,419 B2 | 12/2011 | Robinson et al. |
| 8,079,141 B2 | 12/2011 | Meura |
| 8,097,301 B2 | 1/2012 | Ishikawa et al. |
| 8,097,303 B2 | 1/2012 | Perepezko et al. |
| 8,114,211 B2 | 2/2012 | Handrosch et al. |
| 8,119,267 B2 | 2/2012 | Osakabe et al. |
| 8,119,288 B2 | 2/2012 | Zhamu et al. |
| 8,119,314 B1 | 2/2012 | Heuft et al. |
| 8,119,315 B1 | 2/2012 | Heuft et al. |
| 8,124,245 B2 | 2/2012 | Budinger et al. |
| 8,137,525 B1 | 3/2012 | Harreld et al. |
| 8,173,010 B2 | 5/2012 | Ying et al. |
| 8,173,269 B2 | 5/2012 | Narita |
| 8,182,939 B2 | 5/2012 | Kim et al. |
| 8,182,943 B2 | 5/2012 | Visco et al. |
| 8,202,649 B2 | 6/2012 | Visco et al. |
| 8,211,226 B2 | 7/2012 | Bredt et al. |
| 8,216,439 B2 | 7/2012 | Olevsky et al. |
| 8,221,921 B2 | 7/2012 | Ogawa et al. |
| 8,236,452 B2 | 8/2012 | Zhamu et al. |
| 8,247,142 B1 | 8/2012 | Cote et al. |
| RE43,661 E | 9/2012 | Ying et al. |
| 8,268,099 B2 | 9/2012 | O'Neill et al. |
| 8,268,100 B2 | 9/2012 | O'Neill et al. |
| 8,273,194 B2 | 9/2012 | Shaw et al. |
| 8,313,560 B1 | 11/2012 | Cote et al. |
| 8,319,350 B2 | 11/2012 | Katsurayama et al. |
| 8,323,820 B2 | 12/2012 | Visco et al. |
| 8,326,024 B2 | 12/2012 | Shkolnik et al. |
| 8,334,075 B2 | 12/2012 | Visco et al. |
| 8,339,837 B2 | 12/2012 | Inoue et al. |
| 8,353,574 B1 | 1/2013 | Heuft et al. |
| 8,354,136 B2 | 1/2013 | Li et al. |
| 8,357,311 B2 | 1/2013 | Shirota et al. |
| 8,357,731 B2 | 1/2013 | Matsushige et al. |
| 8,359,744 B2 | 1/2013 | Hislop et al. |
| 8,361,873 B2 | 1/2013 | Ohnuma et al. |
| 8,367,224 B2 | 2/2013 | Katakura et al. |
| 8,372,330 B2 | 2/2013 | El-Siblani et al. |
| 8,372,685 B2 | 2/2013 | Robinson et al. |
| 8,375,581 B2 | 2/2013 | Romanelli et al. |
| 8,377,999 B2 | 2/2013 | Cote et al. |
| 8,383,985 B2 | 2/2013 | Twelves, Jr. et al. |
| 8,387,229 B2 | 3/2013 | Meyer et al. |
| 8,389,060 B2 | 3/2013 | Heuft et al. |
| 8,389,147 B2 | 3/2013 | Visco et al. |
| 8,394,168 B2 | 3/2013 | Withers et al. |

(56) References Cited

U.S. PATENT DOCUMENTS

| | | |
|---|---|---|
| 8,394,495 B2 | 3/2013 | Heuft et al. |
| 8,410,016 B2 | 4/2013 | Cote et al. |
| 8,414,424 B2 | 4/2013 | Hebert et al. |
| 8,425,651 B2 | 4/2013 | Xu et al. |
| 8,428,671 B2 | 4/2013 | Sathyamurthy et al. |
| 8,435,477 B2 | 5/2013 | Kambe et al. |
| 8,436,130 B2 | 5/2013 | Cote et al. |
| 8,436,833 B2 | 5/2013 | King et al. |
| 8,440,498 B2 | 5/2013 | Robinson et al. |
| 8,455,131 B2 | 6/2013 | Visco et al. |
| 8,455,331 B2 | 6/2013 | Yamazaki et al. |
| 8,457,930 B2 | 6/2013 | Schroeder |
| 8,465,847 B2 | 6/2013 | Shaw et al. |
| 8,466,095 B2 | 6/2013 | Martin et al. |
| 8,479,393 B2 | 7/2013 | Abels et al. |
| 8,480,754 B2 | 7/2013 | Bojarski et al. |
| 8,487,439 B2 | 7/2013 | Tani et al. |
| 8,488,994 B2 | 7/2013 | Hanson et al. |
| 8,497,312 B2 | 7/2013 | Matsushige et al. |
| 8,507,132 B2 | 8/2013 | Wakita et al. |
| 8,509,933 B2 | 8/2013 | Steingart et al. |
| 8,512,808 B2 | 8/2013 | Yousefiani et al. |
| 8,513,562 B2 | 8/2013 | Bichsel |
| 8,535,049 B2 | 9/2013 | MacLeod |
| 8,546,161 B2 | 10/2013 | Yamazaki et al. |
| 8,546,717 B2 | 10/2013 | Stecker |
| 8,552,088 B2 | 10/2013 | Shinoda et al. |
| 8,556,981 B2 | 10/2013 | Jones et al. |
| 8,556,983 B2 | 10/2013 | Bojarski et al. |
| 8,563,872 B2 | 10/2013 | Hirai et al. |
| 8,568,684 B2 | 10/2013 | Bi et al. |
| 8,575,513 B2 | 11/2013 | Abdo et al. |
| 8,586,199 B2 | 11/2013 | Sado et al. |
| 8,586,492 B2 | 11/2013 | Barefoot et al. |
| 8,591,997 B2 | 11/2013 | Heuft et al. |
| 8,592,057 B2 | 11/2013 | Katakura et al. |
| 8,598,523 B2 | 12/2013 | Stecker et al. |
| 8,604,350 B2 | 12/2013 | Himori et al. |
| 8,606,540 B2 | 12/2013 | Haisty et al. |
| 8,610,120 B2 | 12/2013 | Miyake et al. |
| 8,610,761 B2 | 12/2013 | Haisty et al. |
| 8,617,640 B2 | 12/2013 | Robinson et al. |
| 8,617,661 B2 | 12/2013 | Newkirk et al. |
| 8,617,994 B2 | 12/2013 | Shirota et al. |
| 8,623,026 B2 | 1/2014 | Wong et al. |
| 8,623,554 B2 | 1/2014 | Nanba et al. |
| 8,628,987 B2 | 1/2014 | Yamazaki |
| 8,629,564 B2 | 1/2014 | Katsurayama et al. |
| 8,632,850 B2 | 1/2014 | Schultz et al. |
| 8,634,228 B2 | 1/2014 | Matsuzaki et al. |
| 8,636,194 B2 | 1/2014 | Schultz et al. |
| 8,637,864 B2 | 1/2014 | Saito et al. |
| 8,642,965 B2 | 2/2014 | Hernandez et al. |
| 8,652,686 B2 | 2/2014 | Visco et al. |
| 8,654,566 B2 | 2/2014 | Nagatsuka et al. |
| 8,658,304 B2 | 2/2014 | Visco et al. |
| RE44,817 E | 3/2014 | Koike |
| 8,666,142 B2 | 3/2014 | Shkolnik et al. |
| 8,671,726 B2 | 3/2014 | Clew et al. |
| 8,673,050 B2 | 3/2014 | Sakuyama et al. |
| 8,673,477 B2 | 3/2014 | Visco et al. |
| 8,678,802 B2 | 3/2014 | Jenko |
| RE44,820 E | 4/2014 | Ying et al. |
| 8,685,520 B2 | 4/2014 | Meyer et al. |
| 8,690,472 B2 | 4/2014 | Meyer et al. |
| 8,691,333 B2 | 4/2014 | Godfrey et al. |
| 8,692,127 B2 | 4/2014 | Horikawa et al. |
| 8,697,322 B2 | 4/2014 | Cote et al. |
| 8,708,458 B2 | 4/2014 | Zhao et al. |
| 8,718,522 B2 | 5/2014 | Chillscyzn et al. |
| 8,723,176 B2 | 5/2014 | Yamazaki |
| 8,728,387 B2 | 5/2014 | Jones et al. |
| 8,728,807 B2 | 5/2014 | Forgacs et al. |
| 8,735,773 B2 | 5/2014 | Lang |
| 8,740,598 B2 | 6/2014 | Jenko et al. |
| 8,746,013 B2 | 6/2014 | Geremew et al. |
| 8,748,241 B2 | 6/2014 | Isobe et al. |
| 8,753,105 B2 | 6/2014 | Scott |
| 8,759,473 B2 | 6/2014 | Cote et al. |
| 8,765,837 B2 | 7/2014 | Fujinami et al. |
| 8,766,253 B2 | 7/2014 | Miyake |
| 8,775,133 B2 | 7/2014 | Schroeder |
| 8,778,538 B2 | 7/2014 | Kung et al. |
| 8,783,063 B2 | 7/2014 | Osakabe et al. |
| 8,789,626 B2 | 7/2014 | Can et al. |
| 8,789,998 B2 | 7/2014 | Schneider et al. |
| 8,790,768 B2 | 7/2014 | Pershing et al. |
| 8,790,793 B2 | 7/2014 | Yasukawa et al. |
| 8,790,858 B2 | 7/2014 | Hasegawa et al. |
| 8,795,899 B2 | 8/2014 | Liu et al. |
| 8,796,683 B2 | 8/2014 | Yamazaki |
| 8,797,487 B2 | 8/2014 | Koyama |
| 8,801,418 B2 | 8/2014 | El-Siblani et al. |
| 8,802,286 B2 | 8/2014 | Konishiike et al. |
| 8,809,780 B2 | 8/2014 | Wollenhaupt et al. |
| 8,810,035 B2 | 8/2014 | Nakamura et al. |
| 8,815,974 B2 | 8/2014 | Matsushige et al. |
| 8,821,060 B2 | 9/2014 | Meyer et al. |
| 8,822,875 B2 | 9/2014 | Webster et al. |
| 8,826,511 B2 | 9/2014 | Barnes et al. |
| 8,828,311 B2 | 9/2014 | Medina et al. |
| 8,828,579 B2 | 9/2014 | Kubota et al. |
| 8,829,528 B2 | 9/2014 | Yamazaki et al. |
| 8,840,831 B2 | 9/2014 | Davies et al. |
| 8,842,358 B2 | 9/2014 | Bareman et al. |
| 8,844,782 B2 | 9/2014 | Brown |
| 8,844,877 B1 | 9/2014 | Driemeyer et al. |
| 8,852,801 B2 | 10/2014 | Takada et al. |
| 8,853,867 B2 | 10/2014 | Chopin et al. |
| 8,860,021 B2 | 10/2014 | Isobe et al. |
| 8,875,976 B2 | 11/2014 | Schultz et al. |
| 8,879,957 B2 | 11/2014 | Hanson et al. |
| 8,882,442 B2 | 11/2014 | Smarsly et al. |
| 8,883,314 B2 | 11/2014 | Chang et al. |
| 8,884,284 B2 | 11/2014 | Koyama |
| 8,893,954 B2 | 11/2014 | Schultz et al. |
| 8,901,558 B2 | 12/2014 | Yamazaki |
| 8,906,107 B2 | 12/2014 | Bojarski et al. |
| 8,906,462 B2 | 12/2014 | Wigglesworth et al. |
| 8,906,469 B2 | 12/2014 | Adachi et al. |
| 8,907,871 B2 | 12/2014 | Orsley |
| 8,907,879 B2 | 12/2014 | Yoshida et al. |
| 8,915,728 B2 | 12/2014 | Mironets et al. |
| 8,916,085 B2 | 12/2014 | Jackson et al. |
| 8,916,406 B2 | 12/2014 | Ishikawa et al. |
| 8,916,424 B2 | 12/2014 | Isobe et al. |
| 8,919,150 B2 | 12/2014 | Imai et al. |
| 8,921,473 B1 | 12/2014 | Hyman |
| 8,926,389 B2 | 1/2015 | Nishido |
| 8,926,706 B2 | 1/2015 | Bojarski et al. |
| 8,931,171 B2 | 1/2015 | Abels et al. |
| 8,931,880 B2 | 1/2015 | Murphy et al. |
| 8,932,060 B2 | 1/2015 | Tsuruta et al. |
| 8,932,184 B2 | 1/2015 | Redmond |
| 8,932,771 B2 | 1/2015 | Visco et al. |
| 8,946,704 B2 | 2/2015 | Yamazaki |
| 8,951,650 B2 | 2/2015 | Yasukawa et al. |
| 8,952,380 B2 | 2/2015 | Honda et al. |
| 8,952,678 B2 | 2/2015 | Giboney |
| 8,956,478 B2 | 2/2015 | Allemand et al. |
| 8,956,766 B2 | 2/2015 | Nishimoto |
| 8,956,912 B2 | 2/2015 | Yamazaki |
| 8,957,468 B2 | 2/2015 | Uochi |
| 8,960,523 B2 | 2/2015 | Szymanski et al. |
| 8,962,188 B2 | 2/2015 | Zhamu et al. |
| 8,963,148 B2 | 2/2015 | Matsubayashi et al. |
| 8,969,867 B2 | 3/2015 | Yamazaki et al. |
| 8,974,105 B2 | 3/2015 | Schneider et al. |
| 8,974,539 B2 | 3/2015 | Bojarski et al. |
| 8,976,997 B1 | 3/2015 | Hecht et al. |
| 8,979,606 B2 | 3/2015 | Ma |
| 8,980,115 B2 | 3/2015 | Bibi et al. |
| 8,983,098 B2 | 3/2015 | Norris |
| 8,985,497 B2 | 3/2015 | Mannella et al. |

(56) References Cited

U.S. PATENT DOCUMENTS

| | | | |
|---|---|---|---|
| 8,986,234 | B2 | 3/2015 | Summit et al. |
| 8,986,880 | B2 | 3/2015 | Odani et al. |
| 8,987,728 | B2 | 3/2015 | Honda et al. |
| 8,988,116 | B2 | 3/2015 | Inoue et al. |
| 8,992,703 | B2 | 3/2015 | O'Neill et al. |
| 8,994,695 | B2 | 3/2015 | King et al. |
| 8,999,200 | B2 | 4/2015 | Bandyopadhyay et al. |
| 9,005,821 | B2 | 4/2015 | Odani et al. |
| 9,006,733 | B2 | 4/2015 | Yamazaki |
| 9,011,620 | B2 | 4/2015 | Fernie et al. |
| 9,020,788 | B2 | 4/2015 | Lang et al. |
| 9,023,566 | B2 | 5/2015 | Martin |
| 9,029,058 | B2 | 5/2015 | Martin |
| 9,034,048 | B2 | 5/2015 | Choren |
| 9,034,442 | B2 | 5/2015 | Chang et al. |
| 9,035,867 | B2 | 5/2015 | Yoshida |
| 9,040,975 | B2 | 5/2015 | Tani et al. |
| 9,040,981 | B2 | 5/2015 | Yamazaki |
| 9,045,335 | B2 | 6/2015 | Mitlin et al. |
| 9,048,665 | B2 | 6/2015 | Wojcik et al. |
| 9,054,364 | B2 | 6/2015 | Matsui et al. |
| 9,061,465 | B2 | 6/2015 | Hagiwara et al. |
| 9,070,399 | B2 | 6/2015 | Hamaguchi et al. |
| 9,070,729 | B2 | 6/2015 | Ji et al. |
| 9,073,150 | B2 | 7/2015 | Graichen |
| 9,073,260 | B2 | 7/2015 | El-Siblani et al. |
| 9,073,261 | B2 | 7/2015 | El-Siblani et al. |
| 9,073,262 | B2 | 7/2015 | El-Siblani et al. |
| 9,075,409 | B2 | 7/2015 | El-Siblani et al. |
| 9,076,825 | B2 | 7/2015 | Yamamoto et al. |
| 9,078,294 | B2 | 7/2015 | Doumanidis et al. |
| 9,079,246 | B2 | 7/2015 | Xu et al. |
| 9,079,248 | B2 | 7/2015 | Ackelid |
| 9,079,355 | B2 | 7/2015 | El-Siblani et al. |
| 9,079,386 | B2 | 7/2015 | Meyer et al. |
| 9,082,861 | B2 | 7/2015 | Yamazaki |
| 9,083,054 | B2 | 7/2015 | Hirose et al. |
| 9,090,428 | B2 | 7/2015 | Batchelder et al. |
| 9,090,955 | B2 | 7/2015 | Xu et al. |
| 9,093,383 | B1 | 7/2015 | Chopin et al. |
| 9,097,995 | B2 | 8/2015 | Heuft et al. |
| 9,101,978 | B2 | 8/2015 | Xu et al. |
| 9,102,007 | B2 | 8/2015 | Hosseini |
| 9,102,099 | B1 | 8/2015 | Karpas et al. |
| 9,102,566 | B2 | 8/2015 | Sawada |
| 9,105,869 | B2 | 8/2015 | Nishido |
| 9,107,725 | B2 | 8/2015 | Abels et al. |
| 9,109,429 | B2 | 8/2015 | Xu et al. |
| 9,112,086 | B2 | 8/2015 | Kataishi et al. |
| 9,112,168 | B2 | 8/2015 | Ishidai et al. |
| 9,112,272 | B2 | 8/2015 | Finn et al. |
| 9,113,571 | B2 | 8/2015 | Nakagoshi et al. |
| 9,114,478 | B2 | 8/2015 | Scott et al. |
| 9,114,567 | B2 | 8/2015 | Monsheimer et al. |
| 9,117,662 | B2 | 8/2015 | Isobe et al. |
| 9,120,270 | B2 | 9/2015 | Chen et al. |
| 9,126,365 | B1 | 9/2015 | Mark et al. |
| 9,126,367 | B1 | 9/2015 | Mark et al. |
| 9,127,515 | B2 | 9/2015 | Xu et al. |
| 9,130,358 | B2 | 9/2015 | Ma |
| 9,133,429 | B2 | 9/2015 | Higuera et al. |
| 9,136,568 | B2 | 9/2015 | Visco et al. |
| 9,141,015 | B2 | 9/2015 | Hanson et al. |
| 9,142,679 | B2 | 9/2015 | Yamazaki et al. |
| 9,142,681 | B2 | 9/2015 | Watanabe et al. |
| 9,144,940 | B2 | 9/2015 | Martin |
| 9,144,961 | B2 | 9/2015 | Meyer et al. |
| 9,145,363 | B2 | 9/2015 | Yabunouchi et al. |
| 9,149,952 | B2 | 10/2015 | Murphy et al. |
| 9,149,988 | B2 | 10/2015 | Mark et al. |
| 9,153,436 | B2 | 10/2015 | Yamazaki et al. |
| 9,156,205 | B2 | 10/2015 | Mark et al. |
| 9,156,240 | B2 | 10/2015 | Bertrand et al. |
| 9,157,465 | B2 | 10/2015 | Massoels |
| 9,157,735 | B2 | 10/2015 | Haisty et al. |
| 9,166,019 | B2 | 10/2015 | Saito et al. |
| 9,166,061 | B2 | 10/2015 | Yamazaki |
| 9,168,573 | B2 | 10/2015 | Hojaji |
| 9,168,697 | B2 | 10/2015 | Crump et al. |
| 9,171,787 | B2 | 10/2015 | Hosseini et al. |
| 9,175,174 | B2 | 11/2015 | Kambe |
| 9,176,571 | B2 | 11/2015 | Nishijima |
| 9,180,010 | B2 | 11/2015 | Dong et al. |
| 9,181,790 | B2 | 11/2015 | Mace et al. |
| 9,184,160 | B2 | 11/2015 | Yamazaki |
| 9,184,355 | B2 | 11/2015 | Hirakawa et al. |
| 9,186,270 | B2 | 11/2015 | Blanck |
| 9,186,295 | B2 | 11/2015 | Weeks et al. |
| 9,186,846 | B1 | 11/2015 | Mark et al. |
| 9,186,848 | B2 | 11/2015 | Mark et al. |
| 9,190,529 | B2 | 11/2015 | Yamazaki |
| 9,190,666 | B2 | 11/2015 | Kubota et al. |
| 9,192,728 | B2 | 11/2015 | Gilmore et al. |
| 9,192,990 | B2 | 11/2015 | Meyer et al. |
| 9,192,999 | B2 | 11/2015 | Carter et al. |
| 9,196,760 | B2 | 11/2015 | Duty et al. |
| 9,198,829 | B2 | 12/2015 | Weeks et al. |
| 9,199,044 | B2 | 12/2015 | Bangera et al. |
| 9,199,345 | B2 | 12/2015 | Flesch et al. |
| 9,204,945 | B2 | 12/2015 | Korten et al. |
| 9,205,204 | B2 | 12/2015 | Bangera et al. |
| 9,205,578 | B2 | 12/2015 | Schultz et al. |
| 9,209,480 | B2 | 12/2015 | Odani et al. |
| 9,211,669 | B2 | 12/2015 | Zoppas et al. |
| 9,214,566 | B2 | 12/2015 | Yamazaki |
| 9,218,966 | B2 | 12/2015 | Honda et al. |
| 9,219,161 | B2 | 12/2015 | Yamazaki |
| 9,220,328 | B2 | 12/2015 | Magness |
| 9,221,100 | B2 | 12/2015 | Schwarze et al. |
| 9,222,932 | B2 | 12/2015 | Shepherd et al. |
| 9,227,243 | B2 | 1/2016 | Xu |
| 9,227,339 | B2 | 1/2016 | Murphy et al. |
| 9,227,365 | B2 | 1/2016 | Dikovsky et al. |
| 9,228,859 | B2 | 1/2016 | Ranky et al. |
| 9,231,410 | B2 | 1/2016 | Wojcik et al. |
| 9,233,506 | B2 | 1/2016 | Leavitt |
| 9,236,428 | B2 | 1/2016 | Isobe et al. |
| 9,236,606 | B2 | 1/2016 | Tadano |
| 9,241,869 | B2 | 1/2016 | Weeks et al. |
| 9,243,475 | B2 | 1/2016 | Xu |
| 9,248,611 | B2 | 2/2016 | Divine et al. |
| 9,252,283 | B2 | 2/2016 | Matsubayashi et al. |
| 9,252,286 | B2 | 2/2016 | Isobe et al. |
| 9,254,535 | B2 | 2/2016 | Buller et al. |
| 9,258,651 | B2 | 2/2016 | Norris et al. |
| 9,260,390 | B2 | 2/2016 | Kato |
| 9,263,259 | B2 | 2/2016 | Yamazaki et al. |
| 9,264,090 | B2 | 2/2016 | Johnson et al. |
| 9,269,520 | B2 | 2/2016 | Satoh |
| 9,269,647 | B2 | 2/2016 | Du |
| 9,272,946 | B2 | 3/2016 | Chang et al. |
| 9,278,483 | B2 | 3/2016 | Wescott et al. |
| 9,279,328 | B2 | 3/2016 | Roy et al. |
| 9,281,517 | B2 | 3/2016 | Matsushita et al. |
| 9,283,593 | B2 | 3/2016 | Bruck et al. |
| 9,284,212 | B2 | 3/2016 | Dannoux et al. |
| 9,287,405 | B2 | 3/2016 | Sasagawa et al. |
| 9,287,521 | B2 | 3/2016 | Hakii et al. |
| 9,287,573 | B2 | 3/2016 | Visco et al. |
| 9,287,916 | B2 | 3/2016 | Wicks et al. |
| 9,290,407 | B2 | 3/2016 | Barefoot et al. |
| 9,296,039 | B2 | 3/2016 | Propheter-Hinckley et al. |
| 9,296,129 | B2 | 3/2016 | Pallari |
| 9,296,190 | B1 | 3/2016 | Corral et al. |
| 9,302,338 | B2 | 4/2016 | Zhang et al. |
| 9,308,583 | B2 | 4/2016 | El-Dasher et al. |
| 9,308,616 | B2 | 4/2016 | Bliss |
| 9,308,691 | B2 | 4/2016 | Silvanus et al. |
| 9,310,188 | B2 | 4/2016 | Snis |
| 9,315,043 | B2 | 4/2016 | Murphy et al. |
| 9,318,484 | B2 | 4/2016 | Matsubayashi |
| 9,320,620 | B2 | 4/2016 | Bojarski et al. |
| 9,324,875 | B2 | 4/2016 | Yamazaki |
| 9,326,780 | B2 | 5/2016 | Wong et al. |

(56) References Cited

U.S. PATENT DOCUMENTS

| | | |
|---|---|---|
| 9,327,056 B2 | 5/2016 | Bandyopadhyay et al. |
| 9,327,350 B2 | 5/2016 | Mannella et al. |
| 9,327,447 B2 | 5/2016 | Batchelder et al. |
| 9,327,452 B2 | 5/2016 | Mark et al. |
| 9,327,453 B2 | 5/2016 | Mark et al. |
| 9,330,909 B2 | 5/2016 | Yamazaki et al. |
| 9,331,156 B2 | 5/2016 | Yamazaki et al. |
| 9,331,251 B2 | 5/2016 | Kuramoto et al. |
| 9,332,251 B2 | 5/2016 | Haisty et al. |
| 9,333,148 B2 | 5/2016 | Suzuki |
| 9,339,993 B2 | 5/2016 | Cites et al. |
| 9,341,467 B2 | 5/2016 | Snis |
| 9,346,116 B2 | 5/2016 | Guldberg |
| 9,346,127 B2 | 5/2016 | Buller et al. |
| 9,347,770 B2 | 5/2016 | Snis |
| 9,350,005 B2 | 5/2016 | Nishimoto |
| 9,351,083 B2 | 5/2016 | Hecht et al. |
| 9,352,421 B2 | 5/2016 | Illston |
| 9,354,029 B2 | 5/2016 | Mace et al. |
| 9,358,350 B2 | 6/2016 | Bangera et al. |
| 9,359,513 B1 | 6/2016 | Takashima et al. |
| 9,362,972 B2 | 6/2016 | Johnson et al. |
| 9,364,888 B2 | 6/2016 | McBrien et al. |
| 9,369,259 B2 | 6/2016 | Mohamadi |
| 9,369,553 B2 | 6/2016 | Zahler et al. |
| 9,370,896 B2 | 6/2016 | Mark |
| 9,375,298 B2 | 6/2016 | Boronkay et al. |
| 9,375,782 B2 | 6/2016 | McBrien et al. |
| 9,387,079 B2 | 7/2016 | Bojarski et al. |
| 9,390,312 B2 | 7/2016 | Bangera et al. |
| 9,399,256 B2 | 7/2016 | Buller et al. |
| 9,399,264 B2 | 7/2016 | Stecker |
| 9,399,321 B2 | 7/2016 | Ljungblad |
| 9,402,313 B2 | 7/2016 | Sakuyama et al. |
| 9,403,235 B2 | 8/2016 | Buller et al. |
| 9,406,483 B1 | 8/2016 | Lock |
| 9,406,698 B2 | 8/2016 | Yamazaki et al. |
| 9,407,746 B2 | 8/2016 | Schmid et al. |
| 9,408,781 B2 | 8/2016 | Qian et al. |
| 9,414,501 B2 | 8/2016 | Wicker et al. |
| 9,414,513 B2 | 8/2016 | Nakagoshi et al. |
| 9,415,438 B2 | 8/2016 | McBrien et al. |
| 9,419,299 B2 | 8/2016 | Visco et al. |
| 9,419,502 B2 | 8/2016 | Veronesi et al. |
| 9,421,715 B2 | 8/2016 | Hartmann et al. |
| 9,423,756 B2 | 8/2016 | Hanson et al. |
| 9,428,826 B2 | 8/2016 | Ramm |
| 9,431,430 B2 | 8/2016 | Yamazaki |
| 9,434,633 B2 | 9/2016 | Bookbinder et al. |
| 9,435,915 B1 | 9/2016 | Lower et al. |
| 9,437,744 B2 | 9/2016 | Sasagawa et al. |
| 9,439,767 B2 | 9/2016 | Bojarski et al. |
| 9,440,397 B1 | 9/2016 | Fly |
| 9,440,853 B2 | 9/2016 | Lee et al. |
| 9,442,105 B2 | 9/2016 | Shepherd et al. |
| 9,442,395 B2 | 9/2016 | Lafarre et al. |
| 9,446,475 B2 | 9/2016 | Norfolk et al. |
| 9,446,979 B2 | 9/2016 | Lander et al. |
| 9,452,474 B2 | 9/2016 | Xu |
| 9,452,489 B2 | 9/2016 | Honda |
| 9,453,142 B2 | 9/2016 | Rolland et al. |
| 9,456,777 B2 | 10/2016 | Bangera et al. |
| 9,456,901 B2 | 10/2016 | Jones et al. |
| 9,457,428 B2 | 10/2016 | Webster et al. |
| 9,457,521 B2 | 10/2016 | Johnston et al. |
| 9,460,557 B1 | 10/2016 | Tran et al. |
| 9,463,506 B2 | 10/2016 | Xu |
| 9,466,725 B2 | 10/2016 | Shimomura |
| 9,468,317 B2 | 10/2016 | Gorham |
| 9,471,172 B2 | 10/2016 | Sirois |
| 9,472,310 B2 | 10/2016 | Van Den Berghe et al. |
| 9,472,656 B2 | 10/2016 | Yamazaki et al. |
| 9,474,688 B2 | 10/2016 | Weeks et al. |
| 9,474,689 B2 | 10/2016 | Weeks et al. |
| 9,475,947 B2 | 10/2016 | Sirois |
| 9,476,685 B2 | 10/2016 | Mace et al. |
| 9,477,346 B2 | 10/2016 | Sirois |
| 9,478,422 B2 | 10/2016 | Davis |
| 9,481,931 B2 | 11/2016 | Stempfer |
| 9,482,103 B2 | 11/2016 | McBrien et al. |
| 9,482,105 B1 | 11/2016 | Gorokhovsky et al. |
| 9,482,974 B2 | 11/2016 | Martin |
| 9,486,878 B2 | 11/2016 | Buller et al. |
| 9,486,944 B2 | 11/2016 | El-Siblani et al. |
| 9,486,964 B2 | 11/2016 | Joyce |
| 9,488,456 B2 | 11/2016 | Mace et al. |
| 9,490,350 B2 | 11/2016 | Koyama |
| 9,490,351 B2 | 11/2016 | Honda et al. |
| 9,494,829 B2 | 11/2016 | Hayakawa et al. |
| 9,496,375 B2 | 11/2016 | Isobe et al. |
| 9,499,779 B2 | 11/2016 | Murphy et al. |
| 9,505,648 B2 | 11/2016 | Afzal et al. |
| 9,507,061 B2 | 11/2016 | Hofmann et al. |
| 9,507,274 B2 | 11/2016 | Lafarre et al. |
| 9,508,667 B2 | 11/2016 | Prack |
| 9,508,979 B2 | 11/2016 | Matsui et al. |
| 9,511,005 B2 | 12/2016 | Nakatsuka et al. |
| 9,511,543 B2 | 12/2016 | Tyler |
| 9,511,547 B2 | 12/2016 | Swanson et al. |
| 9,512,029 B2 | 12/2016 | Ehemann et al. |
| 9,512,544 B2 | 12/2016 | Heikkila |
| 9,517,134 B2 | 12/2016 | Lang |
| 9,522,836 B2 | 12/2016 | Gulati et al. |
| 9,523,934 B2 | 12/2016 | Orrock et al. |
| 9,527,165 B2 | 12/2016 | Bruck et al. |
| 9,527,240 B2 | 12/2016 | Batchelder |
| 9,527,242 B2 | 12/2016 | Rodgers et al. |
| 9,527,244 B2 | 12/2016 | El-Siblani |
| 9,527,246 B2 | 12/2016 | Wiesner et al. |
| 9,528,705 B2 | 12/2016 | Melton |
| 9,528,902 B2 | 12/2016 | Clew et al. |
| 9,530,895 B2 | 12/2016 | Honda et al. |
| RE46,275 E | 1/2017 | Ying et al. |
| 9,533,350 B2 | 1/2017 | Zhuang et al. |
| 9,533,372 B2 | 1/2017 | O'Neill |
| 9,533,450 B2 | 1/2017 | El-Siblani et al. |
| 9,533,485 B2 | 1/2017 | Marshall et al. |
| 9,533,526 B1 | 1/2017 | Nevins |
| 9,536,844 B1 | 1/2017 | Brewer et al. |
| 9,543,116 B2 | 1/2017 | Lock |
| 9,545,017 B2 | 1/2017 | Hunrath et al. |
| 9,545,669 B2 | 1/2017 | Åklint et al. |
| 9,555,475 B2 | 1/2017 | Sidhu et al. |
| 9,555,612 B2 | 1/2017 | Kottilingam et al. |
| 9,556,415 B2 | 1/2017 | Forgacs et al. |
| 9,556,505 B2 | 1/2017 | Rosenzweig et al. |
| 9,557,331 B2 | 1/2017 | Bangera et al. |
| 9,557,661 B2 | 1/2017 | Martin |
| 9,559,213 B2 | 1/2017 | Yamazaki |
| 9,561,622 B2 | 2/2017 | Das et al. |
| 9,561,623 B2 | 2/2017 | El-Siblani et al. |
| 9,564,457 B2 | 2/2017 | Yamazaki |
| 9,564,589 B2 | 2/2017 | Awano et al. |
| 9,564,938 B1 | 2/2017 | Wang |
| 9,565,910 B2 | 2/2017 | Magness |
| 9,566,758 B2 | 2/2017 | Cheung et al. |
| 9,570,789 B2 | 2/2017 | Sherrer |
| 9,573,193 B2 | 2/2017 | Buller et al. |
| 9,573,224 B2 | 2/2017 | Sparks |
| 9,573,225 B2 | 2/2017 | Buller et al. |
| 9,575,037 B2 | 2/2017 | Acharya et al. |
| 9,578,695 B2 | 2/2017 | Jerby et al. |
| 9,579,718 B2 | 2/2017 | Hofmann |
| 9,579,829 B2 | 2/2017 | Williams |
| 9,579,851 B2 | 2/2017 | Mark et al. |
| 9,583,856 B2 | 2/2017 | Sherrer et al. |
| 9,586,285 B2 | 3/2017 | Abe et al. |
| 9,586,290 B2 | 3/2017 | Buller et al. |
| 9,586,298 B2 | 3/2017 | Jones et al. |
| 9,586,364 B2 | 3/2017 | El-Siblani et al. |
| 9,587,296 B2 | 3/2017 | Prest et al. |
| 9,587,317 B2 | 3/2017 | Wunderlich et al. |
| 9,592,530 B2 | 3/2017 | Rodgers |
| 9,593,924 B2 | 3/2017 | Mace et al. |

(56) References Cited

U.S. PATENT DOCUMENTS

| | | |
|---|---|---|
| 9,598,606 B2 | 3/2017 | Rolland et al. |
| 9,599,766 B2 | 3/2017 | Ouderkirk et al. |
| 9,601,779 B2 | 3/2017 | Visco et al. |
| 9,603,711 B2 | 3/2017 | Bojarski et al. |
| 9,603,775 B2 | 3/2017 | Weeks et al. |
| 9,603,780 B2 | 3/2017 | Stelzig et al. |
| 9,604,280 B2 | 3/2017 | Xu |
| 9,608,124 B2 | 3/2017 | Yamazaki |
| 9,608,228 B2 | 3/2017 | Kuroki |
| 9,611,167 B2 | 4/2017 | Brown |
| 9,614,062 B2 | 4/2017 | Yamazaki |
| 9,614,100 B2 | 4/2017 | Yamazaki et al. |
| 9,614,160 B2 | 4/2017 | Kato |
| 9,617,865 B2 | 4/2017 | Zotz |
| 9,623,512 B2 | 4/2017 | Amaya et al. |
| 9,625,156 B2 | 4/2017 | Rudrapatna et al. |
| 9,625,764 B2 | 4/2017 | Yamazaki et al. |
| 9,626,608 B2 | 4/2017 | Bobbitt, III |
| 9,636,229 B2 | 5/2017 | Lang et al. |
| 9,636,769 B2 | 5/2017 | Goehler et al. |
| 9,636,770 B2 | 5/2017 | Schwarze et al. |
| 9,636,775 B2 | 5/2017 | Huang et al. |
| 9,636,868 B2 | 5/2017 | Crump et al. |
| 9,642,727 B2 | 5/2017 | Verschueren et al. |
| 9,643,250 B2 | 5/2017 | Mazyar et al. |
| 9,643,279 B2 | 5/2017 | Schultz et al. |
| 9,643,281 B1 | 5/2017 | Memmen et al. |
| 9,643,361 B2 | 5/2017 | Liu |
| 9,649,690 B2 | 5/2017 | McMahan et al. |
| 9,655,293 B2 | 5/2017 | Schmid |
| 9,656,429 B1 | 5/2017 | Mantha et al. |
| 9,656,877 B2 | 5/2017 | Rahmani Nezhad |
| 9,660,265 B2 | 5/2017 | Visco et al. |
| 9,661,423 B2 | 5/2017 | Hecht et al. |
| 9,662,840 B1 | 5/2017 | Buller et al. |
| 9,663,400 B2 | 5/2017 | O'Malley et al. |
| 9,664,504 B2 | 5/2017 | Snis |
| 9,664,505 B2 | 5/2017 | Snis |
| 9,666,896 B2 | 5/2017 | Todorov et al. |
| 9,668,944 B2 | 6/2017 | Stelzig et al. |
| 9,669,583 B2 | 6/2017 | Ferrar |
| 9,676,145 B2 | 6/2017 | Buller et al. |
| 9,676,159 B2 | 6/2017 | Sterman et al. |
| 9,676,653 B2 | 6/2017 | Dannoux et al. |
| 9,676,963 B2 | 6/2017 | Rolland et al. |
| 9,682,019 B2 | 6/2017 | Klee et al. |
| 9,682,166 B2 | 6/2017 | Watanabe |
| 9,682,425 B2 | 6/2017 | Xu et al. |
| 9,688,028 B2 | 6/2017 | Mark et al. |
| 9,688,540 B2 | 6/2017 | Davis |
| 9,690,286 B2 | 6/2017 | Hovsepian et al. |
| 9,694,423 B2 | 7/2017 | Bruck et al. |
| 9,694,545 B2 | 7/2017 | Skubic et al. |
| 9,696,142 B2 | 7/2017 | Bamberg et al. |
| 9,700,485 B2 | 7/2017 | Weeks et al. |
| 9,700,486 B2 | 7/2017 | Weeks et al. |
| 9,705,099 B2 | 7/2017 | Adamovich et al. |
| 9,707,153 B2 | 7/2017 | Weeks et al. |
| 9,707,154 B2 | 7/2017 | Weeks et al. |
| 9,707,155 B2 | 7/2017 | Weeks et al. |
| 9,707,717 B2 | 7/2017 | Sand |
| 9,708,440 B2 | 7/2017 | Das et al. |
| 9,713,572 B2 | 7/2017 | Weeks et al. |
| 9,713,843 B2 | 7/2017 | Snyder et al. |
| 9,714,318 B2 | 7/2017 | Jaker et al. |
| 9,715,563 B1 | 7/2017 | Schroeder |
| 9,717,648 B2 | 8/2017 | Weeks et al. |
| 9,717,649 B2 | 8/2017 | Weeks et al. |
| 9,718,127 B2 | 8/2017 | Xu |
| 9,720,363 B2 | 8/2017 | Chillscyzn et al. |
| 9,721,384 B1 | 8/2017 | Tran et al. |
| 9,721,755 B2 | 8/2017 | Lock |
| 9,722,275 B2 | 8/2017 | Zhamu et al. |
| 9,724,727 B2 | 8/2017 | Domey et al. |
| 9,728,648 B2 | 8/2017 | Sasagawa et al. |
| 9,728,773 B2 | 8/2017 | Kung et al. |
| 9,729,187 B1 | 8/2017 | Adelmann |
| 9,731,377 B2 | 8/2017 | Forsdike et al. |
| 9,732,239 B2 | 8/2017 | Clapp et al. |
| 9,735,428 B2 | 8/2017 | Tanaka et al. |
| 9,737,934 B2 | 8/2017 | Lafarre et al. |
| 9,742,001 B2 | 8/2017 | Zhamu et al. |
| 9,744,722 B2 | 8/2017 | Rodgers |
| 9,744,730 B2 | 8/2017 | Comb |
| 9,744,743 B2 | 8/2017 | Jung et al. |
| 9,745,223 B2 | 8/2017 | Hojaji |
| 9,751,610 B2 | 9/2017 | Hegenbart et al. |
| 9,755,191 B2 | 9/2017 | Uezawa et al. |
| 9,757,802 B2 | 9/2017 | Cui et al. |
| 9,764,418 B1 | 9/2017 | Schroers et al. |
| 9,764,515 B2 | 9/2017 | Yost et al. |
| 9,765,167 B2 | 9/2017 | Haschick et al. |
| 9,765,271 B2 | 9/2017 | Myrick |
| 9,765,635 B2 | 9/2017 | Gorokhovsky |
| 9,765,727 B2 | 9/2017 | Evers et al. |
| 9,768,026 B2 | 9/2017 | Davis |
| 9,769,573 B2 | 9/2017 | Hecht et al. |
| 9,770,758 B2 | 9/2017 | Xu |
| 9,770,760 B2 | 9/2017 | Liu |
| 9,770,866 B2 | 9/2017 | Mironets et al. |
| 9,771,400 B2 | 9/2017 | Kurland et al. |
| 9,771,629 B2 | 9/2017 | Soloway |
| 9,772,621 B2 | 9/2017 | Verschueren et al. |
| 9,774,192 B2 | 9/2017 | Wojcik et al. |
| 9,775,680 B2 | 10/2017 | Bojarski et al. |
| 9,776,243 B2 | 10/2017 | Abe et al. |
| 9,776,282 B2 | 10/2017 | Subramanian et al. |
| 9,776,376 B2 | 10/2017 | Swartz et al. |
| 9,777,385 B2 | 10/2017 | Wirth et al. |
| 9,780,348 B2 | 10/2017 | Kagami et al. |
| 9,782,932 B2 | 10/2017 | Roels et al. |
| 9,782,935 B2 | 10/2017 | Yamashita et al. |
| 9,783,718 B2 | 10/2017 | Stevenson et al. |
| 9,783,885 B2 | 10/2017 | Newman et al. |
| 9,785,064 B2 | 10/2017 | Orrock et al. |
| 9,788,600 B2 | 10/2017 | Wawrousek et al. |
| 9,789,665 B2 | 10/2017 | Lin et al. |
| 9,790,124 B2 | 10/2017 | Dejneka et al. |
| 9,793,057 B2 | 10/2017 | McConnell et al. |
| 9,795,541 B2 | 10/2017 | Fontein et al. |
| 9,796,048 B2 | 10/2017 | Lacy et al. |
| 9,802,253 B2 | 10/2017 | Jonasson |
| 9,808,991 B2 | 11/2017 | Tyler |
| 9,812,467 B2 | 11/2017 | Yamazaki et al. |
| 9,812,582 B2 | 11/2017 | Yamazaki |
| 9,815,118 B1 | 11/2017 | Schmitt et al. |
| 9,815,139 B2 | 11/2017 | Bruck et al. |
| 9,815,144 B2 | 11/2017 | Grundmueller et al. |
| 9,815,268 B2 | 11/2017 | Mark et al. |
| 9,818,715 B2 | 11/2017 | Yamada et al. |
| 9,821,399 B1 | 11/2017 | Vigdal et al. |
| 9,821,411 B2 | 11/2017 | Buller et al. |
| 9,821,546 B2 | 11/2017 | Schaafsma et al. |
| 9,822,045 B2 | 11/2017 | Jones |
| 9,826,652 B2 | 11/2017 | Adelmann |
| 9,827,754 B2 | 11/2017 | Swartz et al. |
| 9,828,679 B1 | 11/2017 | Brooks |
| 9,832,866 B2 | 11/2017 | Ahn et al. |
| 9,833,838 B2 | 12/2017 | Mazyar et al. |
| 9,833,839 B2 | 12/2017 | Gibson et al. |
| 9,833,949 B2 | 12/2017 | Swartz et al. |
| 9,833,987 B2 | 12/2017 | Zoppas et al. |
| 9,835,428 B2 | 12/2017 | Mace et al. |
| 9,836,883 B2 | 12/2017 | Tran et al. |
| 9,838,018 B2 | 12/2017 | Ghanea-Hercock |
| 9,839,579 B2 | 12/2017 | Weeks et al. |
| 9,839,977 B2 | 12/2017 | Liebl et al. |
| 9,849,066 B2 | 12/2017 | Weeks et al. |
| 9,849,510 B2 | 12/2017 | Lacy et al. |
| 9,849,543 B2 | 12/2017 | Scott et al. |
| 9,850,160 B2 | 12/2017 | Marjanovic et al. |
| 9,850,172 B2 | 12/2017 | Wu et al. |
| 9,852,904 B2 | 12/2017 | Yamazaki et al. |
| 9,855,369 B2 | 1/2018 | Murphy et al. |

(56) References Cited

U.S. PATENT DOCUMENTS

| | | |
|---|---|---|
| 9,855,625 B2 | 1/2018 | El-Dasher et al. |
| 9,855,698 B2 | 1/2018 | Perez et al. |
| 9,857,860 B2 | 1/2018 | Tokunaga |
| 9,859,114 B2 | 1/2018 | Yamazaki |
| 9,861,452 B2 | 1/2018 | Rundlett |
| 9,862,146 B2 | 1/2018 | Driessen et al. |
| 9,862,617 B2 | 1/2018 | Law et al. |
| 9,868,255 B2 | 1/2018 | Comb et al. |
| 9,869,734 B2 | 1/2018 | Mathieu et al. |
| 9,871,059 B2 | 1/2018 | Isobe et al. |
| 9,871,176 B2 | 1/2018 | Maloney et al. |
| 9,871,209 B2 | 1/2018 | Yoshida et al. |
| 9,873,180 B2 | 1/2018 | Bajaj et al. |
| 9,873,228 B2 | 1/2018 | Suzuki et al. |
| 9,873,281 B2 | 1/2018 | Cape et al. |
| 9,873,761 B1 | 1/2018 | Das et al. |
| 9,877,790 B2 | 1/2018 | Bojarski et al. |
| 9,878,497 B2 | 1/2018 | Schwarze et al. |
| 9,881,744 B2 | 1/2018 | McConnell et al. |
| 9,882,111 B2 | 1/2018 | Cauchon et al. |
| 9,885,987 B2 | 2/2018 | Chillscyzn et al. |
| 9,887,066 B2 | 2/2018 | Ryding et al. |
| 9,890,091 B2 | 2/2018 | Jones |
| 9,896,944 B2 | 2/2018 | Kamel et al. |
| 9,897,513 B2 | 2/2018 | Snis |
| 9,899,136 B2 | 2/2018 | Lee et al. |
| 9,899,672 B2 | 2/2018 | Zhamu et al. |
| 9,902,112 B2 | 2/2018 | El-Siblani et al. |
| 9,902,588 B2 | 2/2018 | Mannella et al. |
| 9,903,037 B2 | 2/2018 | Ferreira et al. |
| 9,903,214 B2 | 2/2018 | Kenyon et al. |
| 9,903,574 B2 | 2/2018 | Golle et al. |
| 9,904,223 B2 | 2/2018 | Chillscyzn et al. |
| 9,905,516 B2 | 2/2018 | Watanabe et al. |
| 9,905,860 B2 | 2/2018 | Visco et al. |
| 9,908,803 B2 | 3/2018 | Bookbinder et al. |
| 9,911,874 B2 | 3/2018 | Harley et al. |
| 9,915,583 B2 | 3/2018 | Snis |
| 9,915,756 B2 | 3/2018 | Nordahl |
| 9,916,958 B1 | 3/2018 | Bhandari et al. |
| 9,917,263 B2 | 3/2018 | Yoshida et al. |
| 9,919,111 B2 | 3/2018 | Hyde et al. |
| 9,919,112 B2 | 3/2018 | Hyde et al. |
| 9,919,273 B2 | 3/2018 | Doyen et al. |
| 9,919,360 B2 | 3/2018 | Buller et al. |
| 9,919,361 B2 | 3/2018 | Jonasson |
| 9,919,472 B1 | 3/2018 | Cohen et al. |
| 9,919,479 B2 | 3/2018 | Baecker et al. |
| 9,920,433 B2 | 3/2018 | Engel et al. |
| 9,922,759 B2 | 3/2018 | Bharadwaj |
| 9,923,000 B2 | 3/2018 | Koyama |
| 9,923,166 B2 | 3/2018 | Kinoshita et al. |
| 9,925,714 B2 | 3/2018 | Rodgers et al. |
| 9,925,724 B2 | 3/2018 | Long |
| 9,926,427 B2 | 3/2018 | Zhamu et al. |
| 9,931,695 B2 | 4/2018 | Lacy et al. |
| 9,931,697 B2 | 4/2018 | Levin et al. |
| 9,931,814 B2 | 4/2018 | Lacy et al. |
| 9,931,817 B2 | 4/2018 | Rickerl |
| 9,932,663 B2 | 4/2018 | Cheah et al. |
| 9,932,841 B2 | 4/2018 | Staroselsky et al. |
| 9,933,718 B2 | 4/2018 | Martin |
| 9,933,820 B2 | 4/2018 | Helot et al. |
| 9,937,580 B2 | 4/2018 | Peters et al. |
| 9,938,839 B2 | 4/2018 | Rosenzweig et al. |
| 9,943,927 B2 | 4/2018 | Zhai |
| 9,943,929 B2 | 4/2018 | Schultz et al. |
| 9,943,981 B2 | 4/2018 | Gunther |
| 9,944,021 B2 | 4/2018 | Easter et al. |
| 9,945,032 B2 | 4/2018 | Helvajian |
| 9,947,964 B2 | 4/2018 | Hatta et al. |
| 9,950,367 B2 | 4/2018 | Backlund et al. |
| 9,950,465 B2 | 4/2018 | Linnell et al. |
| 9,953,899 B2 | 4/2018 | Chen et al. |
| 9,954,212 B2 | 4/2018 | Kagami et al. |
| 9,956,047 B2 | 5/2018 | Bojarski et al. |
| 9,956,048 B2 | 5/2018 | Bojarski et al. |
| 9,956,107 B2 | 5/2018 | Blanck |
| 9,956,612 B1 | 5/2018 | Redding et al. |
| 9,956,725 B2 | 5/2018 | Mark et al. |
| 9,956,727 B2 | 5/2018 | Steele |
| 9,959,613 B2 | 5/2018 | Ohno et al. |
| 9,960,122 B2 | 5/2018 | Kato |
| 9,962,767 B2 | 5/2018 | Buller et al. |
| 9,969,000 B2 | 5/2018 | Witney et al. |
| 9,969,153 B2 | 5/2018 | Meisner et al. |
| 9,969,930 B2 | 5/2018 | Florio et al. |
| 9,970,824 B2 | 5/2018 | Cheung et al. |
| 9,972,802 B2 | 5/2018 | Ikemizu et al. |
| 9,975,179 B2 | 5/2018 | Czinger et al. |
| 9,975,199 B2 | 5/2018 | Moagar-Poladian |
| 9,975,296 B2 | 5/2018 | El-Siblani |
| 9,975,323 B2 | 5/2018 | Chan et al. |
| 9,981,425 B2 | 5/2018 | El-Siblani et al. |
| 9,982,164 B2 | 5/2018 | Rolland et al. |
| 9,982,684 B2 | 5/2018 | Moricca |
| 9,987,798 B2 | 6/2018 | Tyler |
| 9,987,804 B2 | 6/2018 | El-Siblani et al. |
| 9,988,720 B2 | 6/2018 | Johnson |
| 9,990,965 B2 | 6/2018 | Atsumi |
| 9,991,221 B2 | 6/2018 | Yamada et al. |
| 9,991,293 B2 | 6/2018 | Yamazaki et al. |
| 9,991,395 B2 | 6/2018 | Sasagawa et al. |
| 9,991,453 B2 | 6/2018 | Kita et al. |
| 9,993,395 B2 | 6/2018 | Klee et al. |
| 9,993,976 B2 | 6/2018 | Coeck et al. |
| 9,993,982 B2 | 6/2018 | Sherrer et al. |
| 9,994,339 B2 | 6/2018 | Colson et al. |
| 9,996,981 B1 | 6/2018 | Tran et al. |
| 9,997,545 B2 | 6/2018 | Yamazaki |
| 9,997,784 B2 | 6/2018 | Su et al. |
| 9,999,576 B2 | 6/2018 | Klee et al. |
| 9,999,920 B2 | 6/2018 | Xu et al. |
| 10,000,023 B2 | 6/2018 | El-Siblani et al. |
| 10,002,685 B2 | 6/2018 | Kita et al. |
| 10,005,227 B2 | 6/2018 | Facci et al. |
| 10,005,228 B2 | 6/2018 | Alvarez et al. |
| 10,005,230 B2 | 6/2018 | Alvarez et al. |
| 10,005,237 B2 | 6/2018 | El-Siblani et al. |
| 10,008,870 B2 | 6/2018 | Davison et al. |
| 10,011,076 B2 | 7/2018 | El-Siblani et al. |
| 10,011,089 B2 | 7/2018 | Lyons et al. |
| 10,011,352 B1 | 7/2018 | Dahlstrom |
| 10,016,262 B2 | 7/2018 | Sabina et al. |
| 10,016,661 B2 | 7/2018 | Madson et al. |
| 10,016,942 B2 | 7/2018 | Mark et al. |
| 10,018,937 B2 | 7/2018 | Martin |
| 10,022,614 B1 | 7/2018 | Tran et al. |
| 10,023,495 B2 | 7/2018 | Chang et al. |
| 10,023,739 B2 | 7/2018 | Rodgers et al. |
| 10,029,422 B2 | 7/2018 | Meisner et al. |
| 10,029,424 B2 | 7/2018 | Verschueren et al. |
| 10,029,461 B2 | 7/2018 | Yamada |
| 10,035,306 B2 | 7/2018 | Crump et al. |
| 10,035,920 B2 | 7/2018 | Omenetto et al. |
| 10,039,195 B2 | 7/2018 | Elmieh et al. |
| 10,040,239 B2 | 8/2018 | Brown, Jr. |
| 10,040,240 B1 | 8/2018 | Tyler et al. |
| 10,040,250 B2 | 8/2018 | Liu et al. |
| 10,040,252 B2 | 8/2018 | Mark |
| 10,040,810 B2 | 8/2018 | Muller et al. |
| 10,045,835 B2 | 8/2018 | Boronkay et al. |
| 10,046,494 B2 | 8/2018 | Pruitt et al. |
| 10,046,521 B2 | 8/2018 | Walker et al. |
| 10,046,524 B2 | 8/2018 | Meyer |
| 10,051,753 B2 | 8/2018 | Ehemann et al. |
| 10,052,159 B2 | 8/2018 | Bangera et al. |
| 10,052,691 B2 | 8/2018 | Heikkila |
| 10,054,530 B2 | 8/2018 | Swanner, Jr. et al. |
| 10,058,920 B2 | 8/2018 | Buller et al. |
| 10,059,053 B2 | 8/2018 | Jaker et al. |
| 10,059,057 B2 | 8/2018 | Schirtzinger et al. |
| 10,059,092 B2 | 8/2018 | Welch et al. |
| 10,059,595 B1 | 8/2018 | Farbstein |

(56) References Cited

U.S. PATENT DOCUMENTS

| | | |
|---|---|---|
| 10,060,217 B2 | 8/2018 | Murphree et al. |
| 10,061,221 B2 | 8/2018 | Orrock et al. |
| 10,064,745 B2 | 9/2018 | Hossainy et al. |
| 10,065,270 B2 | 9/2018 | Buller et al. |
| 10,065,367 B2 | 9/2018 | Brown, Jr. |
| 10,065,371 B2 | 9/2018 | Martin |
| 10,065,885 B2 | 9/2018 | Kase et al. |
| 10,068,863 B2 | 9/2018 | Prack |
| 10,071,422 B2 | 9/2018 | Buller et al. |
| 10,076,875 B2 | 9/2018 | Mark et al. |
| 10,076,876 B2 | 9/2018 | Mark et al. |
| 10,081,129 B1 | 9/2018 | Alvarado et al. |
| 10,082,605 B2 | 9/2018 | Ibuki et al. |
| 10,086,564 B2 | 10/2018 | Batchelder et al. |
| 10,087,556 B2 | 10/2018 | Gallucci et al. |
| 10,089,413 B2 | 10/2018 | Wirx-Speetjens et al. |
| 10,091,891 B2 | 10/2018 | Ilic et al. |
| 10,093,039 B2 | 10/2018 | Jayanti et al. |
| 10,096,537 B1 | 10/2018 | Chen et al. |
| 10,099,309 B2 | 10/2018 | Vigdal et al. |
| 10,099,427 B2 | 10/2018 | Mark et al. |
| 10,105,902 B2 | 10/2018 | Frauens |
| 10,105,906 B2 | 10/2018 | Cho et al. |
| 10,112,345 B2 | 10/2018 | El-Siblani et al. |
| 10,112,379 B2 | 10/2018 | Sreekumar |
| 10,116,777 B2 | 10/2018 | Kil et al. |
| 10,117,806 B2 | 11/2018 | Chang et al. |
| 10,117,810 B2 | 11/2018 | Stelzig et al. |
| 10,118,054 B2 | 11/2018 | Maharbiz et al. |
| 10,118,337 B2 | 11/2018 | Nowak et al. |
| 10,123,807 B2 | 11/2018 | Geebelen |
| 10,123,947 B2 | 11/2018 | Takei et al. |
| 10,124,408 B2 | 11/2018 | Kenney et al. |
| 10,124,410 B2 | 11/2018 | Kanko et al. |
| 10,124,532 B2 | 11/2018 | El-Siblani et al. |
| 10,124,539 B2 | 11/2018 | Batchelder et al. |
| 10,131,088 B1 | 11/2018 | Tyler et al. |
| 10,131,131 B2 | 11/2018 | Batchelder et al. |
| 10,132,578 B2 | 11/2018 | Knowlen et al. |
| 10,134,766 B2 | 11/2018 | Hayakawa et al. |
| 10,135,002 B2 | 11/2018 | Ono et al. |
| 10,135,109 B2 | 11/2018 | Sherrer |
| 10,136,689 B1 | 11/2018 | Pandolfino |
| 10,137,634 B2 | 11/2018 | Ruiz et al. |
| 10,137,636 B2 | 11/2018 | Meisner et al. |
| 10,137,642 B1 | 11/2018 | Gifford et al. |
| 10,137,667 B2 | 11/2018 | Cleary et al. |
| 10,144,178 B2 | 12/2018 | Meisner et al. |
| 10,144,205 B2 | 12/2018 | El-Siblani |
| 10,144,828 B2 | 12/2018 | Rodgers et al. |
| 10,144,840 B2 | 12/2018 | Hearon |
| 10,145,271 B2 | 12/2018 | Brown et al. |
| 10,149,505 B2 | 12/2018 | Pandolfino |
| 10,150,258 B2 | 12/2018 | Feinberg et al. |
| 10,151,049 B2 | 12/2018 | Banin et al. |
| 10,151,377 B2 | 12/2018 | Hofmann et al. |
| 10,153,608 B2 | 12/2018 | Hemenway et al. |
| 10,155,882 B2 | 12/2018 | Rolland et al. |
| 10,156,185 B2 | 12/2018 | Hesselink et al. |
| 10,157,503 B2 | 12/2018 | Tran et al. |
| 10,160,022 B2 | 12/2018 | Butcher et al. |
| 10,160,061 B2 | 12/2018 | Helvajian et al. |
| 10,160,193 B2 | 12/2018 | Nielsen-Cole et al. |
| 10,162,084 B2 | 12/2018 | Hart et al. |
| 10,166,744 B2 | 1/2019 | Brown et al. |
| 10,170,500 B2 | 1/2019 | Koyama |
| 10,170,726 B2 | 1/2019 | Yamazaki et al. |
| 10,172,400 B1 | 1/2019 | Pandolfino |
| 10,172,695 B2 | 1/2019 | Okada et al. |
| 10,173,916 B2 | 1/2019 | Bankaitis et al. |
| 10,173,945 B1 | 1/2019 | Buckner et al. |
| 10,174,205 B2 | 1/2019 | Keoshkerian et al. |
| 10,174,276 B2 | 1/2019 | Murphy et al. |
| 10,179,640 B2 | 1/2019 | Wilkerson |
| 10,181,017 B2 | 1/2019 | Clarke et al. |
| 10,182,869 B2 | 1/2019 | Bangera et al. |
| 10,183,330 B2 | 1/2019 | Buller et al. |
| 10,183,443 B2 | 1/2019 | Alvarez et al. |
| 10,183,477 B2 | 1/2019 | Dean et al. |
| 10,189,057 B2 | 1/2019 | Craft et al. |
| 10,189,114 B2 | 1/2019 | Stecker |
| 10,189,204 B2 | 1/2019 | Fulop et al. |
| 10,189,210 B2 | 1/2019 | Rodgers et al. |
| 10,189,239 B2 | 1/2019 | Downing |
| 10,190,244 B2 | 1/2019 | Ashraf et al. |
| 10,190,955 B2 | 1/2019 | Hossain et al. |
| 10,195,629 B1 | 2/2019 | Dahlstrom |
| 10,195,643 B2 | 2/2019 | Domey et al. |
| 10,195,693 B2 | 2/2019 | Buller et al. |
| 10,196,295 B2 | 2/2019 | Gulati et al. |
| 10,200,834 B2 | 2/2019 | Tran et al. |
| 10,201,409 B2 | 2/2019 | Mason et al. |
| 10,201,931 B2 | 2/2019 | Batchelder et al. |
| 10,202,216 B2 | 2/2019 | Fushimi |
| 2001/0000889 A1 | 5/2001 | Yadav et al. |
| 2001/0008230 A1 | 7/2001 | Keicher et al. |
| 2001/0008317 A1 | 7/2001 | Gaylo et al. |
| 2001/0018159 A1 | 8/2001 | Maemoto |
| 2001/0021292 A1 | 9/2001 | Merkel |
| 2001/0028990 A1 | 10/2001 | Uesugi et al. |
| 2001/0038029 A1 | 11/2001 | Weihs et al. |
| 2001/0039810 A1 | 11/2001 | Eda et al. |
| 2001/0043996 A1 | 11/2001 | Yamada et al. |
| 2002/0007751 A1 | 1/2002 | Inoue et al. |
| 2002/0009626 A1 | 1/2002 | Terazono et al. |
| 2002/0015654 A1 | 2/2002 | Das et al. |
| 2002/0025493 A1 | 2/2002 | Hotta |
| 2002/0031731 A1 | 3/2002 | Hosokawa |
| 2002/0041137 A1 | 4/2002 | Nishikawa et al. |
| 2002/0056401 A1 | 5/2002 | Rupich et al. |
| 2002/0062858 A1 | 5/2002 | Mowles |
| 2002/0066233 A1 | 6/2002 | McArdle et al. |
| 2002/0069592 A1 | 6/2002 | Sherman et al. |
| 2002/0081447 A1 | 6/2002 | Movchan et al. |
| 2002/0082171 A1 | 6/2002 | Schoop et al. |
| 2002/0084527 A1 | 7/2002 | Yeoh |
| 2002/0090821 A1 | 7/2002 | Yeoh |
| 2002/0092325 A1 | 7/2002 | Muschik et al. |
| 2002/0098381 A1 | 7/2002 | Coffey et al. |
| 2002/0098776 A1 | 7/2002 | Dopper |
| 2002/0108400 A1 | 8/2002 | Watanabe et al. |
| 2002/0110698 A1 | 8/2002 | Singh |
| 2002/0144838 A1 | 10/2002 | Fritzemeier et al. |
| 2002/0153253 A1 | 10/2002 | Nishino et al. |
| 2002/0154741 A1 | 10/2002 | Rigali et al. |
| 2002/0160308 A1 | 10/2002 | Nishino et al. |
| 2002/0160685 A1 | 10/2002 | Kodas et al. |
| 2002/0168051 A1 | 11/2002 | Lee et al. |
| 2002/0173416 A1 | 11/2002 | Ellison et al. |
| 2002/0177003 A1 | 11/2002 | Myrick |
| 2002/0192494 A1 | 12/2002 | Tzatzov et al. |
| 2002/0192564 A1 | 12/2002 | Ota et al. |
| 2002/0195676 A1 | 12/2002 | Hamamoto et al. |
| 2003/0003474 A1 | 1/2003 | Tanner et al. |
| 2003/0009126 A1 | 1/2003 | Zollinger et al. |
| 2003/0019326 A1 | 1/2003 | Han et al. |
| 2003/0022094 A1 | 1/2003 | Nakamura et al. |
| 2003/0029910 A1 | 2/2003 | Goretta et al. |
| 2003/0039459 A1 | 2/2003 | Brambilla et al. |
| 2003/0044593 A1 | 3/2003 | Vaidyanathan et al. |
| 2003/0068575 A1 | 4/2003 | Yanaka |
| 2003/0070916 A1 | 4/2003 | Nanno et al. |
| 2003/0108795 A1 | 6/2003 | Tamura et al. |
| 2003/0109202 A1 | 6/2003 | Matsuno et al. |
| 2003/0113506 A1 | 6/2003 | Takahashi et al. |
| 2003/0114936 A1 | 6/2003 | Sherwood et al. |
| 2003/0116503 A1 | 6/2003 | Wang et al. |
| 2003/0116542 A1 | 6/2003 | McGregor et al. |
| 2003/0119920 A1 | 6/2003 | Wang et al. |
| 2003/0127051 A1 | 7/2003 | Fritzemeier et al. |
| 2003/0128428 A1 | 7/2003 | Anderson et al. |
| 2003/0161750 A1 | 8/2003 | Moxson et al. |
| 2003/0162127 A1 | 8/2003 | Kikuchi |
| 2003/0173720 A1 | 9/2003 | Musso et al. |

(56) References Cited

U.S. PATENT DOCUMENTS

| | | |
|---|---|---|
| 2003/0180571 A1 | 9/2003 | Singh |
| 2003/0189082 A1 | 10/2003 | Dockus et al. |
| 2003/0203205 A1 | 10/2003 | Bi et al. |
| 2003/0206820 A1 | 11/2003 | Keicher et al. |
| 2004/0009402 A1 | 1/2004 | Adachi et al. |
| 2004/0016769 A1 | 1/2004 | Redmond |
| 2004/0016912 A1 | 1/2004 | Bandyopadhyay et al. |
| 2004/0018432 A1 | 1/2004 | Adachi et al. |
| 2004/0023087 A1 | 2/2004 | Redmond |
| 2004/0035910 A1 | 2/2004 | Dockus et al. |
| 2004/0056022 A1 | 3/2004 | Meiners et al. |
| 2004/0071882 A1 | 4/2004 | Rupich et al. |
| 2004/0081895 A1 | 4/2004 | Adachi et al. |
| 2004/0096742 A1 | 5/2004 | Akashi et al. |
| 2004/0099996 A1 | 5/2004 | Herzog |
| 2004/0100164 A1 | 5/2004 | Murata et al. |
| 2004/0106060 A1 | 6/2004 | Maemoto |
| 2004/0112478 A1 | 6/2004 | Bieler et al. |
| 2004/0133298 A1 | 7/2004 | Toyserkani et al. |
| 2004/0147620 A1 | 7/2004 | Wang et al. |
| 2004/0149806 A1 | 8/2004 | Hardwick |
| 2004/0154488 A1 | 8/2004 | Tomita et al. |
| 2004/0161789 A1 | 8/2004 | Tanner et al. |
| 2004/0168637 A1 | 9/2004 | Gorokhovsky |
| 2004/0182835 A1 | 9/2004 | Hall |
| 2004/0191106 A1 | 9/2004 | O'Neill et al. |
| 2004/0192063 A1 | 9/2004 | Koike |
| 2004/0192171 A1 | 9/2004 | Koike |
| 2004/0197650 A1 | 10/2004 | Kubota et al. |
| 2004/0202883 A1 | 10/2004 | Scheydecker et al. |
| 2004/0206267 A1 | 10/2004 | Sambasivan et al. |
| 2004/0209756 A1 | 10/2004 | Anderson et al. |
| 2004/0210289 A1 | 10/2004 | Wang et al. |
| 2004/0219295 A1 | 11/2004 | Perepezko et al. |
| 2004/0221515 A1 | 11/2004 | McArdle et al. |
| 2004/0224258 A1 | 11/2004 | Maemoto |
| 2004/0231758 A1 | 11/2004 | Hampden-Smith et al. |
| 2004/0234866 A1 | 11/2004 | Yamaguchi et al. |
| 2004/0234883 A1 | 11/2004 | Maemoto |
| 2004/0242792 A1 | 12/2004 | Sotzing |
| 2004/0247782 A1 | 12/2004 | Hampden-Smith et al. |
| 2004/0249428 A1 | 12/2004 | Wang et al. |
| 2004/0254419 A1 | 12/2004 | Wang et al. |
| 2004/0261420 A1 | 12/2004 | Lewis |
| 2004/0265736 A1 | 12/2004 | Aoshima et al. |
| 2005/0007105 A1 | 1/2005 | Siegle et al. |
| 2005/0008939 A1 | 1/2005 | Ota et al. |
| 2005/0013759 A1 | 1/2005 | Grow |
| 2005/0023508 A1 | 2/2005 | Fujimaki |
| 2005/0025797 A1 | 2/2005 | Wang et al. |
| 2005/0031891 A1 | 2/2005 | Kaiser et al. |
| 2005/0036893 A1 | 2/2005 | Decker |
| 2005/0036898 A1 | 2/2005 | Sweetland |
| 2005/0040090 A1 | 2/2005 | Wang et al. |
| 2005/0044987 A1 | 3/2005 | Takayama et al. |
| 2005/0045034 A1 | 3/2005 | Paglieri et al. |
| 2005/0048571 A1 | 3/2005 | Danielson et al. |
| 2005/0054510 A1 | 3/2005 | Ellison et al. |
| 2005/0056806 A1 | 3/2005 | Ellison et al. |
| 2005/0061107 A1 | 3/2005 | Hampden-Smith et al. |
| 2005/0064291 A1 | 3/2005 | Sato et al. |
| 2005/0065035 A1 | 3/2005 | Rupich et al. |
| 2005/0069640 A1 | 3/2005 | Kodas et al. |
| 2005/0079132 A1 | 4/2005 | Wang et al. |
| 2005/0089627 A1 | 4/2005 | Chuntonov |
| 2005/0095442 A1 | 5/2005 | Byers et al. |
| 2005/0098609 A1 | 5/2005 | Greenhut et al. |
| 2005/0100790 A1 | 5/2005 | Ota et al. |
| 2005/0106495 A1 | 5/2005 | Fujimaki |
| 2005/0107870 A1 | 5/2005 | Wang et al. |
| 2005/0118482 A1 | 6/2005 | Sriramulu et al. |
| 2005/0119725 A1 | 6/2005 | Wang et al. |
| 2005/0127334 A1 | 6/2005 | Shibata et al. |
| 2005/0133527 A1 | 6/2005 | Dullea et al. |
| 2005/0142377 A1 | 6/2005 | Hall |
| 2005/0147752 A1 | 7/2005 | Kodas et al. |
| 2005/0149002 A1 | 7/2005 | Wang et al. |
| 2005/0149169 A1 | 7/2005 | Wang et al. |
| 2005/0151228 A1 | 7/2005 | Tanida et al. |
| 2005/0153161 A1 | 7/2005 | Narita et al. |
| 2005/0153208 A1 | 7/2005 | Konishiike et al. |
| 2005/0155779 A1 | 7/2005 | Wang et al. |
| 2005/0165471 A1 | 7/2005 | Wang et al. |
| 2005/0172643 A1 | 8/2005 | Lewis |
| 2005/0174208 A1 | 8/2005 | Sato et al. |
| 2005/0175822 A1 | 8/2005 | Ohno et al. |
| 2005/0182482 A1 | 8/2005 | Wang et al. |
| 2005/0202343 A1 | 9/2005 | Fujimaki |
| 2005/0216075 A1 | 9/2005 | Wang et al. |
| 2005/0227148 A1 | 10/2005 | Nanno et al. |
| 2005/0230029 A1 | 10/2005 | Vaidyanathan et al. |
| 2005/0233886 A1 | 10/2005 | Anderson |
| 2005/0240100 A1 | 10/2005 | Wang et al. |
| 2005/0244337 A1 | 11/2005 | Wang et al. |
| 2005/0255694 A1 | 11/2005 | Yeoh |
| 2005/0261763 A1 | 11/2005 | Wang et al. |
| 2005/0278020 A1 | 12/2005 | Wang et al. |
| 2006/0001726 A1 | 1/2006 | Kodas et al. |
| 2006/0021221 A1 | 2/2006 | Decker |
| 2006/0027625 A1 | 2/2006 | Dockus et al. |
| 2006/0032838 A1 | 2/2006 | Muylaert et al. |
| 2006/0035149 A1 | 2/2006 | Nanba et al. |
| 2006/0051600 A1 | 3/2006 | Rupich et al. |
| 2006/0062684 A1 | 3/2006 | Zahrah et al. |
| 2006/0081571 A1 | 4/2006 | Hoebel et al. |
| 2006/0094603 A1 | 5/2006 | Li et al. |
| 2006/0102871 A1 | 5/2006 | Wang et al. |
| 2006/0108567 A1 | 5/2006 | Charati et al. |
| 2006/0118758 A1 | 6/2006 | Wang et al. |
| 2006/0119249 A1 | 6/2006 | Miyata et al. |
| 2006/0135344 A1 | 6/2006 | Rigali et al. |
| 2006/0141362 A1 | 6/2006 | Nanno et al. |
| 2006/0142853 A1 | 6/2006 | Wang et al. |
| 2006/0147138 A1 | 7/2006 | Johal et al. |
| 2006/0147332 A1 | 7/2006 | Jones et al. |
| 2006/0147369 A1 | 7/2006 | Bi et al. |
| 2006/0147631 A1 | 7/2006 | Lev et al. |
| 2006/0151582 A1 | 7/2006 | Goretta et al. |
| 2006/0160919 A1 | 7/2006 | Brugger et al. |
| 2006/0166159 A1 | 7/2006 | Abels et al. |
| 2006/0167120 A1 | 7/2006 | Wang et al. |
| 2006/0172073 A1 | 8/2006 | Groza et al. |
| 2006/0185473 A1 | 8/2006 | Withers et al. |
| 2006/0216539 A1 | 9/2006 | Takayanagi et al. |
| 2006/0216604 A1 | 9/2006 | Kawase et al. |
| 2006/0224027 A1 | 10/2006 | Turek et al. |
| 2006/0225817 A1 | 10/2006 | Chuntonov |
| 2006/0226421 A1 | 10/2006 | Fujiwara et al. |
| 2006/0227695 A1 | 10/2006 | Nagaoka |
| 2006/0228475 A1 | 10/2006 | Perepezko et al. |
| 2006/0234127 A1 | 10/2006 | Kim et al. |
| 2006/0235060 A1 | 10/2006 | Yoshida et al. |
| 2006/0246725 A1 | 11/2006 | Yeoh |
| 2006/0249705 A1 | 11/2006 | Wang et al. |
| 2006/0274510 A1 | 12/2006 | Nakada et al. |
| 2006/0276875 A1 | 12/2006 | Stinson et al. |
| 2006/0280998 A1 | 12/2006 | Ying et al. |
| 2007/0000129 A1 | 1/2007 | Hahn et al. |
| 2007/0002239 A1 | 1/2007 | Koike |
| 2007/0010702 A1 | 1/2007 | Wang et al. |
| 2007/0029927 A1 | 2/2007 | Kawamura et al. |
| 2007/0048531 A1 | 3/2007 | Nagaoka et al. |
| 2007/0054189 A1 | 3/2007 | Matsuno et al. |
| 2007/0061006 A1 | 3/2007 | Desatnik et al. |
| 2007/0065675 A1 | 3/2007 | Stamm |
| 2007/0068605 A1 | 3/2007 | Statnikov |
| 2007/0072113 A1 | 3/2007 | Taguchi |
| 2007/0093006 A1 | 4/2007 | Basol |
| 2007/0099088 A1 | 5/2007 | Kwon et al. |
| 2007/0104605 A1 | 5/2007 | Hampden-Smith et al. |
| 2007/0111893 A1 | 5/2007 | Kodenkandath et al. |
| 2007/0122549 A1 | 5/2007 | Hampden-Smith et al. |
| 2007/0122707 A1 | 5/2007 | Kwon et al. |
| 2007/0122710 A1 | 5/2007 | Kwon et al. |

(56) References Cited

U.S. PATENT DOCUMENTS

| | | |
|---|---|---|
| 2007/0128520 A1 | 6/2007 | Konishiike et al. |
| 2007/0128521 A1 | 6/2007 | Konishiike et al. |
| 2007/0134096 A1 | 6/2007 | Mons et al. |
| 2007/0140065 A1 | 6/2007 | Levingston |
| 2007/0141375 A1 | 6/2007 | Budinger et al. |
| 2007/0141469 A1 | 6/2007 | Tokunaga et al. |
| 2007/0142914 A1 | 6/2007 | Jones et al. |
| 2007/0151087 A1 | 7/2007 | Stern et al. |
| 2007/0152026 A1 | 7/2007 | Suh et al. |
| 2007/0158200 A1 | 7/2007 | Cohen et al. |
| 2007/0160315 A1 | 7/2007 | Johal et al. |
| 2007/0178384 A1 | 8/2007 | Kajita et al. |
| 2007/0183918 A1 | 8/2007 | Monsheimer et al. |
| 2007/0187464 A1 | 8/2007 | Routbort et al. |
| 2007/0189986 A1 | 8/2007 | Wang et al. |
| 2007/0203584 A1 | 8/2007 | Bandyopadhyay et al. |
| 2007/0214467 A1 | 9/2007 | Fukuda et al. |
| 2007/0227627 A1 | 10/2007 | Suh et al. |
| 2007/0251389 A1 | 11/2007 | Katsir et al. |
| 2007/0259220 A1 | 11/2007 | Redmond |
| 2007/0298325 A1 | 12/2007 | Kubota et al. |
| 2007/0298351 A1 | 12/2007 | Shimada et al. |
| 2008/0008894 A1 | 1/2008 | Abdo et al. |
| 2008/0015284 A1 | 1/2008 | Cakmak et al. |
| 2008/0015494 A1 | 1/2008 | Santini et al. |
| 2008/0026220 A9 | 1/2008 | Bi et al. |
| 2008/0032192 A1 | 2/2008 | Yokomizo et al. |
| 2008/0041921 A1 | 2/2008 | Creehan et al. |
| 2008/0047599 A1 | 2/2008 | Buller et al. |
| 2008/0052904 A1 | 3/2008 | Schneider et al. |
| 2008/0057203 A1 | 3/2008 | Robinson et al. |
| 2008/0057267 A1 | 3/2008 | Brocheton et al. |
| 2008/0057395 A1 | 3/2008 | Kubota et al. |
| 2008/0057616 A1 | 3/2008 | Robinson et al. |
| 2008/0075878 A1 | 3/2008 | Perrin et al. |
| 2008/0075984 A1 | 3/2008 | Badding et al. |
| 2008/0087629 A1 | 4/2008 | Shimomura et al. |
| 2008/0106261 A1 | 5/2008 | Romalis et al. |
| 2008/0110491 A1 | 5/2008 | Buller et al. |
| 2008/0139342 A1 | 6/2008 | Hebert et al. |
| 2008/0145707 A1 | 6/2008 | Yabunouchi et al. |
| 2008/0152998 A1 | 6/2008 | Murakami et al. |
| 2008/0156475 A1 | 7/2008 | Suh |
| 2008/0175982 A1 | 7/2008 | Robinson et al. |
| 2008/0188373 A1 | 8/2008 | Rupich et al. |
| 2008/0201008 A1 | 8/2008 | Twelves et al. |
| 2008/0210413 A1 | 9/2008 | Hislop et al. |
| 2008/0213718 A1 | 9/2008 | Abels et al. |
| 2008/0233434 A1 | 9/2008 | Kawamura et al. |
| 2008/0241660 A1 | 10/2008 | Ogawa et al. |
| 2008/0241705 A1 | 10/2008 | Wakita et al. |
| 2008/0268618 A1 | 10/2008 | Yamazaki |
| 2008/0280201 A1 | 11/2008 | Konishiike et al. |
| 2008/0280424 A1 | 11/2008 | Yamazaki et al. |
| 2008/0284719 A1 | 11/2008 | Yoshida |
| 2008/0284768 A1 | 11/2008 | Yoshida et al. |
| 2008/0290329 A1 | 11/2008 | Yoshida et al. |
| 2008/0290795 A1 | 11/2008 | Sado et al. |
| 2008/0299459 A1 | 12/2008 | Shiozaki et al. |
| 2008/0302418 A1 | 12/2008 | Buller et al. |
| 2008/0306182 A1 | 12/2008 | Brugger et al. |
| 2008/0308792 A1 | 12/2008 | Takahashi |
| 2008/0317951 A1 | 12/2008 | Green |
| 2009/0000480 A1 | 1/2009 | Dardas et al. |
| 2009/0004764 A1 | 1/2009 | Ohnuma et al. |
| 2009/0004878 A1 | 1/2009 | Ohnuma et al. |
| 2009/0011575 A1 | 1/2009 | Shimomura et al. |
| 2009/0014055 A1 | 1/2009 | Beck et al. |
| 2009/0043116 A1 | 2/2009 | Yoshida et al. |
| 2009/0046441 A1 | 2/2009 | Funaya et al. |
| 2009/0075083 A1 | 3/2009 | Bi et al. |
| 2009/0076189 A1 | 3/2009 | Matsushige et al. |
| 2009/0098674 A1 | 4/2009 | Yamazaki et al. |
| 2009/0110954 A1 | 4/2009 | Allen et al. |
| 2009/0114797 A1 | 5/2009 | Beals et al. |
| 2009/0117466 A1 | 5/2009 | Zhamu et al. |
| 2009/0117707 A1 | 5/2009 | Shimomura et al. |
| 2009/0123690 A1 | 5/2009 | Scholl et al. |
| 2009/0131203 A1 | 5/2009 | Hebert et al. |
| 2009/0136769 A1 | 5/2009 | Stamm |
| 2009/0155676 A1 | 6/2009 | Zhamu et al. |
| 2009/0160325 A1 | 6/2009 | Yatsunami et al. |
| 2009/0178741 A1 | 7/2009 | Xun et al. |
| 2009/0206065 A1 | 8/2009 | Kruth et al. |
| 2009/0214373 A1 | 8/2009 | Stinson et al. |
| 2009/0214857 A1 | 8/2009 | Itoh et al. |
| 2009/0235915 A1 | 9/2009 | Doumanidis et al. |
| 2009/0267491 A1 | 10/2009 | Takashima et al. |
| 2009/0269497 A1 | 10/2009 | Yousefiani et al. |
| 2009/0269605 A1 | 10/2009 | Warke et al. |
| 2009/0283501 A1 | 11/2009 | Erikson et al. |
| 2009/0284138 A1 | 11/2009 | Yasukawa et al. |
| 2009/0286008 A1 | 11/2009 | O'Neill et al. |
| 2009/0288952 A1 | 11/2009 | Olevsky et al. |
| 2009/0291312 A1 | 11/2009 | Perepezko et al. |
| 2009/0291345 A1 | 11/2009 | Hommura et al. |
| 2009/0297718 A1 | 12/2009 | Sarrafi-Nour et al. |
| 2009/0311598 A1 | 12/2009 | Tadano |
| 2009/0317658 A1 | 12/2009 | Narita |
| 2010/0010638 A1 | 1/2010 | Jones et al. |
| 2010/0013096 A1 | 1/2010 | Irumata et al. |
| 2010/0015330 A1 | 1/2010 | Koike |
| 2010/0021565 A1 | 1/2010 | Handrosch et al. |
| 2010/0029036 A1 | 2/2010 | Robinson et al. |
| 2010/0036075 A1 | 2/2010 | Ishino et al. |
| 2010/0048762 A1 | 2/2010 | Ishino et al. |
| 2010/0056026 A1 | 3/2010 | Shirota et al. |
| 2010/0062179 A1 | 3/2010 | Adachi et al. |
| 2010/0068464 A1 | 3/2010 | Meyer |
| 2010/0078830 A1 | 4/2010 | Katsurayama et al. |
| 2010/0089976 A1 | 4/2010 | Szymanski et al. |
| 2010/0089977 A1 | 4/2010 | Chen et al. |
| 2010/0102446 A1 | 4/2010 | Katsurayama et al. |
| 2010/0112192 A1 | 5/2010 | Li et al. |
| 2010/0119740 A1 | 5/2010 | Bettger et al. |
| 2010/0119846 A1 | 5/2010 | Sawada |
| 2010/0125356 A1 | 5/2010 | Shkolnik et al. |
| 2010/0126132 A1 | 5/2010 | Merkel |
| 2010/0130682 A1 | 5/2010 | Hinamoto et al. |
| 2010/0132765 A1 | 6/2010 | Cumpston et al. |
| 2010/0133688 A1 | 6/2010 | Shigihara et al. |
| 2010/0139840 A1 | 6/2010 | Allemand et al. |
| 2010/0143601 A1 | 6/2010 | Hawtof et al. |
| 2010/0178571 A1 | 7/2010 | Nanba et al. |
| 2010/0190038 A1 | 7/2010 | Osakabe et al. |
| 2010/0190054 A1 | 7/2010 | Odani et al. |
| 2010/0196750 A1 | 8/2010 | Kajita et al. |
| 2010/0203706 A1 | 8/2010 | Ohnuma et al. |
| 2010/0209328 A1 | 8/2010 | Bi et al. |
| 2010/0216034 A1 | 8/2010 | Odani et al. |
| 2010/0216907 A1 | 8/2010 | Matsushige et al. |
| 2010/0221567 A1 | 9/2010 | Budinger et al. |
| 2010/0224867 A1 | 9/2010 | Heuft et al. |
| 2010/0227071 A1 | 9/2010 | Heuft et al. |
| 2010/0227157 A1 | 9/2010 | Heuft et al. |
| 2010/0228025 A1 | 9/2010 | Cote et al. |
| 2010/0229940 A1 | 9/2010 | Basol |
| 2010/0236288 A1 | 9/2010 | Kodas et al. |
| 2010/0242843 A1 | 9/2010 | Peretti et al. |
| 2010/0255362 A1 | 10/2010 | Ogawa et al. |
| 2010/0261144 A1 | 10/2010 | Fujinami et al. |
| 2010/0262054 A1 | 10/2010 | Summit et al. |
| 2010/0262272 A1 | 10/2010 | Shkolnik et al. |
| 2010/0267856 A1 | 10/2010 | Shinoda et al. |
| 2010/0279000 A1 | 11/2010 | Sambasivan et al. |
| 2010/0285207 A1 | 11/2010 | Creehan et al. |
| 2010/0291286 A1 | 11/2010 | O'Neill et al. |
| 2010/0291401 A1 | 11/2010 | Medina et al. |
| 2010/0291758 A1 | 11/2010 | Robinson et al. |
| 2010/0300532 A1 | 12/2010 | Cumpston et al. |
| 2010/0305742 A1 | 12/2010 | Twelves, Jr. et al. |
| 2010/0310941 A1 | 12/2010 | Kumta et al. |
| 2010/0313416 A1 | 12/2010 | Meura |
| 2010/0314258 A1 | 12/2010 | Cohen et al. |

(56) References Cited

U.S. PATENT DOCUMENTS

| | | |
|---|---|---|
| 2010/0315796 A1 | 12/2010 | Sakuyama et al. |
| 2010/0326429 A1 | 12/2010 | Cumpston et al. |
| 2010/0330357 A1 | 12/2010 | Davies et al. |
| 2011/0003143 A1 | 1/2011 | Sugimoto et al. |
| 2011/0003200 A1 | 1/2011 | Shizuka et al. |
| 2011/0006670 A1 | 1/2011 | Katakura et al. |
| 2011/0008640 A1 | 1/2011 | Goto et al. |
| 2011/0014081 A1 | 1/2011 | Jones et al. |
| 2011/0015102 A1 | 1/2011 | Martin et al. |
| 2011/0016939 A1 | 1/2011 | Clew et al. |
| 2011/0027547 A1 | 2/2011 | Xun et al. |
| 2011/0029093 A1 | 2/2011 | Bojarski et al. |
| 2011/0032467 A1 | 2/2011 | Koike |
| 2011/0047799 A1 | 3/2011 | Abels et al. |
| 2011/0052921 A1 | 3/2011 | Gong et al. |
| 2011/0061591 A1 | 3/2011 | Stecker |
| 2011/0065973 A1 | 3/2011 | Fernie et al. |
| 2011/0087332 A1 | 4/2011 | Bojarski et al. |
| 2011/0089610 A1 | 4/2011 | El-Siblani et al. |
| 2011/0104571 A1 | 5/2011 | Zhamu et al. |
| 2011/0108760 A1 | 5/2011 | Mukainakano et al. |
| 2011/0111303 A1 | 5/2011 | Kung et al. |
| 2011/0114075 A1 | 5/2011 | Mills |
| 2011/0114182 A1 | 5/2011 | Robinson et al. |
| 2011/0114839 A1 | 5/2011 | Stecker et al. |
| 2011/0136162 A1 | 6/2011 | Sun et al. |
| 2011/0139251 A1 | 6/2011 | Robinson et al. |
| 2011/0143201 A1 | 6/2011 | Takada et al. |
| 2011/0165462 A1 | 7/2011 | Zhamu et al. |
| 2011/0166824 A1 | 7/2011 | Haisty et al. |
| 2011/0169924 A1 | 7/2011 | Haisty et al. |
| 2011/0195279 A1 | 8/2011 | Saeki et al. |
| 2011/0214799 A1 | 9/2011 | Szymanski et al. |
| 2011/0240108 A1 | 10/2011 | Law et al. |
| 2011/0240594 A1 | 10/2011 | Hamaguchi et al. |
| 2011/0245083 A1 | 10/2011 | Sathyamurthy et al. |
| 2011/0248251 A1 | 10/2011 | Yamamoto et al. |
| 2011/0253990 A1 | 10/2011 | Ishikawa et al. |
| 2011/0259862 A1 | 10/2011 | Scott et al. |
| 2011/0269621 A1 | 11/2011 | Emori et al. |
| 2011/0278051 A1 | 11/2011 | Himori et al. |
| 2011/0290549 A1 | 12/2011 | Hirai et al. |
| 2011/0291331 A1 | 12/2011 | Scott |
| 2011/0293840 A1 | 12/2011 | Newkirk et al. |
| 2011/0293976 A1 | 12/2011 | Chiba et al. |
| 2011/0295378 A1 | 12/2011 | Bojarski et al. |
| 2011/0297081 A1 | 12/2011 | Green |
| 2011/0297450 A1 | 12/2011 | Can et al. |
| 2011/0305578 A1 | 12/2011 | Smarsly et al. |
| 2012/0009339 A1 | 1/2012 | Creehan et al. |
| 2012/0012032 A1 | 1/2012 | Bi et al. |
| 2012/0024332 A1 | 2/2012 | Stefan et al. |
| 2012/0028176 A1 | 2/2012 | Cote et al. |
| 2012/0032329 A1 | 2/2012 | Shigihara et al. |
| 2012/0040282 A1 | 2/2012 | Heuft et al. |
| 2012/0040283 A1 | 2/2012 | Heuft et al. |
| 2012/0041446 A1 | 2/2012 | Wong et al. |
| 2012/0044652 A1 | 2/2012 | Horikawa et al. |
| 2012/0045688 A1 | 2/2012 | Liu et al. |
| 2012/0051116 A1 | 3/2012 | Inoue et al. |
| 2012/0052625 A1 | 3/2012 | Yamazaki |
| 2012/0056647 A1 | 3/2012 | Nagatsuka et al. |
| 2012/0061665 A1 | 3/2012 | Miyake et al. |
| 2012/0061677 A1 | 3/2012 | Miyake |
| 2012/0062813 A1 | 3/2012 | Koyama |
| 2012/0063203 A1 | 3/2012 | Matsuzaki et al. |
| 2012/0064650 A1 | 3/2012 | Yamazaki et al. |
| 2012/0065755 A1 | 3/2012 | Steingart et al. |
| 2012/0067728 A1 | 3/2012 | Harreld et al. |
| 2012/0085811 A1 | 4/2012 | Warke et al. |
| 2012/0100031 A1 | 4/2012 | Ljungblad |
| 2012/0113341 A1 | 5/2012 | Uochi |
| 2012/0114518 A1 | 5/2012 | Hara et al. |
| 2012/0115973 A1 | 5/2012 | Blackwell |
| 2012/0128284 A1 | 5/2012 | Mordente |
| 2012/0129056 A1 | 5/2012 | Majima et al. |
| 2012/0132627 A1 | 5/2012 | Wescott et al. |
| 2012/0132631 A1 | 5/2012 | Wescott et al. |
| 2012/0135153 A1 | 5/2012 | Osakabe et al. |
| 2012/0138586 A1 | 6/2012 | Webster et al. |
| 2012/0146014 A1 | 6/2012 | Kato |
| 2012/0156323 A1 | 6/2012 | Macleod |
| 2012/0164413 A1 | 6/2012 | Hara et al. |
| 2012/0171847 A1 | 7/2012 | Robinson et al. |
| 2012/0191205 A1 | 7/2012 | Bojarski et al. |
| 2012/0191420 A1 | 7/2012 | Bojarski et al. |
| 2012/0193063 A1 | 8/2012 | Yuan et al. |
| 2012/0193335 A1 | 8/2012 | Guldberg |
| 2012/0194756 A1 | 8/2012 | Hayakawa et al. |
| 2012/0195994 A1 | 8/2012 | El-Siblani et al. |
| 2012/0196952 A1 | 8/2012 | Suzuki |
| 2012/0201960 A1 | 8/2012 | Hartmann et al. |
| 2012/0205348 A1 | 8/2012 | Romanelli et al. |
| 2012/0207264 A1 | 8/2012 | Van Den Berghe et al. |
| 2012/0208002 A1 | 8/2012 | Todd et al. |
| 2012/0209394 A1 | 8/2012 | Bojarski et al. |
| 2012/0214900 A1 | 8/2012 | Klee et al. |
| 2012/0219698 A1 | 8/2012 | Steingart et al. |
| 2012/0231352 A1 | 9/2012 | Pol et al. |
| 2012/0232308 A1 | 9/2012 | Cote et al. |
| 2012/0232669 A1 | 9/2012 | Bojarski et al. |
| 2012/0232670 A1 | 9/2012 | Bojarski et al. |
| 2012/0232671 A1 | 9/2012 | Bojarski et al. |
| 2012/0237631 A1 | 9/2012 | Jenko |
| 2012/0238658 A1 | 9/2012 | Matsushige et al. |
| 2012/0241734 A1 | 9/2012 | Honda et al. |
| 2012/0243823 A1 | 9/2012 | Giboney |
| 2012/0244060 A9 | 9/2012 | Bi et al. |
| 2012/0255176 A1 | 10/2012 | Flesch et al. |
| 2012/0261654 A1 | 10/2012 | Yasukawa et al. |
| 2012/0264884 A1 | 10/2012 | Liu et al. |
| 2012/0270106 A1 | 10/2012 | Todorov et al. |
| 2012/0279441 A1 | 11/2012 | Creehan et al. |
| 2012/0296029 A1 | 11/2012 | Liu et al. |
| 2012/0298873 A1 | 11/2012 | Hernandez et al. |
| 2012/0298886 A1 | 11/2012 | Petersen et al. |
| 2012/0316716 A1 | 12/2012 | Odani et al. |
| 2012/0322197 A1 | 12/2012 | Robinson et al. |
| 2012/0326601 A1 | 12/2012 | Yasukawa et al. |
| 2012/0328945 A1 | 12/2012 | Hirose et al. |
| 2013/0001834 A1 | 1/2013 | El-Siblani et al. |
| 2013/0002764 A1 | 1/2013 | Heuft et al. |
| 2013/0004680 A1 | 1/2013 | Godfrey et al. |
| 2013/0008698 A1 | 1/2013 | Himori et al. |
| 2013/0008879 A1 | 1/2013 | Bichsel |
| 2013/0017141 A1 | 1/2013 | Cote et al. |
| 2013/0017390 A1 | 1/2013 | Cote et al. |
| 2013/0025409 A1 | 1/2013 | Xu |
| 2013/0026636 A1 | 1/2013 | Tani et al. |
| 2013/0028781 A1 | 1/2013 | Xu |
| 2013/0029886 A1 | 1/2013 | Mazyar et al. |
| 2013/0031753 A1 | 2/2013 | Massoels |
| 2013/0034759 A1 | 2/2013 | Funada et al. |
| 2013/0034932 A1 | 2/2013 | Robinson et al. |
| 2013/0036942 A1 | 2/2013 | Ramm |
| 2013/0043573 A1 | 2/2013 | Williams et al. |
| 2013/0045093 A1 | 2/2013 | Wunderlich et al. |
| 2013/0054061 A1 | 2/2013 | Nishimoto |
| 2013/0056912 A1 | 3/2013 | O'Neill et al. |
| 2013/0061636 A1 | 3/2013 | Imai et al. |
| 2013/0062107 A1 | 3/2013 | Higuchi et al. |
| 2013/0064706 A1 | 3/2013 | Schwarze et al. |
| 2013/0068513 A1 | 3/2013 | Hirai et al. |
| 2013/0071294 A1 | 3/2013 | Redmond |
| 2013/0075735 A1 | 3/2013 | Watanabe et al. |
| 2013/0079693 A1 | 3/2013 | Ranky et al. |
| 2013/0092924 A1 | 4/2013 | Sasagawa et al. |
| 2013/0092925 A1 | 4/2013 | Saito et al. |
| 2013/0092944 A1 | 4/2013 | Honda et al. |
| 2013/0101423 A1 | 4/2013 | Roy et al. |
| 2013/0101596 A1 | 4/2013 | DeMartino et al. |
| 2013/0101729 A1 | 4/2013 | Keremes et al. |
| 2013/0101761 A1 | 4/2013 | Bunker et al. |
| 2013/0105791 A1 | 5/2013 | Honda et al. |

(56) References Cited

U.S. PATENT DOCUMENTS

| | | |
|---|---|---|
| 2013/0108460 A1 | 5/2013 | Szwedowicz et al. |
| 2013/0109194 A1 | 5/2013 | Shirota et al. |
| 2013/0112672 A1 | 5/2013 | Keremes et al. |
| 2013/0119360 A1 | 5/2013 | Katakura et al. |
| 2013/0119373 A1 | 5/2013 | Yamazaki |
| 2013/0119374 A1 | 5/2013 | Kataishi et al. |
| 2013/0126868 A1 | 5/2013 | Yamazaki et al. |
| 2013/0134414 A1 | 5/2013 | Yamazaki et al. |
| 2013/0134637 A1 | 5/2013 | Wiesner et al. |
| 2013/0136868 A1 | 5/2013 | Bruck et al. |
| 2013/0137033 A1 | 5/2013 | Heuft et al. |
| 2013/0140554 A1 | 6/2013 | Yamazaki et al. |
| 2013/0140741 A1 | 6/2013 | El-Siblani et al. |
| 2013/0147092 A1 | 6/2013 | Jenko et al. |
| 2013/0149632 A1 | 6/2013 | Yoo et al. |
| 2013/0153889 A1 | 6/2013 | Yamazaki et al. |
| 2013/0155790 A1 | 6/2013 | Atsumi |
| 2013/0161606 A1 | 6/2013 | Isobe et al. |
| 2013/0161608 A1 | 6/2013 | Yamazaki |
| 2013/0161609 A1 | 6/2013 | Koyama |
| 2013/0161621 A1 | 6/2013 | Isobe et al. |
| 2013/0162306 A1 | 6/2013 | Inoue et al. |
| 2013/0166256 A1 | 6/2013 | Wirx-Speetjens et al. |
| 2013/0168257 A1 | 7/2013 | Mazyar et al. |
| 2013/0168902 A1 | 7/2013 | Herzog et al. |
| 2013/0172642 A1 | 7/2013 | Behrens et al. |
| 2013/0181214 A1 | 7/2013 | Yamazaki et al. |
| 2013/0184415 A1 | 7/2013 | Yoshikawa et al. |
| 2013/0186265 A1 | 7/2013 | Massoels |
| 2013/0186514 A1 | 7/2013 | Zhuang et al. |
| 2013/0187151 A1 | 7/2013 | Yamazaki |
| 2013/0192304 A1 | 8/2013 | Nakae et al. |
| 2013/0193433 A1 | 8/2013 | Yamazaki |
| 2013/0193493 A1 | 8/2013 | Yamazaki |
| 2013/0193620 A1 | 8/2013 | Mironets et al. |
| 2013/0196094 A1 | 8/2013 | Weeks et al. |
| 2013/0196095 A1 | 8/2013 | Weeks et al. |
| 2013/0196096 A1 | 8/2013 | Weeks et al. |
| 2013/0196097 A1 | 8/2013 | Weeks et al. |
| 2013/0196468 A1 | 8/2013 | Yamazaki |
| 2013/0197683 A1 | 8/2013 | Zhang et al. |
| 2013/0199013 A1 | 8/2013 | Graichen |
| 2013/0199241 A1 | 8/2013 | Sawada |
| 2013/0200365 A1 | 8/2013 | Yamazaki |
| 2013/0200375 A1 | 8/2013 | Yamazaki |
| 2013/0202823 A1 | 8/2013 | Weeks et al. |
| 2013/0203214 A1 | 8/2013 | Isobe et al. |
| 2013/0209698 A1 | 8/2013 | Schlesinger et al. |
| 2013/0209932 A1 | 8/2013 | Hasegawa et al. |
| 2013/0210618 A1 | 8/2013 | Mitlin et al. |
| 2013/0211531 A1 | 8/2013 | Steines et al. |
| 2013/0213848 A1 | 8/2013 | Weeks et al. |
| 2013/0216597 A1 | 8/2013 | Mathias et al. |
| 2013/0216742 A1 | 8/2013 | DeMartino et al. |
| 2013/0219890 A1 | 8/2013 | Majima et al. |
| 2013/0232366 A1 | 9/2013 | Nishijima |
| 2013/0233303 A1 | 9/2013 | Majima et al. |
| 2013/0233846 A1 | 9/2013 | Jakimov et al. |
| 2013/0236662 A1 | 9/2013 | Dua et al. |
| 2013/0241069 A1 | 9/2013 | Nakamura et al. |
| 2013/0248528 A1 | 9/2013 | Fushimi |
| 2013/0260217 A1 | 10/2013 | Matsui et al. |
| 2013/0263977 A1 | 10/2013 | Rickenbacher et al. |
| 2013/0266915 A1 | 10/2013 | Tsuruta et al. |
| 2013/0268085 A1 | 10/2013 | Dong et al. |
| 2013/0270750 A1 | 10/2013 | Green |
| 2013/0274373 A1 | 10/2013 | Yoshikawa et al. |
| 2013/0280091 A1 | 10/2013 | Propheter-Hinckley et al. |
| 2013/0289216 A1 | 10/2013 | Klee et al. |
| 2013/0291385 A1 | 11/2013 | Abels et al. |
| 2013/0295212 A1 | 11/2013 | Chen et al. |
| 2013/0300284 A1 | 11/2013 | Nishido |
| 2013/0305727 A1 | 11/2013 | Yousefiani et al. |
| 2013/0309946 A1 | 11/2013 | Hamaguchi |
| 2013/0313708 A1 | 11/2013 | Shigihara et al. |
| 2013/0338252 A1 | 12/2013 | Klee et al. |
| 2013/0343023 A1 | 12/2013 | Nakagoshi et al. |
| 2013/0344258 A1 | 12/2013 | Covey |
| 2013/0344765 A1 | 12/2013 | Ma |
| 2014/0001155 A1 | 1/2014 | Hamaguchi |
| 2014/0008327 A1 | 1/2014 | Prest et al. |
| 2014/0008686 A1 | 1/2014 | Hirakawa et al. |
| 2014/0013554 A1 | 1/2014 | Hojaji |
| 2014/0014629 A1 | 1/2014 | Stecker |
| 2014/0021171 A1 | 1/2014 | Jerby et al. |
| 2014/0025978 A1 | 1/2014 | Tokunaga |
| 2014/0034544 A1 | 2/2014 | Chang et al. |
| 2014/0034626 A1 | 2/2014 | Illston |
| 2014/0035205 A1 | 2/2014 | Hagiwara et al. |
| 2014/0035423 A1 | 2/2014 | Veronesi et al. |
| 2014/0035995 A1 | 2/2014 | Chou et al. |
| 2014/0037873 A1 | 2/2014 | Cheung et al. |
| 2014/0037969 A1 | 2/2014 | Margolies et al. |
| 2014/0039087 A1 | 2/2014 | Stelzig et al. |
| 2014/0039088 A1 | 2/2014 | Stelzig et al. |
| 2014/0039451 A1 | 2/2014 | Bangera et al. |
| 2014/0039452 A1 | 2/2014 | Bangera et al. |
| 2014/0039631 A1 | 2/2014 | Bojarski et al. |
| 2014/0039658 A1 | 2/2014 | Bangera et al. |
| 2014/0047996 A1 | 2/2014 | Kambe |
| 2014/0050921 A1 | 2/2014 | Lyons et al. |
| 2014/0051335 A1 | 2/2014 | Morinaga et al. |
| 2014/0052288 A1 | 2/2014 | El-Siblani et al. |
| 2014/0061165 A1 | 3/2014 | Stempfer |
| 2014/0061167 A1 | 3/2014 | Stecker et al. |
| 2014/0061977 A1 | 3/2014 | Silvanus et al. |
| 2014/0063432 A1 | 3/2014 | Yamazaki et al. |
| 2014/0065361 A1 | 3/2014 | Rosenzweig et al. |
| 2014/0065430 A1 | 3/2014 | Yamazaki et al. |
| 2014/0079741 A1 | 3/2014 | Bink et al. |
| 2014/0091299 A1 | 4/2014 | Tani et al. |
| 2014/0095107 A1 | 4/2014 | Haisty et al. |
| 2014/0099476 A1 | 4/2014 | Subramanian et al. |
| 2014/0103338 A1 | 4/2014 | Yamazaki et al. |
| 2014/0103340 A1 | 4/2014 | Yamazaki et al. |
| 2014/0103346 A1 | 4/2014 | Yamazaki |
| 2014/0104133 A1 | 4/2014 | Finn et al. |
| 2014/0106504 A1 | 4/2014 | Yamazaki et al. |
| 2014/0109440 A1 | 4/2014 | McDowell et al. |
| 2014/0110153 A1 | 4/2014 | Kashiwagi et al. |
| 2014/0110706 A1 | 4/2014 | Yamazaki |
| 2014/0113021 A1 | 4/2014 | Zoppas et al. |
| 2014/0120195 A1 | 5/2014 | Ploskonka |
| 2014/0120417 A1 | 5/2014 | Matsushita et al. |
| 2014/0127868 A1 | 5/2014 | Saito et al. |
| 2014/0130736 A1 | 5/2014 | Schultz et al. |
| 2014/0131700 A1 | 5/2014 | Yamazaki |
| 2014/0131702 A1 | 5/2014 | Matsubayashi et al. |
| 2014/0134325 A1 | 5/2014 | Schultz et al. |
| 2014/0136154 A1 | 5/2014 | Bojarski et al. |
| 2014/0140030 A1 | 5/2014 | Sakuyama et al. |
| 2014/0140882 A1 | 5/2014 | Syassen |
| 2014/0141303 A1 | 5/2014 | Matsushita et al. |
| 2014/0145522 A1 | 5/2014 | Gershenfeld et al. |
| 2014/0151320 A1 | 6/2014 | Chang et al. |
| 2014/0151321 A1 | 6/2014 | Chang et al. |
| 2014/0151370 A1 | 6/2014 | Chang et al. |
| 2014/0151371 A1 | 6/2014 | Chang et al. |
| 2014/0151691 A1 | 6/2014 | Matsubayashi et al. |
| 2014/0154088 A1 | 6/2014 | Etter et al. |
| 2014/0154646 A1 | 6/2014 | Blackwell et al. |
| 2014/0162043 A1 | 6/2014 | Schmid |
| 2014/0163445 A1 | 6/2014 | Pallari et al. |
| 2014/0163568 A1 | 6/2014 | Wong et al. |
| 2014/0172111 A1 | 6/2014 | Lang et al. |
| 2014/0174344 A1 | 6/2014 | Schultz et al. |
| 2014/0175435 A1 | 6/2014 | Yamazaki et al. |
| 2014/0177132 A1 | 6/2014 | McConnell et al. |
| 2014/0182170 A1 | 7/2014 | Wawrousek et al. |
| 2014/0184757 A1 | 7/2014 | Haisty et al. |
| 2014/0189989 A1 | 7/2014 | Flitsch |
| 2014/0190942 A1 | 7/2014 | Wescott et al. |
| 2014/0194996 A1 | 7/2014 | Bojarski et al. |
| 2014/0203277 A1 | 7/2014 | Shimomura |

(56) References Cited

U.S. PATENT DOCUMENTS

| | | |
|---|---|---|
| 2014/0204160 A1 | 7/2014 | Cote et al. |
| 2014/0209886 A1 | 7/2014 | Ishidai et al. |
| 2014/0209898 A1 | 7/2014 | Yamamoto et al. |
| 2014/0216123 A1 | 8/2014 | Clew et al. |
| 2014/0217647 A1 | 8/2014 | Pallari |
| 2014/0222184 A1 | 8/2014 | Verschueren et al. |
| 2014/0227548 A1 | 8/2014 | Myrick |
| 2014/0228474 A1 | 8/2014 | Qian et al. |
| 2014/0228860 A1 | 8/2014 | Steines et al. |
| 2014/0231126 A1 | 8/2014 | Hunrath et al. |
| 2014/0231266 A1 | 8/2014 | Sherrer et al. |
| 2014/0231799 A1 | 8/2014 | Matsubayashi |
| 2014/0231803 A1 | 8/2014 | Yamazaki |
| 2014/0246809 A1 | 9/2014 | Hofmann et al. |
| 2014/0249643 A1 | 9/2014 | Jones et al. |
| 2014/0252351 A1 | 9/2014 | Isobe et al. |
| 2014/0252687 A1 | 9/2014 | El-Dasher et al. |
| 2014/0255785 A1 | 9/2014 | Do et al. |
| 2014/0263209 A1 | 9/2014 | Burris et al. |
| 2014/0264323 A1 | 9/2014 | Sasagawa et al. |
| 2014/0265040 A1 | 9/2014 | Batchelder |
| 2014/0265046 A1 | 9/2014 | Burris et al. |
| 2014/0265047 A1 | 9/2014 | Burris et al. |
| 2014/0265048 A1 | 9/2014 | Burris et al. |
| 2014/0265049 A1 | 9/2014 | Burris et al. |
| 2014/0265812 A1 | 9/2014 | Ma |
| 2014/0271328 A1 | 9/2014 | Burris et al. |
| 2014/0271965 A1 | 9/2014 | Ferrar |
| 2014/0272154 A1 | 9/2014 | Wigglesworth et al. |
| 2014/0272398 A1 | 9/2014 | Hakii et al. |
| 2014/0286048 A1 | 9/2014 | Riello et al. |
| 2014/0291886 A1 | 10/2014 | Mark et al. |
| 2014/0294567 A1 | 10/2014 | Zotz |
| 2014/0295087 A1 | 10/2014 | Rickenbacher et al. |
| 2014/0306380 A1 | 10/2014 | El-Siblani et al. |
| 2014/0314581 A1 | 10/2014 | McBrien et al. |
| 2014/0319735 A1 | 10/2014 | El-Siblani et al. |
| 2014/0319736 A1 | 10/2014 | El-Siblani et al. |
| 2014/0319737 A1 | 10/2014 | El-Siblani et al. |
| 2014/0319738 A1 | 10/2014 | El-Siblani et al. |
| 2014/0322374 A1 | 10/2014 | El-Siblani et al. |
| 2014/0328964 A1 | 11/2014 | Mark et al. |
| 2014/0335653 A1 | 11/2014 | Koyama |
| 2014/0336680 A1 | 11/2014 | Medina et al. |
| 2014/0338552 A1 | 11/2014 | Mace et al. |
| 2014/0338894 A1 | 11/2014 | Mace et al. |
| 2014/0339122 A1 | 11/2014 | Weeks et al. |
| 2014/0339125 A1 | 11/2014 | Weeks et al. |
| 2014/0339126 A1 | 11/2014 | Weeks et al. |
| 2014/0339555 A1 | 11/2014 | Yamazaki |
| 2014/0341883 A1 | 11/2014 | Weeks et al. |
| 2014/0341888 A1 | 11/2014 | Weeks et al. |
| 2014/0341889 A1 | 11/2014 | Weeks et al. |
| 2014/0341890 A1 | 11/2014 | Weeks et al. |
| 2014/0341891 A1 | 11/2014 | Weeks et al. |
| 2014/0341945 A1 | 11/2014 | Weeks et al. |
| 2014/0342979 A1 | 11/2014 | Weeks et al. |
| 2014/0346216 A1 | 11/2014 | Rigal et al. |
| 2014/0349191 A1 | 11/2014 | Kung et al. |
| 2014/0353808 A1 | 12/2014 | Hosseini et al. |
| 2014/0361460 A1 | 12/2014 | Mark |
| 2014/0363585 A1 | 12/2014 | Pialot et al. |
| 2014/0366761 A1 | 12/2014 | Mace et al. |
| 2014/0368804 A1 | 12/2014 | Lafarre et al. |
| 2014/0370111 A1 | 12/2014 | Boyan et al. |
| 2014/0370323 A1 | 12/2014 | Ackelid |
| 2014/0370337 A1 | 12/2014 | Matsui et al. |
| 2014/0370654 A1 | 12/2014 | Yamazaki et al. |
| 2014/0373743 A1 | 12/2014 | Mace et al. |
| 2014/0374084 A1 | 12/2014 | Mace et al. |
| 2014/0374728 A1 | 12/2014 | Adamovich et al. |
| 2015/0001093 A1 | 1/2015 | Carter et al. |
| 2015/0001516 A1 | 1/2015 | Yoshida et al. |
| 2015/0017475 A1 | 1/2015 | Ward-Close |
| 2015/0021379 A1 | 1/2015 | Albrecht et al. |
| 2015/0021603 A1 | 1/2015 | Isobe et al. |
| 2015/0021815 A1 | 1/2015 | Albrecht et al. |
| 2015/0024169 A1 | 1/2015 | Martin |
| 2015/0024309 A1 | 1/2015 | Martin |
| 2015/0024319 A1 | 1/2015 | Martin |
| 2015/0027948 A1 | 1/2015 | Doyen et al. |
| 2015/0029485 A1 | 1/2015 | Lafarre et al. |
| 2015/0030494 A1 | 1/2015 | Ward-Close |
| 2015/0030932 A1 | 1/2015 | Yoshida et al. |
| 2015/0032215 A1 | 1/2015 | Slamin et al. |
| 2015/0034604 A1 | 2/2015 | Subramanian et al. |
| 2015/0037601 A1 | 2/2015 | Blackmore |
| 2015/0041025 A1 | 2/2015 | Wescott et al. |
| 2015/0041788 A1 | 2/2015 | Ishidai et al. |
| 2015/0044415 A1 | 2/2015 | Read et al. |
| 2015/0045924 A1 | 2/2015 | Cluckers et al. |
| 2015/0045928 A1 | 2/2015 | Perez et al. |
| 2015/0048209 A1 | 2/2015 | Hoyt et al. |
| 2015/0050463 A1 | 2/2015 | Nakano et al. |
| 2015/0054193 A1 | 2/2015 | Meyer |
| 2015/0054930 A1 | 2/2015 | Bangera et al. |
| 2015/0054944 A1 | 2/2015 | Bangera et al. |
| 2015/0054945 A1 | 2/2015 | Bangera et al. |
| 2015/0060422 A1 | 3/2015 | Liebl et al. |
| 2015/0064050 A1 | 3/2015 | Retze et al. |
| 2015/0064374 A1 | 3/2015 | Jain et al. |
| 2015/0064474 A1 | 3/2015 | Dejneka et al. |
| 2015/0064841 A1 | 3/2015 | Koyama |
| 2015/0069449 A1 | 3/2015 | Nishido |
| 2015/0069668 A1 | 3/2015 | Mironets et al. |
| 2015/0071913 A1 | 3/2015 | Weeks et al. |
| 2015/0076469 A1 | 3/2015 | Ikemizu et al. |
| 2015/0079298 A1 | 3/2015 | Ferreira et al. |
| 2015/0080495 A1 | 3/2015 | Heikkila |
| 2015/0089881 A1 | 4/2015 | Stevenson et al. |
| 2015/0090074 A1 | 4/2015 | Etter et al. |
| 2015/0093283 A1 | 4/2015 | Miller et al. |
| 2015/0093589 A1 | 4/2015 | Mazyar et al. |
| 2015/0093880 A1 | 4/2015 | Ji et al. |
| 2015/0094396 A1 | 4/2015 | Nakatsuka et al. |
| 2015/0100149 A1 | 4/2015 | Coeck et al. |
| 2015/0102531 A1 | 4/2015 | El-Siblani et al. |
| 2015/0103495 A1 | 4/2015 | Nakagoshi et al. |
| 2015/0104344 A1 | 4/2015 | Webster et al. |
| 2015/0104345 A1 | 4/2015 | Abels et al. |
| 2015/0108677 A1 | 4/2015 | Mark et al. |
| 2015/0108694 A1 | 4/2015 | Shimosoyama et al. |
| 2015/0113993 A1 | 4/2015 | Rudrapatna et al. |
| 2015/0116968 A1 | 4/2015 | Yamada et al. |
| 2015/0118570 A1 | 4/2015 | Nishimoto |
| 2015/0123091 A1 | 5/2015 | Hakii et al. |
| 2015/0125333 A1 | 5/2015 | Bruck et al. |
| 2015/0125335 A1 | 5/2015 | Bruck et al. |
| 2015/0126641 A1 | 5/2015 | Suzuki |
| 2015/0129544 A1 | 5/2015 | Davis |
| 2015/0129583 A1 | 5/2015 | Richter et al. |
| 2015/0130754 A1 | 5/2015 | Yairi et al. |
| 2015/0132173 A1 | 5/2015 | Bruck et al. |
| 2015/0132548 A1 | 5/2015 | Davis |
| 2015/0132563 A1 | 5/2015 | O'Malley et al. |
| 2015/0135897 A1 | 5/2015 | Sutcliffe et al. |
| 2015/0136908 A1 | 5/2015 | Hegenbart et al. |
| 2015/0137122 A1 | 5/2015 | Yamazaki |
| 2015/0139849 A1 | 5/2015 | Pialot, Jr. et al. |
| 2015/0140230 A1 | 5/2015 | Jones et al. |
| 2015/0140731 A1 | 5/2015 | Isobe et al. |
| 2015/0141234 A1 | 5/2015 | Sander et al. |
| 2015/0145174 A1 | 5/2015 | Comb |
| 2015/0145177 A1 | 5/2015 | El-Siblani et al. |
| 2015/0147540 A1 | 5/2015 | Davis |
| 2015/0147585 A1 | 5/2015 | Schwarze et al. |
| 2015/0155312 A1 | 6/2015 | Yamazaki |
| 2015/0155392 A1 | 6/2015 | Yamazaki |
| 2015/0155399 A1 | 6/2015 | Mu et al. |
| 2015/0155456 A1 | 6/2015 | Kuramoto et al. |
| 2015/0158111 A1 | 6/2015 | Schwarze et al. |
| 2015/0161299 A1 | 6/2015 | Summit et al. |
| 2015/0165525 A1 | 6/2015 | Jonasson |
| 2015/0165545 A1 | 6/2015 | Goehler et al. |

(56) References Cited

U.S. PATENT DOCUMENTS

| | | |
|---|---|---|
| 2015/0165556 A1 | 6/2015 | Jones et al. |
| 2015/0167130 A1 | 6/2015 | Steinwandel et al. |
| 2015/0174827 A1 | 6/2015 | Schwarze et al. |
| 2015/0179777 A1 | 6/2015 | Honda et al. |
| 2015/0179804 A1 | 6/2015 | Yamazaki et al. |
| 2015/0179998 A1 | 6/2015 | Kagami et al. |
| 2015/0182315 A1 | 7/2015 | Okada et al. |
| 2015/0183070 A1 | 7/2015 | Jones et al. |
| 2015/0184540 A1 | 7/2015 | Winkler et al. |
| 2015/0196971 A1 | 7/2015 | Schneider et al. |
| 2015/0197064 A1 | 7/2015 | Walker et al. |
| 2015/0197862 A1 | 7/2015 | Engel et al. |
| 2015/0198052 A1 | 7/2015 | Pavlov et al. |
| 2015/0202687 A1 | 7/2015 | Pialot et al. |
| 2015/0202716 A1 | 7/2015 | Bruck et al. |
| 2015/0202717 A1 | 7/2015 | Bruck et al. |
| 2015/0207080 A1 | 7/2015 | Yoshida et al. |
| 2015/0207146 A1 | 7/2015 | Tanaka et al. |
| 2015/0209162 A1 | 7/2015 | Verschueren et al. |
| 2015/0209889 A1 | 7/2015 | Peters et al. |
| 2015/0210013 A1 | 7/2015 | Teulet |
| 2015/0214342 A1 | 7/2015 | Yamazaki |
| 2015/0214555 A1 | 7/2015 | Visco et al. |
| 2015/0217367 A1 | 8/2015 | Dickey et al. |
| 2015/0219133 A1 | 8/2015 | Meyer et al. |
| 2015/0219444 A1 | 8/2015 | Bamberg et al. |
| 2015/0219521 A1 | 8/2015 | Clew et al. |
| 2015/0224607 A1 | 8/2015 | Bruck et al. |
| 2015/0224710 A1 | 8/2015 | El-Siblani |
| 2015/0227062 A1 | 8/2015 | Martin |
| 2015/0227070 A1 | 8/2015 | Martin |
| 2015/0228801 A1 | 8/2015 | Yamazaki |
| 2015/0231040 A1 | 8/2015 | Stelzig et al. |
| 2015/0231796 A1 | 8/2015 | Kottilingam et al. |
| 2015/0231825 A1 | 8/2015 | Swartz et al. |
| 2015/0231828 A1 | 8/2015 | El-Siblani et al. |
| 2015/0231831 A1 | 8/2015 | El-Siblani |
| 2015/0239046 A1 | 8/2015 | McMahan et al. |
| 2015/0243792 A1 | 8/2015 | Honda et al. |
| 2015/0246482 A1 | 9/2015 | El-Siblani et al. |
| 2015/0246486 A1 | 9/2015 | El-Siblani et al. |
| 2015/0247474 A1 | 9/2015 | Evers et al. |
| 2015/0251247 A1 | 9/2015 | Monsheimer et al. |
| 2015/0251250 A1 | 9/2015 | Schlick et al. |
| 2015/0251351 A1 | 9/2015 | Feygin |
| 2015/0251353 A1 | 9/2015 | Rodgers et al. |
| 2015/0252190 A1 | 9/2015 | Rodgers et al. |
| 2015/0258735 A1 | 9/2015 | O'Neill et al. |
| 2015/0259263 A1 | 9/2015 | Sherman et al. |
| 2015/0259530 A1 | 9/2015 | Rodgers et al. |
| 2015/0259790 A1 | 9/2015 | Newman et al. |
| 2015/0266237 A1 | 9/2015 | Comb et al. |
| 2015/0266285 A1 | 9/2015 | James et al. |
| 2015/0270088 A1 | 9/2015 | Satoh |
| 2015/0270531 A1 | 9/2015 | Matsui et al. |
| 2015/0273586 A1 | 10/2015 | Ross |
| 2015/0273622 A1 | 10/2015 | Manabe |
| 2015/0273631 A1 | 10/2015 | Kenney et al. |
| 2015/0275916 A1 | 10/2015 | Marshall et al. |
| 2015/0283613 A1 | 10/2015 | Backlund et al. |
| 2015/0283614 A1 | 10/2015 | Wu et al. |
| 2015/0283642 A1 | 10/2015 | Forsdike et al. |
| 2015/0283646 A1 | 10/2015 | Amaya et al. |
| 2015/0283649 A1 | 10/2015 | Amaya et al. |
| 2015/0285502 A1 | 10/2015 | DiCintio et al. |
| 2015/0285504 A1 | 10/2015 | Melton |
| 2015/0290707 A1 | 10/2015 | Xu |
| 2015/0290711 A1 | 10/2015 | Norfolk et al. |
| 2015/0290741 A1 | 10/2015 | Abe et al. |
| 2015/0290875 A1 | 10/2015 | Mark et al. |
| 2015/0298263 A1 | 10/2015 | Goncharov et al. |
| 2015/0299035 A1 | 10/2015 | Kuksenkov |
| 2015/0300179 A1 | 10/2015 | Kamel et al. |
| 2015/0306664 A1 | 10/2015 | klint et al. |
| 2015/0306665 A1 | 10/2015 | Sidhu et al. |
| 2015/0306667 A1 | 10/2015 | Yao |
| 2015/0306699 A1 | 10/2015 | Honda |
| 2015/0306700 A1 | 10/2015 | Honda |
| 2015/0311452 A1 | 10/2015 | Yoshida et al. |
| 2015/0314389 A1 | 11/2015 | Yamada |
| 2015/0314390 A1 | 11/2015 | Otsuka et al. |
| 2015/0315392 A1 | 11/2015 | Otani et al. |
| 2015/0320158 A1 | 11/2015 | Duffy, Jr. et al. |
| 2015/0321250 A1 | 11/2015 | Xu |
| 2015/0321289 A1 | 11/2015 | Bruck et al. |
| 2015/0322808 A1 | 11/2015 | Wulf |
| 2015/0328713 A1 | 11/2015 | Miyazaki et al. |
| 2015/0328719 A1 | 11/2015 | Jarvis et al. |
| 2015/0333160 A1 | 11/2015 | Yamazaki et al. |
| 2015/0336171 A1 | 11/2015 | Czyk et al. |
| 2015/0338709 A1 | 11/2015 | Yoshida |
| 2015/0340641 A1 | 11/2015 | Kuroki |
| 2015/0343564 A1 | 12/2015 | Bruck et al. |
| 2015/0343673 A1 | 12/2015 | Williams |
| 2015/0348863 A1 | 12/2015 | Du |
| 2015/0349154 A1 | 12/2015 | Harley et al. |
| 2015/0351493 A1 | 12/2015 | Ashcroft et al. |
| 2015/0352668 A1 | 12/2015 | Scott et al. |
| 2015/0352770 A1 | 12/2015 | Busenbecker |
| 2015/0357581 A1 | 12/2015 | Yoshida et al. |
| 2015/0360372 A1 | 12/2015 | Schtettecatte et al. |
| 2015/0360954 A1 | 12/2015 | Davis |
| 2015/0366756 A1 | 12/2015 | Weeks et al. |
| 2015/0367415 A1 | 12/2015 | Buller et al. |
| 2015/0367416 A1 | 12/2015 | Buller et al. |
| 2015/0367417 A1 | 12/2015 | Buller et al. |
| 2015/0367418 A1 | 12/2015 | Buller et al. |
| 2015/0367419 A1 | 12/2015 | Buller et al. |
| 2015/0367446 A1 | 12/2015 | Buller et al. |
| 2015/0367447 A1 | 12/2015 | Buller et al. |
| 2015/0367448 A1 | 12/2015 | Buller et al. |
| 2015/0367453 A1 | 12/2015 | Herzog |
| 2015/0367575 A1 | 12/2015 | Roels et al. |
| 2015/0367577 A1 | 12/2015 | Coeck |
| 2015/0371279 A1 | 12/2015 | Gerard et al. |
| 2015/0371854 A1 | 12/2015 | Davis |
| 2015/0372123 A1 | 12/2015 | Yamazaki et al. |
| 2015/0374582 A1 | 12/2015 | Weeks et al. |
| 2015/0374915 A1 | 12/2015 | Hyde et al. |
| 2015/0374929 A1 | 12/2015 | Hyde et al. |
| 2015/0374930 A1 | 12/2015 | Hyde et al. |
| 2015/0375336 A9 | 12/2015 | Webster et al. |
| 2015/0375340 A1 | 12/2015 | Cui et al. |
| 2015/0376248 A1 | 12/2015 | Kurland et al. |
| 2015/0380364 A1 | 12/2015 | Watanabe et al. |
| 2015/0380529 A1 | 12/2015 | Isobe et al. |
| 2016/0001364 A1 | 1/2016 | Mironets et al. |
| 2016/0001365 A1 | 1/2016 | Blanchet |
| 2016/0001401 A1 | 1/2016 | Dimter et al. |
| 2016/0001509 A1 | 1/2016 | Long |
| 2016/0003063 A1 | 1/2016 | Rosenzweig et al. |
| 2016/0005878 A1 | 1/2016 | Yamazaki |
| 2016/0008887 A1 | 1/2016 | Earle et al. |
| 2016/0008889 A1 | 1/2016 | Xu |
| 2016/0008922 A1 | 1/2016 | Schwarze |
| 2016/0009027 A1 | 1/2016 | Martin |
| 2016/0009028 A1 | 1/2016 | Tjellesen et al. |
| 2016/0009029 A1 | 1/2016 | Cohen et al. |
| 2016/0009030 A1 | 1/2016 | Mark et al. |
| 2016/0009039 A1 | 1/2016 | Blanchet |
| 2016/0010457 A1 | 1/2016 | Striedelmeyer et al. |
| 2016/0010469 A1 | 1/2016 | Guo |
| 2016/0013439 A1 | 1/2016 | Kinoshita |
| 2016/0014906 A1 | 1/2016 | Ilic et al. |
| 2016/0018371 A1 | 1/2016 | Acharya et al. |
| 2016/0022383 A1 | 1/2016 | Abels et al. |
| 2016/0023272 A1 | 1/2016 | Mongillo, Jr. et al. |
| 2016/0023307 A1 | 1/2016 | Suciu et al. |
| 2016/0023438 A1 | 1/2016 | Johnson et al. |
| 2016/0023948 A1 | 1/2016 | Hojaji |
| 2016/0024293 A1 | 1/2016 | Nestle et al. |
| 2016/0024676 A1 | 1/2016 | Willigan et al. |
| 2016/0030105 A1 | 2/2016 | Mayer et al. |
| 2016/0032416 A1 | 2/2016 | Propheter-Hinckley et al. |

(56) References Cited

U.S. PATENT DOCUMENTS

| | | |
|---|---|---|
| 2016/0033248 A1 | 2/2016 | Mace et al. |
| 2016/0038633 A1 | 2/2016 | Watanabe |
| 2016/0039054 A1 | 2/2016 | Ghasripoor et al. |
| 2016/0039851 A1 | 2/2016 | Muller et al. |
| 2016/0040312 A1 | 2/2016 | Chen et al. |
| 2016/0043384 A1 | 2/2016 | Zhamu et al. |
| 2016/0043392 A1 | 2/2016 | Fujiki et al. |
| 2016/0043429 A1 | 2/2016 | Hatta et al. |
| 2016/0045967 A1 | 2/2016 | Carter et al. |
| 2016/0045981 A1 | 2/2016 | Zurecki et al. |
| 2016/0047255 A1 | 2/2016 | Vargas et al. |
| 2016/0052056 A1 | 2/2016 | Fager |
| 2016/0052057 A1 | 2/2016 | Xu |
| 2016/0052079 A1 | 2/2016 | Ackelid |
| 2016/0052087 A1 | 2/2016 | O'Neill |
| 2016/0052176 A1 | 2/2016 | Zoppas et al. |
| 2016/0052208 A1 | 2/2016 | Debora et al. |
| 2016/0054115 A1 | 2/2016 | Snis |
| 2016/0054121 A1 | 2/2016 | Snis |
| 2016/0054347 A1 | 2/2016 | Snis |
| 2016/0056392 A1 | 2/2016 | Ono et al. |
| 2016/0056396 A1 | 2/2016 | Sugino et al. |
| 2016/0059154 A1 | 3/2016 | Fockele et al. |
| 2016/0059302 A1 | 3/2016 | McBrien et al. |
| 2016/0059315 A1 | 3/2016 | Baudimont |
| 2016/0059352 A1 | 3/2016 | Sparks |
| 2016/0059437 A1 | 3/2016 | Lacy et al. |
| 2016/0061044 A1 | 3/2016 | McBrien et al. |
| 2016/0061381 A1 | 3/2016 | Kotliar |
| 2016/0061806 A1 | 3/2016 | Reid et al. |
| 2016/0064422 A1 | 3/2016 | Yamazaki |
| 2016/0064669 A1 | 3/2016 | Kato |
| 2016/0066930 A1 | 3/2016 | Geeblen et al. |
| 2016/0067766 A1 | 3/2016 | Verreault et al. |
| 2016/0067778 A1 | 3/2016 | Liu |
| 2016/0067779 A1 | 3/2016 | Dautova et al. |
| 2016/0067780 A1 | 3/2016 | Zediker |
| 2016/0067781 A1 | 3/2016 | Kawada et al. |
| 2016/0067820 A1 | 3/2016 | Mironets et al. |
| 2016/0067928 A1 | 3/2016 | Mark et al. |
| 2016/0069622 A1 | 3/2016 | Alexiou et al. |
| 2016/0071625 A1 | 3/2016 | Kita et al. |
| 2016/0074558 A1 | 3/2016 | Murphy et al. |
| 2016/0074938 A1 | 3/2016 | Kitani et al. |
| 2016/0074965 A1 | 3/2016 | Jakimov et al. |
| 2016/0075089 A1 | 3/2016 | Duro Royo et al. |
| 2016/0075119 A1 | 3/2016 | Cook |
| 2016/0079548 A1 | 3/2016 | Kita et al. |
| 2016/0082547 A1 | 3/2016 | Szwedowicz et al. |
| 2016/0082550 A1 | 3/2016 | Jarvis et al. |
| 2016/0082657 A1 | 3/2016 | Swartz et al. |
| 2016/0082658 A1 | 3/2016 | Swartz et al. |
| 2016/0082695 A1 | 3/2016 | Swartz et al. |
| 2016/0083135 A1 | 3/2016 | Fushimi |
| 2016/0083516 A1 | 3/2016 | Elomaa et al. |
| 2016/0089719 A1 | 3/2016 | Lacy et al. |
| 2016/0089859 A1 | 3/2016 | Lacy et al. |
| 2016/0090848 A1 | 3/2016 | Engeli et al. |
| 2016/0093642 A1 | 3/2016 | Isobe et al. |
| 2016/0095795 A1 | 4/2016 | Weeks et al. |
| 2016/0095796 A1 | 4/2016 | Weeks et al. |
| 2016/0096326 A1 | 4/2016 | Naware |
| 2016/0098495 A1 | 4/2016 | Dong et al. |
| 2016/0099353 A1 | 4/2016 | Yamazaki |
| 2016/0101433 A1 | 4/2016 | Bruck et al. |
| 2016/0101643 A1 | 4/2016 | Cape et al. |
| 2016/0101988 A1 | 4/2016 | Law et al. |
| 2016/0104877 A1 | 4/2016 | Tadano |
| 2016/0107232 A1 | 4/2016 | Okazaki et al. |
| 2016/0107261 A1 | 4/2016 | Guldberg |
| 2016/0107262 A1 | 4/2016 | Schultz et al. |
| 2016/0107287 A1 | 4/2016 | Bajaj et al. |
| 2016/0107290 A1 | 4/2016 | Bajaj et al. |
| 2016/0107295 A1 | 4/2016 | Bajaj et al. |
| 2016/0114431 A1 | 4/2016 | Cheverton et al. |
| 2016/0114432 A1 | 4/2016 | Ferrar et al. |
| 2016/0114458 A1 | 4/2016 | Bajaj et al. |
| 2016/0115083 A1 | 4/2016 | Wu et al. |
| 2016/0120040 A1 | 4/2016 | Elmieh et al. |
| 2016/0121399 A1 | 5/2016 | Buller et al. |
| 2016/0121430 A1 | 5/2016 | Deiss et al. |
| 2016/0122541 A1 | 5/2016 | Jaker et al. |
| 2016/0126360 A1 | 5/2016 | Sasagawa et al. |
| 2016/0129503 A1 | 5/2016 | El-Dasher et al. |
| 2016/0129643 A1 | 5/2016 | Mark et al. |
| 2016/0131564 A1 | 5/2016 | Hossain et al. |
| 2016/0135537 A1 | 5/2016 | Wawrousek et al. |
| 2016/0136759 A1 | 5/2016 | Broda |
| 2016/0136787 A1 | 5/2016 | Bajaj et al. |
| 2016/0136885 A1 | 5/2016 | Nielsen-Cole et al. |
| 2016/0136887 A1 | 5/2016 | Guillemette et al. |
| 2016/0136889 A1 | 5/2016 | Rolland et al. |
| 2016/0136897 A1 | 5/2016 | Nielsen-Cole et al. |
| 2016/0137838 A1 | 5/2016 | Rolland et al. |
| 2016/0137839 A1 | 5/2016 | Rolland et al. |
| 2016/0141422 A1 | 5/2016 | Matsubayashi et al. |
| 2016/0143744 A1 | 5/2016 | Bojarski et al. |
| 2016/0144428 A1 | 5/2016 | Mironets et al. |
| 2016/0144430 A1 | 5/2016 | Haack et al. |
| 2016/0144566 A1 | 5/2016 | Mark et al. |
| 2016/0145722 A1 | 5/2016 | Chou et al. |
| 2016/0145990 A1 | 5/2016 | Mace et al. |
| 2016/0146153 A1 | 5/2016 | Hesselink et al. |
| 2016/0151854 A1 | 6/2016 | Zhai |
| 2016/0151856 A1 | 6/2016 | Cook |
| 2016/0151859 A1 | 6/2016 | Sparks |
| 2016/0151860 A1 | 6/2016 | Engeli et al. |
| 2016/0151861 A1 | 6/2016 | Soracco et al. |
| 2016/0153271 A1 | 6/2016 | Mace et al. |
| 2016/0153272 A1 | 6/2016 | Mace et al. |
| 2016/0158843 A1 | 6/2016 | Yolton et al. |
| 2016/0158889 A1 | 6/2016 | Carter et al. |
| 2016/0159955 A1 | 6/2016 | Haschick et al. |
| 2016/0160077 A1 | 6/2016 | Rolland et al. |
| 2016/0163744 A1 | 6/2016 | Yamazaki et al. |
| 2016/0163948 A1 | 6/2016 | Wang |
| 2016/0164046 A1 | 6/2016 | Uezawa et al. |
| 2016/0166284 A1 | 6/2016 | Hacking et al. |
| 2016/0167160 A1 | 6/2016 | Hellestam |
| 2016/0167299 A1 | 6/2016 | Jallouli et al. |
| 2016/0167303 A1 | 6/2016 | Petelet |
| 2016/0167312 A1 | 6/2016 | Feinberg et al. |
| 2016/0168453 A1 | 6/2016 | Florio et al. |
| 2016/0168715 A1 | 6/2016 | Ma et al. |
| 2016/0172655 A1 | 6/2016 | Rigobert et al. |
| 2016/0175787 A1 | 6/2016 | Merrigan et al. |
| 2016/0175929 A1 | 6/2016 | Colin et al. |
| 2016/0175932 A1 | 6/2016 | Dimter et al. |
| 2016/0175934 A1 | 6/2016 | Lacy et al. |
| 2016/0175935 A1 | 6/2016 | Ladewig et al. |
| 2016/0181217 A1 | 6/2016 | Prack |
| 2016/0181601 A1 | 6/2016 | Usui et al. |
| 2016/0184891 A1 | 6/2016 | Mironets |
| 2016/0184925 A1 | 6/2016 | Huang et al. |
| 2016/0184931 A1 | 6/2016 | Green |
| 2016/0186579 A1 | 6/2016 | Suciu et al. |
| 2016/0186620 A1 | 6/2016 | Knudsen |
| 2016/0187166 A1 | 6/2016 | Ranky et al. |
| 2016/0190329 A1 | 6/2016 | Matsumoto et al. |
| 2016/0190640 A1 | 6/2016 | Visco et al. |
| 2016/0193695 A1 | 7/2016 | Haynes |
| 2016/0193696 A1 | 7/2016 | McFarland et al. |
| 2016/0193697 A1 | 7/2016 | Shearn |
| 2016/0193790 A1 | 7/2016 | Shuck et al. |
| 2016/0199933 A1 | 7/2016 | Silvanus et al. |
| 2016/0200045 A1 | 7/2016 | Hopkins et al. |
| 2016/0200046 A1 | 7/2016 | Zeman et al. |
| 2016/0200047 A1 | 7/2016 | Mark et al. |
| 2016/0201155 A1 | 7/2016 | Niendorf et al. |
| 2016/0202042 A1 | 7/2016 | Snis |
| 2016/0202043 A1 | 7/2016 | Snis |
| 2016/0202101 A1 | 7/2016 | Sparks |
| 2016/0204271 A1 | 7/2016 | Yamazaki et al. |
| 2016/0207106 A1 | 7/2016 | Mazyar et al. |

(56) References Cited

U.S. PATENT DOCUMENTS

| | | |
|---|---|---|
| 2016/0207109 A1 | 7/2016 | Buller et al. |
| 2016/0207112 A1 | 7/2016 | Pallari |
| 2016/0211116 A1 | 7/2016 | Lock |
| 2016/0211119 A1 | 7/2016 | Lock |
| 2016/0214173 A1 | 7/2016 | Fisser |
| 2016/0214211 A1 | 7/2016 | Gregg et al. |
| 2016/0218106 A1 | 7/2016 | Matsubayashi |
| 2016/0221114 A1 | 8/2016 | Dietrich |
| 2016/0221115 A1 | 8/2016 | Loeffel et al. |
| 2016/0221122 A1 | 8/2016 | D'Orlando et al. |
| 2016/0221262 A1 | 8/2016 | Das et al. |
| 2016/0221733 A1 | 8/2016 | Prouvost et al. |
| 2016/0222807 A1 | 8/2016 | Liebl et al. |
| 2016/0223041 A1 | 8/2016 | Saga et al. |
| 2016/0228255 A1 | 8/2016 | Samuelson et al. |
| 2016/0228929 A1 | 8/2016 | Williamson et al. |
| 2016/0228975 A1 | 8/2016 | Blackmore |
| 2016/0228987 A1 | 8/2016 | Baudimont et al. |
| 2016/0228990 A1 | 8/2016 | Bruck et al. |
| 2016/0228991 A1 | 8/2016 | Ryan et al. |
| 2016/0228992 A1 | 8/2016 | Bandyopadhyay et al. |
| 2016/0229005 A1 | 8/2016 | Ryan et al. |
| 2016/0233474 A1 | 8/2016 | Kagami et al. |
| 2016/0233487 A1 | 8/2016 | Jun et al. |
| 2016/0235929 A1 | 8/2016 | Bangera et al. |
| 2016/0236299 A1 | 8/2016 | Oberhofer |
| 2016/0237827 A1 | 8/2016 | Campbell et al. |
| 2016/0240690 A1 | 8/2016 | Yamazaki et al. |
| 2016/0242853 A1 | 8/2016 | Bangera et al. |
| 2016/0242931 A1 | 8/2016 | Wong et al. |
| 2016/0243620 A1 | 8/2016 | Butcher |
| 2016/0243644 A1 | 8/2016 | Moneta et al. |
| 2016/0243649 A1 | 8/2016 | Zheng et al. |
| 2016/0243652 A1 | 8/2016 | El-Dasher et al. |
| 2016/0244212 A1 | 8/2016 | Destal et al. |
| 2016/0244625 A1 | 8/2016 | Clapp et al. |
| 2016/0244980 A1 | 8/2016 | Urban et al. |
| 2016/0247665 A1 | 8/2016 | Belmonte et al. |
| 2016/0248115 A1 | 8/2016 | Hatta et al. |
| 2016/0250688 A1 | 9/2016 | Coppola |
| 2016/0250711 A1 | 9/2016 | Moagar-Poladian |
| 2016/0250715 A1 | 9/2016 | Burbaum et al. |
| 2016/0250717 A1 | 9/2016 | Kruger et al. |
| 2016/0250724 A1 | 9/2016 | Krol et al. |
| 2016/0254097 A1 | 9/2016 | McConnell et al. |
| 2016/0254511 A1 | 9/2016 | Hatta et al. |
| 2016/0254687 A1 | 9/2016 | Tanaka et al. |
| 2016/0256925 A1 | 9/2016 | Heikkila |
| 2016/0258383 A1 | 9/2016 | Kobayashi et al. |
| 2016/0260261 A1 | 9/2016 | Hsu |
| 2016/0260948 A1 | 9/2016 | Nishimoto |
| 2016/0263704 A1 | 9/2016 | Schwarze et al. |
| 2016/0264479 A1 | 9/2016 | Tomita et al. |
| 2016/0265362 A1 | 9/2016 | Slavens et al. |
| 2016/0265366 A1 | 9/2016 | Snyder et al. |
| 2016/0271732 A1 | 9/2016 | Dutta |
| 2016/0271870 A1 | 9/2016 | Brown, Jr. |
| 2016/0271875 A1 | 9/2016 | Brown, Jr. |
| 2016/0271877 A1 | 9/2016 | Suzuki et al. |
| 2016/0271878 A1 | 9/2016 | Nuechterlein et al. |
| 2016/0271879 A1 | 9/2016 | Yamashita et al. |
| 2016/0271884 A1 | 9/2016 | Herzog |
| 2016/0273074 A1 | 9/2016 | Smarsly et al. |
| 2016/0273079 A1 | 9/2016 | Das et al. |
| 2016/0273368 A1 | 9/2016 | Smarsly et al. |
| 2016/0273369 A1 | 9/2016 | McBrien et al. |
| 2016/0273687 A1 | 9/2016 | Rubinski et al. |
| 2016/0276056 A1 | 9/2016 | Stolyarov et al. |
| 2016/0279703 A1 | 9/2016 | Clare et al. |
| 2016/0279706 A1 | 9/2016 | Domrose et al. |
| 2016/0279707 A1 | 9/2016 | Mattes et al. |
| 2016/0279708 A1 | 9/2016 | Hann et al. |
| 2016/0279734 A1 | 9/2016 | Schick et al. |
| 2016/0279735 A1 | 9/2016 | Hellestam |
| 2016/0282848 A1 | 9/2016 | Hellestam |
| 2016/0288200 A1 | 10/2016 | Xu et al. |
| 2016/0288209 A1 | 10/2016 | Jakimov et al. |
| 2016/0288244 A1 | 10/2016 | Stecker |
| 2016/0288254 A1 | 10/2016 | Pettit et al. |
| 2016/0288264 A1 | 10/2016 | Jones et al. |
| 2016/0288265 A1 | 10/2016 | Suzuki et al. |
| 2016/0288266 A1 | 10/2016 | Rockstroh et al. |
| 2016/0288414 A1 | 10/2016 | Ozbolat et al. |
| 2016/0289483 A1 | 10/2016 | Yamamoto et al. |
| 2016/0297006 A1 | 10/2016 | Buller et al. |
| 2016/0297007 A1 | 10/2016 | Buller et al. |
| 2016/0297104 A1 | 10/2016 | Guillemette et al. |
| 2016/0297141 A1 | 10/2016 | El-Siblani et al. |
| 2016/0297148 A1 | 10/2016 | Ladewig |
| 2016/0298218 A1 | 10/2016 | Kilmer et al. |
| 2016/0298220 A1 | 10/2016 | Bruck et al. |
| 2016/0298268 A1 | 10/2016 | Gallucci et al. |
| 2016/0301071 A1 | 10/2016 | Shizuka et al. |
| 2016/0303656 A1 | 10/2016 | Lacy et al. |
| 2016/0303687 A1 | 10/2016 | Ljungblad |
| 2016/0303762 A1 | 10/2016 | Gunther |
| 2016/0303798 A1 | 10/2016 | Mironets et al. |
| 2016/0305256 A1 | 10/2016 | Knittel et al. |
| 2016/0305271 A1 | 10/2016 | Schmidt et al. |
| 2016/0307678 A1 | 10/2016 | Unosson et al. |
| 2016/0307731 A1 | 10/2016 | Lock |
| 2016/0310077 A1 | 10/2016 | Hunter et al. |
| 2016/0310236 A1 | 10/2016 | Kopelman et al. |
| 2016/0310279 A1 | 10/2016 | Samuelson et al. |
| 2016/0310282 A1 | 10/2016 | Bojarski et al. |
| 2016/0311020 A1 | 10/2016 | Abeshaus et al. |
| 2016/0311022 A1 | 10/2016 | Krebs et al. |
| 2016/0311160 A1 | 10/2016 | Nam et al. |
| 2016/0311162 A1 | 10/2016 | Liu et al. |
| 2016/0311165 A1 | 10/2016 | Mark et al. |
| 2016/0311230 A1 | 10/2016 | Conrads et al. |
| 2016/0312338 A1 | 10/2016 | Miller |
| 2016/0312653 A1 | 10/2016 | DiDomizio et al. |
| 2016/0313306 A1 | 10/2016 | Ingber et al. |
| 2016/0317312 A1 | 11/2016 | Bojarski et al. |
| 2016/0318072 A1 | 11/2016 | Martin et al. |
| 2016/0318128 A1 | 11/2016 | Dutton |
| 2016/0318129 A1 | 11/2016 | Hu |
| 2016/0318130 A1 | 11/2016 | Stempfer et al. |
| 2016/0318253 A1 | 11/2016 | Barnhart |
| 2016/0319677 A1 | 11/2016 | McBrien et al. |
| 2016/0319678 A1 | 11/2016 | Staroselsky et al. |
| 2016/0321384 A1 | 11/2016 | Pal et al. |
| 2016/0324581 A1 | 11/2016 | Bojarski et al. |
| 2016/0325355 A1 | 11/2016 | Nardi et al. |
| 2016/0325358 A1 | 11/2016 | Nardi et al. |
| 2016/0325378 A1 | 11/2016 | Ohno et al. |
| 2016/0325383 A1 | 11/2016 | Xu et al. |
| 2016/0325492 A1 | 11/2016 | Hartmann et al. |
| 2016/0325498 A1 | 11/2016 | Gelbart |
| 2016/0325541 A1 | 11/2016 | Lavrentyev et al. |
| 2016/0326613 A1 | 11/2016 | Cui et al. |
| 2016/0326880 A1 | 11/2016 | Slavens et al. |
| 2016/0326892 A1 | 11/2016 | Grant et al. |
| 2016/0332229 A1 | 11/2016 | Snyder et al. |
| 2016/0332250 A1 | 11/2016 | Xu et al. |
| 2016/0332253 A1 | 11/2016 | Nardi et al. |
| 2016/0332259 A1 | 11/2016 | Jones et al. |
| 2016/0332266 A1 | 11/2016 | Xu |
| 2016/0332366 A1 | 11/2016 | Donovan |
| 2016/0332371 A1 | 11/2016 | Staroselsky et al. |
| 2016/0332379 A1 | 11/2016 | Paternoster et al. |
| 2016/0332380 A1 | 11/2016 | De Pena et al. |
| 2016/0332384 A1 | 11/2016 | De Pena et al. |
| 2016/0336538 A1 | 11/2016 | Yamazaki et al. |
| 2016/0339516 A1 | 11/2016 | Xu |
| 2016/0339518 A1 | 11/2016 | Nardi et al. |
| 2016/0339520 A1 | 11/2016 | Zhang et al. |
| 2016/0339521 A1 | 11/2016 | Dardas et al. |
| 2016/0339536 A1 | 11/2016 | Goto |
| 2016/0339542 A1 | 11/2016 | Paetz |
| 2016/0339639 A1 | 11/2016 | Chivel |
| 2016/0339642 A1 | 11/2016 | Donovan |
| 2016/0339646 A1 | 11/2016 | Baecker et al. |

(56) References Cited

U.S. PATENT DOCUMENTS

| | | |
|---|---|---|
| 2016/0340256 A1 | 11/2016 | Oribe et al. |
| 2016/0340768 A1 | 11/2016 | Margolies et al. |
| 2016/0346998 A1 | 12/2016 | Mark et al. |
| 2016/0348203 A1 | 12/2016 | Monroe et al. |
| 2016/0348517 A1 | 12/2016 | Kenyon et al. |
| 2016/0349029 A1 | 12/2016 | Mace et al. |
| 2016/0351321 A1 | 12/2016 | Lyoo et al. |
| 2016/0354064 A1 | 12/2016 | Bangera et al. |
| 2016/0354839 A1 | 12/2016 | Schick et al. |
| 2016/0354842 A1 | 12/2016 | Schick et al. |
| 2016/0354843 A1 | 12/2016 | Lacy et al. |
| 2016/0355433 A1 | 12/2016 | Jedamzik et al. |
| 2016/0355904 A1 | 12/2016 | Achuthan et al. |
| 2016/0358575 A1 | 12/2016 | Kobayashi et al. |
| 2016/0358795 A1 | 12/2016 | Flitsch |
| 2016/0359050 A1 | 12/2016 | Sasagawa et al. |
| 2016/0361765 A1 | 12/2016 | Danger et al. |
| 2016/0361872 A1 | 12/2016 | El-Siblani |
| 2016/0361873 A1 | 12/2016 | Maier |
| 2016/0367264 A1 | 12/2016 | Geebelen |
| 2016/0368050 A1 | 12/2016 | Morris et al. |
| 2016/0368055 A1 | 12/2016 | Swaminathan et al. |
| 2016/0368056 A1 | 12/2016 | Swaminathan et al. |
| 2016/0368057 A1 | 12/2016 | Hopkins et al. |
| 2016/0368213 A1 | 12/2016 | Mark |
| 2016/0369040 A1 | 12/2016 | Das et al. |
| 2016/0369096 A1 | 12/2016 | Rolland et al. |
| 2016/0370898 A1 | 12/2016 | Kobayashi |
| 2016/0375676 A1 | 12/2016 | Ritchie et al. |
| 2016/0376453 A1 | 12/2016 | Hearon |
| 2016/0376674 A1 | 12/2016 | Soloway |
| 2016/0377994 A1 | 12/2016 | Lafarre et al. |
| 2016/0378004 A1 | 12/2016 | Martin |
| 2016/0380634 A1 | 12/2016 | Ghanea-Hercock |
| 2016/0381794 A1 | 12/2016 | Ahn et al. |
| 2017/0001253 A1 | 1/2017 | Stempfer |
| 2017/0001258 A1 | 1/2017 | Hildebrand et al. |
| 2017/0001263 A1 | 1/2017 | Steiner |
| 2017/0001374 A1 | 1/2017 | Graham et al. |
| 2017/0001377 A1 | 1/2017 | Meisner et al. |
| 2017/0001379 A1 | 1/2017 | Long |
| 2017/0001919 A1 | 1/2017 | Kobayashi |
| 2017/0002978 A1 | 1/2017 | Ballinger et al. |
| 2017/0005048 A1 | 1/2017 | Shigihara et al. |
| 2017/0005361 A1 | 1/2017 | Kamezaki et al. |
| 2017/0007359 A1 | 1/2017 | Kopelman et al. |
| 2017/0007360 A1 | 1/2017 | Kopelman et al. |
| 2017/0007362 A1 | 1/2017 | Chen et al. |
| 2017/0007363 A1 | 1/2017 | Boronkay |
| 2017/0007366 A1 | 1/2017 | Kopelman et al. |
| 2017/0007367 A1 | 1/2017 | Li et al. |
| 2017/0007386 A1 | 1/2017 | Mason et al. |
| 2017/0008080 A1 | 1/2017 | Xu |
| 2017/0008084 A1 | 1/2017 | Witney et al. |
| 2017/0008085 A1 | 1/2017 | Nguyen et al. |
| 2017/0008086 A1 | 1/2017 | Jones |
| 2017/0008123 A1 | 1/2017 | Mezawa et al. |
| 2017/0008126 A1 | 1/2017 | Long et al. |
| 2017/0008236 A1 | 1/2017 | Easter et al. |
| 2017/0008333 A1 | 1/2017 | Mason et al. |
| 2017/0009584 A1 | 1/2017 | Cui et al. |
| 2017/0014169 A1 | 1/2017 | Dean et al. |
| 2017/0014235 A1 | 1/2017 | Jones et al. |
| 2017/0014312 A1 | 1/2017 | Suzuki |
| 2017/0014903 A1 | 1/2017 | Sugiura |
| 2017/0014909 A1 | 1/2017 | Tanaka et al. |
| 2017/0014937 A1 | 1/2017 | Wilhelmy et al. |
| 2017/0014950 A1 | 1/2017 | Okada |
| 2017/0015452 A1 | 1/2017 | Heuser et al. |
| 2017/0016093 A1 | 1/2017 | Karlen et al. |
| 2017/0016094 A1 | 1/2017 | Karlen et al. |
| 2017/0016703 A1 | 1/2017 | Mace et al. |
| 2017/0016781 A1 | 1/2017 | Dave et al. |
| 2017/0021383 A1 | 1/2017 | Takai et al. |
| 2017/0021420 A1 | 1/2017 | Buller et al. |
| 2017/0021452 A1 | 1/2017 | Tanaka et al. |
| 2017/0021453 A1 | 1/2017 | Engeli et al. |
| 2017/0021454 A1 | 1/2017 | Dallarosa et al. |
| 2017/0021455 A1 | 1/2017 | Dallarosa et al. |
| 2017/0021456 A1 | 1/2017 | Varetti |
| 2017/0021562 A1 | 1/2017 | El-Siblani et al. |
| 2017/0021565 A1 | 1/2017 | Deaville |
| 2017/0021572 A1 | 1/2017 | Wiesner et al. |
| 2017/0022608 A1 | 1/2017 | King et al. |
| 2017/0023168 A1 | 1/2017 | Kobayashi et al. |
| 2017/0025440 A1 | 1/2017 | Koyama |
| 2017/0027624 A1 | 2/2017 | Wilson et al. |
| 2017/0028472 A1 | 2/2017 | Shaw et al. |
| 2017/0028475 A1 | 2/2017 | Heikkila |
| 2017/0028589 A1 | 2/2017 | Capobianco et al. |
| 2017/0028622 A1 | 2/2017 | Westlind et al. |
| 2017/0028631 A1 | 2/2017 | Hyatt et al. |
| 2017/0028682 A9 | 2/2017 | Johnson et al. |
| 2017/0028703 A1 | 2/2017 | Xu |
| 2017/0029300 A1 | 2/2017 | Yeung et al. |
| 2017/0030204 A1 | 2/2017 | Gorokhovsky |
| 2017/0030399 A1 | 2/2017 | Sanders et al. |
| 2017/0031057 A1 | 2/2017 | Nordahl |
| 2017/0033068 A1 | 2/2017 | Prack |
| 2017/0033129 A1 | 2/2017 | Hayakawa et al. |
| 2017/0036238 A1 | 2/2017 | Zhuang et al. |
| 2017/0036272 A1 | 2/2017 | Lafarre et al. |
| 2017/0036300 A1 | 2/2017 | Takashima et al. |
| 2017/0036303 A1 | 2/2017 | Oribe et al. |
| 2017/0036783 A1 | 2/2017 | Snyder |
| 2017/0036951 A1 | 2/2017 | Chang et al. |
| 2017/0037674 A1 | 2/2017 | Hooper et al. |
| 2017/0037867 A1 | 2/2017 | Moricca |
| 2017/0038047 A1 | 2/2017 | Golle et al. |
| 2017/0043395 A1 | 2/2017 | She et al. |
| 2017/0043402 A1 | 2/2017 | Di Serio et al. |
| 2017/0044416 A1 | 2/2017 | Sharon et al. |
| 2017/0047583 A1 | 2/2017 | Kamezaki et al. |
| 2017/0050198 A1 | 2/2017 | Ohno et al. |
| 2017/0050241 A1 | 2/2017 | Thomas et al. |
| 2017/0050242 A1 | 2/2017 | Melton |
| 2017/0050254 A1 | 2/2017 | Holverson et al. |
| 2017/0050261 A1 | 2/2017 | Li et al. |
| 2017/0050268 A1 | 2/2017 | Fujiya et al. |
| 2017/0050270 A1 | 2/2017 | Miyano et al. |
| 2017/0050271 A1 | 2/2017 | Wendt et al. |
| 2017/0050349 A1 | 2/2017 | Hara et al. |
| 2017/0051386 A1 | 2/2017 | Carter et al. |
| 2017/0051613 A1 | 2/2017 | Saha et al. |
| 2017/0051675 A1 | 2/2017 | Mcmasters et al. |
| 2017/0053584 A1 | 2/2017 | Takahashi |
| 2017/0056179 A1 | 3/2017 | Lorio |
| 2017/0057013 A1 | 3/2017 | Gillespie et al. |
| 2017/0059529 A1 | 3/2017 | Kamel et al. |
| 2017/0066051 A1 | 3/2017 | Ackelid et al. |
| 2017/0066052 A1 | 3/2017 | Abe et al. |
| 2017/0066187 A1 | 3/2017 | Mark et al. |
| 2017/0066928 A1 | 3/2017 | Camps et al. |
| 2017/0067154 A1 | 3/2017 | Grotjohn |
| 2017/0067344 A1 | 3/2017 | Willett, Jr. et al. |
| 2017/0067788 A1 | 3/2017 | Dautova et al. |
| 2017/0068774 A1 | 3/2017 | Cluckers et al. |
| 2017/0069817 A1 | 3/2017 | Cauchon et al. |
| 2017/0072104 A1 | 3/2017 | Sugawara |
| 2017/0072465 A1 | 3/2017 | Welch et al. |
| 2017/0072466 A1 | 3/2017 | Zehavi et al. |
| 2017/0072468 A1 | 3/2017 | Schilling et al. |
| 2017/0072635 A1 | 3/2017 | El-Siblani et al. |
| 2017/0074285 A1 | 3/2017 | Marshall et al. |
| 2017/0080641 A1 | 3/2017 | El-Siblani |
| 2017/0087635 A1 | 3/2017 | Wilkes et al. |
| 2017/0087661 A1 | 3/2017 | Backlund et al. |
| 2017/0087666 A1 | 3/2017 | Sasaki et al. |
| 2017/0087670 A1 | 3/2017 | Kalentics et al. |
| 2017/0087765 A1 | 3/2017 | Rundlett et al. |
| 2017/0088918 A1 | 3/2017 | Cui et al. |
| 2017/0090462 A1 | 3/2017 | Dave et al. |
| 2017/0092400 A1 | 3/2017 | Bharadwaj |
| 2017/0092565 A1 | 3/2017 | Chen et al. |

(56) References Cited

U.S. PATENT DOCUMENTS

| | | |
|---|---|---|
| 2017/0095882 A1 | 4/2017 | Mireles et al. |
| 2017/0095888 A1 | 4/2017 | Butcher |
| 2017/0100209 A1 | 4/2017 | Wen |
| 2017/0100210 A1 | 4/2017 | Wen |
| 2017/0100214 A1 | 4/2017 | Wen |
| 2017/0100215 A1 | 4/2017 | Khouri |
| 2017/0100817 A1 | 4/2017 | Ganapathiappan et al. |
| 2017/0100888 A1 | 4/2017 | Batchelder |
| 2017/0100891 A1 | 4/2017 | Meisner et al. |
| 2017/0100893 A1 | 4/2017 | Meisner et al. |
| 2017/0100899 A1 | 4/2017 | El-Siblani et al. |
| 2017/0101707 A1 | 4/2017 | Kottilingam et al. |
| 2017/0101875 A1 | 4/2017 | Rosenzweig et al. |
| 2017/0103714 A1 | 4/2017 | Yamamoto et al. |
| 2017/0106432 A1 | 4/2017 | Clew et al. |
| 2017/0106438 A1 | 4/2017 | Cook et al. |
| 2017/0106443 A1 | 4/2017 | Karlsson |
| 2017/0106444 A1 | 4/2017 | Ishida et al. |
| 2017/0106445 A1 | 4/2017 | Schwarze et al. |
| 2017/0106446 A1 | 4/2017 | Okamoto et al. |
| 2017/0106474 A1 | 4/2017 | Bruck et al. |
| 2017/0106477 A1 | 4/2017 | Mironets et al. |
| 2017/0106570 A1 | 4/2017 | Karlsson |
| 2017/0106593 A1 | 4/2017 | Khairallah |
| 2017/0107385 A1 | 4/2017 | Kumai et al. |
| 2017/0107636 A1 | 4/2017 | Barzi et al. |
| 2017/0107764 A1 | 4/2017 | Grant et al. |
| 2017/0107821 A1 | 4/2017 | Schwarz |
| 2017/0108780 A1 | 4/2017 | Eva |
| 2017/0110728 A1 | 4/2017 | Kobayashi et al. |
| 2017/0110760 A1 | 4/2017 | Hatta et al. |
| 2017/0113303 A1 | 4/2017 | Rockstroh et al. |
| 2017/0113416 A1 | 4/2017 | DeSimone et al. |
| 2017/0114233 A1 | 4/2017 | Asami et al. |
| 2017/0115594 A1 | 4/2017 | Martin |
| 2017/0119531 A1 | 5/2017 | Bojarski et al. |
| 2017/0120326 A1 | 5/2017 | La |
| 2017/0120332 A1 | 5/2017 | DeMuth et al. |
| 2017/0120333 A1 | 5/2017 | DeMuth et al. |
| 2017/0120334 A1 | 5/2017 | DeMuth et al. |
| 2017/0120335 A1 | 5/2017 | DeMuth et al. |
| 2017/0120336 A1 | 5/2017 | DeMuth et al. |
| 2017/0120337 A1 | 5/2017 | Kanko et al. |
| 2017/0120359 A1 | 5/2017 | Carter et al. |
| 2017/0120370 A1 | 5/2017 | Ahn et al. |
| 2017/0120376 A1 | 5/2017 | Cheverton et al. |
| 2017/0120377 A1 | 5/2017 | Webster et al. |
| 2017/0120385 A1 | 5/2017 | Tsuji et al. |
| 2017/0120386 A1 | 5/2017 | Lin et al. |
| 2017/0120387 A1 | 5/2017 | DeMuth et al. |
| 2017/0120393 A1 | 5/2017 | Lin et al. |
| 2017/0120416 A1 | 5/2017 | Chockalingam et al. |
| 2017/0120518 A1 | 5/2017 | DeMuth et al. |
| 2017/0120519 A1 | 5/2017 | Mark |
| 2017/0120529 A1 | 5/2017 | DeMuth et al. |
| 2017/0120530 A1 | 5/2017 | DeMuth et al. |
| 2017/0120537 A1 | 5/2017 | DeMuth et al. |
| 2017/0120538 A1 | 5/2017 | DeMuth et al. |
| 2017/0122322 A1 | 5/2017 | Zinniel et al. |
| 2017/0123222 A1 | 5/2017 | DeMuth et al. |
| 2017/0123237 A1 | 5/2017 | DeMuth et al. |
| 2017/0125908 A1 | 5/2017 | Pance et al. |
| 2017/0125909 A1 | 5/2017 | Pance et al. |
| 2017/0125910 A1 | 5/2017 | Pance et al. |
| 2017/0126087 A1 | 5/2017 | Soderberg |
| 2017/0128174 A1 | 5/2017 | Mayr et al. |
| 2017/0128961 A1 | 5/2017 | Richardson |
| 2017/0129049 A1 | 5/2017 | Schwarze et al. |
| 2017/0129052 A1 | 5/2017 | Buller et al. |
| 2017/0129060 A1 | 5/2017 | Szuromi et al. |
| 2017/0129168 A1 | 5/2017 | El-Siblani et al. |
| 2017/0129180 A1 | 5/2017 | Coates et al. |
| 2017/0129184 A1 | 5/2017 | Buller et al. |
| 2017/0129185 A1 | 5/2017 | Buller et al. |
| 2017/0129806 A1 | 5/2017 | Fujii et al. |
| 2017/0130591 A1 | 5/2017 | Bunker |
| 2017/0130599 A1 | 5/2017 | Bunker et al. |
| 2017/0135909 A1 | 5/2017 | Takei et al. |
| 2017/0136540 A1 | 5/2017 | Dods |
| 2017/0136541 A1 | 5/2017 | Eager |
| 2017/0136542 A1 | 5/2017 | Nordkvist et al. |
| 2017/0136543 A1 | 5/2017 | Hermann et al. |
| 2017/0136545 A1 | 5/2017 | Yoshimura et al. |
| 2017/0136574 A1 | 5/2017 | Zenzinger et al. |
| 2017/0136578 A1 | 5/2017 | Yoshimura |
| 2017/0136603 A1 | 5/2017 | Ganapathiappan et al. |
| 2017/0136699 A1 | 5/2017 | Erb et al. |
| 2017/0136708 A1 | 5/2017 | Das et al. |
| 2017/0137327 A1 | 5/2017 | Capobianco et al. |
| 2017/0138164 A1 | 5/2017 | Mace et al. |
| 2017/0139082 A1 | 5/2017 | Takai et al. |
| 2017/0143315 A1 | 5/2017 | Bangera et al. |
| 2017/0144219 A1 | 5/2017 | Xu |
| 2017/0144223 A1 | 5/2017 | Gold et al. |
| 2017/0144224 A1 | 5/2017 | DeMuth et al. |
| 2017/0144248 A1 | 5/2017 | Yoshimura et al. |
| 2017/0144250 A1 | 5/2017 | Gold et al. |
| 2017/0144254 A1 | 5/2017 | Buller et al. |
| 2017/0145578 A1 | 5/2017 | Wirth et al. |
| 2017/0145584 A1 | 5/2017 | Wirth et al. |
| 2017/0145586 A1 | 5/2017 | Xiao |
| 2017/0148562 A1 | 5/2017 | Lee et al. |
| 2017/0151631 A1 | 6/2017 | Kuo et al. |
| 2017/0151718 A1 | 6/2017 | Rolland et al. |
| 2017/0151719 A1 | 6/2017 | Swartz et al. |
| 2017/0154713 A1 | 6/2017 | Simon et al. |
| 2017/0155309 A1 | 6/2017 | Jassal et al. |
| 2017/0157850 A1 | 6/2017 | Duan et al. |
| 2017/0159447 A1 | 6/2017 | Clum et al. |
| 2017/0162701 A1 | 6/2017 | Yamazaki |
| 2017/0162790 A1 | 6/2017 | Kato |
| 2017/0164700 A1 | 6/2017 | Zito |
| 2017/0165532 A1 | 6/2017 | Khan et al. |
| 2017/0165751 A1 | 6/2017 | Buller et al. |
| 2017/0165752 A1 | 6/2017 | Buller et al. |
| 2017/0165753 A1 | 6/2017 | Buller et al. |
| 2017/0165754 A1 | 6/2017 | Buller et al. |
| 2017/0165781 A1 | 6/2017 | Veldsman et al. |
| 2017/0165790 A1 | 6/2017 | McCarthy et al. |
| 2017/0165791 A1 | 6/2017 | Kamachi et al. |
| 2017/0165792 A1 | 6/2017 | Buller et al. |
| 2017/0165916 A1 | 6/2017 | El-Siblani |
| 2017/0166730 A1 | 6/2017 | Tsutsumi et al. |
| 2017/0167000 A1 | 6/2017 | Dial et al. |
| 2017/0167270 A1 | 6/2017 | Itzel et al. |
| 2017/0167274 A1 | 6/2017 | Itzel |
| 2017/0173628 A1 | 6/2017 | Downing |
| 2017/0173681 A1 | 6/2017 | Moricca et al. |
| 2017/0173683 A1 | 6/2017 | Simpson et al. |
| 2017/0173688 A1 | 6/2017 | Miyashita |
| 2017/0173691 A1 | 6/2017 | Jonasson |
| 2017/0173692 A1 | 6/2017 | Myerberg et al. |
| 2017/0173693 A1 | 6/2017 | Myerberg et al. |
| 2017/0173694 A1 | 6/2017 | Myerberg et al. |
| 2017/0173695 A1 | 6/2017 | Myerberg et al. |
| 2017/0173696 A1 | 6/2017 | Sheinman |
| 2017/0173697 A1 | 6/2017 | Myerberg et al. |
| 2017/0173735 A1 | 6/2017 | Hsu |
| 2017/0173736 A1 | 6/2017 | Gray |
| 2017/0173737 A1 | 6/2017 | Gray |
| 2017/0173747 A1 | 6/2017 | Jones et al. |
| 2017/0173868 A1 | 6/2017 | Mark |
| 2017/0173872 A1 | 6/2017 | McCall et al. |
| 2017/0173874 A1 | 6/2017 | Batchelder et al. |
| 2017/0173877 A1 | 6/2017 | Myerberg et al. |
| 2017/0173878 A1 | 6/2017 | Myerberg et al. |
| 2017/0173879 A1 | 6/2017 | Myerberg et al. |
| 2017/0173883 A1 | 6/2017 | Gray et al. |
| 2017/0173892 A1 | 6/2017 | Steele |
| 2017/0174545 A1 | 6/2017 | Kunisa et al. |
| 2017/0174565 A1 | 6/2017 | Kase et al. |
| 2017/0175756 A1 | 6/2017 | Zotz |
| 2017/0179482 A1 | 6/2017 | Verbrugge et al. |
| 2017/0181291 A1 | 6/2017 | Bell et al. |

(56) References Cited

U.S. PATENT DOCUMENTS

| | | |
|---|---|---|
| 2017/0182556 A1 | 6/2017 | Ramaswamy et al. |
| 2017/0182558 A1 | 6/2017 | Shimizu et al. |
| 2017/0182560 A1 | 6/2017 | Myerberg et al. |
| 2017/0182594 A1 | 6/2017 | Crear et al. |
| 2017/0182596 A1 | 6/2017 | Toru |
| 2017/0182598 A1 | 6/2017 | Crear et al. |
| 2017/0183257 A1 | 6/2017 | Apitz et al. |
| 2017/0183497 A9 | 6/2017 | Rodgers et al. |
| 2017/0183870 A1 | 6/2017 | Cheung et al. |
| 2017/0186143 A1 | 6/2017 | Ohno et al. |
| 2017/0189553 A1 | 7/2017 | Hunter |
| 2017/0189961 A1 | 7/2017 | Ferrar |
| 2017/0189962 A1 | 7/2017 | Kestler et al. |
| 2017/0189963 A1 | 7/2017 | Buller et al. |
| 2017/0189964 A1 | 7/2017 | Backlund et al. |
| 2017/0189965 A1 | 7/2017 | Vaidya et al. |
| 2017/0191177 A1 | 7/2017 | Whitaker et al. |
| 2017/0194263 A1 | 7/2017 | Kato |
| 2017/0194686 A1 | 7/2017 | Ito et al. |
| 2017/0197246 A1 | 7/2017 | Wachter et al. |
| 2017/0197278 A1 | 7/2017 | Garry et al. |
| 2017/0197330 A1 | 7/2017 | Surjaatmadja |
| 2017/0197359 A1 | 7/2017 | Yang et al. |
| 2017/0197875 A1 | 7/2017 | Fujii et al. |
| 2017/0203355 A1 | 7/2017 | Satoh et al. |
| 2017/0203363 A1 | 7/2017 | Rowland et al. |
| 2017/0203364 A1 | 7/2017 | Ramaswamy et al. |
| 2017/0203365 A1 | 7/2017 | Pays et al. |
| 2017/0203387 A1 | 7/2017 | Ladewig et al. |
| 2017/0203391 A1 | 7/2017 | Budge |
| 2017/0203406 A1 | 7/2017 | Ganapathiappan et al. |
| 2017/0203408 A1 | 7/2017 | Ganapathiappan et al. |
| 2017/0203517 A1 | 7/2017 | Crear et al. |
| 2017/0209908 A1 | 7/2017 | Smathers et al. |
| 2017/0209923 A1 | 7/2017 | Giovannetti et al. |
| 2017/0209929 A1 | 7/2017 | Ishida et al. |
| 2017/0209931 A1 | 7/2017 | Ishida et al. |
| 2017/0209954 A1 | 7/2017 | Kato et al. |
| 2017/0209958 A1 | 7/2017 | Soshi |
| 2017/0209963 A1 | 7/2017 | Smathers et al. |
| 2017/0210070 A1 | 7/2017 | Sreekumar |
| 2017/0210144 A1 | 7/2017 | Hosaka |
| 2017/0210662 A1 | 7/2017 | Wagner et al. |
| 2017/0211331 A1 | 7/2017 | Vempati et al. |
| 2017/0211990 A1 | 7/2017 | Gouko et al. |
| 2017/0212088 A1 | 7/2017 | Acharya et al. |
| 2017/0216916 A1 | 8/2017 | Nyrhila et al. |
| 2017/0216921 A1 | 8/2017 | Oswald et al. |
| 2017/0216962 A1 | 8/2017 | Schultz et al. |
| 2017/0216966 A1 | 8/2017 | DeMuth et al. |
| 2017/0217093 A1 | 8/2017 | DeMuth et al. |
| 2017/0217095 A1 | 8/2017 | Buller et al. |
| 2017/0217105 A1 | 8/2017 | Taniuchi |
| 2017/0217181 A1 | 8/2017 | Yamada |
| 2017/0218228 A1 | 8/2017 | Jose et al. |
| 2017/0219855 A1 | 8/2017 | DeMuth et al. |
| 2017/0220031 A1 | 8/2017 | Morovic, Jr. et al. |
| 2017/0225227 A1 | 8/2017 | Volk |
| 2017/0225228 A1 | 8/2017 | Nagahama |
| 2017/0225229 A1 | 8/2017 | Liu |
| 2017/0225393 A1 | 8/2017 | Shkolnik |
| 2017/0225394 A9 | 8/2017 | Rodgers et al. |
| 2017/0225398 A1 | 8/2017 | Verschueren et al. |
| 2017/0226362 A1 | 8/2017 | Fratello et al. |
| 2017/0227800 A1 | 8/2017 | Yamazaki et al. |
| 2017/0229731 A1 | 8/2017 | Visco et al. |
| 2017/0231783 A1 | 8/2017 | Lang et al. |
| 2017/0231873 A1 | 8/2017 | Sakamoto et al. |
| 2017/0231874 A1 | 8/2017 | Sakamoto et al. |
| 2017/0232511 A1 | 8/2017 | Fieldman et al. |
| 2017/0232513 A1 | 8/2017 | Coffman |
| 2017/0232514 A1 | 8/2017 | Bruck |
| 2017/0232515 A1 | 8/2017 | DeMuth et al. |
| 2017/0232518 A1 | 8/2017 | Shi et al. |
| 2017/0232519 A1 | 8/2017 | Pan et al. |
| 2017/0232549 A1 | 8/2017 | Lacaze et al. |
| 2017/0232552 A1 | 8/2017 | Crear et al. |
| 2017/0232557 A1 | 8/2017 | DeMuth et al. |
| 2017/0232637 A1 | 8/2017 | DeMuth et al. |
| 2017/0232674 A1 | 8/2017 | Mark |
| 2017/0233287 A1 | 8/2017 | Li et al. |
| 2017/0233574 A9 | 8/2017 | Rodgers et al. |
| 2017/0234138 A1 | 8/2017 | Bunker |
| 2017/0235852 A1 | 8/2017 | Joshi et al. |
| 2017/0239718 A1 | 8/2017 | Steinhoff, Jr. et al. |
| 2017/0239719 A1 | 8/2017 | Buller et al. |
| 2017/0239720 A1 | 8/2017 | Levin et al. |
| 2017/0239721 A1 | 8/2017 | Buller et al. |
| 2017/0239722 A1 | 8/2017 | Goehlich et al. |
| 2017/0239723 A1 | 8/2017 | Hoyt et al. |
| 2017/0239724 A1 | 8/2017 | Diaz et al. |
| 2017/0239725 A1 | 8/2017 | Ufton |
| 2017/0239752 A1 | 8/2017 | Buller et al. |
| 2017/0239887 A1 | 8/2017 | Rolland et al. |
| 2017/0239891 A1 | 8/2017 | Buller et al. |
| 2017/0239892 A1 | 8/2017 | Buller et al. |
| 2017/0241830 A1 | 8/2017 | Jaaskelainen |
| 2017/0242424 A1 | 8/2017 | Spears |
| 2017/0243900 A1 | 8/2017 | Yamazaki |
| 2017/0246682 A1 | 8/2017 | Duerig |
| 2017/0246689 A1 | 8/2017 | Garry |
| 2017/0246709 A1 | 8/2017 | Guerrier et al. |
| 2017/0246804 A1 | 8/2017 | El-Siblani et al. |
| 2017/0247785 A1 | 8/2017 | Bandyopadhyay et al. |
| 2017/0248319 A1 | 8/2017 | McMahan et al. |
| 2017/0249440 A1 | 8/2017 | Lang et al. |
| 2017/0252271 A1 | 9/2017 | Klee et al. |
| 2017/0252787 A1 | 9/2017 | Stawovy |
| 2017/0252806 A1 | 9/2017 | Wienberg |
| 2017/0252812 A1 | 9/2017 | Mykulowycz et al. |
| 2017/0252813 A1 | 9/2017 | Myerberg et al. |
| 2017/0252814 A1 | 9/2017 | Myerberg et al. |
| 2017/0252815 A1 | 9/2017 | Fontana et al. |
| 2017/0252816 A1 | 9/2017 | Shim et al. |
| 2017/0252817 A1 | 9/2017 | Mykulowycz et al. |
| 2017/0252818 A1 | 9/2017 | Gibson et al. |
| 2017/0252819 A1 | 9/2017 | Gibson et al. |
| 2017/0252820 A1 | 9/2017 | Myerberg et al. |
| 2017/0252846 A1 | 9/2017 | Stawovy |
| 2017/0252851 A1 | 9/2017 | Fulop et al. |
| 2017/0252854 A1 | 9/2017 | Maier et al. |
| 2017/0252860 A1 | 9/2017 | Bamberg et al. |
| 2017/0252967 A9 | 9/2017 | Guillemette et al. |
| 2017/0252978 A1 | 9/2017 | Claes |
| 2017/0253523 A1 | 9/2017 | O'Malley et al. |
| 2017/0259502 A1 | 9/2017 | Chapiro et al. |
| 2017/0260865 A1 | 9/2017 | Schloffer |
| 2017/0266081 A1 | 9/2017 | Blackwell et al. |
| 2017/0266759 A1 | 9/2017 | Fieret et al. |
| 2017/0266879 A1 | 9/2017 | Mathur |
| 2017/0271674 A1 | 9/2017 | Cheng et al. |
| 2017/0271837 A1 | 9/2017 | Hemenway et al. |
| 2017/0274454 A1 | 9/2017 | Feng |
| 2017/0274456 A1 | 9/2017 | Walker et al. |
| 2017/0276023 A1 | 9/2017 | Richter |
| 2017/0278975 A1 | 9/2017 | Yamazaki et al. |
| 2017/0282246 A1 | 10/2017 | Liebl et al. |
| 2017/0282247 A1 | 10/2017 | Cullinan et al. |
| 2017/0282296 A1 | 10/2017 | Kitani et al. |
| 2017/0282297 A1 | 10/2017 | Ohno |
| 2017/0282455 A1 | 10/2017 | DeFelice et al. |
| 2017/0284676 A1 | 10/2017 | North et al. |
| 2017/0285227 A1 | 10/2017 | Chen et al. |
| 2017/0288224 A1 | 10/2017 | Cheng et al. |
| 2017/0290746 A1 | 10/2017 | Ida et al. |
| 2017/0291077 A1 | 10/2017 | Madson et al. |
| 2017/0291260 A1 | 10/2017 | McCarren et al. |
| 2017/0291261 A1 | 10/2017 | Mathur |
| 2017/0291263 A1 | 10/2017 | Mironets et al. |
| 2017/0291362 A1 | 10/2017 | Tombs et al. |
| 2017/0292174 A1 | 10/2017 | Karabin et al. |
| 2017/0292195 A1 | 10/2017 | Roberge |
| 2017/0294288 A1 | 10/2017 | Lock |
| 2017/0294291 A1 | 10/2017 | Saleh et al. |

(56) References Cited

U.S. PATENT DOCUMENTS

| | | |
|---|---|---|
| 2017/0296441 A1 | 10/2017 | Renn et al. |
| 2017/0296442 A1 | 10/2017 | Renn et al. |
| 2017/0297097 A1 | 10/2017 | Gibson et al. |
| 2017/0297098 A1 | 10/2017 | Myerberg et al. |
| 2017/0297099 A1 | 10/2017 | Gibson et al. |
| 2017/0297100 A1 | 10/2017 | Gibson et al. |
| 2017/0297101 A1 | 10/2017 | Casper et al. |
| 2017/0297102 A1 | 10/2017 | Chin et al. |
| 2017/0297103 A1 | 10/2017 | Myerberg et al. |
| 2017/0297104 A1 | 10/2017 | Gibson et al. |
| 2017/0297106 A1 | 10/2017 | Myerberg et al. |
| 2017/0297108 A1 | 10/2017 | Gibson et al. |
| 2017/0297109 A1 | 10/2017 | Gibson et al. |
| 2017/0297111 A1 | 10/2017 | Myerberg et al. |
| 2017/0297267 A1 | 10/2017 | Liu et al. |
| 2017/0297275 A1 | 10/2017 | Mark et al. |
| 2017/0297674 A1 | 10/2017 | Zahlen et al. |
| 2017/0299181 A1 | 10/2017 | Graichen et al. |
| 2017/0299973 A1 | 10/2017 | Frauens |
| 2017/0304894 A1 | 10/2017 | Buller |
| 2017/0304895 A1 | 10/2017 | Porch et al. |
| 2017/0304896 A1 | 10/2017 | Kovalchuk et al. |
| 2017/0304897 A1 | 10/2017 | Walrand et al. |
| 2017/0304900 A1 | 10/2017 | Strangman |
| 2017/0304933 A1 | 10/2017 | Miles et al. |
| 2017/0304944 A1 | 10/2017 | Symeonidis et al. |
| 2017/0304945 A1 | 10/2017 | Sutcliffe |
| 2017/0304946 A1 | 10/2017 | Shibazaki |
| 2017/0304947 A1 | 10/2017 | Shibazaki |
| 2017/0306221 A1 | 10/2017 | Koole et al. |
| 2017/0306447 A1 | 10/2017 | Lin et al. |
| 2017/0306448 A1 | 10/2017 | Lin et al. |
| 2017/0306449 A1 | 10/2017 | Lin et al. |
| 2017/0306450 A1 | 10/2017 | Lin et al. |
| 2017/0306457 A1 | 10/2017 | Lin et al. |
| 2017/0306458 A1 | 10/2017 | Lin et al. |
| 2017/0306459 A1 | 10/2017 | Lin et al. |
| 2017/0306460 A1 | 10/2017 | Lin et al. |
| 2017/0306766 A1 | 10/2017 | Munzer |
| 2017/0307859 A1 | 10/2017 | Li et al. |
| 2017/0309710 A1 | 10/2017 | Davis |
| 2017/0312821 A1 | 11/2017 | DeFelice et al. |
| 2017/0312822 A1 | 11/2017 | Kimblad |
| 2017/0312826 A1 | 11/2017 | Lafarre et al. |
| 2017/0312857 A1 | 11/2017 | Bourell et al. |
| 2017/0312858 A1 | 11/2017 | Eriksson et al. |
| 2017/0312984 A1 | 11/2017 | Ruiz et al. |
| 2017/0312985 A1 | 11/2017 | Talgorn et al. |
| 2017/0314109 A1 | 11/2017 | McCloskey |
| 2017/0314114 A1 | 11/2017 | Ozbaysal et al. |
| 2017/0315538 A1 | 11/2017 | Sauer et al. |
| 2017/0317336 A1 | 11/2017 | Zhamu et al. |
| 2017/0320162 A1 | 11/2017 | Wang |
| 2017/0320168 A1 | 11/2017 | Martinsen |
| 2017/0320264 A1 | 11/2017 | Herzog et al. |
| 2017/0320277 A1 | 11/2017 | Wang |
| 2017/0320773 A1 | 11/2017 | Bookbinder et al. |
| 2017/0322487 A1 | 11/2017 | Baur et al. |
| 2017/0323627 A1 | 11/2017 | Barefoot |
| 2017/0326668 A1 | 11/2017 | Grabau |
| 2017/0326681 A1 | 11/2017 | Sidhu et al. |
| 2017/0326690 A1 | 11/2017 | Heard et al. |
| 2017/0326788 A1 | 11/2017 | Alvarez et al. |
| 2017/0326797 A1 | 11/2017 | Alvarez et al. |
| 2017/0326805 A1 | 11/2017 | Alvarez et al. |
| 2017/0326816 A1 | 11/2017 | Seepersad et al. |
| 2017/0330674 A1 | 11/2017 | Lee et al. |
| 2017/0332733 A1 | 11/2017 | Cluckers et al. |
| 2017/0333295 A1 | 11/2017 | Hatanaka et al. |
| 2017/0333994 A1 | 11/2017 | Schmitt et al. |
| 2017/0333995 A1 | 11/2017 | Ott et al. |
| 2017/0334023 A1 | 11/2017 | Mohr |
| 2017/0334024 A1 | 11/2017 | Buller et al. |
| 2017/0334133 A9 | 11/2017 | Swartz et al. |
| 2017/0334136 A1 | 11/2017 | Mark et al. |
| 2017/0334725 A1 | 11/2017 | Noyes et al. |
| 2017/0335436 A1 | 11/2017 | Schloffer et al. |
| 2017/0338392 A1 | 11/2017 | Marutani |
| 2017/0338472 A1 | 11/2017 | Zhamu et al. |
| 2017/0341141 A1 | 11/2017 | Ackelid |
| 2017/0341142 A1 | 11/2017 | Ackelid |
| 2017/0341175 A1 | 11/2017 | Ladewig et al. |
| 2017/0341182 A1 | 11/2017 | Casper et al. |
| 2017/0341183 A1 | 11/2017 | Buller et al. |
| 2017/0341451 A1 | 11/2017 | Minamidate et al. |
| 2017/0342303 A1 | 11/2017 | Stevenson et al. |
| 2017/0342535 A1 | 11/2017 | She et al. |
| 2017/0348201 A1 | 12/2017 | Gruner et al. |
| 2017/0348202 A1 | 12/2017 | Gruner et al. |
| 2017/0348458 A1 | 12/2017 | Kesti et al. |
| 2017/0348792 A1 | 12/2017 | Fager |
| 2017/0348906 A1 | 12/2017 | Nowak et al. |
| 2017/0348909 A1 | 12/2017 | Clark et al. |
| 2017/0349756 A1 | 12/2017 | Gruner et al. |
| 2017/0350259 A1 | 12/2017 | Dutta et al. |
| 2017/0354805 A1 | 12/2017 | Stanley et al. |
| 2017/0354806 A1 | 12/2017 | Stanley et al. |
| 2017/0355135 A1 | 12/2017 | Tombs |
| 2017/0355138 A1 | 12/2017 | Mark |
| 2017/0355146 A1 | 12/2017 | Buller et al. |
| 2017/0355147 A1 | 12/2017 | Buller et al. |
| 2017/0355855 A1 | 12/2017 | Gruner et al. |
| 2017/0356068 A1 | 12/2017 | Engeli et al. |
| 2017/0358685 A1 | 12/2017 | Sasagawa et al. |
| 2017/0358795 A1 | 12/2017 | Kung et al. |
| 2017/0360534 A1 | 12/2017 | Sun et al. |
| 2017/0361405 A1 | 12/2017 | Renz et al. |
| 2017/0362119 A1 | 12/2017 | Dejneka et al. |
| 2017/0362687 A1 | 12/2017 | Rios et al. |
| 2017/0365473 A1 | 12/2017 | Davis |
| 2017/0365843 A1 | 12/2017 | Kawase et al. |
| 2017/0365853 A1 | 12/2017 | Visco et al. |
| 2017/0368603 A1 | 12/2017 | Beals et al. |
| 2017/0368640 A1 | 12/2017 | Herzog et al. |
| 2017/0368644 A1 | 12/2017 | Handwerker et al. |
| 2017/0368647 A1 | 12/2017 | Bunker |
| 2017/0368740 A1 | 12/2017 | Rolland |
| 2017/0368816 A1 | 12/2017 | Batchelder et al. |
| 2018/0000501 A1 | 1/2018 | Baym et al. |
| 2018/0000502 A1 | 1/2018 | Baym et al. |
| 2018/0000503 A1 | 1/2018 | Baym et al. |
| 2018/0000571 A1 | 1/2018 | Watanabe |
| 2018/0001423 A1 | 1/2018 | Stevenson et al. |
| 2018/0001424 A1 | 1/2018 | Brunhuber et al. |
| 2018/0001547 A1 | 1/2018 | Cuypers et al. |
| 2018/0001553 A1 | 1/2018 | Buller et al. |
| 2018/0001556 A1 | 1/2018 | Buller et al. |
| 2018/0001557 A1 | 1/2018 | Buller et al. |
| 2018/0001567 A1 | 1/2018 | Juan et al. |
| 2018/0006293 A1 | 1/2018 | Demaray et al. |
| 2018/0009007 A1 | 1/2018 | Craft et al. |
| 2018/0009054 A1 | 1/2018 | Forseth et al. |
| 2018/0009064 A1 | 1/2018 | Miyashita |
| 2018/0009134 A1 | 1/2018 | Berben et al. |
| 2018/0010001 A1 | 1/2018 | Hersam et al. |
| 2018/0010221 A1 | 1/2018 | Aswathanarayanaswamy et al. |
| 2018/0010237 A1 | 1/2018 | Forseth et al. |
| 2018/0014844 A1 | 1/2018 | Conlon |
| 2018/0015564 A1 | 1/2018 | Honda |
| 2018/0015565 A1 | 1/2018 | Goto |
| 2018/0015566 A1 | 1/2018 | Etter et al. |
| 2018/0019458 A1 | 1/2018 | Kagami et al. |
| 2018/0021473 A1 | 1/2018 | Yliperttula et al. |
| 2018/0021877 A1 | 1/2018 | Rios et al. |
| 2018/0021878 A1 | 1/2018 | Karlen et al. |
| 2018/0022022 A1 | 1/2018 | Tyler |
| 2018/0022065 A1 | 1/2018 | Swartz et al. |
| 2018/0022640 A1 | 1/2018 | Dejneka et al. |
| 2018/0026171 A1 | 1/2018 | Kurosaki et al. |
| 2018/0027615 A1 | 1/2018 | Rios et al. |
| 2018/0027616 A1 | 1/2018 | Rios et al. |
| 2018/0029124 A1 | 2/2018 | Okamoto et al. |
| 2018/0029125 A1 | 2/2018 | Okamoto et al. |
| 2018/0029241 A1 | 2/2018 | Kim et al. |

(56) References Cited

U.S. PATENT DOCUMENTS

| | | |
|---|---|---|
| 2018/0029294 A1 | 2/2018 | Herzog et al. |
| 2018/0029295 A1 | 2/2018 | Herzog et al. |
| 2018/0029306 A1 | 2/2018 | Gold et al. |
| 2018/0031028 A1 | 2/2018 | Himmelmann |
| 2018/0036939 A1 | 2/2018 | Sundaresan |
| 2018/0036945 A1 | 2/2018 | Lereboullet et al. |
| 2018/0036953 A1 | 2/2018 | Gottschalk-Gaudig |
| 2018/0037546 A1 | 2/2018 | Sugino et al. |
| 2018/0038167 A1 | 2/2018 | Xu et al. |
| 2018/0038995 A1 | 2/2018 | Fujii |
| 2018/0040916 A1 | 2/2018 | Tsuda et al. |
| 2018/0042718 A1 | 2/2018 | Remenschneider et al. |
| 2018/0043455 A1 | 2/2018 | Vigdal et al. |
| 2018/0043467 A1 | 2/2018 | Huysmans |
| 2018/0044523 A1 | 2/2018 | Rodgers et al. |
| 2018/0047696 A1 | 2/2018 | Yamada et al. |
| 2018/0050390 A1 | 2/2018 | Gibson et al. |
| 2018/0050423 A1 | 2/2018 | Hoferer |
| 2018/0050490 A1 | 2/2018 | Swartz et al. |
| 2018/0050493 A1 | 2/2018 | Sanz Ananos et al. |
| 2018/0050495 A1 | 2/2018 | Stolyarov et al. |
| 2018/0052087 A1 | 2/2018 | Swanner, Jr. et al. |
| 2018/0052254 A1 | 2/2018 | Takai et al. |
| 2018/0055641 A1 | 3/2018 | Jones et al. |
| 2018/0056389 A1 | 3/2018 | Grant et al. |
| 2018/0056390 A1 | 3/2018 | O'Neill |
| 2018/0056391 A1 | 3/2018 | Buller et al. |
| 2018/0056392 A1 | 3/2018 | Ichijo |
| 2018/0056396 A1 | 3/2018 | Menon et al. |
| 2018/0056446 A1 | 3/2018 | Mezawa |
| 2018/0057142 A1 | 3/2018 | Wilkerson |
| 2018/0061279 A1 | 3/2018 | Niimi et al. |
| 2018/0065144 A1 | 3/2018 | Tyler |
| 2018/0065178 A1 | 3/2018 | Rowland et al. |
| 2018/0065181 A1 | 3/2018 | Mori et al. |
| 2018/0065182 A1 | 3/2018 | Money et al. |
| 2018/0065186 A1 | 3/2018 | Cullinan et al. |
| 2018/0065208 A1 | 3/2018 | Mori et al. |
| 2018/0065209 A1 | 3/2018 | Foret |
| 2018/0065295 A1 | 3/2018 | Alves |
| 2018/0065298 A1 | 3/2018 | Tyler |
| 2018/0065300 A1 | 3/2018 | Tyler et al. |
| 2018/0065304 A1 | 3/2018 | Stockett et al. |
| 2018/0065305 A1 | 3/2018 | Tyler |
| 2018/0065306 A1 | 3/2018 | Tyler et al. |
| 2018/0065307 A1 | 3/2018 | Stockett et al. |
| 2018/0065308 A1 | 3/2018 | Stockett et al. |
| 2018/0065309 A1 | 3/2018 | Tyler et al. |
| 2018/0065316 A1 | 3/2018 | Tyler et al. |
| 2018/0065317 A1 | 3/2018 | Tyler |
| 2018/0065318 A1 | 3/2018 | Tyler |
| 2018/0065320 A1 | 3/2018 | Tyler |
| 2018/0065322 A1 | 3/2018 | Tyler et al. |
| 2018/0066358 A1 | 3/2018 | Newman et al. |
| 2018/0066603 A1 | 3/2018 | Evers et al. |
| 2018/0067464 A1 | 3/2018 | Budge et al. |
| 2018/0070458 A1 | 3/2018 | Ahn et al. |
| 2018/0071175 A1 | 3/2018 | Stelzig et al. |
| 2018/0071819 A1 | 3/2018 | Connor et al. |
| 2018/0071821 A1 | 3/2018 | Crear et al. |
| 2018/0071825 A1 | 3/2018 | Schmitt et al. |
| 2018/0071949 A1 | 3/2018 | Giles |
| 2018/0071986 A1 | 3/2018 | Buller et al. |
| 2018/0071988 A1 | 3/2018 | Emamjomeh et al. |
| 2018/0071989 A1 | 3/2018 | Zenou et al. |
| 2018/0072040 A1 | 3/2018 | Mark et al. |
| 2018/0072613 A1 | 3/2018 | Minorikawa et al. |
| 2018/0072630 A1 | 3/2018 | Beaman et al. |
| 2018/0073532 A1 | 3/2018 | Whalen et al. |
| 2018/0078936 A1 | 3/2018 | Owens et al. |
| 2018/0079003 A1 | 3/2018 | Lin et al. |
| 2018/0079029 A1 | 3/2018 | Scott et al. |
| 2018/0079033 A1 | 3/2018 | Krueger et al. |
| 2018/0079034 A1 | 3/2018 | Shuck |
| 2018/0079125 A1 | 3/2018 | Perez et al. |
| 2018/0083266 A1 | 3/2018 | Zhamu et al. |
| 2018/0083281 A1 | 3/2018 | Cheng et al. |
| 2018/0083282 A1 | 3/2018 | Baba et al. |
| 2018/0083289 A1 | 3/2018 | Zhamu et al. |
| 2018/0085605 A1 | 3/2018 | Maharbiz et al. |
| 2018/0085826 A1 | 3/2018 | Luo et al. |
| 2018/0085856 A1 | 3/2018 | Bour et al. |
| 2018/0086004 A1 | 3/2018 | Van Espen |
| 2018/0086025 A1 | 3/2018 | Yoshigahara et al. |
| 2018/0087157 A1 | 3/2018 | Harrison et al. |
| 2018/0088399 A1 | 3/2018 | Fukushi et al. |
| 2018/0088462 A1 | 3/2018 | Vyatskikh et al. |
| 2018/0089824 A1 | 3/2018 | Bevan |
| 2018/0093325 A1 | 4/2018 | Mori et al. |
| 2018/0093347 A1 | 4/2018 | Obara et al. |
| 2018/0093418 A1 | 4/2018 | Lappas et al. |
| 2018/0093419 A1 | 4/2018 | Lappas et al. |
| 2018/0094953 A1 | 4/2018 | Colson et al. |
| 2018/0095450 A1 | 4/2018 | Lappas et al. |
| 2018/0096175 A1 | 4/2018 | Schmeling et al. |
| 2018/0098919 A1 | 4/2018 | Pallari et al. |
| 2018/0099307 A1 | 4/2018 | Takeda et al. |
| 2018/0099331 A1 | 4/2018 | Hoebel et al. |
| 2018/0102543 A1 | 4/2018 | Su et al. |
| 2018/0104770 A1 | 4/2018 | Liebl et al. |
| 2018/0105903 A9 | 4/2018 | Steinwandel et al. |
| 2018/0111191 A1 | 4/2018 | Mironets et al. |
| 2018/0111193 A1 | 4/2018 | Romano et al. |
| 2018/0111194 A1 | 4/2018 | Buller et al. |
| 2018/0111195 A1 | 4/2018 | Romano et al. |
| 2018/0111196 A1 | 4/2018 | Brezoczky et al. |
| 2018/0111197 A1 | 4/2018 | Romano et al. |
| 2018/0111198 A1 | 4/2018 | Vitanov et al. |
| 2018/0111219 A1 | 4/2018 | Ackelid |
| 2018/0111317 A1 | 4/2018 | Herzog et al. |
| 2018/0111318 A1 | 4/2018 | Herzog et al. |
| 2018/0111319 A1 | 4/2018 | Brezoczky et al. |
| 2018/0111334 A1 | 4/2018 | Gold et al. |
| 2018/0113445 A1 | 4/2018 | Pressacco et al. |
| 2018/0115072 A1 | 4/2018 | Pance et al. |
| 2018/0116762 A1 | 5/2018 | Kopelman |
| 2018/0117674 A1 | 5/2018 | Cavaliere et al. |
| 2018/0117675 A1 | 5/2018 | Foret et al. |
| 2018/0117713 A1 | 5/2018 | Foret et al. |
| 2018/0117845 A1 | 5/2018 | Buller et al. |
| 2018/0122541 A1 | 5/2018 | Chou et al. |
| 2018/0122629 A1 | 5/2018 | Yamazaki |
| 2018/0124341 A1 | 5/2018 | Harding et al. |
| 2018/0125365 A1 | 5/2018 | Hunter et al. |
| 2018/0126460 A1 | 5/2018 | Murphree et al. |
| 2018/0126461 A1 | 5/2018 | Buller et al. |
| 2018/0126462 A1 | 5/2018 | Murphree et al. |
| 2018/0126487 A1 | 5/2018 | Chen et al. |
| 2018/0126637 A1 | 5/2018 | Tyler et al. |
| 2018/0126638 A1 | 5/2018 | Tyler et al. |
| 2018/0126639 A1 | 5/2018 | Tyler |
| 2018/0126640 A1 | 5/2018 | Tyler et al. |
| 2018/0126641 A1 | 5/2018 | Tyler et al. |
| 2018/0126642 A1 | 5/2018 | Tyler et al. |
| 2018/0126648 A1 | 5/2018 | Tyler |
| 2018/0126649 A1 | 5/2018 | Romano et al. |
| 2018/0126650 A1 | 5/2018 | Murphree et al. |
| 2018/0126655 A1 | 5/2018 | Tyler et al. |
| 2018/0126666 A9 | 5/2018 | Swartz et al. |
| 2018/0126720 A1 | 5/2018 | Tyler et al. |
| 2018/0127317 A1 | 5/2018 | Mayr et al. |
| 2018/0128803 A1 | 5/2018 | Foret |
| 2018/0131040 A1 | 5/2018 | Visco et al. |
| 2018/0133583 A1 | 5/2018 | Tran et al. |
| 2018/0133801 A1 | 5/2018 | Buller et al. |
| 2018/0133804 A1 | 5/2018 | van Hassel et al. |
| 2018/0133839 A1 | 5/2018 | Shigeta |
| 2018/0133840 A1 | 5/2018 | Noriyama et al. |
| 2018/0133956 A1 | 5/2018 | Buller et al. |
| 2018/0133958 A1 | 5/2018 | Niitani et al. |
| 2018/0134027 A1 | 5/2018 | O'Neill et al. |
| 2018/0136367 A1 | 5/2018 | Fujii |
| 2018/0136458 A1 | 5/2018 | Plucinski et al. |
| 2018/0141119 A1 | 5/2018 | Shu et al. |

(56) References Cited

U.S. PATENT DOCUMENTS

| | | |
|---|---|---|
| 2018/0141123 A1 | 5/2018 | Revanur et al. |
| 2018/0141126 A1 | 5/2018 | Buller et al. |
| 2018/0141127 A1 | 5/2018 | Richard |
| 2018/0141159 A1 | 5/2018 | Niitani et al. |
| 2018/0141160 A1 | 5/2018 | Karp et al. |
| 2018/0141162 A1 | 5/2018 | Etter et al. |
| 2018/0141174 A1 | 5/2018 | Mori et al. |
| 2018/0141235 A1 | 5/2018 | Guenster et al. |
| 2018/0141274 A1 | 5/2018 | Fink et al. |
| 2018/0141305 A9 | 5/2018 | Swartz et al. |
| 2018/0143147 A1 | 5/2018 | Milner et al. |
| 2018/0144934 A1 | 5/2018 | Dolzhnikov et al. |
| 2018/0147627 A1 | 5/2018 | Nakamura et al. |
| 2018/0147628 A1 | 5/2018 | Saxena et al. |
| 2018/0147653 A1 | 5/2018 | Kitamura et al. |
| 2018/0147654 A1 | 5/2018 | Kitamura et al. |
| 2018/0147655 A1 | 5/2018 | Ackelid |
| 2018/0147669 A1 | 5/2018 | Narayanan et al. |
| 2018/0147779 A1 | 5/2018 | Yamada et al. |
| 2018/0148378 A1 | 5/2018 | Mayr et al. |
| 2018/0148379 A1 | 5/2018 | Schaedler et al. |
| 2018/0148380 A1 | 5/2018 | Eckel et al. |
| 2018/0148585 A1 | 5/2018 | Eckel et al. |
| 2018/0149039 A1 | 5/2018 | Loeffel et al. |
| 2018/0149196 A1 | 5/2018 | Gorges et al. |
| 2018/0151048 A1 | 5/2018 | Winkler |
| 2018/0153205 A1 | 6/2018 | Wu |
| 2018/0154437 A1 | 6/2018 | Mark |
| 2018/0154438 A1 | 6/2018 | Mark |
| 2018/0154439 A1 | 6/2018 | Mark |
| 2018/0154440 A1 | 6/2018 | Gibson et al. |
| 2018/0154441 A1 | 6/2018 | Miller et al. |
| 2018/0154442 A1 | 6/2018 | Milshtein et al. |
| 2018/0154443 A1 | 6/2018 | Milshtein et al. |
| 2018/0154444 A1 | 6/2018 | Jonasson |
| 2018/0154484 A1 | 6/2018 | Hall |
| 2018/0154574 A1 | 6/2018 | Mark |
| 2018/0154580 A1 | 6/2018 | Mark |
| 2018/0154591 A1 | 6/2018 | Hauber et al. |
| 2018/0154657 A1 | 6/2018 | Iio et al. |
| 2018/0159016 A1 | 6/2018 | Cauchon et al. |
| 2018/0161873 A1 | 6/2018 | Brown et al. |
| 2018/0161874 A1* | 6/2018 | Nuechterlein ......... B33Y 10/00 |
| 2018/0161875 A1 | 6/2018 | Buller et al. |
| 2018/0161931 A1 | 6/2018 | Li et al. |
| 2018/0161932 A1 | 6/2018 | Ohno et al. |
| 2018/0161934 A1 | 6/2018 | Boswell |
| 2018/0161935 A1 | 6/2018 | Brown et al. |
| 2018/0161954 A1 | 6/2018 | Bajaj et al. |
| 2018/0162013 A1 | 6/2018 | Fulop et al. |
| 2018/0162044 A1 | 6/2018 | Gibson et al. |
| 2018/0162047 A1 | 6/2018 | Gibson et al. |
| 2018/0162048 A1 | 6/2018 | Gibson et al. |
| 2018/0162053 A1 | 6/2018 | Fujita et al. |
| 2018/0162771 A1 | 6/2018 | Fujii |
| 2018/0163311 A1 | 6/2018 | Engel et al. |
| 2018/0166251 A1 | 6/2018 | Yuan et al. |
| 2018/0166665 A1 | 6/2018 | Audebert et al. |
| 2018/0168254 A1 | 6/2018 | Pandolfino |
| 2018/0168294 A1 | 6/2018 | Pandolfino |
| 2018/0169351 A1 | 6/2018 | Hyde et al. |
| 2018/0169756 A1 | 6/2018 | Palys |
| 2018/0169784 A1 | 6/2018 | Ekberg |
| 2018/0169950 A1 | 6/2018 | Meisner et al. |
| 2018/0169951 A1 | 6/2018 | Niitani |
| 2018/0169952 A1 | 6/2018 | Engel et al. |
| 2018/0169960 A1 | 6/2018 | Seefried et al. |
| 2018/0169970 A1 | 6/2018 | Harding et al. |
| 2018/0170107 A1 | 6/2018 | Costlow et al. |
| 2018/0170914 A1 | 6/2018 | Miyata et al. |
| 2018/0172369 A1 | 6/2018 | Rhoden et al. |
| 2018/0175333 A1 | 6/2018 | Sodeyama et al. |
| 2018/0178284 A1 | 6/2018 | Martin et al. |
| 2018/0178285 A1 | 6/2018 | Martin et al. |
| 2018/0178286 A1 | 6/2018 | Martin et al. |
| 2018/0178287 A1 | 6/2018 | Mamrak et al. |
| 2018/0178288 A1 | 6/2018 | Lacy et al. |
| 2018/0178325 A1 | 6/2018 | Wahl et al. |
| 2018/0178326 A1 | 6/2018 | Wahl et al. |
| 2018/0178413 A1 | 6/2018 | Kalyanaraman et al. |
| 2018/0178491 A1 | 6/2018 | Lacy et al. |
| 2018/0179332 A1 | 6/2018 | Priedeman, Jr. |
| 2018/0179956 A1 | 6/2018 | Wertz |
| 2018/0180803 A1 | 6/2018 | Victor et al. |
| 2018/0180812 A1 | 6/2018 | Schowengerdt et al. |
| 2018/0180813 A1 | 6/2018 | Gross et al. |
| 2018/0180874 A1 | 6/2018 | Schowengerdt et al. |
| 2018/0180896 A1 | 6/2018 | Karlsen et al. |
| 2018/0183062 A1 | 6/2018 | Zhamu et al. |
| 2018/0185098 A1 | 7/2018 | Buck |
| 2018/0185875 A1 | 7/2018 | Murakami et al. |
| 2018/0185893 A1 | 7/2018 | Vincent |
| 2018/0185921 A1 | 7/2018 | Tong |
| 2018/0185961 A1 | 7/2018 | Meidani et al. |
| 2018/0185965 A1 | 7/2018 | Victor et al. |
| 2018/0186067 A1 | 7/2018 | Buller et al. |
| 2018/0186078 A1 | 7/2018 | Herzog et al. |
| 2018/0186080 A1 | 7/2018 | Miishtein et al. |
| 2018/0186081 A1 | 7/2018 | Miishtein et al. |
| 2018/0186082 A1 | 7/2018 | Randhawa |
| 2018/0186120 A1 | 7/2018 | Dua et al. |
| 2018/0187569 A1 | 7/2018 | Ucok et al. |
| 2018/0193916 A1 | 7/2018 | Lou et al. |
| 2018/0193923 A1 | 7/2018 | Koch et al. |
| 2018/0193953 A1 | 7/2018 | Boswell |
| 2018/0193954 A1 | 7/2018 | Yuan et al. |
| 2018/0193955 A1 | 7/2018 | Karp et al. |
| 2018/0194080 A1 | 7/2018 | El-Siblani et al. |
| 2018/0195186 A1 | 7/2018 | Zhang et al. |
| 2018/0195684 A1 | 7/2018 | Vissenberg et al. |
| 2018/0200790 A1 | 7/2018 | Hart et al. |
| 2018/0200791 A1 | 7/2018 | Redding et al. |
| 2018/0200792 A1 | 7/2018 | Redding et al. |
| 2018/0200793 A1 | 7/2018 | Redding et al. |
| 2018/0200794 A1 | 7/2018 | Spears |
| 2018/0200796 A1 | 7/2018 | Backlund et al. |
| 2018/0200797 A1 | 7/2018 | Backlund et al. |
| 2018/0200798 A1 | 7/2018 | Sharon et al. |
| 2018/0200800 A1 | 7/2018 | Hart et al. |
| 2018/0200836 A1 | 7/2018 | Garcia et al. |
| 2018/0200960 A1 | 7/2018 | DeFelice et al. |
| 2018/0202076 A1 | 7/2018 | Van Der Schaaf et al. |
| 2018/0202234 A1 | 7/2018 | Saini et al. |
| 2018/0202293 A1 | 7/2018 | Joshi et al. |
| 2018/0207725 A1 | 7/2018 | Chen et al. |
| 2018/0207749 A1 | 7/2018 | Wasynczuk |
| 2018/0207750 A1 | 7/2018 | Carter |
| 2018/0207850 A1 | 7/2018 | Stockett et al. |
| 2018/0207862 A1 | 7/2018 | Tyler et al. |
| 2018/0207863 A1 | 7/2018 | Porter et al. |
| 2018/0207865 A1 | 7/2018 | Tyler et al. |
| 2018/0207866 A1 | 7/2018 | Tyler et al. |
| 2018/0207868 A1 | 7/2018 | Tyler et al. |
| 2018/0208762 A1 | 7/2018 | Pomestchenko et al. |
| 2018/0208785 A1 | 7/2018 | Chopra et al. |
| 2018/0209057 A1 | 7/2018 | Tripathy et al. |
| 2018/0209381 A1 | 7/2018 | Jones |
| 2018/0209498 A1 | 7/2018 | Zandbergen et al. |
| 2018/0212184 A1 | 7/2018 | Kondo et al. |
| 2018/0212250 A1 | 7/2018 | Zhamu et al. |
| 2018/0214351 A1 | 8/2018 | Fik et al. |
| 2018/0214874 A1 | 8/2018 | Koksal et al. |
| 2018/0214946 A1 | 8/2018 | Spears |
| 2018/0214947 A1 | 8/2018 | Haro Gonzalez et al. |
| 2018/0214950 A1 | 8/2018 | Karlsen et al. |
| 2018/0214951 A1 | 8/2018 | Koponen et al. |
| 2018/0214955 A1 | 8/2018 | Kottilingam et al. |
| 2018/0214984 A1 | 8/2018 | Haro Gonzalez |
| 2018/0214985 A1 | 8/2018 | Victor et al. |
| 2018/0215094 A1 | 8/2018 | Birnbaum et al. |
| 2018/0215103 A1 | 8/2018 | Herzog et al. |
| 2018/0215644 A1 | 8/2018 | Doering et al. |
| 2018/0216501 A1 | 8/2018 | Brown et al. |
| 2018/0219254 A1 | 8/2018 | Tamura et al. |

(56) References Cited

U.S. PATENT DOCUMENTS

| | | |
|---|---|---|
| 2018/0221950 A1 | 8/2018 | Mark |
| 2018/0221985 A1 | 8/2018 | Amira et al. |
| 2018/0226917 A1 | 8/2018 | Jacques |
| 2018/0228570 A1 | 8/2018 | Jones et al. |
| 2018/0228612 A1 | 8/2018 | Jones et al. |
| 2018/0228613 A1 | 8/2018 | Jones et al. |
| 2018/0228701 A1 | 8/2018 | Klee et al. |
| 2018/0228737 A1 | 8/2018 | Giridhar et al. |
| 2018/0229300 A1 | 8/2018 | Myerberg et al. |
| 2018/0229434 A1 | 8/2018 | Tyler |
| 2018/0229436 A1 | 8/2018 | Gu et al. |
| 2018/0236546 A1 | 8/2018 | Mark |
| 2018/0236551 A1 | 8/2018 | Michiels et al. |
| 2018/0236714 A1* | 8/2018 | Thelakkadan .......... B29C 71/04 |
| 2018/0237325 A1 | 8/2018 | Li et al. |
| 2018/0237329 A1 | 8/2018 | Drewnowski et al. |
| 2018/0237567 A1 | 8/2018 | Klee et al. |
| 2018/0240691 A1 | 8/2018 | Flitsch |
| 2018/0243094 A1 | 8/2018 | Jones et al. |
| 2018/0243097 A1 | 8/2018 | Jones et al. |
| 2018/0243977 A1 | 8/2018 | Meinders et al. |
| 2018/0243991 A1 | 8/2018 | Troukens et al. |
| 2018/0244862 A1 | 8/2018 | Price |
| 2018/0244863 A1 | 8/2018 | Leenders |
| 2018/0250737 A1 | 9/2018 | Moosman |
| 2018/0250739 A1 | 9/2018 | Saurwalt et al. |
| 2018/0250744 A1 | 9/2018 | Symeonidis et al. |
| 2018/0250745 A1 | 9/2018 | Spink et al. |
| 2018/0250746 A1 | 9/2018 | Symeonidis et al. |
| 2018/0250771 A1 | 9/2018 | Brown et al. |
| 2018/0250772 A1 | 9/2018 | Symeonidis et al. |
| 2018/0250773 A1 | 9/2018 | Symeonidis et al. |
| 2018/0250774 A1 | 9/2018 | Symeonidis et al. |
| 2018/0250775 A1 | 9/2018 | Spink et al. |
| 2018/0250890 A1 | 9/2018 | Claussen et al. |
| 2018/0251645 A1 | 9/2018 | Magdassi et al. |
| 2018/0252398 A1 | 9/2018 | Golle et al. |
| 2018/0257138 A1 | 9/2018 | Mark |
| 2018/0257297 A1 | 9/2018 | Matheu |
| 2018/0264679 A1 | 9/2018 | van Rooyen et al. |
| 2018/0264719 A1 | 9/2018 | Rolland et al. |
| 2018/0264778 A1 | 9/2018 | Ishikawa et al. |
| 2018/0265417 A1 | 9/2018 | Champion et al. |
| 2018/0265738 A1 | 9/2018 | Rolland et al. |
| 2018/0267373 A1 | 9/2018 | Yoshida |
| 2018/0272464 A1 | 9/2018 | Bruck |
| 2018/0272610 A1 | 9/2018 | El-Siblani et al. |
| 2018/0272652 A1 | 9/2018 | Lyons et al. |
| 2018/0273422 A1 | 9/2018 | Hori et al. |
| 2018/0273425 A1 | 9/2018 | Mishiro et al. |
| 2018/0273707 A1 | 9/2018 | Price |
| 2018/0281236 A1 | 10/2018 | Elgar et al. |
| 2018/0281237 A1 | 10/2018 | Frechman et al. |
| 2018/0281282 A1 | 10/2018 | Elgar et al. |
| 2018/0281283 A1 | 10/2018 | Frechman et al. |
| 2018/0281284 A1 | 10/2018 | Elgar et al. |
| 2018/0281294 A1 | 10/2018 | Gottschalk-Gaudig et al. |
| 2018/0282604 A1 | 10/2018 | Schulz et al. |
| 2018/0289493 A1 | 10/2018 | Mansmann |
| 2018/0290212 A1 | 10/2018 | Jaworowski et al. |
| 2018/0290373 A1 | 10/2018 | El-Siblani et al. |
| 2018/0291195 A1 | 10/2018 | Schulz et al. |
| 2018/0296343 A1 | 10/2018 | Wei |
| 2018/0297113 A1 | 10/2018 | Preston et al. |
| 2018/0297114 A1 | 10/2018 | Preston et al. |
| 2018/0297117 A1 | 10/2018 | Kanko et al. |
| 2018/0297272 A1 | 10/2018 | Preston et al. |
| 2018/0297296 A1 | 10/2018 | Schwerdtfeger et al. |
| 2018/0303491 A1 | 10/2018 | Marien et al. |
| 2018/0303616 A1 | 10/2018 | Bhattacharyya et al. |
| 2018/0304353 A1 | 10/2018 | LaPlante |
| 2018/0304359 A1 | 10/2018 | Gibson et al. |
| 2018/0304360 A1 | 10/2018 | Fontana et al. |
| 2018/0304361 A1 | 10/2018 | Gibson et al. |
| 2018/0304363 A1 | 10/2018 | Myerberg et al. |
| 2018/0304364 A1 | 10/2018 | Myerberg et al. |
| 2018/0304365 A1 | 10/2018 | Brzezinski et al. |
| 2018/0304369 A1 | 10/2018 | Myerberg et al. |
| 2018/0304370 A1 | 10/2018 | Myerberg et al. |
| 2018/0304537 A1 | 10/2018 | Rubinsky et al. |
| 2018/0304540 A1 | 10/2018 | Tobia et al. |
| 2018/0305266 A1 | 10/2018 | Gibson et al. |
| 2018/0307209 A1 | 10/2018 | Chin et al. |
| 2018/0309202 A1 | 10/2018 | Pance et al. |
| 2018/0311731 A1 | 11/2018 | Spicer et al. |
| 2018/0311735 A1 | 11/2018 | Mitsui et al. |
| 2018/0311738 A1 | 11/2018 | Myerberg et al. |
| 2018/0312660 A1 | 11/2018 | Schulz et al. |
| 2018/0318657 A1 | 11/2018 | Madson et al. |
| 2018/0318922 A1 | 11/2018 | Valls Angles |
| 2018/0318925 A1 | 11/2018 | Myerberg et al. |
| 2018/0318928 A1 | 11/2018 | Christiansen et al. |
| 2018/0318932 A1 | 11/2018 | Myerberg et al. |
| 2018/0318933 A1 | 11/2018 | Myerberg et al. |
| 2018/0319108 A1 | 11/2018 | Sherrer et al. |
| 2018/0319132 A1 | 11/2018 | Mori et al. |
| 2018/0319150 A1 | 11/2018 | Buller et al. |
| 2018/0320006 A1 | 11/2018 | Lee et al. |
| 2018/0323514 A1 | 11/2018 | Pance et al. |
| 2018/0326488 A1 | 11/2018 | Lappas et al. |
| 2018/0326663 A1 | 11/2018 | DeMuth et al. |
| 2018/0326664 A1 | 11/2018 | DeMuth et al. |
| 2018/0326665 A1 | 11/2018 | Gatenholm et al. |
| 2018/0326668 A1 | 11/2018 | Walker et al. |
| 2018/0333911 A1 | 11/2018 | Lin et al. |
| 2018/0333912 A1 | 11/2018 | Lin et al. |
| 2018/0333913 A1 | 11/2018 | Lin et al. |
| 2018/0335659 A1 | 11/2018 | Takeda et al. |
| 2018/0337110 A1 | 11/2018 | Chen et al. |
| 2018/0338196 A1 | 11/2018 | Freedman |
| 2018/0345367 A1 | 12/2018 | Connor et al. |
| 2018/0345382 A1 | 12/2018 | Roychowdhury et al. |
| 2018/0345405 A1 | 12/2018 | Ostroverkhov et al. |
| 2018/0345575 A1 | 12/2018 | Constantinou et al. |
| 2018/0345576 A1 | 12/2018 | Constantinou et al. |
| 2018/0353391 A1 | 12/2018 | Renn et al. |
| 2018/0354304 A1 | 12/2018 | Hatdet et al. |
| 2018/0354860 A1 | 12/2018 | Wang et al. |
| 2018/0355199 A1 | 12/2018 | Stasiak |
| 2018/0360609 A1 | 12/2018 | Steines et al. |
| 2018/0361510 A1 | 12/2018 | Stamp et al. |
| 2018/0361660 A1 | 12/2018 | Chen et al. |
| 2018/0361661 A1 | 12/2018 | Nowak et al. |
| 2018/0361666 A1 | 12/2018 | Adzima |
| 2018/0361674 A1 | 12/2018 | Jaker et al. |
| 2018/0361727 A1* | 12/2018 | Tilita .................. G06F 30/00 |
| 2018/0363361 A1 | 12/2018 | Heckman et al. |
| 2018/0369918 A1 | 12/2018 | Gold |
| 2018/0370114 A1 | 12/2018 | Hopkins et al. |
| 2018/0370120 A1 | 12/2018 | Pawloski et al. |
| 2018/0370125 A1 | 12/2018 | Rolland et al. |
| 2018/0370147 A1 | 12/2018 | Peter et al. |
| 2018/0370846 A1 | 12/2018 | Harrison et al. |
| 2018/0370860 A1 | 12/2018 | Pegna et al. |
| 2018/0371244 A1 | 12/2018 | Leenders et al. |
| 2018/0374262 A1 | 12/2018 | Ezair et al. |
| 2019/0000166 A1 | 1/2019 | Pandolfino |
| 2019/0001412 A1 | 1/2019 | Gibson et al. |
| 2019/0001553 A1 | 1/2019 | Robeson et al. |
| 2019/0001563 A1 | 1/2019 | Stockett et al. |
| 2019/0001564 A1 | 1/2019 | Stockett et al. |
| 2019/0001570 A1 | 1/2019 | Branham et al. |
| 2019/0001576 A1 | 1/2019 | Eller et al. |
| 2019/0002353 A1 | 1/2019 | Eckel et al. |
| 2019/0009472 A1 | 1/2019 | Mark |
| 2019/0010270 A1 | 1/2019 | Ely et al. |
| 2019/0017185 A1 | 1/2019 | Takshi et al. |
| 2019/0019736 A1 | 1/2019 | Schrauben et al. |
| 2019/0020105 A1 | 1/2019 | Pance et al. |
| 2019/0022427 A1 | 1/2019 | Maharbiz et al. |
| 2019/0022428 A1 | 1/2019 | Maharbiz et al. |
| 2019/0022725 A1 | 1/2019 | Bauer et al. |
| 2019/0022926 A1 | 1/2019 | Frauens |
| 2019/0022979 A1 | 1/2019 | Luzzato et al. |

(56) References Cited

U.S. PATENT DOCUMENTS

| | | |
|---|---|---|
| 2019/0026499 A1 | 1/2019 | Flitsch |
| 2019/0030498 A1 | 1/2019 | Kariya et al. |
| 2019/0030601 A1 | 1/2019 | Mark |
| 2019/0030602 A1 | 1/2019 | Sachs et al. |
| 2019/0030605 A1 | 1/2019 | TenHouten et al. |
| 2019/0030809 A1 | 1/2019 | Gasso et al. |
| 2019/0030810 A1 | 1/2019 | Gasso et al. |
| 2019/0030811 A1 | 1/2019 | Gasso et al. |
| 2019/0031844 A1 | 1/2019 | Kato et al. |
| 2019/0031908 A1 | 1/2019 | Louis et al. |
| 2019/0031911 A1 | 1/2019 | Rolland et al. |
| 2019/0033719 A1 | 1/2019 | Cole |
| 2019/0033737 A1 | 1/2019 | Iguchi et al. |
| 2019/0039182 A1 | 2/2019 | Rockstroh et al. |
| 2019/0039294 A1 | 2/2019 | Stasiak |
| 2019/0039367 A1 | 2/2019 | Roman et al. |
| 2019/0047047 A1 | 2/2019 | Mark |
| 2019/0047212 A1 | 2/2019 | Bartos |
| 2019/0047214 A1 | 2/2019 | Franke et al. |
| 2019/0047277 A1 | 2/2019 | El-Siblani |

\* cited by examiner

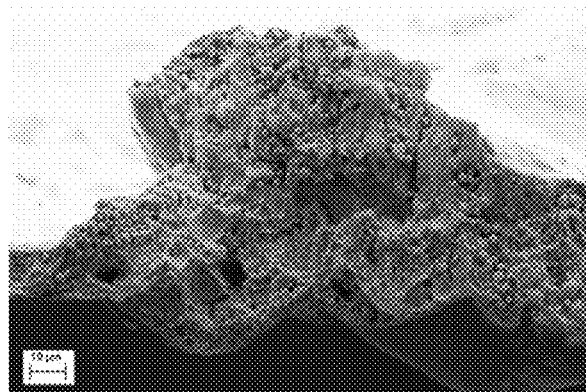 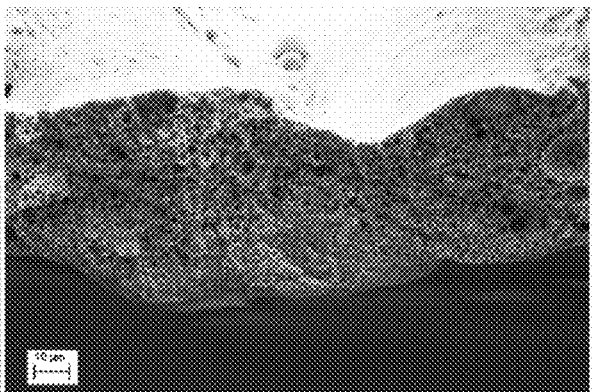
| Sample | Power [W] | Scan speed [mm/s] | Exposure | Hatch distance [mm] | Layer thickness [μm] | Energy density [J/mm³] |
|---|---|---|---|---|---|---|
| 1 | 150 | 5250 | Double | 0.09 | 20 | 15.87 |
| 2 | 120 | 1700 | Double | 0.09 | 20 | 39.21 |
Fig. 3A           Fig. 3B
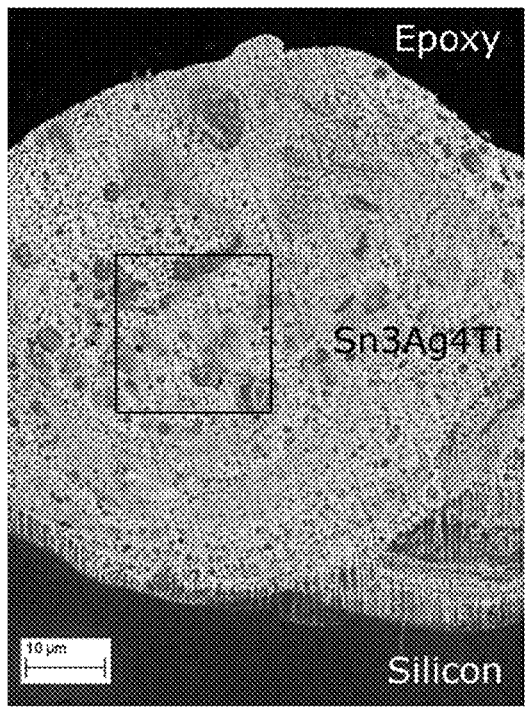
| Element | Wt% - EDS | At% - EDS |
|---|---|---|
| Sn | 91.13 (L shell) | 83.14 (L shell) |
| Ti | 6.33 (K shell) | 14.30 (K shell) |
| Ag | 2.55 (L shell) | 2.56 (L shell) |
Fig. 4

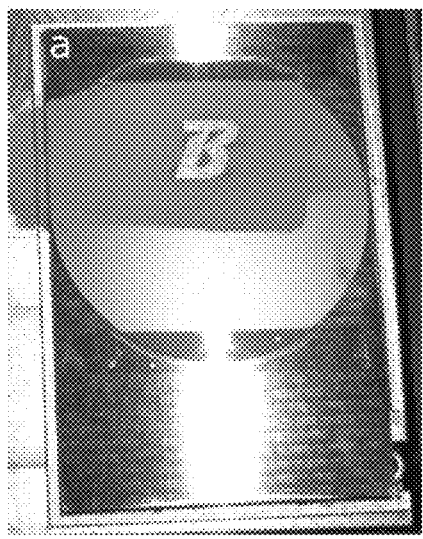
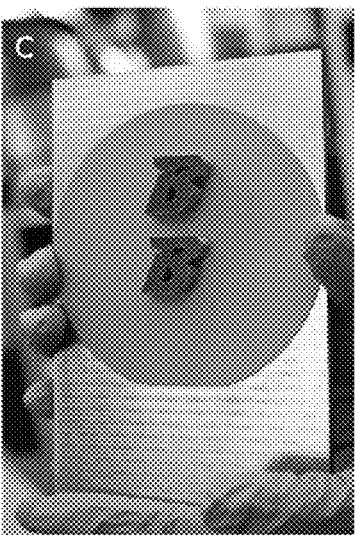
Fig. 5A    Fig. 5B    Fig. 5C
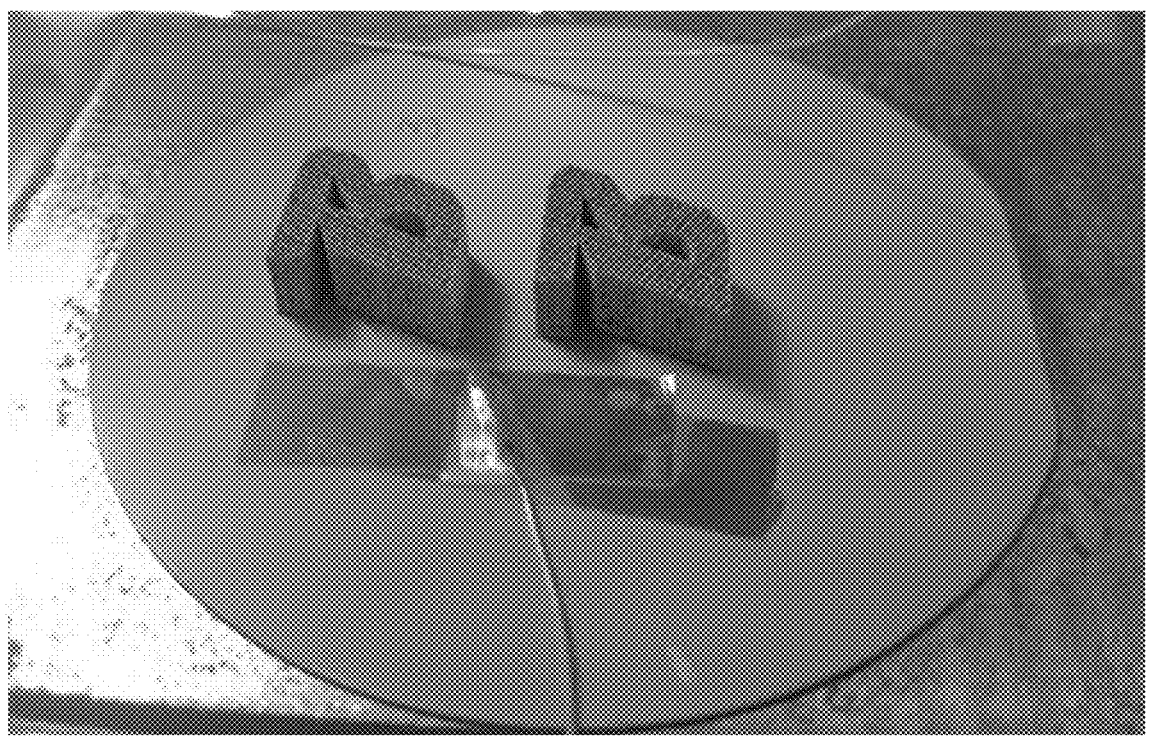
Fig. 6

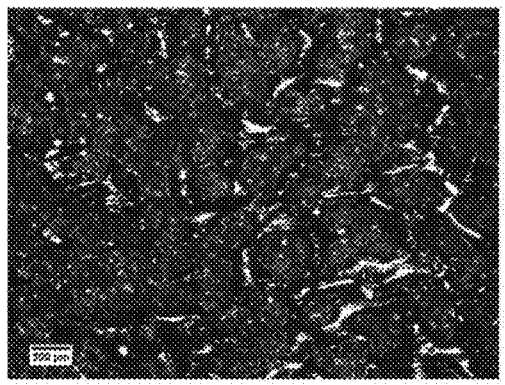
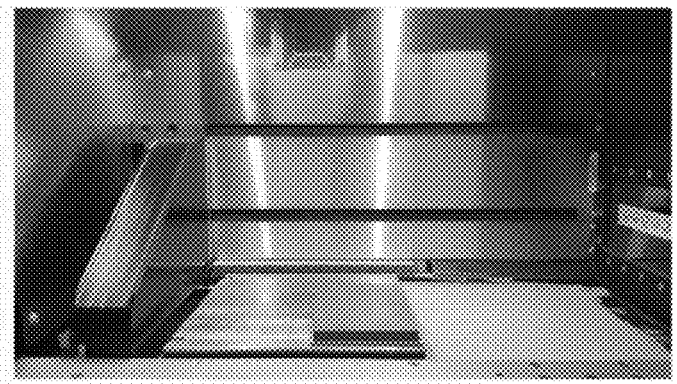
Fig. 13A　　　　　　　　　　　Fig. 13B
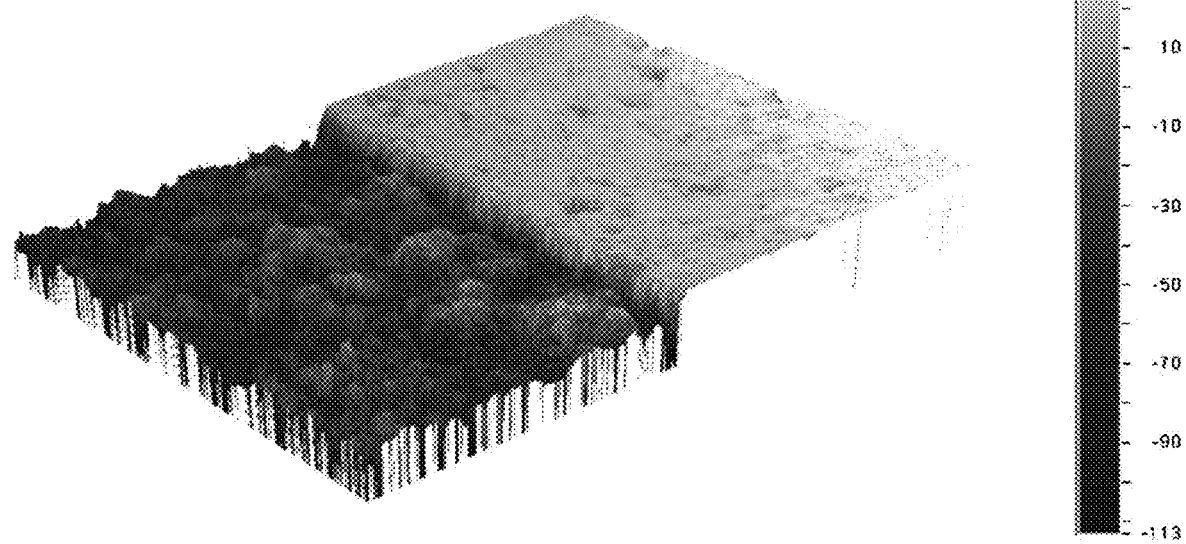
Fig. 14
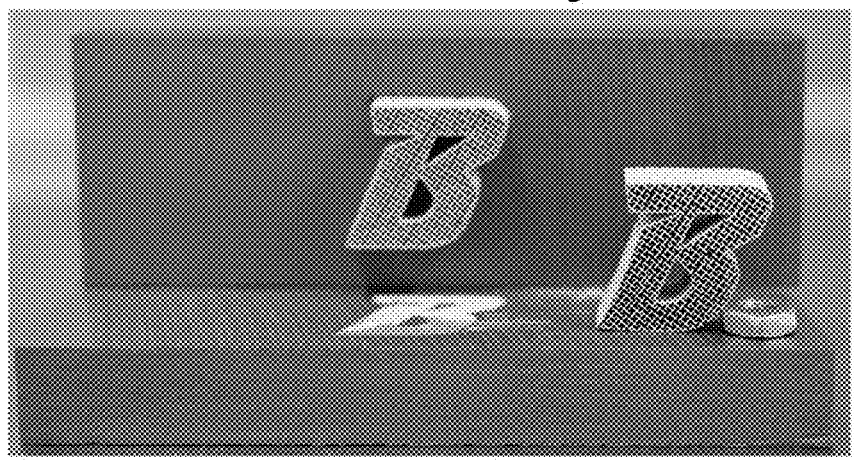
Fig. 15A　　　　　　　　　　　Fig. 15B

| Element | C | Ag | Sn | Ti |
|---|---|---|---|---|
| At% | 25.85 | 00.00 | 61.92 | 12.22 |
| Wt% | 03.77 | 00.00 | 89.13 | 07.10 |

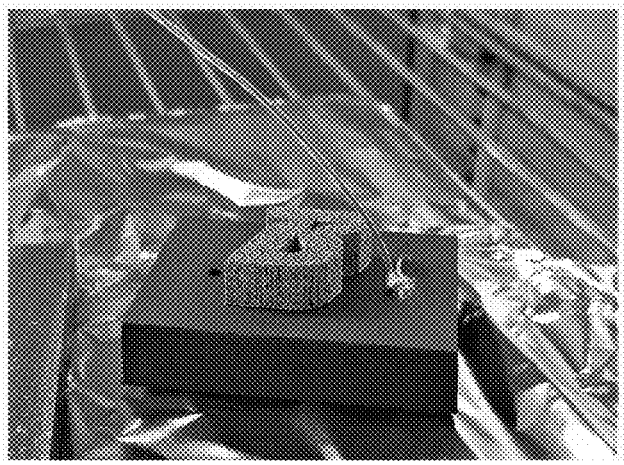 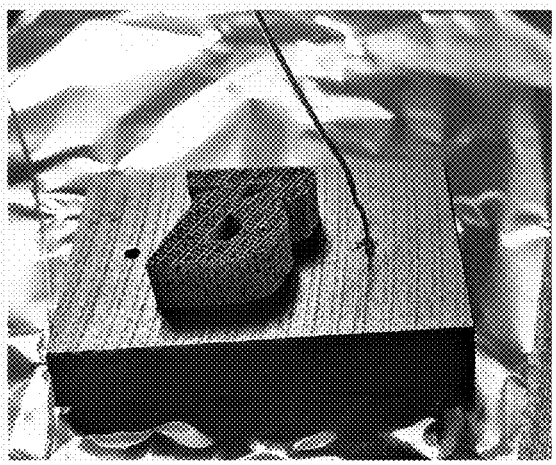
Fig. 22A  Fig. 22B
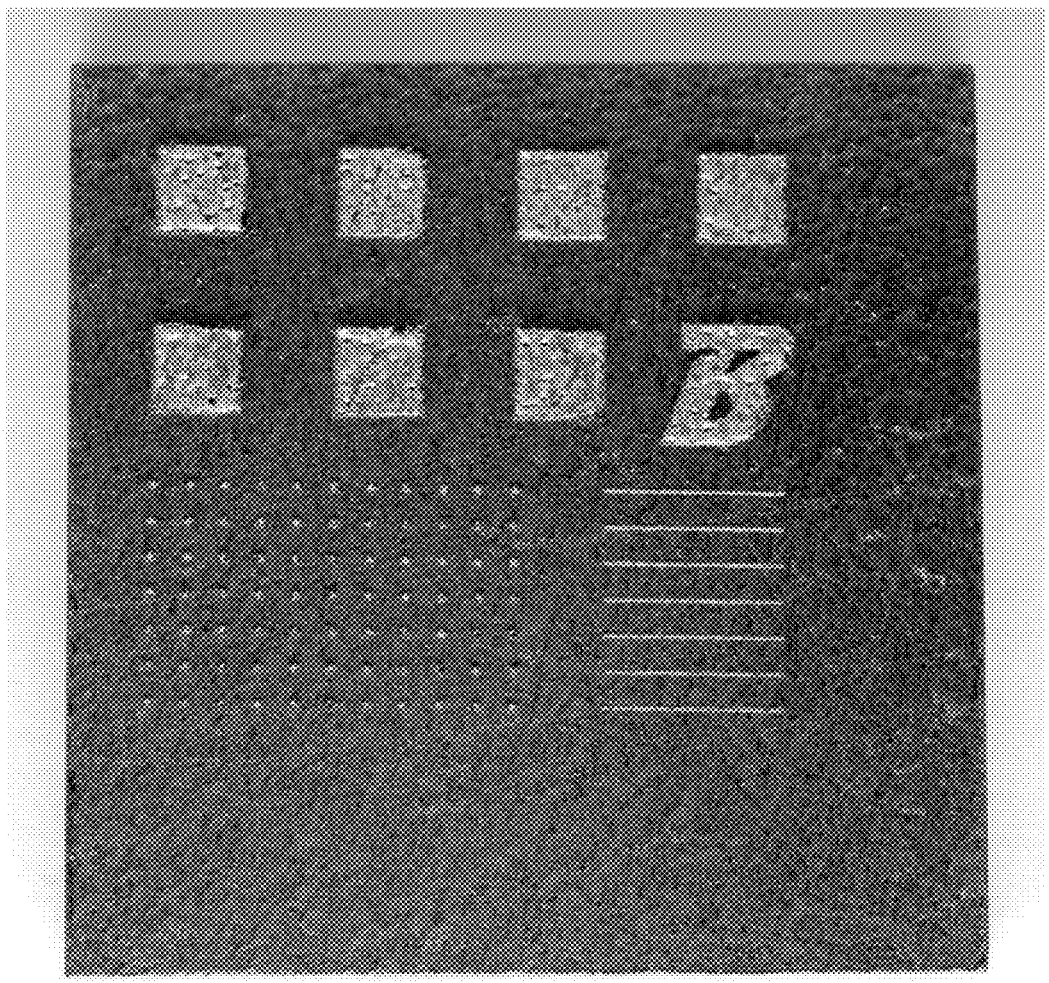
Fig. 23

ADDITIVE MANUFACTURING PROCESSES AND ADDITIVELY MANUFACTURED PRODUCTS

CROSS REFERENCE TO RELATED APPLICATIONS

The present application is a non-provisional of, and claims benefit or priority from each of U.S. Provisional Patent Application No. 62/806,901, filed Feb. 17, 2019, and U.S. Provisional Patent Application No. 62/717,444, filed Aug. 10, 2019, each of which is expressly incorporated herein by reference in its entirety.

FIELD OF THE INVENTION

The present invention relates to the field of additive manufacturing, and more particularly to additive manufacturing by controlled focused energy (e.g., laser or electron-beam) melting of particles, on a dissimilar substrate, specifically glasses and ceramics.

BACKGROUND OF THE INVENTION

Each reference cited herein is expressly incorporated by reference in its entirety, for all purposes.

Additive manufacturing is well known. See the following U.S. patents and published patent applications; U.S. Pat. Nos. 10,000,023; 10,005,227; 10,005,228; 10,005,230; 10,005,237; 10,011,076; 10,011,089; 10,011,352; 10,016, 262; 10,016,661; 10,016,942; 10,018,937; 10,022,614; 10,023,739; 10,029,422; 10,029,424; 10,029,461; 10,035, 306; 10,035,920; 10,039,195; 10,040,239; 10,040,240; 10,040,250; 10,040,252; 10,040,810; 10,045,835; 10,046, 494; 10,046,521; 10,046,524; 10,052,159; 10,052,691; 10,054,530; 10,058,920; 10,059,053; 10,059,057; 10,059, 092; 10,059,595; 10,060,217; 10,061,221; 10,064,745; 10,065,270; 10,065,367; 10,065,371; 10,068,863; 10,071, 422; 10,076,875; 10,076,876; 10,081,129; 10,086,564; 10,087,556; 10,089,413; 10,091,891; 10,093,039; 10,096, 537; 10,099,309; 10,099,427; 10,105,902; 10,105,906; 10,112,345; 10,112,379; 10,118,054; 10,118,337; 10,123, 807; 10,124,408; 10,124,410; 10,124,532; 10,124,539; 10,131,088; 10,131,131; 10,132,578; 10,135,109; 10,136, 689; 10,137,634; 10,137,636; 10,137,642; 10,144,178; 10,144,205; 10,144,828; 10,144,840; 10,145,271; 10,149, 505; 10,150,258; 10,151,049; 10,151,377; 10,153,608; 10,155,882; 10,156,185; 10,157,503; 10,160,061; 10,160, 193; 10,172,400; 10,173,945; 10,174,205; 10,174,276; 10,179,640; 10,182,869; 10,183,330; 10,183,443; 10,183, 477; 10,189,057; 10,189,114; 10,189,204; 10,189,210; 10,189,239; 10,190,244; 10,190,955; 10,195,629; 10,195, 693; 10,200,834; 10,201,409; 10,201,931; 4,748,085; 4,863, 538; 4,938,816; 4,944,817; 5,053,090; 5,076,869; 5,132, 143; 5,147,587; 5,155,321; 5,155,324; 5,156,697; 5,182, 170; 5,207,371; 5,281,789; 5,296,062; 5,316,580; 5,382, 308; 5,431,967; 5,433,280; 5,544,550; 5,597,589; 5,616, 294; 5,622,577; 5,639,070; 5,730,925; 5,957,006; 6,046, 426; 6,085,122; 6,143,378; 6,144,008; 6,202,734; 6,215, 093; 6,261,493; 6,341,952; 6,391,251; 6,397,922; 6,454, 811; 6,459,069; 6,476,343; 6,583,379; 6,596,224; 6,629, 559; 6,676,892; 6,730,252; 6,756,561; 6,767,499; 6,811, 744; 6,814,823; 6,830,643; 6,925,346; 6,930,278; 6,995, 334; 7,020,539; 7,034,246; 7,043,330; 7,045,738; 7,212, 095; 7,305,367; 7,537,664; 7,695,248; 7,705,264; 7,716, 802; 7,777,155; 7,968,026; 8,021,138; 8,071,007; 8,124, 245; 8,211,226; 8,268,099; 8,268,100; 8,326,024; 8,359, 744; 8,372,330; 8,375,581; 8,383,985; 8,387,229; 8,394, 168; 8,457,930; 8,479,393; 8,480,754; 8,488,994; 8,509, 933; 8,513,562; 8,535,049; 8,546,717; 8,556,981; 8,556, 983; 8,575,513; 8,598,523; 8,606,540; 8,610,761; 8,617, 661; 8,623,026; 8,642,965; 8,666,142; 8,671,726; 8,678, 802; 8,685,520; 8,690,472; 8,691,333; 8,718,522; 8,728, 387; 8,728,807; 8,735,773; 8,740,598; 8,746,013; 8,753, 105; 8,775,133; 8,790,858; 8,801,418; 8,809,780; 8,821, 060; 8,822,875; 8,826,511; 8,828,311; 8,844,877; 8,875, 976; 8,879,957; 8,906,107; 8,915,728; 8,916,085; 8,926, 706; 8,931,171; 8,931,880; 8,952,678; 8,974,539; 8,985, 497; 8,986,234; 8,992,703; 9,020,788; 9,023,566; 9,029, 058; 9,034,048; 9,061,465; 9,073,150; 9,073,260; 9,073, 261; 9,073,262; 9,075,409; 9,079,248; 9,079,355; 9,079, 386; 9,090,428; 9,102,099; 9,107,725; 9,112,272; 9,114, 478; 9,114,567; 9,120,270; 9,126,365; 9,126,367; 9,133, 429; 9,141,015; 9,144,940; 9,144,961; 9,149,952; 9,149, 988; 9,156,205; 9,156,240; 9,157,465; 9,157,735; 9,168, 697; 9,180,010; 9,186,270; 9,186,846; 9,186,848; 9,192, 990; 9,192,999; 9,196,760; 9,199,044; 9,199,345; 9,204, 945; 9,205,204; 9,211,669; 9,221,100; 9,222,932; 9,227, 339; 9,227,365; 9,228,859; 9,233,506; 9,248,611; 9,254, 535; 9,269,520; 9,278,483; 9,279,328; 9,283,593; 9,296, 039; 9,296,129; 9,302,338; 9,308,583; 9,308,691; 9,310, 188; 9,315,043; 9,320,620; 9,326,780; 9,327,056; 9,327, 350; 9,327,447; 9,327,452; 9,327,453; 9,332,251; 9,341, 467; 9,346,116; 9,346,127; 9,347,770; 9,352,421; 9,358, 350; 9,364,888; 9,369,259; 9,370,896; 9,375,298; 9,375, 782; 9,387,079; 9,390,312; 9,399,256; 9,399,264; 9,399, 321; 9,403,235; 9,406,483; 9,414,501; 9,415,438; 9,419, 502; 9,421,715; 9,423,756; 9,439,767; 9,440,397; 9,442, 105; 9,442,395; 9,446,475; 9,452,474; 9,452,489; 9,453, 142; 9,456,777; 9,456,901; 9,457,428; 9,457,521; 9,460, 557; 9,463,506; 9,481,931; 9,482,103; 9,482,974; 9,486, 878; 9,486,944; 9,486,964; 9,499,779; 9,507,061; 9,507, 274; 9,508,667; 9,511,543; 9,511,547; 9,512,544; 9,517, 134; 9,523,934; 9,527,165; 9,527,240; 9,527,242; 9,527, 244; 9,527,246; 9,528,705; 9,528,902; 9,533,350; 9,533, 372; 9,533,450; 9,533,485; 9,533,526; 9,543,116; 9,545, 669; 9,555,475; 9,555,612; 9,556,415; 9,557,331; 9,557, 661; 9,561,622; 9,561,623; 9,566,758; 9,570,789; 9,573, 193; 9,573,224; 9,573,225; 9,578,695; 9,579,718; 9,579, 829; 9,579,851; 9,583,856; 9,586,285; 9,586,290; 9,586, 298; 9,586,364; 9,587,317; 9,592,530; 9,598,606; 9,603, 711; 9,604,280; 9,617,865; 9,623,512; 9,625,156; 9,626, 608; 9,636,229; 9,636,769; 9,636,770; 9,636,775; 9,636, 868; 9,642,727; 9,643,281; 9,643,361; 9,649,690; 9,656, 429; 9,662,840; 9,664,504; 9,664,505; 9,669,583; 9,676, 145; 9,676,159; 9,676,963; 9,682,166; 9,688,028; 9,690, 286; 9,694,423; 9,694,545; 9,696,142; 9,707,717; 9,708, 440; 9,713,843; 9,714,318; 9,715,563; 9,718,127; 9,720, 363; 9,721,384; 9,721,755; 9,731,377; 9,732,239; 9,737, 934; 9,744,722; 9,744,730; 9,751,610; 9,757,802; 9,764, 418; 9,764,515; 9,765,727; 9,770,758; 9,770,760; 9,770, 866; 9,771,400; 9,771,629; 9,772,621; 9,775,680; 9,776, 243; 9,776,282; 9,776,376; 9,777,385; 9,782,932; 9,782, 935; 9,783,718; 9,783,885; 9,785,064; 9,788,600; 9,795, 541; 9,796,048; 9,802,253; 9,808,991; 9,815,118; 9,815, 139; 9,815,268; 9,821,399; 9,821,411; 9,821,546; 9,822, 045; 9,827,754; 9,828,679; 9,833,839; 9,833,949; 9,833, 987; 9,836,883; 9,838,018; 9,839,977; 9,849,510; 9,849, 543; 9,850,172; 9,855,369; 9,855,625; 9,855,698; 9,861, 452; 9,862,146; 9,868,255; 9,869,734; 9,873,180; 9,873, 228; 9,873,281; 9,873,761; 9,877,790; 9,878,497; 9,882, 111; 9,885,987; 9,890,091; 9,896,944; 9,897,513; 9,902, 112; 9,902,588; 9,903,214; 9,903,574; 9,904,223; 9,915, 583; 9,919,111; 9,919,112; 9,919,273; 9,919,360; 9,919, 361; 9,919,479; 9,920,433; 9,922,759; 9,925,714; 9,925,724; 9,926,427; 9,931,695; 9,931,697; 9,931,814; 9,932,841; 9,933,718; 9,937,580; 9,943,981; 9,944,021; 9,945,032; 9,950,367; 9,950,465; 9,953,899; 9,956,047; 9,956,048; 9,956,107; 9,956,612; 9,9567,25; 9,956,727; 9,959,613; 9,962,767; 9,969,000; 9,969,153; 9,969,930; 9,970,824; 9,975,179; 9,975,199; 9,975,296; 9,975,323; 9,981,425; 9,982,164; 9,982,684; 9,987,798; 9,987,804; 9,988,720; 9,993,976; 9,993,982; 9,994,339; 9,996,981; 9,999,920; 20010008230; 20010008317; 20020015654; 20030114936; 20030116542; 20030206820; 20040056022; 20040099996; 20040133298; 20040191106; 20050133527; 20050174208; 20060032838; 20060081571; 20060147332; 20060166159; 20060185473; 20070134096; 20070141375; 20070142914; 20070151087; 20070183918; 20070203584; 20080008894; 20080052904; 20080201008; 20080210413; 20080213718; 20080317951; 20090206065; 20090283501; 20090286008; 20100010638; 20100068464; 20100125356; 20100143601; 20100221567; 20100242843; 20100262054; 20100262272; 20100291286; 20100291401; 20100305742; 20110014081; 20110016939; 20110029093; 20110047799; 20110061591; 20110087332; 20110089610; 20110114839; 20110136162; 20110166824; 20110169924; 20110259862; 20110291331; 20110293840; 20110295378; 20110297081; 20120041446; 20120065755; 20120100031; 20120132627; 20120132631; 20120138586; 20120156323; 20120191205; 20120191420; 20120193063; 20120193335; 20120195994; 20120201960; 20120205348; 20120209394; 20120219698; 20120232669; 20120232670; 20120232671; 20120237631; 20120243823; 20120255176; 20120279441; 20120298873; 20120298886; 20130001834; 20130004680; 20130008879; 20130031753; 20130045093; 20130056912; 20130064706; 20130079693; 20130101423; 20130101729; 20130101761; 20130108460; 20130112672; 20130134637; 20130136868; 20130140741; 20130147092; 20130166256; 20130168902; 20130186265; 20130186514; 20130193620; 20130197683; 20130199013; 20130209932; 20130211531; 20130233846; 20130263977; 20130268085; 20130270750; 20130280091; 20130291385; 20130295212; 20130344258; 20140014629; 20140021171; 20140034626; 20140035205; 20140035423; 20140035995; 20140037873; 20140039451; 20140039452; 20140039631; 20140039658; 20140050921; 20140052288; 20140061165; 20140061167; 20140061977; 20140079741; 20140095107; 20140099476; 20140104133; 20140109440; 20140113021; 20140120195; 20140136154; 20140140882; 20140145522; 20140154088; 20140163445; 20140163568; 20140172111; 20140174344; 20140182170; 20140184757; 20140189989; 20140190942; 20140194996; 20140216123; 20140217647; 20140222184; 20140228860; 20140231266; 20140246809; 20140249643; 20140252687; 20140263209; 20140265040; 20140265046; 20140265047; 20140265048; 20140265049; 20140271328; 20140271965; 20140286048; 20140291886; 20140294567; 20140295087; 20140306380; 20140314581; 20140319735; 20140319736; 20140319737; 20140319738; 20140322374; 20140328964; 20140336680; 20140361460; 20140363585; 20140368804; 20140370111; 20140370323; 20150001093; 20150017475; 20150021379; 20150021815; 20150024169; 20150024309; 20150024319; 20150027948; 20150029485; 20150030494; 20150032215; 20150034604; 20150037601; 20150041025; 20150044415; 20150045924; 20150045928; 20150048209; 20150050463; 20150054193; 20150054930; 20150054944; 20150054945; 20150060422; 20150064050; 20150069668; 20150080495; 20150089881; 20150090074; 20150093283; 20150100149; 20150102531; 20150104344; 20150104345; 20150108677; 20150113993; 20150125333; 20150125335; 20150129583; 20150130754; 20150132173; 20150135897; 20150136908; 20150139849; 20150140230; 20150141234; 20150145174; 20150145177; 20150147585; 20150158111; 20150161299; 20150165525; 20150165545; 20150165556; 20150167130; 20150174827; 20150183070; 20150184540; 20150196971; 20150197064; 20150197862; 20150198052; 20150202687; 20150202716; 20150202717; 20150209162; 20150209889; 20150210013; 20150217367; 20150219133; 20150219444; 20150219521; 20150224607; 20150224710; 20150227062; 20150227070; 20150231796; 20150231825; 20150231828; 20150231831; 20150239046; 20150246482; 20150246486; 20150247474; 20150251247; 20150251250; 20150251351; 20150251353; 20150252190; 20150258735; 20150259530; 20150259790; 20150266237; 20150266285; 20150270088; 20150273586; 20150273622; 20150273631; 20150275916; 20150283613; 20150283614; 20150283642; 20150283646; 20150283649; 20150285502; 20150285504; 20150290707; 20150290711; 20150290741; 20150290875; 20150300179; 20150306664; 20150306665; 20150306667; 20150306699; 20150306700; 20150314389; 20150320158; 20150321250; 20150321289; 20150322808; 20150328713; 20150328719; 20150336171; 20150343564; 20150343673; 20150351493; 20150352668; 20150352770; 20150360372; 20150367415; 20150367416; 20150367417; 20150367418; 20150367419; 20150367446; 20150367447; 20150367448; 20150367453; 20150367575; 20150367577; 20150371279; 20150374915; 20150374929; 20150374930; 20150375336; 20150375340; 20150376248; 20160001364; 20160001365; 20160001401; 20160001509; 20160008887; 20160008889; 20160008922; 20160009027; 20160009028; 20160009029; 20160009030; 20160009039; 20160010457; 20160010469; 20160014906; 20160022383; 20160023272; 20160023307; 20160024293; 20160030105; 20160032416; 20160038633; 20160039054; 20160039851; 20160045967; 20160045981; 20160047255; 20160052056; 20160052057; 20160052079; 20160052087; 20160052176; 20160052208; 20160054115; 20160054121; 20160054347; 20160059154; 20160059302; 20160059315; 20160059352; 20160059437; 20160061044; 20160061381; 20160066930; 20160067766; 20160067778; 20160067779; 20160067780; 20160067781; 20160067820; 20160067928; 20160069622; 20160074558; 20160074938; 20160074965; 20160075089; 20160082547; 20160082550; 20160082657; 20160082658; 20160082695; 20160083516; 20160089719; 20160089859; 20160090848; 20160096326; 20160098495; 20160101643; 20160107232; 20160107261; 20160107287; 20160107290; 20160107295; 20160114431; 20160114432; 20160114458; 20160115083; 20160120040; 20160121399; 20160121430; 20160122541; 20160129503; 20160129643; 20160131564; 20160135537; 20160136759; 20160136787; 20160136885; 20160136887; 20160136889; 20160136897; 20160137838; 20160137839; 20160143744; 20160144428; 20160144430; 20160144566; 20160145722; 20160146153; 20160151859; 20160151860; 20160151861; 20160158843; 20160158889; 20160160077; 20160166284; 20160167160; 20160167299; 20160167303; 20160167312; 20160168453; 20160168715; 20160172655; 20160175787; 20160175929; 20160175932; 20160175934; 20160175935; 20160181217; 20160184891; 20160184925; 20160184931; 20160186620; 20160187166; 20160193695; 20160193696; 20160193697; 20160193790; 20160199933; 20160200045; 20160200046; 20160200047; 20160201155; 20160202042; 20160202043; 20160202101; 20160207109; 20160207112; 20160211116; 20160211119; 20160214173; 20160214211; 20160221114; 20160221115; 20160221122; 20160221262; 20160222807; 20160223041; 20160228255; 20160228929; 20160228975; 20160228987; 20160228990; 20160228991; 20160228992; 20160229005; 20160235929; 20160236299; 20160237827; 20160242853; 20160242931; 20160243620; 20160243644;

20160243649; 20160243652; 20160244625; 20160244980; 20160247665; 20160250688; 20160250711; 20160250715; 20160250717; 20160250724; 20160256925; 20160260261; 20160263704; 20160265362; 20160265366; 20160271732; 20160271870; 20160271875; 20160271877; 20160271878; 20160271879; 20160271884; 20160273074; 20160273079; 20160273368; 20160273369; 20160273687; 20160276056; 20160279703; 20160279706; 20160279707; 20160279708; 20160279734; 20160279735; 20160282848; 20160288200; 20160288209; 20160288244; 20160288254; 20160288264; 20160288265; 20160288266; 20160288414; 20160297006; 20160297007; 20160297104; 20160297141; 20160297148; 20160298218; 20160298220; 20160298268; 20160303656; 20160303687; 20160303762; 20160303798; 20160305256; 20160305271; 20160307678; 20160307731; 20160310077; 20160310236; 20160310279; 20160310282; 20160311020; 20160311022; 20160311160; 20160311162; 20160311165; 20160311230; 20160312338; 20160312653; 20160313306; 20160317312; 20160318072; 20160318128; 20160318129; 20160318130; 20160318253; 20160319677; 20160319678; 20160321384; 20160324581; 20160325355; 20160325358; 20160325378; 20160325383; 20160325492; 20160325498; 20160325541; 20160326613; 20160326880; 20160332229; 20160332250; 20160332253; 20160332259; 20160332266; 20160332366; 20160332371; 20160332379; 20160332380; 20160332384; 20160339516; 20160339518; 20160339520; 20160339521; 20160339536; 20160339542; 20160339639; 20160339642; 20160339646; 20160346998; 20160348203; 20160348517; 20160354064; 20160354839; 20160354842; 20160354843; 20160355904; 20160358795; 20160361765; 20160361872; 20160361873; 20160367264; 20160368050; 20160368055; 20160368056; 20160368057; 20160368213; 20160369040; 20160369096; 20160375676; 20160376453; 20160376674; 20160377994; 20160378004; 20160380634; 20170001253; 20170001258; 20170001263; 20170001374; 20170001377; 20170001379; 20170002978; 20170007359; 20170007360; 20170007362; 20170007363; 20170007366; 20170007367; 20170007386; 20170008080; 20170008084; 20170008085; 20170008086; 20170008123; 20170008126; 20170008236; 20170008333; 20170009584; 20170014169; 20170014235; 20170014903; 20170014909; 20170014937; 20170014950; 20170015452; 20170016093; 20170016094; 20170016781; 20170021420; 20170021452; 20170021453; 20170021454; 20170021455; 20170021456; 20170021562; 20170021565; 20170021572; 20170027624; 20170028472; 20170028475; 20170028589; 20170028622; 20170028631; 20170028703; 20170030399; 20170033068; 20170036238; 20170036272; 20170036300; 20170036783; 20170037674; 20170037867; 20170038047; 20170043395; 20170043402; 20170044416; 20170050198; 20170050241; 20170050242; 20170050254; 20170050261; 20170050268; 20170050270; 20170050271; 20170051386; 20170051613; 20170051675; 20170056179; 20170057013; 20170059529; 20170066051; 20170066052; 20170066187; 20170067154; 20170067344; 20170067788; 20170068774; 20170069817; 20170072465; 20170072466; 20170072468; 20170072635; 20170074285; 20170080641; 20170087635; 20170087661; 20170087666; 20170087670; 20170087765; 20170088918; 20170092400; 20170092565; 20170095882; 20170095888; 20170100209; 20170100210; 20170100214; 20170100215; 20170100817; 20170100888; 20170100891; 20170100893; 20170100899; 20170101707; 20170106432; 20170106438; 20170106443; 20170106444; 20170106445; 20170106446; 20170106474; 20170106477; 20170106570; 20170106593; 20170107385; 20170107764; 20170107821; 20170113303; 20170113416; 20170114233; 20170115594; 20170119531; 20170120326; 20170120332; 20170120333; 20170120334; 20170120335; 20170120336; 20170120337; 20170120359; 20170120370; 20170120376; 20170120377; 20170120385; 20170120386; 20170120387; 20170120393; 20170120416; 20170120518; 20170120519; 20170120529; 20170120530; 20170120537; 20170120538; 20170122322; 20170123222; 20170123237; 20170125908; 20170125909; 20170125910; 20170126087; 20170128174; 20170128961; 20170129049; 20170129052; 20170129060; 20170129168; 20170129180; 20170129184; 20170129185; 20170130591; 20170130599; 20170136540; 20170136541; 20170136542; 20170136543; 20170136545; 20170136574; 20170136578; 20170136603; 20170136699; 20170136708; 20170137327; 20170143315; 20170144219; 20170144223; 20170144224; 20170144248; 20170144250; 20170144254; 20170145578; 20170145584; 20170145586; 20170151631; 20170151718; 20170151719; 20170154713; 20170155309; 20170157850; 20170159447; 20170164700; 20170165532; 20170165751; 20170165752; 20170165753; 20170165754; 20170165781; 20170165790; 20170165791; 20170165792; 20170165916; 20170167000; 20170167270; 20170167274; 20170173628; 20170173681; 20170173683; 20170173688; 20170173691; 20170173692; 20170173693; 20170173694; 20170173695; 20170173696; 20170173697; 20170173735; 20170173736; 20170173737; 20170173747; 20170173868; 20170173872; 20170173874; 20170173877; 20170173878; 20170173879; 20170173883; 20170173892; 20170175756; 20170181291; 20170182556; 20170182558; 20170182560; 20170182594; 20170182596; 20170182598; 20170183497; 20170183870; 20170186143; 20170189553; 20170189961; 20170189962; 20170189963; 20170189964; 20170189965; 20170191177; 20170197246; 20170197278; 20170197330; 20170197359; 20170203355; 20170203363; 20170203364; 20170203365; 20170203387; 20170203391; 20170203406; 20170203408; 20170203517; 20170209908; 20170209923; 20170209929; 20170209931; 20170209954; 20170209958; 20170209963; 20170210070; 20170210144; 20170211331; 20170216916; 20170216921; 20170216966; 20170217093; 20170217095; 20170217105; 20170217181; 20170218228; 20170219855; 20170220031; 20170225227; 20170225228; 20170225229; 20170225393; 20170225394; 20170225398; 20170226362; 20170231783; 20170232511; 20170232513; 20170232514; 20170232515; 20170232518; 20170232519; 20170232549; 20170232552; 20170232557; 20170232637; 20170232674; 20170233574; 20170234138; 20170239718; 20170239719; 20170239720; 20170239721; 20170239722; 20170239723; 20170239724; 20170239725; 20170239752; 20170239887; 20170239891; 20170239892; 20170241830; 20170242424; 20170246682; 20170246689; 20170246709; 20170246804; 20170247785; 20170248319; 20170249440; 20170252787; 20170252806; 20170252812; 20170252813; 20170252814; 20170252815; 20170252816; 20170252817; 20170252818; 20170252819; 20170252820; 20170252846; 20170252851; 20170252854; 20170252860; 20170252967; 20170252978; 20170259502; 20170260865; 20170266759; 20170266879; 20170271837; 20170274454; 20170274456; 20170276023; 20170282246; 20170282247; 20170282296; 20170282297; 20170282455; 20170284676; 20170291077; 20170291260; 20170291261; 20170291263; 20170291362; 20170292174; 20170292195; 20170294288; 20170294291; 20170297097; 20170297098; 20170297099; 20170297100; 20170297101; 20170297102; 20170297103; 20170297104; 20170297106; 20170297108; 20170297109; 20170297111; 20170297267; 20170297275; 20170297674; 20170299181; 20170299973; 20170304894; 20170304895; 20170304896; 20170304897; 20170304900; 20170304944; 20170304945; 20170304946; 20170304947; 20170306221; 20170306447; 20170306448; 20170306449; 20170306450; 20170306457; 20170306458; 20170306459; 20170306460;

20170306766; 20170307859; 20170312821; 20170312822; 20170312826; 20170312857; 20170312858; 20170312984; 20170312985; 20170314109; 20170314114; 20170315538; 20170320162; 20170320168; 20170320264; 20170320277; 20170322487; 20170323627; 20170326668; 20170326681; 20170326690; 20170326788; 20170326797; 20170326805; 20170326816; 20170332733; 20170333994; 20170333995; 20170334023; 20170334024; 20170334133; 20170334136; 20170334725; 20170335436; 20170338392; 20170341141; 20170341142; 20170341175; 20170341182; 20170341183; 20170342303; 20170342535; 20170348458; 20170348792; 20170348906; 20170348909; 20170350259; 20170354805; 20170354806; 20170355135; 20170355138; 20170355146; 20170355147; 20170356068; 20170360534; 20170361405; 20170368603; 20170368640; 20170368647; 20170368740; 20170368816; 20180000501; 20180000502; 20180000503; 20180000571; 20180001423; 20180001424; 20180001547; 20180001553; 20180001556; 20180001557; 20180001567; 20180009007; 20180009054; 20180009064; 20180009134; 20180010001; 20180010221; 20180010237; 20180014844; 20180015564; 20180015565; 20180015566; 20180021473; 20180021877; 20180021878; 20180022022; 20180022065; 20180027615; 20180027616; 20180029124; 20180029125; 20180029241; 20180029294; 20180029295; 20180029306; 20180031028; 20180036939; 20180036945; 20180036953; 20180038167; 20180042718; 20180043455; 20180043467; 20180044523; 20180050390; 20180050423; 20180050490; 20180050493; 20180050495; 20180052087; 20180055641; 20180056389; 20180056390; 20180056391; 20180056392; 20180056396; 20180056446; 20180057142; 20180061279; 20180065144; 20180065178; 20180065181; 20180065182; 20180065186; 20180065208; 20180065209; 20180065295; 20180065298; 20180065300; 20180065304; 20180065305; 20180065306; 20180065307; 20180065308; 20180065309; 20180065316; 20180065317; 20180065318; 20180065320; 20180065322; 20180066358; 20180066603; 20180067464; 20180071819; 20180071821; 20180071825; 20180071949; 20180071986; 20180071988; 20180071989; 20180072040; 20180072630; 20180078936; 20180079003; 20180079029; 20180079033; 20180079034; 20180079125; 20180085605; 20180085826; 20180085856; 20180086004; 20180087157; 20180088462; 20180089824; 20180093325; 20180093347; 20180093418; 20180093419; 20180094953; 20180095450; 20180096175; 20180098919; 20180099331; 20180104770; 20180105903; 20180111191; 20180111193; 20180111194; 20180111195; 20180111196; 20180111197; 20180111198; 20180111219; 20180111317; 20180111318; 20180111319; 20180111334; 20180113445; 20180115072; 20180116762; 20180117674; 20180117675; 20180117713; 20180117845; 20180122541; 20180124341; 20180125365; 20180126460; 20180126461; 20180126462; 20180126487; 20180126637; 20180126638; 20180126639; 20180126640; 20180126641; 20180126642; 20180126648; 20180126649; 20180126650; 20180126655; 20180126666; 20180126720; 20180127317; 20180128803; 20180133583; 20180133801; 20180133804; 20180133839; 20180133840; 20180133956; 20180133958; 20180134027; 20180136458; 20180141119; 20180141123; 20180141126; 20180141127; 20180141159; 20180141160; 20180141162; 20180141174; 20180141235; 20180141274; 20180141305; 20180143147; 20180144934; 20180147627; 20180147628; 20180147653; 20180147654; 20180147655; 20180147669; 20180147779; 20180148378; 20180148379; 20180148380; 20180148585; 20180149039; 20180151048; 20180153205; 20180154437; 20180154438; 20180154439; 20180154440; 20180154441; 20180154442; 20180154443; 20180154444; 20180154484; 20180154574; 20180154580; 20180154591; 20180154657; 20180159016; 20180161873; 20180161874; 20180161875; 20180161932; 20180161934; 20180161935; 20180161954; 20180162013; 20180162044; 20180162047; 20180162048; 20180162053; 20180163311; 20180166251; 20180166665; 20180168254; 20180168294; 20180169351; 20180169756; 20180169784; 20180169950; 20180169951; 20180169952; 20180169960; 20180169970; 20180170107; 20180172369; 20180178284; 20180178285; 20180178286; 20180178287; 20180178288; 20180178325; 20180178326; 20180178413; 20180178491; 20180179332; 20180179956; 20180180803; 20180180812; 20180180813; 20180180874; 20180180896; 20180185098; 20180185893; 20180185921; 20180185961; 20180185965; 20180186067; 20180186078; 20180186080; 20180186081; 20180186082; 20180187569; 20180193916; 20180193923; 20180193953; 20180193954; 20180193955; 20180194080; 20180195186; 20180195684; 20180200790; 20180200791; 20180200792; 20180200793; 20180200794; 20180200796; 20180200797; 20180200798; 20180200800; 20180200836; 20180200960; 20180202076; 20180202293; 20180207725; 20180207749; 20180207750; 20180207850; 20180207862; 20180207863; 20180207865; 20180207866; 20180207868; 20180208762; 20180208785; 20180209381; 20180209498; 20180214874; 20180214946; 20180214947; 20180214950; 20180214951; 20180214955; 20180214984; 20180214985; 20180215094; 20180215103; 20180216501; 20180221950; 20180226917; 20180228570; 20180228612; 20180228613; 20180228737; 20180229300; 20180229434; 20180229436; 20180236546; 20180236551; 20180237325; 20180237329; 20180240691; 20180243094; 20180243097; 20180243977; 20180243991; 20180244862; 20180244863; 20180250737; 20180250739; 20180250744; 20180250745; 20180250746; 20180250771; 20180250772; 20180250773; 20180250774; 20180250775; 20180250890; 20180251645; 20180252398; 20180257138; 20180257297; 20180264679; 20180264719; 20180265417; 20180265738; 20180272464; 20180272610; 20180272652; 20180273707; 20180281236; 20180281237; 20180281282; 20180281283; 20180281284; 20180281294; 20180289493; 20180290212; 20180290373; 20180296343; 20180297113; 20180297114; 20180297117; 20180297272; 20180297296; 20180303491; 20180303616; 20180304353; 20180304359; 20180304360; 20180304361; 20180304363; 20180304364; 20180304365; 20180304369; 20180304370; 20180304537; 20180304540; 20180305266; 20180307209; 20180309202; 20180311731; 20180311735; 20180311738; 20180318657; 20180318922; 20180318925; 20180318928; 20180318932; 20180318933; 20180319108; 20180319150; 20180320006; 20180323514; 20180326488; 20180326663; 20180326664; 20180326665; 20180326668; 20180333911; 20180333912; 20180333913; 20180337110; 20180338196; 20180345367; 20180345382; 20180345405; 20180345575; 20180345576; 20180354304; 20180354860; 20180355199; 20180360609; 20180361510; 20180361660; 20180361661; 20180361666; 20180361674; 20180369918; 20180370114; 20180370120; 20180370125; 20180370147; 20180370846; 20180370860; 20180371244; 20180374262; 20190000166; 20190001412; 20190001553; 20190001563; 20190001564; 20190001570; 20190001576; 20190002353; 20190009472; 20190010270; 20190017185; 20190020105; 20190022427; 20190022428; 20190022725; 20190022926; 20190026499; 20190030601; 20190030602; 20190030605; 20190030809; 20190030810; 20190030811; 20190031908; 20190031911; 20190033719; 20190033737; 20190039182; 20190039294; 20190039367; 20190047047; 20190047212; 20190047214; and 20190047277; and more generally CPC classes B33Y, B23K and B22F.

The current paradigm is to use a focused energy source (e.g., laser or electron beam) to fuse metal powders into a solid part by building on a baseplate that is identical or very similar to the build metal, to facilitate wetting. Capabilities offered by selective laser melting (SLM) enable industries to fabricate complex parts faster and cheaper by eliminating traditional forging, machining, and welding techniques. For instance, heat pipes have been directly metal printed via SLM with the wick structure made out of a printed lattice structure that enables low resistance fluid flow, while also producing the capillary driving force to draw coolant to the evaporator.[1,2] A flat-plate oscillating heat pipe, that drives liquid coolant via temperature driven pressure variations has also been additively manufactured.[3] Performance enhancements have also been demonstrated for novel metal printed heat sinks and heat exchangers with lattice-architectures that are too complex to conventionally manufacture. [4,5]

A prior additive manufacturing process does permit bonding of stainless steel substrates to Zr-metal glasses via laser welded V/Ti/Zr intermediate foil layers in a process called laser-foil-printing, [6] and laser welding dissimilar metals, like stainless steel and Ti via foil interlayers. [7,8]

A prior technology permits low-temperature bonding of metal alloys onto semiconductor and ceramic substrates using active brazes. Elements such as Ti, Zr, V, Nb, Hf, Ta, Mo, Cr, and W can form intermetallic compounds (like silicides on Si and SiC, and carbides on graphite) or amorphised mixtures of the substrate and reactive metal elements on the surface of many dissimilar substrates.[9-26] However the timescale of this bonding in these typical processes are more than three orders-of-magnitude longer than typical additive manufacturing processes energy source exposures in various additive manufacturing processes (powder bed fusion, directed energy deposition).[9,19,27, 28]

However, the art does not provide means to directly integrate these novel additively manufactured devices directly onto electronic devices.

The removal of heat from electronic circuits is important for reliability of electronic devices. The current electronic packaging paradigm has a microprocessor packaged with a bottom thermal interface material, a lid, and a top thermal interface material, and finally a heat removal device[29]. One embodiment of the technique developed herein can enable direct manufacture of heat removal devices on electronic devices, by removing the temperature drops due to thermal interface materials. Computational energy of integrated circuits versus temperature can be predicted via the changing power consumption with temperature[30,31]. Furthermore, a leading cause of device failure is interconnects that break because of thermal cycling and electromigration. These interconnects are heated by the microprocessor, and their mean-time-to-failure is an exponential relation with temperature (Black's Law)[32]. A significant amount of e-waste can be reduced per year as many electronic device failures are thermally exacerbated, so the benefit of directly manufacturing heat sinks according to that embodiment is great.

Good wetting, as characterized by low contact angles, is an indication of strong mechanical bonding. Lower contact angles occur when more energetically favored bonding occurs between, for example, a liquid metal and a semiconductor, implying a stronger bond between the two surfaces. This wetting of dissimilar materials occurs via diffusion and dissolution of the substrate into the molten metal, and/or the metal into the substrate [9]. For example, intermetallic compounds may form. For reactive systems, wetting is limited by the diffusion of reactive elements and local reaction kinetics [10]. Many metals that melt at low temperatures do not wet silicon well, because they do not form silicides (e.g., Sn and Ag) [11]. While elements like Ti can amorphously bond to silicon at lower temperatures [12,13], a stronger silicide bonds can be achieved above 550° C. [14]. Similar trends also exist for wetting of SiC, graphite and diamond, for instance.

An intermetallic (also called an intermetallic compound, intermetallic alloy, ordered intermetallic alloy, and a long-range-ordered alloy) is a type of metallic alloy that forms a solid-state compound exhibiting defined stoichiometry and ordered crystal structure. Intermetallic compounds may be defined as solid phases containing two or more metallic elements, with optionally one or more non-metallic elements, whose crystal structure differs from that of the other constituents. Under this definition, Electron (or Hume-Rothery, see en.wikipedia.org/wiki/Hume-Rothery_rules, www-.phase-trans.msm.cam.ac.uk/2004/titanium/hume.rothery.html; Massalski, Tadeusz Bronislav, and Uichirō Mizutani. "Electronic structure of Hume-Rothery phases." Progress in Materials Science 22, no. 3-4 (1978); 151-262; Mizutani, Uichiro. "The Hume-Rothery rules for structurally complex alloy phases." In Surface Properties And Engineering Of Complex Intermetallics, pp. 323-399. 2010; Hume-Rothery, William. "The structure of metals and alloys." Indian Journal of Physics 11 (1969); 74-74; Paxton, A. T., M. Methfessel, and D. G. Pettifor. "A bandstructure view of the Hume-Rothery electron phases." Proceedings of the Royal Society of London. Series A; Mathematical, Physical and Engineering Sciences 453, no. 1962 (1997); 1493-1514.) compounds; Size packing phases. e.g., Laves phases (Stein, Frank, Martin Palm, and Gerhard Sauthoff. "Structure and stability of Laves phases. Part I. Critical assessment of factors controlling Laves phase stability." Intermetallics 12, no. 7-9 (2004); 713-720; Stein, Frank, Martin Palm, and Gerhard Sauthoff. "Structure and stability of Laves phases part II—structure type variations in binary and ternary systems." Intermetallics 13, no. 10 (2005); 1056-1074; Johnston, Roy L., and Roald Hoffmann. "Structure-Bonding Relationships in the Laves Phases." Zeitschrift für anorganische und allgemeine Chemie 616, no. 10 (1992); 105-120.), Frank-Kasper phases (en.wikipedia.org/wiki/Frank-Kasper_phases; Joubert, J. M.; Crivello, J. C. (2012). "Non-Stoichiometry and Calphad Modeling of Frank-Kasper Phases". Applied Sciences. 2 (4): 669. doi:10.3390/app2030669; Berne, C.; Sluiter, M.; Pasturel, A. (2002). "Theoretical approach of phase selection in refractory metals and alloys". Journal of Alloys and Compounds. 334; 27. doi:10.1016/50925-8388(01)01773-X.) and Nowotny phases (en.wikipedia.org/wiki/Nowotny-_phase, Lu, Guoxin; Lee, Stephen; Lin, Jianhua; You, Liping; Sun, Junliang; Schmidt, Joshua Teal (2002). "RuGavSnw Nowotny Chimney Ladder Phases and the 14-Electron Rule". Journal of Solid State Chemistry. 164 (2); 210-219. doi:10.1006/jssc.2001.9462; King, R. Bruce (2007). "The Relationship between the Nowotny Chimney Ladder". Revista de Chimie. 58 (5); 439-441; Fredrickson, Daniel C.; Lee, Stephen; Hoffmann, Roald; Lin, Jianhua (2004). "The Nowotny Chimney Ladder Phases; Following the Pseudo Clue Toward an Explanation of the 14 Electron Rule". Inorganic Chemistry. 43 (20): 6151-6158. doi: 10.1021/ic049427n. PMID 15446859; Jeitschko, Pearson, W. B. (1970). "Phases with Nowotny chimney-ladder structures considered as 'electron' phases". Acta Crystallographica Section B. 26 (7); 1044-1046. doi:10.1107/50567740870003564; Fredrickson, Daniel C.; Lee, Stephen; Hoffmann, Roald (2004). "The Nowotny Chimney Ladder Phases; Whence the 14 Electron Rule?". Inorganic Chemistry. 43 (20); 6159-6167. doi:10.1021/ic049897h. PMID 15446860.); and Zintl phases (en.wikipedia.org/wiki/Zintl_phase; S. M. Kauzlarich, Encyclopedia of Inorganic chemistry, 1994, John Wiley & Sons, ISBN 0-471-93620-0; Fässler, Thomas F. (2011). "Zintl Phases; Principles and Recent Developments". 139. doi:10.1007/978-3-642-21150-8. ISSN 0081-5993; Sevov, S. C., Zintl Phases in Intermetallic Compounds, Principles and Practice; Progress, Westbrook, J. H.; Freisher, R. L.; Eds.; John Wiley & Sons Ltd., Chichester, England, 2002, pp. 113-132 (Slavi Chapter); Cotton, F. Albert; Wilkinson, Geoffrey; Murillo, Carlos A.; Bochmann, Manfred (1999), Advanced Inorganic Chemistry (6th ed.), New York; Wiley-Interscience, ISBN 0-471-19957-5) are encompassed. The definition of a metal is taken to include the so-called post-transition metals, i.e. aluminum, gallium, indium, thallium, tin and lead, some, if not all, of the metalloids, e.g., silicon, germanium, arsenic, antimony and tellurium, and homogeneous and heterogeneous solid solutions of metals, but interstitial compounds (such as carbides and nitrides), are excluded under this definition. However, interstitial intermetallic compounds are included, as are alloys of semimetal compounds with a metal. For purposes hereof, the phrase "intermetallic" compounds also encompasses certain intermetallic-like compounds, i.e., crystalline metal compounds other than halides or oxides, and including such semimetals, carbides, nitrides, borides, sulfides, selenides, arsenides, and phosphides, and can be stoichiometric, and share similar properties to the intermetallic compounds defined above, including the facilitation of layer adhesion. Thus, compounds such as cementite, $Fe_3C$, is included. See, en.wikipedia.org/wiki/Intermetallic. The interfacial layer may have amorphous characteristics, e.g., due to rapid cooling.

See also U.S. Patent and Patent Application Nos. U.S. Pat. Nos. 4,026,677; 4,034,454; 4,034,906; 4,065,302; 4,171,339; 4,173,614; 4,234,661; 4,241,135; 4,358,506; 4,380,574; 4,396,677; 4,459,062; 4,510,171; 4,518,468; 4,553,856; 4,640,816; 4,683,019; 4,699,310; 4,714,624; 4,725,509; 4,818,628; 4,861,751; 4,873,152; 4,880,614; 4,911,987; 4,916,022; 4,956,011; 4,985,313; 5,015,502; 5,034,274; 5,039,990; 5,047,386; 5,071,828; 5,087,515; 5,104,849; 5,132,278; 5,135,817; 5,154,425; 5,188,164; 5,204,302; 5,209,987; 5,224,969; 5,234,715; 5,247,986; 5,255,730; 5,262,202; 5,266,357; 5,270,296; 5,289,967; 5,326,525; 5,328,717; 5,338,598; 5,342,812; 5,350,637; 5,352,519; 5,362,523; 5,366,570; 5,378,500; 5,422,209; 5,429,843; 5,434,027; 5,458,480; 5,458,705; 5,476,725; 5,490,911; 5,498,298; 5,503,703; 5,516,725; 5,526,914; 5,538,674; 5,580,403; 5,620,791; 5,624,505; 5,648,177; 5,669,436; 5,683,825; 5,686,178; 5,694,184; 5,709,958; 5,741,376; 5,747,111; 5,761,787; 5,770,273; 5,834,070; 5,837,960; 5,865,909; 5,873,771; 5,880,692; 5,939,201; 5,939,224; 5,948,541; 5,964,020; 5,976,716; 5,989,728; 5,993,979; 6,001,461; 6,017,628; 6,019,878; 6,054,185; 6,077,615; 6,086,959; 6,096,436; 6,117,533; 6,129,996; 6,159,267; 6,163,961; 6,214,195; 6,232,037; 6,267,864; 6,277,169; 6,322,897; 6,355,338; 6,372,346; 6,513,433; 6,528,145; 6,531,704; 6,534,194; 6,537,689; 6,540,800; 6,541,695; 6,551,760; 6,558,841; 6,566,035; 6,589,311; 6,596,150; 6,607,844; 6,612,478; 6,613,697; 6,635,357; 6,663,982; 6,669,774; 6,669,989; 6,673,387; 6,676,728; 6,682,780; 6,689,186; 6,699,304; 6,713,519; 6,723,279; 6,730,410; 6,740,464; 6,749,101; 6,765,151; 6,779,951; 6,780,305; 6,797,313; 6,797,449; 6,800,400; 6,800,417; 6,806,478; 6,824,689; 6,828,507; 6,847,699; 6,858,374; 6,875,949; 6,893,732; 6,899,777; 6,909,173; 6,909,192; 6,913,184; 6,929,865; 6,939,505; 6,974,070; 6,974,501; 6,979,646; 6,989,200; 7,004,994; 7,005,191; 7,008,969; 7,011,760; 7,022,165; 7,052,241; 7,060,222; 7,076,959; 7,094,473; 7,097,938; 7,105,217; 7,122,279; 7,145,244; 7,157,188; 7,162,302; 7,169,478; 7,172,663; 7,174,637; 7,192,673; 7,195,842; 7,235,330; 7,241,416; 7,241,533; 7,259,032; 7,282,444; 7,285,337; 7,285,496; 7,287,960; 7,288,576; 7,299,749; 7,300,559; 7,309,548; 7,311,944; 7,318,983; 7,326,434; 7,338,741; 7,351,773; 7,354,471; 7,361,239; 7,381,517; 7,393,559; 7,410,728; 7,413,109; 7,416,835; 7,432,014; 7,451,906; 7,455,458; 7,459,233; 7,476,469; 7,560,138; 7,575,039; 7,597,769; 7,604,897; 7,608,178; 7,621,976; 7,622,424; 7,625,668; 7,626,665; 7,629,058; 7,642,468; 7,645,543; 7,666,233; 7,674,555; 7,722,731; 7,726,872; 7,736,542; 7,736,794; 7,745,050; 7,759,007; 7,771,547; 7,781,376; 7,782,433; 7,794,881; 7,820,332; 7,838,170; 7,858,205; 7,896,222; 7,939,126; 7,940,361; 7,976,985; 7,997,472; 8,007,178; 8,007,929; 8,017,263; 8,025,983; 8,025,984; 8,048,571; 8,063,489; 8,071,419; 8,079,141; 8,097,301; 8,097,303; 8,119,288; 8,119,314; 8,119,315; 8,137,525; 8,173,010; 8,173,269; 8,182,939; 8,182,943; 8,202,649; 8,216,439; 8,221,921; 8,236,452; 8,247,142; 8,273,194; 8,313,560; 8,319,350; 8,323,820; 8,334,075; 8,353,574; 8,354,136; 8,372,685; 8,377,999; 8,389,060; 8,389,147; 8,394,495; 8,410,016; 8,425,651; 8,428,671; 8,436,130; 8,440,498; 8,455,131; 8,465,847; 8,466,095; 8,487,439; 8,507,132; 8,512,808; 8,563,872; 8,591,997; 8,604,350; 8,617,640; 8,623,554; 8,629,564; 8,632,850; 8,636,194; 8,637,864; 8,652,686; 8,658,304; 8,673,050; 8,673,477; 8,692,127; 8,697,322; 8,723,176; 8,748,241; 8,759,473; 8,778,538; 8,789,626; 8,795,899; 8,796,683; 8,802,286; 8,810,035; 8,828,579; 8,840,831; 8,852,801; 8,853,867; 8,860,021; 8,882,442; 8,893,954; 8,901,558; 8,906,462; 8,906,469; 8,916,424; 8,921,473; 8,932,771; 8,946,704; 8,952,380; 8,956,478; 8,956,766; 8,956,912; 8,960,523; 8,962,188; 8,963,148; 8,969,867; 8,979,606; 8,986,880; 8,999,200; 9,005,821; 9,006,733; 9,011,620; 9,040,981; 9,045,335; 9,054,364; 9,070,729; 9,076,825; 9,078,294; 9,079,246; 9,083,054; 9,090,955; 9,093,383; 9,097,995; 9,101,978; 9,109,429; 9,113,571; 9,117,662; 9,127,515; 9,130,358; 9,136,568; 9,142,679; 9,153,436; 9,166,019; 9,166,061; 9,171,787; 9,176,571; 9,181,790; 9,184,160; 9,190,529; 9,190,666; 9,205,578; 9,209,480; 9,214,566; 9,218,966; 9,219,161; 9,227,243; 9,236,428; 9,236,606; 9,243,475; 9,252,283; 9,252,286; 9,263,259; 9,269,647; 9,281,517; 9,287,405; 9,287,573; 9,296,190; 9,318,484; 9,324,875; 9,330,909; 9,331,156; 9,331,251; 9,350,005; 9,354,029; 9,402,313; 9,414,513; 9,419,299; 9,428,826; 9,431,430; 9,437,744; 9,440,853; 9,466,725; 9,472,310; 9,472,656; 9,476,685; 9,482,105; 9,488,456; 9,496,375; 9,508,979; 9,530,895; 9,536,844; 9,545,017; 9,556,505; 9,559,213; 9,564,457; 9,564,589; 9,587,296; 9,593,924; 9,601,779; 9,608,124; 9,614,062; 9,614,100; 9,643,250; 9,643,279; 9,656,877; 9,660,265; 9,666,896; 9,682,425; 9,722,275; 9,728,648; 9,728,773; 9,731,377; 9,735,428; 9,742,001; 9,744,743; 9,765,271; 9,765,635; 9,780,348; 9,793,057; 9,812,467; 9,812,582; 9,818,715; 9,832,866; 9,833,838; 9,835,428; 9,852,904; 9,857,860; 9,859,114; 9,862,617; 9,871,059; 9,881,744; 9,899,136; 9,899,672; 9,903,037; 9,905,860; 9,911,874; 9,916,958; 9,919,472; 9,938,839; 9,943,927; 9,943,929; 9,947,964; 9,954,212; 9,960,122; 9,990,965; 9,991,221; 9,991,395; 9,997,545; 9,997,784; RE41,584; RE43,661; RE44,817; RE44,820; RE46,275; 20010000889; 20010018159; 20010028990; 20010038029; 20020007751; 20020009626; 20020056401; 20020062858; 20020069592; 20020081447; 20020082171; 20020084527; 20020090821; 20020098381; 20020098776; 20020110698; 20020144838;

20020153253; 20020154741; 20020160308; 20020168051; 20020177003; 20020192494; 20020192564; 20020195676; 20030019326; 20030022094; 20030029910; 20030044593; 20030068575; 20030108795; 20030116503; 20030119920; 20030127051; 20030161750; 20030162127; 20030173720; 20030180571; 20030189082; 20040009402; 20040016912; 20040018432; 20040035910; 20040071882; 20040081895; 20040096742; 20040100164; 20040106060; 20040112478; 20040147620; 20040149806; 20040154488; 20040168637; 20040182835; 20040197650; 20040202883; 20040206267; 20040210289; 20040219295; 20040224258; 20040231758; 20040234866; 20040234883; 20040247782; 20040249428; 20040254419; 20040261420; 20040265736; 20050007105; 20050008939; 20050013759; 20050023508; 20050025797; 20050031891; 20050036893; 20050036898; 20050040090; 20050044987; 20050045034; 20050061107; 20050064291; 20050065035; 20050079132; 20050089627; 20050095442; 20050098609; 20050100790; 20050106495; 20050107870; 20050118482; 20050119725; 20050127334; 20050142377; 20050149002; 20050149169; 20050151228; 20050153161; 20050153208; 20050155779; 20050165471; 20050172643; 20050175822; 20050182482; 20050202343; 20050216075; 20050230029; 20050240100; 20050244337; 20050255694; 20050261763; 20050278020; 20060001726; 20060021221; 20060027625; 20060035149; 20060051600; 20060062684; 20060094603; 20060102871; 20060108567; 20060118758; 20060135344; 20060142853; 20060147138; 20060147631; 20060151582; 20060167120; 20060172073; 20060216539; 20060216604; 20060224027; 20060225817; 20060228475; 20060234127; 20060246725; 20060249705; 20060274510; 20060276875; 20060280998; 20070000129; 20070002239; 20070010702; 20070054189; 20070061006; 20070065675; 20070068605; 20070072113; 20070093006; 20070099088; 20070104605; 20070111893; 20070122549; 20070122707; 20070122710; 20070128520; 20070128521; 20070140065; 20070141469; 20070152026; 20070158200; 20070160315; 20070178384; 20070187464; 20070227627; 20070251389; 20070298325; 20070298351; 20080015284; 20080032192; 20080041921; 20080057203; 20080057395; 20080057616; 20080075878; 20080075984; 20080152998; 20080156475; 20080175982; 20080188373; 20080241660; 20080241705; 20080280201; 20080299459; 20090000480; 20090046441; 20090110954; 20090114797; 20090117466; 20090123069; 20090136769; 20090155676; 20090178741; 20090214373; 20090214857; 20090235915; 20090269497; 20090269605; 20090288952; 20090291312; 20090291345; 20090297718; 20090311598; 20090317658; 20100013096; 20100015330; 20100029036; 20100062179; 20100078830; 20100089976; 20100089977; 20100102446; 20100112192; 20100133688; 20100139840; 20100178571; 20100190054; 20100196750; 20100216034; 20100224867; 20100227071; 20100227157; 20100228025; 20100229940; 20100255362; 20100279000; 20100285207; 20100291758; 20100310941; 20100313416; 20100314258; 20100315796; 20100330357; 20110003200; 20110008640; 20110015102; 20110027547; 20110032467; 20110065973; 20110104571; 20110108760; 20110111303; 20110114075; 20110114182; 20110139251; 20110143201; 20110165462; 20110214799; 20110240108; 20110245083; 20110278051; 20110290549; 20110293976; 20110297450; 20110305578; 20120009339; 20120024332; 20120028176; 20120032329; 20120040282; 20120040283; 20120044652; 20120045688; 20120067728; 20120085811; 20120128284; 20120129056; 20120171847; 20120207264; 20120231352; 20120232308; 20120270106; 20120316716; 20120322197; 20120328945; 20130002764; 20130008698; 20130017141; 20130017390; 20130025409; 20130026636; 20130028781; 20130029886; 20130034759; 20130034932; 20130036942; 20130043573; 20130054061; 20130062107; 20130068513; 20130092924; 20130092925; 20130092944; 20130105791; 20130126868; 20130137033; 20130140554; 20130149632; 20130153889; 20130155790; 20130161606; 20130161608; 20130161621; 20130168257; 20130172642; 20130181214; 20130187151; 20130193433; 20130193493; 20130196468; 20130200365; 20130200375; 20130203214; 20130209698; 20130210618; 20130232366; 20130241069; 20130260217; 20130305727; 20130313708; 20130343023; 20130344765; 20140008327; 20140025978; 20140037969; 20140065361; 20140103338; 20140103340; 20140103346; 20140106504; 20140110153; 20140110706; 20140120417; 20140127868; 20140130736; 20140131700; 20140131702; 20140134325; 20140140030; 20140141303; 20140151691; 20140175435; 20140177132; 20140203277; 20140204160; 20140209898; 20140227548; 20140231126; 20140231799; 20140231803; 20140252351; 20140255785; 20140264323; 20140265812; 20140272154; 20140338552; 20140338894; 20140339555; 20140346216; 20140349191; 20140353808; 20140366761; 20140370337; 20140373743; 20140374084; 20150021603; 20150030932; 20150079298; 20150093589; 20150093880; 20150103495; 20150116968; 20150118570; 20150137122; 20150140731; 20150155312; 20150155392; 20150155399; 20150155456; 20150179804; 20150179998; 20150207146; 20150214342; 20150214555; 20150228801; 20150243792; 20150259263; 20150270531; 20150283642; 20150298263; 20150314390; 20150333160; 20150348863; 20150349154; 20150372123; 20150380529; 20160003063; 20160005878; 20160023438; 20160024676; 20160033248; 20160040312; 20160043384; 20160043392; 20160043429; 20160064422; 20160075119; 20160093642; 20160099353; 20160101433; 20160101988; 20160104877; 20160107262; 20160126360; 20160141422; 20160145990; 20160151854; 20160151856; 20160153271; 20160153272; 20160163744; 20160163948; 20160181601; 20160186579; 20160190329; 20160190640; 20160204271; 20160207106; 20160218106; 20160221733; 20160233474; 20160233487; 20160240690; 20160244212; 20160248115; 20160254097; 20160254511; 20160254687; 20160260948; 20160301071; 20160326892; 20160340768; 20160349029; 20160351321; 20160358575; 20160359050; 20160370898; 20160381794; 20170005048; 20170005361; 20170016703; 20170022608; 20170028682; 20170029300; 20170030204; 20170047583; 20170053584; 20170090462; 20170101875; 20170103714; 20170107636; 20170110728; 20170110760; 20170138164; 20170148562; 20170162701; 20170179482; 20170189965; 20170194263; 20170194686; 20170211990; 20170216962; 20170229731; 20170235852; 20170243900; 20170252851; 20170271674; 20170278975; 20170288224; 20170304933; 20170317336; 20170330674; 20170338472; 20170358685; 20170358795; 20170362687; 20170365843; 20170365853; 20170368644; 20180006293; 20180019458; 20180026171; 20180040916; 20180047696; 20180070458; 20180073532; 20180083266; 20180083281; 20180083282; 20180083289; 20180086025; 20180102543; 20180122629; 20180131040; 20180149196; 20180161931; 20180175333; 20180183062; 20180202234; 20180209057; 20180212250; 20180219254; and 20180221985.

Glasses are class of ceramic that have short range order, but lack long-range order (i.e., amorphous) and are often made from oxides (e.g., silica, alumina, beryllia, ceria, zirconia). Performance, strength, rheology, chemical inertness, optical properties and cost make glasses attractive materials for broad range of applications [33]. Conventional silica glasses consist of Si bonded tetrahedrally to four oxygen atoms. If the $SiO_2$ melt is quenched it will harden as an amorphous solid. Amorphous networks of $SiO_2$ structure (short range order) results in glassy forms [34-36] such as Soda-lime-silica glass. Furthermore, various chemical and physical processes can be performed to modify glass properties. As an example, borosilicate glass exhibits high thermal shock and chemical resistance as a result of ion diffusion (boron) to silica. Borosilicate glass will phase separate into silica glass regions and small precipitates of boric glass [37]. Glasses can be made by melting or non-melting based techniques such as physical vapor deposition [36,38], neutron irradiation of crystalline structures [36,39] and sol-gel processing of solutions [36,40].

If on the other hand, the melt is slowly cooled, a crystalline quartz structure with long range order results [41] Crystallinity of ceramics ranges from highly-oriented to complete amorphous structures or some combination.

As glasses, ceramics and metals are widely used in various industries, such as semiconductor, automotive, aerospace, defense, medical, environmental control, it is often beneficial and useful to build structures containing glass or ceramics and metals.

Bettger et al. demonstrated a method to chemically bond soda-lime glass to metal structures consisting of stainless steel alloy, a carbon steel, titanium, aluminum or copper [42]. In this technique, an oxide layer including iron oxide and chromium oxide with iron-to-chromium ratio in the range of 0.02 to 0.6 (atom ratio) is deposited on glass substrate. By heating the metal substrate and glass substrate within the range of 500° C. to 1000° C. and placing them in contact with the oxide layer a bond in between is formed. The duration of contact varies between 10 seconds to 10 minutes based on temperature and pressure (not specified). The interfacial strength of the bond between glass and metal substrate is not quantitively discussed.

In another work McMilan et al. demonstrated the process of bonding glass or ceramic to metal by depositing a uniform layer of glass powder by dipping into a melt or spraying the glass powder suspension onto the metal component [43]. The powder coated metal part is then exposed to a gas-flame in air or nitrogen or in a nitrogen-hydrogen mixture to fuse the powder glass. The metals in the technique should be sandblasted and pre-oxidized before the powder deposition. Ag, Cu and Au metals act as nucleating agent for glass crystallization in the controlled devitrification process and create the bonds to the metal. This devitrification refers to small domains that have crystallized and are no longer amorphous. In this process, the glass powder should be melted within the range of 1000° C. and capable of devitrification under heat treatment to create crystalline structure. Thermal expansion coefficient of post-devitrified glass and the metal should be close to prevent thermal stress and fracture during post heat treatment process. After the heat treatment of metal-glass component at 500° C. to 750° C., liquid state glass will be reflowed to a mold which then bonds to pre-glassed metal. The heat treatment stage varies from 5 minutes to 1 hour.

Bonding of bioglass to metal structures is beneficial for medical devices, like orthopedic and dental devices to improve biocompatibility. One of the greatest challenges in this application is that coefficient of thermal expansion of glasses and metals are dissimilar at melting and cooling process which poses large thermal stress and consequently cracks and failures are probable [44]. There are other limiting factors in conventional glass to metal bonding techniques such as flame spraying. Loss of compositional control during long flame exposure time, extremely high diffusion of metal ions into glass, limited choice of glass types that can match coefficient of thermal expansion of metal during heat treatment process are some of this limiting factors [42,43]. In this bonding technique, similar to previous mentioned methods, the surface of the metal is roughened and oxidized and then heated up to desired glass transition temperature. Then the metal substrate is immersed in molten glass and after removal cooled down in a way to minimize thermomechanical stresses. The proposed metals are surgical stainless steel, carbon steel, cobalt-chrome alloys, titanium and titanium alloys, noble metals such as platinum, noble metal alloys such as platinum (%90)-rhodium (%10) and molybdenum-nickel-cobalt-chrome alloys [44].

The mentioned techniques so far consist of exposing both metal and glass components to high temperatures usually above glass transition temperatures in a furnace or a direct gas-flame. In another technique, it is possible to join ceramics such as lead-zirconite-titanate (PZT) to certain metal oxides (submicron $TiO_2$, material filled with silver particles) by compressing both substrates and exposing the interface to microwave beams. The localized microwave beams will heat up and soften the substrates at the interface and facilitate interdiffusion and reaction [45]. Glass frit can be used as intermediate layer to bond Si, $SiO_2$, $Si_2N_4$, Al, Ti, and Glass substrates [46-51]. However, thermal stress due to CTE mismatch is present.

Bonding of ceramics to metal has great importance in applications such as defense. There is the need to bond advanced ceramic elements to metallic components in missiles where the joints should be able to withstand temperatures ~550° C. or even more for one minute and able to survive environmental thermal fluctuations from −40° C. to 200° C. [52]. In most cases of conventional ceramic-to-metal bonding techniques, thermal expansion coefficient of metals is higher than the ceramic. Furthermore, controlling compositional changes at the interface is rather challenging. Brazing is the favored solution for ceramic to metal bonding due to stable reactive diffusion. Silver-Copper composition containing 2% titanium is commercially available active filler material for conventional brazing [53-56]. High oxidation potential of titanium facilitates oxide redox reaction with ceramic which results in reactive wetting and chemical bond at the interface[52]. In the laser brazing process the temperature of the filler alloy is raised above melting point to cause wetting and reactive bonding to the material. Ceramic-to-metal bonds provided are bonding Ti to ZnS, Pyroceram to Kovar and Nb to Sapphire using Cusil™ and Lucanex 721®. As an example, ZnS is brazed to Ti by Ag—Cu—Ti alloy. The brazed bonds survived up to 12 cycles from 550° C. to liquid nitrogen temperatures and 50 cycles from 0° C. to 200° C. The laser processing was done under vacuum conditions in order to prevent oxidization reactions high reactive metals such as titanium.

Materials containing 90% alumina by weight or higher can bond to certain metals at specified temperatures [57]. Ceramics generally have poor wettability to metals. However, compositions of brazing alloy containing reactive elements such as Ti, Zr, V, Hf, Nb can bond to ceramic oxides (i.e. $Al_2O_3$) [58]. The alloy composition beside the reactive element can be chosen from Ag, Cu, Ni, Mn, In, Sn etc. [57]. Some of these elements are used to decrease the melting point of the braze alloy. Furthermore, by adding aluminum to the compound it is possible to further control the brazing alloy to alumina reaction.

SUMMARY OF THE INVENTION

The present technology provides methods and apparatus for bonding metals on to glass and ceramic substrates, including those composed of oxides (e.g., silica glass, quartz, borosilicate glass, alumina, beryllia, ceria, zirconia, lithium aluminum silicates, gallium oxide, indium tin oxide, indium zinc oxide), silicides (e.g., molybdenum disilicide), nitrides, and carbides (e.g., silicon carbide), carbon materials (e.g., diamond, pyrolytic graphite, carbon nanotubes, graphene, fullerenes), borides (e.g., tungsten borides), arsenides (e.g., gallium arsenide), sulfides (e.g., zinc sulfide) and also enables composites of metals and glasses or ceramics for various applications. Applications may include removable support layers, composite structures, connections to opto-electronics, pollution control devices, thermal devices to cool electronics.

This technology invention builds on the literature of low-temperature bonding of metal alloys onto glass and ceramic substrates using brazes, and seeks to overcome the aforementioned timescale limitations.

The present technology provides laser or electron-beam additive manufacturing of metal structures on ceramic and glass substrates.

The current paradigm is to use a focused energy source (e.g., laser or electron beam) to fuse metal powders into a solid part by building on a baseplate that is identical or very similar to the build metal to facilitate wetting. This is to create the strongest bonding to the build plate and minimize coefficient of thermal expansion mismatches.

One benefit of building on ceramic or glass is to enable direct manufacture of heat removal devices and/or electrical connections on opto-electronic substrates, integration of conventional composite materials into metal additive, heterogeneous integration of dissimilar materials, and for easy parting of the desired part from the support structure and/or the buildplate.

In one embodiment, a brazing alloy powder with homogeneous composition is employed. In another embodiment, the bonding metals are not homogeneous, i.e., are heterogeneous. The inhomogeneous brazing powder can have varying composition of the constituents, including separating each element into separate powders. In the inhomogeneous case, the powder sizes can be varied so that the largest phase has larger average diameter powder, while the lower concentration has smaller diameter to more evenly distribute around the bulk phase, for lower diffusional resistance. In some cases, the brazing powder may be deposited in layers, forming isotropic structures or regional differences. In certain embodiments, a metallization on the substrate can facilitate bonding.

In one embodiment, the bonding metal has an overall composition of about 1 to 10 wt % of an "active" brazing element plus the composition of solder for the balance of the composition. The "active" elements may include Ti, Zr, V, Nb, Hf, Ta, Mo, Cr, and W, which are suitable candidates for bonding of metals to various materials such as ceramics and glasses, including those composed of oxides (e.g., silica glass, quartz, borosilicate glass, alumina, beryllia, ceria, zirconia, lithium aluminum silicates, gallium oxide, indium tin oxide, indium zinc oxide), silicides (e.g., molybdenum disilicide), nitrides, and carbides, carbon materials (e.g., diamond, pyrolytic graphite, carbon nanotubes, graphene, fullerenes), borides (e.g., tungsten borides), arsenides (e.g., gallium arsenide), sulfides (e.g., zinc sulfide), as well as other metals [15] due to the interlayers they form that bond to those materials.

Embodiments may include using one or more of these active elements plus a solder. Embodiments may also include solders that mix elements such as Sn, Pb, Ag, Cu, Sb, Bi, In, Zn, Cd, Au, Ni, Si, Ge, Si, Al. Embodiments includes solders such as InSn (e.g., $In_{52}Sn_{48}$, $In_{60}Sn_{40}$, $In_{50}Sn_{50}$, $In_{42}Sn_{58}$), InCd (e.g., $In_{74}Cd_{26}$), BiPbInCdSn (e.g., $Bi_{44.7}Pb_{22.6}In_{19.1}Cd_{5.3}Sn_{8.3}$), InBiSn (e.g., $In_{51}Bi_{32.5}Sn_{16.5}$), InBiCd (e.g., $In_{61.7}Bi_{30.8}Cd_{7.5}$), BiPbSnIn (e.g., $Bi_{49}Pb_{18}Sn_{12}In_{21}$, $Bi_{50}Pb_{26.7}Sn_{13.3}Cd_{10}$), BiSnIn (e.g., $Bi_{56}Sn_{30}In_{14}$), BiPbSn (e.g., $Bi_{52}Pb_{32}Sn_{16}$, $Bi_{50}Pb_{31.2}Sn_{18.8}$), BiPb (e.g., $Bi_{58}Pb_{42}$), SnPbBi (e.g., $Sn_{46}Pb_{46}Bi_8$), InSnPbCd (e.g., $In_{70}Sn_{15}Pb_{9.6}Cd_{5.4}$), SnPbZn (e.g., $Sn_{54}Pb_{26}In_{20}$, $Sn_{37.5}Pb_{37.5}In_{25}$, $Sn_{70}Pb_{18}In_{12}$), BiSnAg (e.g., $Bi_{57}Sn_{42}Ag_1$), BiSn (e.g., $Bi_{56}Sn_{42}$, $Bi_{58}Sn_{42}$), SnBiPb (e.g., $Sn_{48}Bi_{32}Pb_{20}$, $Sn_{43}Pb_{43}Bi_{14}$), CdSn (e.g., $Cd_{70}Sn_{30}$), InPbAg (e.g., $In_{80}Pb_{15}Ag_5$), InAg (e.g., $In_{97}Ag_3$, $In_{90}Ag_{10}$), SnPbCd (e.g., $Sn_{51.2}Pb_{30.6}Cd_{18.2}$), InPb (e.g., $In_{75}Pb_{25}$, $In_{70}Pb_{30}$, $In_{60}Pb_{40}$, $In_{50}Pb_{50}$, $Pb_{75}In_{25}$), In, PbSnZn (e.g., $Pb_{63}Sn_{34}Zn_3$), SnZnInBi (e.g., $Sn_{86.5}Zn_{5.5}In_{4.5}Bi_{3.5}$), SnInAg (e.g., $Sn_{77.2}In_{20}Ag_{2.8}$, $Sn_{86.9}In_{10}Ag_{3.1}$, $Sn_{91.8}In_{4.8}Ag_{3.4}$, $Sn_{88}In_{8.0}Ag_{3.5}Bi_{0.5}$), SnZnCd (e.g., $Sn_{40}Zn_{27}Cd_{33}$), SnPbZn (e.g., $Sn_{30}Pb_{50}Zn_{20}$), PbSnAg (e.g., $Pb_{54}Sn_{45}Ag_1$, $Sn_{62}Pb_{36}Ag_2$, $Pb_{80}Sn_{18}Ag_2$, $Pb_{96}Sn_2Ag_2$, $Pb_{88}Sn_{10}Ag_2$, $Pb_{92}Sn_{5.5}Ag_{2.5}$, $Pb_{90}Sn_5Ag_5$, $Pb_{93.5}Sn_5Ag_{1.5}$, $Pb_{95.5}Sn_2Ag_{2.5}$), SnZnIn (e.g., $Sn_{83.6}Zn_{7.6}In_{8.8}$), PbSn (e.g., $Pb_{90}Sn_{10}$, $Pb_{85}Sn_{15}$, $Pb_{80}Sn_{20}$, $Sn_{63}Pb_{37}$, $Sn_{70}Pb_{30}$, $Sn_{90}Pb_{10}$, $Sn_{63}Pb_{37}P_{0.0015-0.04}$, $Sn_{62}Pb_{37}Cu_1$, $Sn_{97.5}Pb_1Ag_{1.5}$), SnZnBi (e.g., $Sn_{89}Zn_8Bi_3$), SnZn (e.g., $Sn_{91}Zn_9$, $Sn_{85}Zn_{15}$, $Sn_{60}Zn_{40}$, $Zn_{70}sn_{30}$, $Zn_{60}Sn_{40}$, $Sn_{50}Zn_{49}Cu_1$, $Sn_{90}Zn_7Cu_3$), SnBiAg (e.g., $Sn_{91.8}Bi_{4.8}Ag_{3.4}$), SnAgCu (e.g., $Sn_{96.5}Ag_{3.0}Cu_{0.5}$, $Sn_{95.5}Ag_{4.0}Cu_{0.5}$, $Sn_{95.8}Ag_{3.5}Cu_{0.7}$, $Sn_{95.6}Ag_{3.5}Cu_{0.9}$, $Sn_{99}Cu_{0.7}Ag_{0.3}$, $Sn_{96.2}Ag_{2.5}Cu_{0.8}Sb_{0.5}$, $Sn_{90.7}Ag_{3.6}Cu_{0.7}Cr_5$, $Sn_{95}Ag_{3.5}Zn_1Cu_{0.5}$, $Sn_{95.5}Cu_4Ag_{0.5}$, $Sn_{97}Cu_{2.75}Ag_{0.25}$), SnAu (e.g., $Sn_{90}Au_{10}$), SnAg (e.g., $Sn_{96.5}Ag_{3.5}$—$Sn_{93}Ag_7$), SnCu (e.g., $Sn_{99.3}Cu_{0.7}$, $Sn_{97}Cu_3$), SnPbZn (e.g., $Sn_{33}Pb_{40}Zn_{28}$), Sn, SnSb (e.g., $Sn_{95}Sb_5$—$Sn_{99}Sb_1$), SnAgSb (e.g., $Sn_{64}Ag_{25}Sb_{10}$), PbIn (e.g., $Pb_{81}In_{19}$, $Pb_{70}In_{30}$, $Pb_{75}In_{25}$, $Pb_{90}In_5Ag_5$, $Pb_{92.5}In_5Ag_{2.5}$, $Pb_{92.5}In_5Au_{2.5}$), CdZn (e.g., $Cd_{82.5}Zn_{17.5}$, $Cd_{70}Zn_{30}$, $Cd_{60}Zn_{40}$, $Zn_{90}Cd_{10}$, $Zn_{60}Cd_{40}$, $Cd_{78}Zn_{17}Ag_5$), Bi, AuSn (e.g., $Au_{80}Sn_{20}$), PbSbSn (e.g., $Pb_{80}Sb_{15}Sn_5$), PbAg (e.g., $Pb_{94.5}Ag_{5.5}$—$Pb_{96}Ag_4$, $Pb_{97}Ag_{1.5}Sn_1$, $Pb_{97.5}Ag_{2.5}$), CdAg (e.g., $Cd_{95}Ag_5$), AuSi (e.g., $Au_{98}Si_2$, $Au_{96.8}Si_{3.2}$), ZnAl (e.g., $Zn_{95}Al_5$), ZnSn (e.g., $Zn_{95}Sn_5$), Zn, AuIn (e.g., $Au_{82}In_{18}$), AuGe (e.g., $Au_{87.5}Ge_{12.5}$). Many of these possible bonding alloys are undesirable for due to health and environmental concerns (e.g., those containing Pb, Cd), and for economics due to cost (e.g., Au). However, these are not technologically excluded, and may be employed as appropriate in the application. Aluminum containing solders have advantage for bonding to $Al_2O_3$-based substrates.

In another embodiment, the bonding metal is a homogeneous or heterogeneous powder mixture of a brazing alloy. One specific embodiment of this invention uses the $Sn_3Ag_4Ti$ composition as a heterogeneous or homogeneous composed powder. This alloy has good bonding strength with dissimilar metallic or non-metallic substrates at temperatures between 250° C. to 450° C. [15,59,17,18]. $Sn_3Ag_4Ti$ forms bonds with such materials as oxides (e.g., silica glass, quartz, borosilicate glass, alumina, beryllia, ceria, zirconia, lithium aluminum silicates, gallium oxide, indium tin oxide, indium zinc oxide), silicides (e.g., molybdenum disilicide), nitrides, and carbides, carbon materials (e.g., diamond, pyrolytic graphite, carbon nanotubes, graphene, fullerenes), borides (e.g., tungsten borides), arsenides (e.g., gallium arsenide), sulfides (e.g., zinc sulfide). To form a good bond, the braze or bonding alloy must minimize thermal stress from the solidification temperature to ambient, so the low melting point of the braze is beneficial.

Furthermore, the low melting point increases the activity of the reactive metals by making it more available to react with the substrate. Brazing alloys generally have similar compositions to low-temperature solders, but also include an element that thermodynamically favors forming reactions with the substrate over other elements of the solder. Unlike a solid solution alloy with the different species randomly occupying lattice sites, intermetallics exist at specific stoichiometric ratios and each species has its own lattice sites. Intermetallics possess stiffer bonds than solid solution alloys because of their long range order, negative heats of formation and higher melting temperatures.

A different embodiment uses a homogeneous or heterogeneous powder mixture with a AgCuTi alloy. A different embodiment uses a $Ag_{21}Cu_5X$ alloy where X=Ti, Ta, Zr, V, Hf, Cr, Mo, W, Nb.

In yet another embodiment, Cu or Cu alloy with an active element X=Ti, Ta, Zr, V, Hf, Cr, Mo, W, Nb at about 1-10 wt % is mixed as a homogeneous powder alloy, or as a heterogeneous mixed powder.

In yet another embodiment, Al or Al alloy, such as Al—Si alloys, is mixed with an active element X=Ti, Ta, Zr, V, Hf, Cr, Mo, W, Nb at about 1-10 wt % as a homogeneous powder alloy or as a heterogeneous mixed powder. These Al rich alloys are attractive for bonding to alumina rich substrates.

Certain embodiments can incorporate ceramic or semiconductor micro or nanoparticle inclusions. This can serve two purposes, to better match the coefficient of thermal expansion of the substrate, and to mechanically reinforce the interlayer material.

While the time to make a good bond in typical metal wetting is on the order of tens of minutes [9,19,27,28], in additive manufacturing this nucleation and crystal growth of the intermetallic phase needs to occur in times of less than 100 μs per exposure, as the laser melting and solidification occur rapidly [60,61]. Hence, achieving a good bond with powder bed-additive manufacturing poses unique challenges compared to conventional brazing that are overcome through aspects of this invention.

Several embodiments overcome this kinetic limitation. One such aspect is to repeatedly melt the same area to increase the overall time at elevated temperature, which increases time for bonding elements to diffuse to the interface and for metals to form bonding compounds (e.g., intermetallics, oxides, nitrides, carbides, silicides, borides, arsenides). This multiple exposure is beneficial for protecting the electronics and the substrate because each directed energy melting pulse is brief enough that the thermal penetration depth does not exceed the thickness of the typical silicon wafer. This directed energy pulse may be from a source like a laser or an electron beam. Less focusable energy sources, like a microwave or a hot solder iron tip that moves over the part, could also be used in alternative embodiments as energy sources. Moreover, momentary high temperature helps to overcome the energy barriers for diffusion and crystallization better than in a longer duration, lower heating temperature found in conventional brazing, due to diffusivity and nucleation rate being an exponential function of temperature. This elevated temperature overcomes barriers to diffusion and crystal nucleation that are described by an Arrhenius rate equation, $\exp(-E_a/k_BT)$, where $E_a$ is the activation energy of either diffusion or nucleation, $k_B$ is the Boltzmann constant, and T is absolute temperature [62]. Due to the rapid laser processing temperature, diffusion and nucleation can overcome the energy barrier more rapidly than conventional brazing and proceed more rapidly than reactions occurring just above the melting point of the metal.

In one embodiment, a brazing alloy is used for the first layer to the dissimilar substrate (ceramic or glass substrate), and then subsequent layers transition, either abruptly or gradually to a different material. One particular embodiment of this is to build on a substrate, like Si, and transition with a bonding layer to a material like copper, aluminum, or stainless steel. One application of this is to transition to a higher thermal and electrical conductivity material, like aluminum or copper, for heat transfer or electrical transport benefits. The interlayer can be an abrupt transition with one or more layers of the bonding powder or alloy and then transition to a different material, or the transition can be gradual with interlayers varying in composition from the bonding alloy or bonding powder mixture to the new mixture. The bonding from non-metal to metal can occur via intermetallic bonding or amorphous mixture of the two. The metal-to-metal bond can form via intermetallic formation or solid solution alloy formation at the interface. By controlling the processing parameters, it is even possible to print higher melting point materials on a lower-melting point substrate.

One embodiment uses the bonding alloy or bonding metal powder mixture to bond a substrate via the bonding braze to a subsequent metal. This bonding layer softens and the bulk phase melts at lower temperature than the layer on either side. This bonding layer can therefore be removed by application of heat. This enables the support build platform to be parted from the desired part. This is in contrast to the typical method of part separation that involves machining parts from the build plate via operations like bandsaws and wire electrostatic discharge machining. In a related alternate embodiment, the bonding alloy or bonding powder mixture can be used as internal support structure that will be softened or melted away during post-processing. Thus, the bonding alloy or bonding powder mixture can form the support that enables overhangs, yet also is easily removable via melting, rather than mechanical means. The bonding alloy or bonding powder mixture can be distributed via a stream or via a powder recoater process. The process can even be conducted in two steps, with one additive printer printing one material and a second additive printer printing the next layer, so that a multi-material powder bed fusion or multi-material directed energy deposition tool is not required.

In yet another embodiment, the bonding alloy or bonding powder can be printed directly on a metal, and then subsequently bonded via an oven to a dissimilar substrate (e.g., ceramic or glass). In a particular embodiment, the $Sn_3Ag_4Ti$ alloy can be printed on steel, and then that can be bonded at elevated temperatures to a different metal or non-metal, including from the following possible combinations; oxides (e.g., silica glass, quartz, borosilicate glass, alumina, beryllia, ceria, zirconia, lithium aluminum silicates, gallium oxide, indium tin oxide, indium zinc oxide), silicides (e.g., molybdenum disilicide), nitrides, and carbides (e.g., silicon carbide), carbon materials (e.g., diamond, pyrolytic graphite, carbon nanotubes, graphene, fullerenes), borides (e.g., tungsten borides), arsenides (e.g., gallium arsenide), sulfides (e.g., zinc sulfide), gallium arsenide, stainless steel, copper and copper alloys, and aluminum and aluminum alloys. In yet another embodiment of the invention, a surface may already be coated or made of the bonding alloy and be subsequently additively manufactured on top of the surface.

The glass powder may be a low melting point glass, e.g., leaded glass or lead-free low melting point glass alternatives such as Hitachi Vaneetect or from Corning, JP2010184852A; U.S. Pat. Nos. 3,837,866A; 4,743,302A, WO2016175469A1. For example, the technology may be used to print a pattern of low melting point glass onto a higher melting point glass, for example to provide relief features on a glass surface, such as to provide tactile guidance on a touchscreen, binary (or digital) refractive lens structures, e.g., Fresnel lens type structures, and the like. A low melting temperature glass has a melting point below about 400° C.

In yet another embodiment, the substrate and/or powder can be coated in a metallization that promotes bonding and/or reduces surface fouling. The surface may be coated via techniques including evaporation, sputtering. The metallization can include elements X=Ti, Ta, Zr, V, Hf, Cr, Mo, W, Nb.

In several embodiments of this invention, a 3D pattern or mold can be used to produce the desired features on a ceramic or glass substrate. This mold can be made of a flexible and heat-resistant material like silicone and loaded with brazing alloy powder on the top layer to be bonded to the ceramic or glass substrate. This can be done layer-by-layer. Layers below this bonding alloy can be powder or solid metal to be added to the ceramic or glass substrate. This technique can then have thermal energy from a heat source, including a laser, a microwave or infrared heat source, bond and fuse the metal to the ceramic or glass substrate. The microwave has a greater absorption in the powder than semiconductor, so selectively absorbs more energy, thus not damaging the ceramic or glass. Subsequent layers or bonding to other metals can follow.

In several embodiments of the invention, the processing parameters of a specific bonding alloy powder (homogeneous or inhomogeneous) are determined as a function of the substrate, underlying layer, layer height, directed energy spot size, ambient gas, powder deposition methodology. To determine the ideal print properties, a print on the substrate with different power and scan rate features will be made, and the surface texture and mechanical strength of the alloy and interface are examined. This processing is examined for single and multiple exposures. Once the process for the first layer is determined, subsequent layers and transition layer processing parameters are determined in a similar manner. Methods of examining the print include profilometry to estimate contact angle, mechanical testing via macro mechanical testing and by solder ball shear or pull-off testing.

One embodiment creates surface texturing or voids or wicking texture to enhance phase-change heat transfer. One attractive way to improve heat transfer is to use phase-change, especially boiling and evaporation for cooling. Two-phase cooling via boiling has heat transfer coefficients orders-of-magnitude higher than single-phase liquid cooling, due to the large amount of energy required to vaporize liquids per unit weight. The rate of boiling heat transfer is a function of how many bubble generating sites are available. Scratches and pits often act as nucleation sites, as the crevices encourage bubble growth by reducing the energy required for bubbles to nucleate compared to a flat surface. One way they do this is by trapping nuclei of bubbles that reduce the energy of bubble generation, and increase the heat transfer in the onset boiling regime. Reentrant cavities also delay the critical heat flux, which is the maximum heat flux before any further increase in surface temperature will actually have reduced heat flux due to water vapor blanket fully enveloping the surface, which insulates the surface. Therefore, one embodiment of this invention is to intentionally create texturing for bubble nucleation. An additional embodiment further coats the surface to make bubble liftoff easier and liquid replenishment of bubble sites easier. This can involve deposition via solution, chemical vapor deposition, physical vapor deposition, and/or atomic layer deposition.

In another embodiment, wicks for evaporative cooling and heat pipes are mode using this bonding alloy or bonding powder mixture. While there are many varieties of heat pipes, the basic variety has two primary components; 1) a wick that draws refrigerant into the evaporator by capillary pressure and 2) a condenser that condenses the vaporized refrigerant. The effective thermal conductivity of typical heat pipes exceed that of copper by several times.[63] One embodiment of this invention is directly producing these wicks on the active electronic devices substrate. In an alternative embodiment these wicks are used for evaporative cooling in an open system. The evaporator features could be printed via this technique and a lid can seal and integrate this into a heat-pipe system. It can be sealed to the substrate with adhesive or melting a material that bonds well to the substrate. The lid can be made of any number of materials, including polymers and metals.

An alternative embodiment is to create microchannels. These microchannels can be used for cooling or for microfluidic integration. The microchannels can also be used to make integrated cooling channels for non-wicked heat pipes, like oscillating heat pipes and for two-phase heat transfer devices called vapor chambers. The microchannels can be produced by this technique and a lid that can seals to the chip and has flow inlets and outlets can be used.

Another embodiment uses the bonding alloy or bonding powder mixture to fabricate electrical connections to the substrate. This process can involve transitioning from the bonding metal alloy to a different metal for reasons such as improved electrical conductivity. In some embodiments, electrical connections and thermal heat sinking can occur on the same electrical device. On certain substrates these connections could be made to transparent conductive material (e.g., indium tin oxide, indium zinc oxide, graphene).

It is therefore an object to provide a method for forming a metal structure bonded to a dissimilar substrate, comprising: providing a substrate having a bonding surface; depositing a powder comprising components that, when heated to at least a melting temperature, melts and chemically reacts with the substrate to form an interlayer which adheres the melted powder to the dissimilar substrate; heating a portion of the powder deposited on the substrate with a localized energy source, the localized energy source being dynamically controlled to regionally melt the portion of the powder substantially without melting all of the powder and without bringing the substrate into thermal equilibrium, said heating being sufficient to form the interlayer which adheres the melted powder to the dissimilar substrate; and cooling the regionally melted portion of the powder to form a solid layer, wherein the solid layer is adhered to the dissimilar substrate.

A device, comprising a fused powder conductive metal alloy, wherein the alloy forms an interlayer comprising at least one intermetallic or intermetallic-like compound component with a dissimilar material supporting surface, the fused powder being formed on the dissimilar material supporting surface as a conductive trace separated from at least one other trace by an insulating region, the dissimilar material supporting surface being part of a substrate having a heat sensitive structure which is degraded at a temperature lower than a melting point of the conductive metal alloy.

The cooling may occur concurrently with heating of a different portion of the powder deposited on the substrate with the localized energy source, to regionally melt the different portion of the powder.

The localized energy source may have a heating diameter, and the melted portion of the powder is confined to a region extending laterally along the surface no more than three times the heating diameter. The localized energy source has an energy density of about 40 J/mm$^3$. The localized energy source may have an energy density of less than about 150 J/mm$^3$.

The method may further comprise reheating the portion of the powder deposited on the substrate with the localized energy source, to enhance formation of the interlayer which adheres the melted powder to the dissimilar substrate, and subsequently cooling the regionally remelted portion of the powder to reform the solid layer.

The localized energy source may heat the region above the melting temperature for a duration of less than about 60 seconds, or 30 seconds, or 20 seconds, or 20 seconds, or 5 seconds, or 2.5 seconds, or 1 second, or about 100 milliseconds, or 10 milliseconds, or 1 millisecond, or 100 microseconds, or 25 microseconds, for example.

The localized energy source may heat the region for a duration of less than about 60 seconds, or 30 seconds, or 20 seconds, or 20 seconds, or 5 seconds, or 2.5 seconds, or 1 second, or about 100 milliseconds, or 10 milliseconds, or 1 millisecond, or 100 microseconds, or 25 microseconds, for example.

The localized energy source may be pulsatile or continuous. The localized energy source may be dynamically repositioned over the surface, during exposure or between pulses of exposure. The powder may comprise a metal powder, e.g., having a melting temperature of less than 1600° C., or 1500° C., or 1400° C., or 1300° C., or 1250° C., or 1200° C., or 1100° C., or 1000° C., or 900° C., or 800° C., or 700° C., or 600° C., or 500° C., or 400° C., or 375° C., or 350° C., or 325° C., or 300° C., or 290° C., or 285° C., or 280° C., or 270° C., or 260° C., or 250° C., or 240° C., or 230° C., or 220° C., or 210° C., or 200° C., or 190° C., or 180° C., or 170° C., or 160° C., 150° C., or 140° C., or 130° C., or 125° C., or 120° C., 110° C., 100° C., or 90° C., or 80° C., or 79° C., or 75° C., for example.

The powder may chemically react with the dissimilar substrate to form an intermetallic or intermetallic-like compound. The powder may chemically react with the dissimilar substrate to form a metal carbide or metal silicide compound. The powder may chemically react with the dissimilar substrate in an anoxic or inert environment, such as argon, helium or nitrogen gas.

At least one of the powder and the dissimilar substrate may be flammable in air, especially under conditions of focused laser or electron beam irradiation. At least one of the powder and the dissimilar substrate may be patterned by modulating a flow of reactive gas, such that regions exposed to the focused energy beam in the presence of the reactive gas have different properties than regions exposed to the focused energy beam in the absence of the reactive gas. The modulated property may be porosity, hydrophilicity/hydrophobicity, adhesion to subsequent layers of fused metal or metal particles, bubble liftoff, surface roughness, electrical conductivity, thermal conductivity, optical refractive properties, optical reflective properties, optical absorption properties, frictional coefficient, chemical reactivity, wear-resistance, etc.

The powder may melt to form a metal layer having less than about 1% void space. The melted powder may have a density of at least 99% of a homogeneous solid formed of the same composition as the powder.

The heating may comprise selective laser melting (SLM), electron beam exposure, or other techniques.

The dissimilar substrate may comprise pyrolytic carbon, graphite, silicon, an integrated circuit wafer, stainless steel, 316L stainless steel, a gallium arsenide wafer, an integrated circuit formed on a semiconductor wafer, a microprocessor formed on a silicon wafer, silicon carbide, diamond, a diamond-like coating, gallium oxide, a material with a conductive transparent substrate (indium tin oxide, indium zinc oxide, graphene), silica glass, quartz, borosilicate glass, molybdenum disilicide, tungsten borides, dissimilar metal, a heatsink or other materials, devices or structures.

The solid layer may be part of a stack of solid layers formed above the bonding surface.

The stack of solid layers may define a bounded space. The bounded space may define a fluid flow channel. The fluid flow channel may comprise a microchannel heat exchanger. The fluid flow channel may comprise a phase change heat pipe.

The stack of solid layers may be homogenous or heterogeneous. The stack of solid layers may have a composition gradient. The stack of solid layers may have a composition discontinuity. The stack of solid layers may comprise a low melting point solder.

The dissimilar substrate may be non-metallic and the solid layer may be metallic.

The solid layer may have a first melting point, and a second solid layer is formed over the solid layer having a second melting point, the second melting point being higher than the first melting point, wherein heating the dissimilar substrate to a temperature between the first melting point and the second melting point causes a loss of material integrity between the dissimilar substrate and the second solid layer, making the second solid layer separable from the dissimilar substrate.

The preferred embodiment is a localized energy source that may comprise a laser beam or an electron beam. Alternative embodiments could use an energy source that is less localized, like a microwave energy source, an infrared heating element, or a heated stylus (eg soldering iron tip), possibly with a template or mold providing finer detailing on where material should bond to the substrate.

The dissimilar substrate and the solid layer may have similar coefficients of thermal expansion, wherein thermal mismatch does not cause delamination over a temperature range of −25° C. to +125° C. The dissimilar substrate and the solid layer may have different coefficients of thermal expansion, wherein thermal mismatch is sufficient to reliably cause delamination at a temperature under 250° C.

The pattern produced can have features that are sized small enough that the thermal stresses do not lead to interfacial delaminations. The features can be printed in smaller units at a time so the heat buildup and thermal stresses from cool-down of melt are below the interfacial bond failure stress limit.

The powder may comprise a metal having between about 1% and 10% by weight aggregate of at least one of Ti, Zr, V, Nb, Hf, Ta, Mo, Cr, and W. Various metals form silicide compounds, including; Sc, Ti, V, Cr, Mn, Fe, Co, Ni, Cu, Y, Zr, Nb, Mo, Ru, Rh, Pd, Hf, Ta, W, Re, Os, Jr, Pt, La, Ce, Pr, Nd, Sm, Eu, Gd, Tb, Dy, Ho, Er, Yb, Lu, Th, U, Np, Pu, Am, and Cm. Therefore, these components may be present within the powder to be processed, and potentially form silicides that enhance adhesion to a silicon substrate. Some of these would only be useful in very particular circumstances, for example, Np, Am and Cm might find application in high-cost tolerant situations where one seeks a future release of the solid metal from the silicon, as might result from radioactive decay of the silicides that promote adhesion. Some of these same silicide forming elements also promote bonding to silica materials like ceramics composed of silica, quartz, borosilicate glasses, lithium aluminum silicate glass-ceramics.

The powder may comprise a solder alloy selected from the group consisting of at least two of Sn, Pb, Ag, Cu, Sb, Bi, In, Zn, Cd, Au, Ni, Si, Ge, Si, and Al. The powder may comprise a solder alloy selected from the group consisting of; InSn (e.g., $In_{52}Sn_{48}$, $In_{60}Sn_{40}$, $In_{50}Sn_{50}$, $In_{42}Sn_{58}$), InCd (e.g., $In_{74}Cd_{26}$), BiPbInCdSn (e.g., $Bi_{44.7}Pb_{22.6}In_{19.1}Cd_{5.3}Sn_{8.3}$), InBiSn (e.g., $In_{51}Bi_{32.5}Sn_{16.5}$), InBiCd (e.g., $In_{61.7}Bi_{30.8}Cd_{7.5}$), BiPbSnIn (e.g., $Bi_{49}Pb_{18}Sn_{12}In_{21}$), BiPbSnCd (e.g., $Bi_{50}Pb_{26.7}Sn_{13.3}Cd_{10}$), BiSnIn (e.g., $Bi_{56}Sn_{30}In_{14}$), BiPbSn (e.g., $Bi_{52}Pb_{32}Sn_{16}$, $Bi_{50}Pb_{31.2}Sn_{18.8}$), BiPb (e.g., $Bi_{58}Pb_{42}$), SnPbBi (e.g., $Sn_{46}Pb_{46}Bi_{8}$), InSnPbCd (e.g., $In_{70}Sn_{15}Pb_{9.6}Cd_{5.4}$), SnPbIn (e.g., $Sn_{54}Pb_{26}In_{20}$, $Sn_{37.5}Pb_{37.5}In_{25}$, $Sn_{70}Pb_{18}In_{12}$), BiSnAg (e.g., $Bi_{57}Sn_{42}Ag_{1}$), BiSn (e.g., $Bi_{56}Sn_{42}$, $Bi_{58}Sn_{42}$), SnBiPb (e.g., $Sn_{48}Bi_{32}Pb_{20}$, $Sn_{43}Pb_{43}Bi_{14}$), CdSn (e.g., $Cd_{70}Sn_{30}$), InPbAg (e.g., $In_{80}Pb_{15}Ag_{5}$), InAg (e.g., $In_{97}Ag_{3}$, $In_{90}Ag_{10}$), SnPbCd (e.g., $Sn_{51.2}Pb_{30.6}Cd_{18.2}$), InPb (e.g., $In_{75}Pb_{25}$, $In_{70}Pb_{30}$, $In_{60}Pb_{40}$, $In_{50}Pb_{50}$, $Pb_{75}In_{25}$), In, PbSnZn (e.g., $Pb_{63}Sn_{34}Zn_{3}$), SnZnInBi (e.g., $Sn_{86.5}Zn_{5.5}In_{4.5}Bi_{3.5}$), SnInAg (e.g., $Sn_{77.2}In_{20}Ag_{2.8}$, $Sn_{86.9}In_{10}Ag_{3.1}$, $Sn_{91.8}In_{4.8}Ag_{3.4}$, $Sn_{88}In_{8.0}Ag_{3.5}Bi_{0.5}$), SnZnCd (e.g., $Sn_{40}Zn_{27}Cd_{33}$), SnPbZn (e.g., $Sn_{30}Pb_{50}Zn_{20}$), PbSnAg (e.g., $Pb_{54}Sn_{45}Ag_{1}$, $Sn_{62}Pb_{36}Ag_{2}$, $Pb_{80}Sn_{18}Ag_{2}$, $Pb_{96}Sn_{2}Ag_{2}$, $Pb_{88}Sn_{10}Ag_{2}$, $Pb_{92}Sn_{5.5}Ag_{2.5}$, $Pb_{90}Sn_{5}Ag_{5}$, $Pb_{93.5}Sn_{5}Ag_{1.5}$, $Pb_{95.5}Sn_{2}Ag_{2.5}$), SnZnIn (e.g., $Sn_{83.6}Zn_{7.6}In_{8.8}$), PbSn (e.g., $Pb_{90}Sn_{10}$, $Pb_{85}Sn_{15}$, $Pb_{80}Sn_{20}$, $Sn_{63}Pb_{37}$, $Sn_{70}Pb_{30}$, $Sn_{90}Pb_{10}$, $Sn_{63}Pb_{37}P_{0.0015-0.04}$, $Sn_{62}Pb_{37}Cu_{1}$, $Sn_{97.5}Pb_{1}Ag_{1.5}$), SnZnBi (e.g., $Sn_{89}Zn_{8}Bi_{3}$), SnZn (e.g., $Sn_{91}Zn_{9}$, $Sn_{85}Zn_{15}$, $Sn_{60}Zn_{40}$, $Zn_{70}sn_{30}$, $Zn_{60}Sn_{40}$, $Sn_{50}Zn_{49}Cu_{1}$, $Sn_{90}Zn_{7}Cu_{3}$), SnBiAg (e.g., $Sn_{91.8}Bi_{4.8}Ag_{3.4}$), SnAgCu (e.g., $Sn_{96.5}Ag_{3.0}Cu_{0.5}$, $Sn_{95.5}Ag_{4.0}Cu_{0.5}$, $Sn_{95.8}Ag_{3.5}Cu_{0.7}$, $Sn_{95.6}Ag_{3.5}Cu_{0.9}$, $Sn_{99}Cu_{0.7}Ag_{0.3}$, $Sn_{96.2}Ag_{2.5}Cu_{0.8}Sb_{0.5}$, $Sn_{90.7}Ag_{3.6}Cu_{0.7}Cr_{5}$, $Sn_{95}Ag_{3.5}Zn_{1}Cu_{0.5}$, $Sn_{95.5}Cu_{4}Ag_{0.5}$, $Sn_{97}Cu_{2.75}Ag_{0.25}$), SnAu (e.g., $Sn_{90}Au_{10}$), SnAg (e.g., $Sn_{96.5}Ag_{3.5}$—$Sn_{93}Ag_{7}$), SnCu (e.g., $Sn_{99.3}Cu_{0.7}$, $Sn_{97}Cu_{3}$), SnPbZn (e.g., $Sn_{33}Pb_{40}Zn_{28}$), Sn, SnSb (e.g., $Sn_{95}Sb_{5}$—$Sn_{99}Sb_{1}$), SnAgSb (e.g., $Sn_{64}Ag_{25}Sb_{10}$), PbIn (e.g., $Pb_{81}In_{19}$, $Pb_{70}In_{30}$, $Pb_{75}In_{25}$, $Pb_{90}In_{5}Ag_{5}$, $Pb_{92.5}In_{5}Ag_{2.5}$, $Pb_{92.5}In_{5}Au_{2.5}$), CdZn (e.g., $Cd_{82.5}Zn_{17.5}$, $Cd_{70}Zn_{30}$, $Cd_{60}Zn_{40}$, $Zn_{90}Cd_{10}$, $Zn_{60}Cd_{40}$, $Cd_{78}Zn_{17}Ag_{5}$), Bi, AuSn (e.g., $Au_{80}Sn_{20}$), PbSbSn (e.g., $Pb_{80}Sb_{15}Sn_{5}$), PbAg (e.g., $Pb_{94.5}Ag_{5.5}$—$Pb_{96}Ag_{4}$, $Pb_{97}Ag_{1.5}Sn_{1}$, $Pb_{97.5}Ag_{2.5}$), CdAg (e.g., $Cd_{95}Ag_{5}$), AuSi (e.g., $Au_{98}Si_{2}$, $Au_{96.8}Si_{3.2}$), ZnAl (e.g., $Zn_{95}Al_{5}$), ZnSn (e.g., $Zn_{95}Sn_{5}$), Zn, AuIn (e.g., $Au_{82}In_{18}$), AuGe (e.g., $Au_{87.5}Ge_{12.5}$). The powder may comprise $Sn_{3}Ag_{4}Ti$, or an AgCuTi alloy. The powder may comprise an $Ag_{21}Cu_{5}X$ alloy where X=Ti, Ta, Zr, V, Hf, Cr, Mo, W, and Nb. The powder may comprise a Cu alloy having between about 1% and 10% by aggregate weight of X=Ti, Ta, Zr, V, Hf, Cr, Mo, W, and Nb. The powder may comprise an Al alloy having between about 1% and 10% by aggregate weight of X=Ti, Ta, Zr, V, Hf, Cr, Mo, W, and Nb.

The localized energy source may be a 1064 nm Yb-fiber laser. A position of the localized energy source may be controlled by a galvanometer mirror system. The localized energy source may have a heating zone of less than 300 µm deep.

The dissimilar substrate may comprise at least one of silicon and graphite, with a solid layer formed of $Sn_{3}Ag_{4}Ti$, and a second solid later of 316L stainless steel formed on the $Sn_{3}Ag_{4}Ti$.

The heating and cooling may be repetitively cycled to reduce a contact angle.

The heating and cooling may be repetitively cycled to increase a mechanical strength.

The heating and cooling may be repetitively cycled to relieve residual thermal stress.

The solid layer bonded to the dissimilar substrate may comprise a heat spreader for a heat dissipative device.

It is another object to provide a method of forming a heatsink for an integrated circuit, comprising: depositing a metallic powder on an integrated circuit substrate; and locally heating the metallic power to a sufficient temperature to melt the metallic powder with focused energy, having limited duration at a particular region to avoid heat-induced functional damage to the integrated circuit, and cooling the melted metallic powder to form a solid layer, to form an adherent bond between the integrated circuit substrate and the solid layer.

The adherent bond may comprise a metal silicide component interlayer.

The locally heating may comprise exposing the metallic powder to radiation pulses, and/or spatially scanned radiation.

The locally heating may remelt and subsequently cool regions of the solid layer.

The method may further comprise depositing a second metallic powder over the solid layer, the second metallic powder being different from the metallic powder; and locally heating the second metallic power to a sufficient temperature to melt the second metallic powder, substantially without heat-induced functional damage to the integrated circuit, while forming an alloy interlayer between the melted second metallic powder and the solid layer.

The silicon wafer (or other substrate) may be cleaned by a process selective from the group consisting of at least one of a chemical, a mechanical, and an ablative cleaning step.

It is a further object to provide a method for forming a selectively melted metal structure, comprising: providing a substrate having a bonding surface; depositing a first powder comprising components of a fused low melting temperature metal, having a composition that, when heated, chemically reacts with the substrate; heating the first powder, on the substrate, with localized energy source to melt the powder and the melted low melting temperature metal, and to react with the bonding surface, sufficient to form a bonding interlayer; depositing a second powder comprising components of a high melting temperature metal, having a composition that, when heated, forms an alloy interlayer with the lower melting temperature metal substrate; and heating the second powder, on the fused low melting temperature metal, with localized energy pulses to fuse the second powder, and to alloy with the fused low melting temperature metal.

The substrate mat be further heated to at least soften the fused low melting temperature metal while maintaining the fused high melting temperature metal as a solid; and the solid fused high melting temperature metal then removed from the substrate.

After removing the solid fused high melting temperature metal from the substrate, the substrate may be reused by; depositing a third powder comprising components of a fused low melting temperature metal, having a composition that, when heated, chemically reacts with the substrate; and heating the third powder, on the substrate, with localized energy source to melt the powder and the melted low melting temperature metal, and to react with the bonding surface, sufficient to form a bonding interlayer.

It is another object to provide a metal alloy powder for use in additive manufacturing, comprising a particles of metal alloy, and particles which form non-metal inclusions, wherein a fused volume of the metal alloy powder formed by localized heating has a plurality of surface re-entrant cavities configured to promote bubble nucleation in a heat transfer fluid.

The configuration of the surface re-entrant cavities may be controllable by a modulation and a power setting of a laser power source.

It is a still further object to provide a heat transfer device comprising the fused volume of the metal alloy powder, formed by localized heating having the plurality of surface re-entrant cavities configured to promote bubble nucleation in the heat transfer fluid.

It is also an object to provide a method for forming a structure bonded to a substrate, comprising: providing a substrate; forming an interlayer by chemical reaction on the substrate, between the substrate and a metal layer; depositing a metallic powder on the metal layer; heating a portion of the metallic powder deposited on the substrate with a localized energy source in a localized heating region, the localized energy source being dynamically controlled to regionally melt the portion of the metallic powder substantially while leaving an adjacent portion of the metallic powder unmelted, and without bringing the substrate underneath the localized heating region into thermal equilibrium; and cooling the regionally melted portion of the metallic powder to form a solid layer.

The cooling may occur concurrently with heating of a different portion of the metallic powder deposited on the surface with the localized energy source, to regionally melt the different portion of the metallic powder.

The localized energy source may be operated continuously and is dynamically repositioned over the surface. The metallic powder may consist essentially of a metal or metal alloy powder. The powder may chemically react with the surface of the substrate to form at least one of an intermetallic compound, a metal carbide compound, a metal nitride compound, a metal boride compound, and a metal silicide compound. A location of the localized heating region may be controlled over time to selectively melt the powder into a predefined patterned layer having gaps between portions of the solid layer. The heating may comprise selective laser melting (SLM). The substrate may comprise a semiconductor. The surface of the substrate may comprise an aluminum or copper layer.

The method may further comprise forming a stack of layers over the solid layer above the bonding surface, by sequentially depositing a powder on an upper surface and melting the powder, in a predetermined pattern, to form a three-dimensional structure which adheres to the substrate.

It is a further object to provide a method of forming a structure on an integrated circuit, comprising: depositing a powder on a surface of a substrate comprising an integrated circuit; and locally heating the powder to a sufficient temperature to melt the powder with focused energy, having limited duration at a particular region to avoid heat-induced functional damage to the integrated circuit, and cooling the melted powder to form a solid layer, wherein an adherent bonding layer is present between the substrate and the solid layer comprising a chemical reaction product distinct from a composition of the surface and a composition of the solid layer.

The adherent bonding layer may comprise an interlayer selected from the group consisting of an intermetallic compound, a metal silicide, a metal carbide, a metal boride, and a metal nitride, and the solid layer comprises a metal or metal alloy, and the method further comprise forming a stack of additional solid layers over the solid layer in a regional pattern to form a three dimensional structure having at least one space over the substrate between respective portions of the regional pattern, while avoiding heat-induced functional damage to the integrated circuit.

Another object of the invention provides a device, comprising: a fused layer, formed by a process comprising: depositing a powder on a supporting surface of a substrate, comprising particles; and locally heating a portion of the powder on the supporting surface with a focused energy beam, substantially without achieving thermal equilibrium in the substrate, to fuse the locally heated portion of the powder to form an adhesion interlayer.

The adhesion layer may be formed substantially without concurrently fusing a non-locally heated portion of the powder, configured as a region-specific pattern.

The adhesion interlayer may comprise a heating-induced chemical reaction product of the supporting surface of the substrate and the powder The powder may further comprise particles which form inclusions in the fused volume of powder, wherein after locally heating, the powder, an exposed surface of the fused volume of powder comprises a plurality of surface re-entrant cavities.

The region-specific pattern of the device may be configured as a heat sink.

The fused volume may have a surface with adjacent regions of heterogeneous aqueous fluid wetting, wherein regions with high wettability promote aqueous liquid flow to bubble generation sites, and regions with low wettability promote bubble liftoff. The region-specific pattern may define a circumferential wall of a microchannel configured to guide fluid flow.

The powder may comprise a metal alloy, and between about 1% to about 10% aggregate weight, per weight of the metal alloy, of a reactive element that bonds actively to the substrate surface selected from the group consisting of Ti, Ta, Zr, V, Hf, Cr, Mo, W, and Nb.

A further object of the invention provides a manufactured structure, comprising: a substrate; an interface layer, comprising a chemical reaction product of a surface of the substrate and a metallic composition; and a solid layer, formed over the interface layer from fused portions of the powder, in a regional pattern having at least one void region over the substrate.

The substrate may comprise an integrated circuit having a deposited metal layer, the solid layer is metallic, the fused interface layer comprises an intermetallic composition, and the regional pattern is configured as a heatsink for the integrated circuit.

The manufactured structure may further comprise an additional solid layer formed on the solid layer by regional heating of a powder.

The additional solid layer may be formed in a three dimensional pattern having a gap between selectively formed regions of the regional pattern.

The solid layer may be formed by fusion of a powder that chemically reacts with the surface to form the interface layer comprising at least one of an intermetallic compound, a metal carbide compound, a metal nitride compound, a metal boride compound, and a metal silicide compound.

The substrate may comprise a semiconductor. The semiconductor may be configured as an integrated electronic circuit, and wherein the solid layer is configured as a set of electrically-isolated electrical interconnects to the integrated electronic circuit.

A still further object provides an adhesive interlayer between a substrate and a fused metal alloy powder, comprising a chemical reaction product comprising at least one of a metal silicide, a metal carbide, a metal boride, and a metal nitride with a respective substrate, the chemical reaction product forming a shear resistant layer which causes the fused metal alloy powder to adhere to the substrate.

The chemical reaction product may be selected from the group consisting of an intermetallic compound, an intermetallic-like compound, or a chalcogen bond compound.

It is another object to provide a device, comprising: a fused metal alloy, formed by a process comprising: depositing a powder on a supporting surface of a dissimilar substrate, comprising particles of metal alloy wherein the powder is reactive under heating with the supporting surface of the dissimilar substrate to form an interlayer comprising at least one intermetallic or intermetallic-like compound component; and locally heating the powder on the supporting surface with a focused energy beam, substantially without achieving thermal equilibrium, to fuse the volume of the powder and form the interlayer.

The powder may further comprise particles which form non-metal inclusions in the fused volume of powder, wherein after locally heating, the powder, an exposed surface of the fused volume of powder comprises a plurality of surface re-entrant cavities. A configuration of the re-entrant cavities may be controlled by a modulation and power setting of the focused energy source. The device may be configured as a heat sink, a heat pipe, or a heat spreader.

The device may have a porous surface of the fused volume configured to promote fluid wicking. The porous surface of the fused volume may be configured to promote heat transfer by fluid wicking.

The fused volume may have a surface with adjacent regions of heterogeneous aqueous fluid wetting, wherein regions with high wettability promotes aqueous liquid flow to bubble generation sites, and regions with low wettability promote bubble liftoff. The adjacent regions of heterogeneous aqueous fluid wetting may be defined by a selective coating on the surface. The adjacent regions of heterogeneous aqueous fluid wetting may be defined by a selective surface treatment. The adjacent regions of heterogeneous aqueous fluid wetting may be defined by a selective control over the focused energy beam during the locally heating. The adjacent regions of heterogeneous aqueous fluid wetting may be defined by a selective control over an atmosphere during the locally heating.

The locally heating may be conducted in an inert gas.

The locally heating may be controlled to define a microchannel configured to guide fluid flow within the fused volume of powder, the microchannel being covered by at least one layer above the fused volume of powder.

The dissimilar substrate may be formed of a dissimilar metal with respect to the fused metal alloy.

The device may further comprise a metal structure bonded to the dissimilar substrate. The dissimilar substrate may be formed of a non-metal or a metal.

The fused volume may be separated from the dissimilar substrate after formation.

The device may further comprise at least one additional layer of metal alloy formed over the fused volume of the powder, the at least one additional layer of metal alloy having a higher melting point than the fused volume of the powder.

The device may further comprise at least one metal layer formed over the fused volume of the powder by a process selected from the group consisting of; sputtering, plasma coating, electrodeposition, and evaporation.

The powder may consist essentially of an SnAgX alloy, where X is a reactive element selected from the group consisting of Ti, Ta, Zr, V, Hf, Cr, Mo, W, and Nb in an amount of between about 1% to about 10% by weight, where Ag is about 3% by weight and Sn is the balance.

The powder may consist essentially of an AgCuX alloy, where X is a reactive element selected from the group consisting of Ti, Ta, Zr, V, Hf, Cr, Mo, W, and Nb in an amount of between about 1% to about 10% by weight, where Cu is about 35% by weight and Ag is the balance.

The powder may consist essentially of a Cu alloy comprising copper and additional alloying elements, and optional non-metallic particles, wherein the additional alloying elements are provided in an effective amount to reactively bond with dissimilar substrate to form the intermetallic or intermetallic-like compound, and to lower a melting point of the Cu alloy with respect to Cu.

The additional alloying elements may comprise at least one of Ti, Ta, Zr, V, Hf, Cr, Mo, W, and Nb in weight percentages from about 1-10 wt %, the Cu alloy being at least 50% by weight Cu.

The powder may comprise a mixture of metal powder and non-metal reinforcements.

The locally heating may be performed by controlling a focused laser, to determine; an optimal laser processing power, an optimal scan rate, and an optimal fused volume thickness, for each of a plurality of layers of powder formed on the dissimilar substrate, by rastering multiple scan rates and laser processing power on test parts for each layer thickness, and inspecting the test parts to determine the optimum processing conditions, and subsequently employing the determined optimum processing conditions on other parts. The testing may comprise a visual inspection and/or thermal testing of the test parts.

The powder may comprise of a powder with a homogeneous concentration of an alloying mixture, or a powder with a heterogeneous metal powder.

It is another object to provide a metal alloy powder for selective laser melting additive manufacturing, comprising: optional non-metallic inclusion particles; particles which comprise components that fuse to form an alloy having a thermal conductivity of at least 17 W/mK at 25° C., and forms at least one of metal silicides, metal carbides, and metal nitrides with a respective non-metallic substrate comprising silicon, carbon, or nitrogen, in an interlayer region with the non-metallic substrate.

The powder may comprise the metal alloy, and between about 1% to about 10% aggregate weight, per weight of the metal alloy, of a reactive element that bonds actively to the substrate surface. The reactive element may be one of more element selected from the group consisting of Ti, Ta, Zr, V, Hf, Cr, Mo, W, and Nb. The reactive element may facilitate bonding to a substrate selected from the group consisting of Si, SiC, SiN, graphite, diamond, carbon nanotubes, graphene, fullerenes, GaN, GaAs, $\beta Ga_2O_3$, gallium oxide, $Al_2O_3$, and $SiO_2$ (glass and quartz), silica glass, quartz, borosilicate glass, aluminosilicate glass, lithium aluminum silicates, indium tin oxide, indium zinc oxide, molybdenum disilicide, tungsten boride, gallium arsenide, zinc sulfide, beryllia, ceria, zirconia, indium tin oxide, and indium zinc oxide.

In certain embodiments, additively manufactured metal structures are formed onto glasses and ceramics by directed energy deposition (e.g., laser beam, electron beam) that fuses a metal alloy onto a ceramic or glass substrate. This bond for an oxide-based ceramic or glass will occur via diffusional bonding (e.g., titanium oxides and titanium silicides forming from Ti in bonding alloy bonding to silica-based materials). Vacuum or protective gas such as argon, nitrogen might be used. After deposition of one or more layers of the brazing alloy, the material can be switched to other metals such as stainless steel, titanium alloys, copper alloys, aluminum alloys to build various structures. The thickness of the brazing alloy is a function of the thermal stress to be resisted and interfacial strength of the bond to the substrate. The brazing alloy in this process acts as an interface material and has components that bond to both glass or ceramic and the subsequent metal, unless a structure of the bonding alloy is desired. Because the laser exposure time is very short and high temperatures are reached, rapid bonding is enabled compared to conventional bonding. Moreover, because only a small section of the layer is molten at a time, the stresses at the interfaces can be reduced compared to a non-locally bonded interface, where the entire material is bonded at the same time. Furthermore, most metal have a greater coefficient of thermal expansion than ceramics and glasses, so the cooldown from the molten state can apply a compressive residual stress. In the case of laser heating, the absorption of the laser by the glass can affect how hot the glass substrates can get, and thus the residual stress upon cooling. Because absorption is a function of wavelength, the choice of laser wavelength is another variable that can be tuned to minimize residual stress upon cooling.

The powder bonds may form a metal oxide that diffusion bonds to the substrate.

The dissimilar substrate may comprise a substrate formed principally (e.g., >90% by weight) of silica borosilicate glasses; quartz; doped quartz, borosilicate, soda-lime glass, potash-lime glass, lead glass, flint glass, aluminosilicate glass, alumina, lithium aluminum silicate, beryllia, zirconia, gallium oxide, gallium aluminum oxide, gallium nitride, germanium oxide, silica-germania, germanium-oxide glass (alumina and germanium dioxide), fluoride glass, phosphate glass, borate glass, chalcogenide glass, indium tin oxide (ITO), an indium antimony oxide, indium oxide, indium zinc oxide, molybdenum disilicide, tungsten boride, tungsten carbide, or zinc sulfide for example.

The technology may be used to apply coatings to substrates, which may be homogeneous, heterogeneous, or patterned in two or three dimensions. The coating and/or substrate may be glass. Further, because the technology forms a chemically modified layer on the substrate, the technology may represent a treatment, such as a chemical strengthening, of the substrate.

For example, the known Corning® Gorilla® glass, AGC Inc. Dragontail®, or Schott AG Xensation®, chemically strengthened alkali-aluminosilicate glass may be formed by providing a potassium-rich coating on the base glass, and heating the interface during process to cause ion exchange, and prestress in the glass. As described in U.S. Pat. Nos. 7,666,511, 4,483,700 and 5,674,790, Corning Gorilla glass is made by fusion drawing a glass sheet and then chemical strengthening of the glass sheet. Corning Gorilla glass has a relatively deep depth of layer (DOL) of compressive stress, and presents surfaces having a relatively high flexural strength, scratch resistance and impact resistance.

See, U.S. Pat. Nos. 10,196,295; 10,195,643; 10,181,017; 10,173,916; 10,166,744; 10,162,084; 10,137,667; 10,116,777; 10,082,605; 10,051,753; 10,008,870; 9,933,820; 9,932,663; 9,931,817; 9,908,803; 9,887,066; 9,871,176; 9,850,160; 9,826,652; 9,815,144; 9,789,665; 9,774,192; 9,769,573; 9,729,187; 9,724,727; 9,676,653; 9,661,423; 9,655,293; 9,611,167; 9,599,766; 9,565,910; 9,564,938; 9,522,836; 9,512,029; 9,505,648; 9,477,346; 9,475,947; 9,471,172; 9,468,317; 9,446,979; 9,435,915; 9,434,633; 9,407,746; 9,369,553; 9,362,972; 9,351,083; 9,339,993; 9,308,616; 9,290,407; 9,287,916; 9,284,212; 9,264,090; 9,258,651; 9,231,410; 9,220,328; 9,102,007; 9,048,665; 8,994,695; 8,983,098; 8,980,115; 8,976,997; 8,974,105; 8,907,871; 8,883,314; 8,844,782; 8,842,358; 8,789,998; 8,708,458; and 8,586,492; 8,436,833. See also, U.S. Pat. Nos. 10,002,685; 10,023,495; 10,065,885; 10,117,806; 10,117,810; 10,123,947; 10,134,766; 10,135,002; 10,170,500; 10,170,726; 10,172,695; 10,202,216; 4,888,127; 5,099,759; 5,194,161; 5,628,945; 5,952,253; 5,993,701; 6,119,483; 6,128,918; 6,187,700; 6,300,263; 6,300,389; 6,360,562; 6,377,729; 6,423,387; 6,427,489; 6,430,965; 6,526,778; 6,537,648; 6,555,299; 6,593,061; 6,620,861; 6,643,442; 6,750,023; 6,771,009; 6,800,574; 6,845,635; 6,852,010; 6,866,929; 6,871,514; 6,881,483; 6,914,024; 7,040,953; 7,169,489; 7,235,736; 7,299,749; 7,312,168; 7,321,012; 7,358,008; 7,384,680; 7,405,326; 7,420,065; 7,438,990; 7,514,174; 7,521,567; 7,521,928; 7,629,480; 7,631,518; 7,635,617; 7,666,568; 7,678,668; 7,691,279; 7,727,846; 7,825,007; 7,838,130; 7,851,804; 7,867,907; 7,964,262; 7,977,405; 7,989,068; 8,007,557; 8,066,946; 8,114,211; 8,119,267; 8,119,315; 8,339,837; 8,357,311; 8,357,731; 8,361,873; 8,367,224; 8,414,424; 8,435,477; 8,455,331; 8,497,312; 8,546,161; 8,552,088; 8,568,684; 8,586,199; 8,592,057; 8,610,120; 8,617,994; 8,628,987; 8,634,228; 8,654,566; 8,697,322; 8,765,837; 8,766,253; 8,783,063; 8,790,768; 8,790,793; 8,797,487; 8,815,974; 8,829,528; 8,884,284; 8,907,879; 8,916,406; 8,919,150; 8,926,389; 8,932,060; 8,932,184; 8,951,650; 8,957,468; 8,987,728; 8,988,116; 9,034,442; 9,035,867; 9,040,975; 9,070,399; 9,082,861; 9,102,566; 9,105,869; 9,112,086; 9,112,168; 9,142,681; 9,145,363; 9,168,573; 9,175,174; 9,184,355; 9,186,295; 9,198,829; 9,241,869; 9,260,390; 9,272,946; 9,287,521; 9,333,148; 9,359,513; 9,406,698; 9,408,781; 9,474,688; 9,474,689; 9,478,422; 9,490,350; 9,490,351; 9,494,829; 9,511,005; 9,575,037; 9,603,775; 9,603,780; 9,608,228; 9,614,160; 9,625,764; 9,655,293; 9,663,400; 9,668,944; 9,682,019; 9,688,540; 9,700,485; 9,700,486; 9,705,099; 9,707,153; 9,707,154; 9,707,155; 9,713,572; 9,717,648; 9,717,649; 9,745,223; 9,755,191; 9,765,167; 9,768,026; 9,790,124; 9,839,579; 9,849,066; 9,871,209; 9,905,516; 9,915,756; 9,917,263; 9,923,000; 9,923,166; 9,972,802; 9,991,293; 9,991,453; 9,993,395; 9,999,576; 20010021292; 20010039810; 20010043996; 20020025493; 20020031731; 20020041137; 20020066233; 20020092325; 20020108400; 20020160685; 20020173416; 20030003474; 20030009126; 20030039459; 20030070916; 20030109202; 20030113506; 20030128428; 20030203205; 20040016769; 20040023087; 20040154488; 20040161789; 20040192063; 20040192171; 20040209756; 20040221515; 20040242792; 20050048571; 20050054510; 20050056806; 20050069640; 20050147752; 20050227148; 20050233886; 20060119236; 20060141362; 20060147369; 20060160919; 20060226421; 20060227695; 20060235060; 20070029927; 20070048531; 20070189986; 20070214467; 20070259220; 20080015494; 20080026220; 20080047599; 20080057267; 20080087629;

20080106261; 20080110491; 20080139342; 20080145707; 20080233434; 20080268618; 20080280424; 20080284719; 20080284768; 20080290329; 20080290795; 20080302418; 20080306182; 20080308792; 20090004764; 20090004878; 20090011575; 20090014055; 20090043116; 20090075083; 20090076189; 20090098674; 20090117707; 20090131203; 20090160325; 20090267491; 20090284138; 20100021565; 20100036075; 20100048762; 20100056026; 20100119846; 20100126132; 20100130682; 20100132765; 20100190038; 20100203706; 20100209328; 20100216907; 20100236288; 20100261144; 20100267856; 20100300532; 20100326429; 20110003143; 20110006670; 20110052921; 20110195279; 20110240594; 20110248251; 20110253990; 20110269621; 20120012032; 20120028176; 20120040283; 20120051116; 20120052625; 20120056647; 20120061665; 20120061677; 20120062813; 20120063203; 20120064650; 20120113341; 20120114518; 20120115973; 20120135153; 20120146014; 20120164413; 20120194756; 20120196952; 20120208002; 20120214900; 20120238658; 20120241734; 20120244060; 20120261654; 20120264884; 20120296029; 20120326601; 20130061636; 20130071294; 20130075735; 20130101596; 20130109194; 20130119360; 20130119373; 20130119374; 20130134414; 20130161609; 20130162306; 20130184415; 20130192304; 20130196094; 20130196095; 20130196096; 20130196097; 20130199241; 20130202823; 20130213848; 20130216597; 20130216742; 20130219890; 20130233303; 20130236662; 20130248528; 20130266915; 20130274373; 20130289216; 20130300284; 20130309946; 20130338252; 20140001155; 20140008686; 20140013554; 20140034544; 20140039087; 20140039088; 20140047996; 20140051335; 20140063432; 20140065430; 20140091299; 20140151320; 20140151321; 20140151370; 20140151371; 20140154646; 20140162043; 20140204160; 20140209886; 20140228474; 20140272398; 20140335653; 20140339122; 20140339125; 20140339126; 20140341883; 20140341888; 20140341889; 20140341890; 20140341891; 20140341945; 20140342979; 20140370654; 20140374728; 20150001516; 20150041788; 20150064374; 20150064474; 20150064841; 20150069449; 20150071913; 20150076469; 20150094396; 20150108694; 20150123091; 20150126641; 20150129544; 20150132548; 20150132563; 20150147540; 20150179777; 20150182315; 20150207080; 20150231040; 20150299035; 20150311452; 20150315392; 20150338709; 20150340641; 20150357587; 20150360954; 20150366756; 20150371854; 20150374582; 20150380364; 20160013439; 20160018371; 20160023948; 20160056392; 20160056396; 20160061806; 20160064669; 20160071625; 20160079548; 20160083135; 20160095795; 20160095796; 20160159955; 20160164046; 20160258383; 20160264479; 20160289483; 20160336538; 20160340256; 20160355433; 20170001919; 20170014312; 20170021383; 20170023168; 20170025440; 20170031057; 20170033129; 20170036303; 20170036951; 20170050349; 20170066928; 20170072104; 20170108780; 20170129806; 20170135909; 20170139082; 20170162790; 20170166730; 20170174545; 20170174565; 20170183257; 20170197875; 20170210662; 20170212088; 20170227800; 20170231873; 20170231874; 20170233287; 20170252271; 20170253523; 20170266081; 20170285227; 20170290746; 20170296441; 20170296442; 20170309710; 20170320773; 20170333295; 20170341451; 20170348201; 20170348202; 20170349756; 20170355855; 20170362119; 20170365473; 20180022640; 20180037546; 20180038995; 20180052254; 20180071175; 20180072613; 20180088399; 20180099307; 20180136367; 20180162771; 20180170914; 20180185875; 20180186120; 20180212184; 20180214351; 20180215644; 20180228701; 20180237567; 20180264778; 20180267373; 20180273422; 20180273425; 20180282604; 20180291195; 20180312660; 20180319132; 20180335659; 20180353391; 20180363361; 20190019736; 20190022979; 20190030498; and 20190031844.

Alternately, the process can for a mechanically pre-stressed layer, which does not rely solely on ion exchange chemical hardening to define the mechanical properties of the glass. Further, the deposition according to the present technology may be regionally controlled in the plane of the substrate, and also controlled in depth based on processing parameters and/or use of multiple layers which may be the same or different. The layers or patterns may advantageously provide distinct properties, such as electrical conductivity and conductive channels or planes, optical properties, and the like.

BRIEF DESCRIPTION OF THE DRAWINGS

FIGS. 3A and 3B show SEM images (8.5 mm WD, 18 kV EHT, SE2 detector) of two sample at the interface of alloy and silicon with different exposure parameters, where FIG. 3A shows partial melting in sample one, and FIG. 3B shows full melting.

FIG. 4 shows quantitative measurement of elemental composition of alloy using EDS (DT between 30% to 40%). SEM image (8.2 mm WD, 15 kV EHT, SE2 detector). Polished up to 20 nm roughness.

FIGS. 5A and 5B show $Sn_3Ag_4Ti$ alloy deposited on silicon by SLM process.

FIG. 5C shows a stainless steel logo built on 4" silicon wafer.

FIG. 6 shows stainless steel parts fabricated by SLM on silicon wafer after thermal cycling test (100 cycles from −40° C. to 130° C.). Note, the steel plate used to secure the silicon to the build platform has rusted over the course of the thermal cycling.

FIGS. 13A-13B show optical image of stainless steel 316L deposited on graphite exhibiting poor wetting (13A). Fixture designed to hold graphite substrate on build platform of EOS M290 (13B).

FIG. 14 shows optical profilometry of ablated graphite.

FIGS. 15A and 15B show a stainless steel logo printed on graphite (15A). Removing printed part using hot plate (15B).

FIGS. 22A and 22B show two stainless steel parts after thermal cycling test.

FIG. 23 shows $Sn_3Ag_4Ti$ alloy additively deposited on HT grade high conductivity (~1700 W/m–K at room temperature) pyrolytic graphite by laser processing.

FIG. 27A; SE2 image, FIG. 27B; AgL peak, FIG. 27C; SnL peak, FIG. 27D; O K peak, FIG. 27E; TiK peak, FIG. 27F; SiK peak.

FIG. 28A shows a D50×0.43 mm Sapphire wafer with <0001> orientation and single side polish is purchased from a supplier and installed on a steel build platform using Kapton tape. FIG. 28B shows a single layer of $Sn_3Ag_4Ti$ powder was deposited on the unpolished surface with manual deposition. The layer thickness is ~54 μm which is the thickness of the Kapton tape. FIG. 28C shows the exposure parameters were set to 150 W with scanning rates varying from 4400 mm/s to 5600 mm/s. Two different geometries are considered lines and pillars. FIG. 28D shows a bright field optical imaging at 5× of two lines, top with 150 W and 4400 mm/s and bottom with 150 W and 4600 mm/s. FIG. 28E shows a bright field optical imaging at 20× magnification of 150 W 4400 mm/s line with Z-stack. Line thickness of 100 um is achieved with edge exposure (single line raster).

DETAILED DESCRIPTION OF THE PREFERRED EMBODIMENTS

Figure 1:
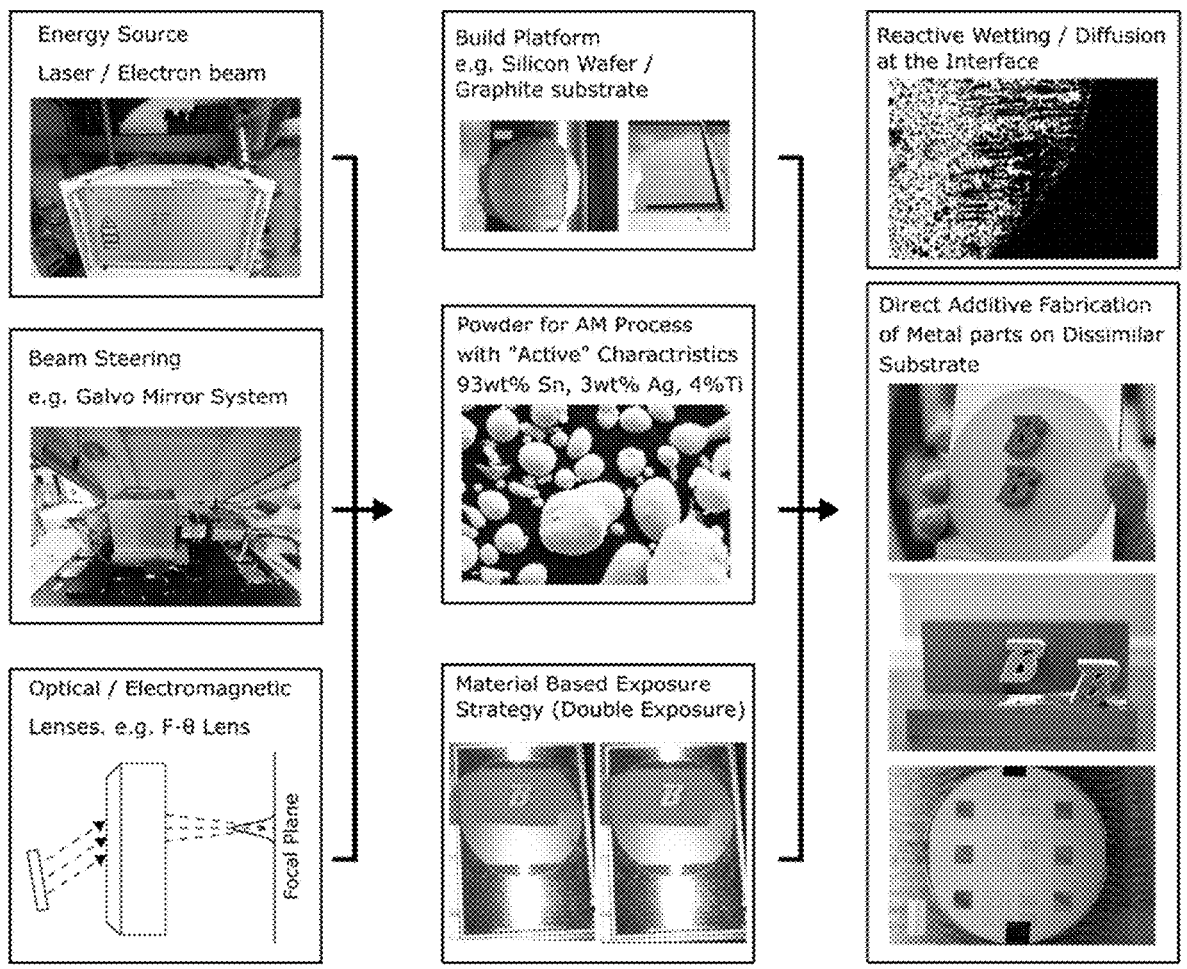
FIG. 1 shows an overview of the additive manufacturing process.

The present technology provides a method for bonding metal powder to various types of dissimilar substrates, employing process technology that forms an adhesion layer from components of the substrate and the metal powder, substantially without causing heat damage to nearby or underlying structures.

Example 1

Metal powder may be deposited in fused layers a non-metal substrate by directed-energy powder fusion manufacturing. The energy source for this process can be from any focused energy sources, and popular sources include laser and electron beams. The powder can be deposited uniformly over an entire layer and then selectively melted, as is done in powder bed fusion processes, or it can be made with powder that is directly deposited onto the area of the part that is being exposed to the focused energy source, in the process typically referred to as directed energy deposition. The directed energy source may be steered or the sample stage may move the sample to selectively fuse powder where desired. This process is conducted in an inert environment, such as an Argon, $N_2$, or vacuum environment to reduce oxidation risk.

A prototype of the technology employs a laser-powder bed fusion EOS M290 machine that possesses a 500 W peak 1064 nm Yb-fiber laser and high speed galvanometer mirror system (maximum raster speed of 7000 mm/s), which presents results which are broadly applicable to other powder bed fusion and directed energy deposition tools, regardless of the focused energy source.

This technique can involve selective melting to a high density solid, or selective sintering to a porous solid depending on the processing parameters. Differences in the processing parameters (powder deposition mechanism, powder composition, substrate properties, energy source (e.g., wavelength of laser), energy source diameter) results in changes in the acceptable range of energy delivery parameters, though the methodology to identify near-ideal processing conditions will be unchanged.

One benefit of this technology is that it enables localized high temperature bonding without damaging the sensitive circuits on the other side of the electronic wafer or sample. Even with the high temperatures of laser melting, the short exposure time of the laser limits the thermal penetration depth to avoid exceeding thermal limits of nearby elements. The thermally effected zone is quite small, as the exposure time for typical focused energy powder fusion is only ~100 μs. The zone that is thermally affected can be estimated by the thermal penetration depth, $L_p \propto \sqrt{\alpha t}$. [64] This depth is less than the typical electronic wafer thickness (e.g., 300 μm for silicon), and so can be safely performed without damaging sensitive devices. This short exposure also enables building of higher melting temperature metals onto low-melting point alloys (e.g., stainless steel 316L on $Sn_3Ag_4Ti$ on Si or graphite).

In particular, during selective laser melting, the metals are typically only molten for times on the order of 75 μs (assuming typical scan rates of 1 m/s, and focused energy spot sizes of 75 μm). This period is much shorter than the typical time for conventional bonding of dissimilar materials (tens of milliseconds to tens of minutes). To overcome this kinetic limitation, the focused energy locally heats the sample beyond the melting point to thermally overcome the energy barrier for the active metal species to more easily diffuse, as the diffusivity, D, has an Arrhenius rate term so that the $D \propto \exp(-E_{a,D}/K_B T)$, where $E_{a,D}$ is the energy barrier for the active alloy element to diffuse. The barrier to nucleate intermetallic phases can also be overcome faster at higher temperature, as the nucleation rate, N, will also be N∝ exp($-E_{a,N}/K_B$ T), where $E_{a,N}$ is the energy barrier for intermetallic phases to nucleate at the interface.

The contact angle and mechanical strength of the interface is not at its highest after a single exposure. Therefore, another key insight provides exposure of a single layer of brazing alloy to energy pulses multiple times. This provides greater time for diffusion of the active metal species and nucleation of the intermetallic phase. The benefit of a greater number of exposure diminishes with each successive exposure. For $Sn_3Ag_4Ti$ on silicon and graphite, the difference between single and double exposures is extreme, but negligible additional improvements for three and more exposures.

FIG. 1 shows an overview of this embodiment of the additive manufacturing process.

Additive manufacturing on electronic substrates can be performed at the wafer level, after dicing, or after reflow onto a polymeric substrate (heterogeneously integrated circuits). The wafer or chips can be mounted in a chuck that maintains the device steady by such means as a vacuum chuck or heat release adhesive. The powder can be kept away from areas where powder ingress is undesired by a powder skirt. The powder skirt can be made out of silicone or elastomeric material. The bonding can be performed on an unpolished side or polished side of the wafer. It can also be used to bond onto diamond films that are used for heat spreading. For bonding, roughening is advantageous for mechanical bonding. This same technique can also be used to make electrical contacts on electronic devices like microprocessors and power electronic devices.

Another embodiment uses this same technique to bond dissimilar metals for composite applications. The alloy may be printed directly on the metal substrate, and then the printed alloy is then bonded this metal substrate by heating to an elevated temperature, which for $Sn_3Ag_4Ti$ is ~220° C. This embodiment can bond to carbon materials, like graphite, that are of interest for composites, nuclear, heat transfer and medical applications. For instance, it can be used to make a pyrolytic graphite based heat spreader or heat sink. The benefit of making in pyrolytic graphite stems from pyrolytic graphite's high thermal conductivity.

Another embodiment uses a bonding alloy for one or more layers and then transitions to printing a different metal. This can be desirable when different properties of a different metal are desired. For instance, copper or aluminum may be preferred to the bonding alloy for their transport properties. For Sn containing braze will form Cu—Sn intermetallics ($Cu_3Sn$ and $Cu_6Sn_5$)[65] and a braze with Ti element can bond to Al via formation of $Al_3Ti$ intermetallics. [21]

Another embodiment uses this alloy to bond to metal as a thermally removable support material. This can help save the cost of refinishing build platforms that are currently used to build metal additively formed parts. This process works by printing the metal mixture or alloy, which forms high melting point intermetallics on the substrate, but the bulk metal melts at temperatures lower than the metal used to form the part. This bonding metal can then be used to bond to the part metal. The bonding metal can also be used as removable support internal to the part, like an overhang feature in the part. The low-melt alloy can be softened or melted in an oven.

Subsequent sub-sections detail the particular embodiment of heterogeneous $Sn_3Ag_4Ti$ powder bonding to silicon and graphite substrates. These subsections also detail subsequent bonding of this $Sn_3Ag_4Ti$ alloy to stainless steel (316L). This same approach and material can also bond to SiC, SiN by forming silicides, and diamond and graphite by forming carbides, and GaN, GaAs, $\beta Ga_2O_3$ by forming Ga—Ti intermetallic compounds, and to silicon containing oxides of crystalline and non-crystalline types (e.g., silica glass, quartz, borosilicate glass, lithium aluminum silicates) via the formation of oxides at the interface.

In an alternative embodiment, this braze can alternatively replace the Ti with other elements that react actively with the substrate, such as Ta, Zr, V, Hf, Cr, Mo, W. The purpose of the $Sn_3Ag$ part of the alloy is to lower the melting point and increase the activity of the active metal elements.

One embodiment of this invention uses $Sn_3Ag_4Ti$ that reacts to form a Titanium Silicide on Si that promotes good bonding, and has a melting point around 250° C. This low melting point increases the activity of Ti. The low melting point also reduces the thermal stresses experienced on cool down from the molten state, hence preventing interfacial mechanical failure when printed. The interfacial mechanical failure is observed to be dependent on the size of the feature made and on the shape of the edges, as sharp corners are prone to greater thermal stresses.

Bonding to Silicon with $Sn_3Ag_4Ti$:

All experiments were conducted using a laser-powder bed fusion EOS M290 tool having a 500 W 1064 nm Yb-fiber laser and high speed galvanometer mirror system (maximum raster speed of 7000 mm/s). The machine has a $N_2$ generator that maintains an $N_2$ gas atmosphere with $O_2$ concentrations of less than 1.5%. A special wafer tray is used to securely hold the silicon wafer.

Figure 2:
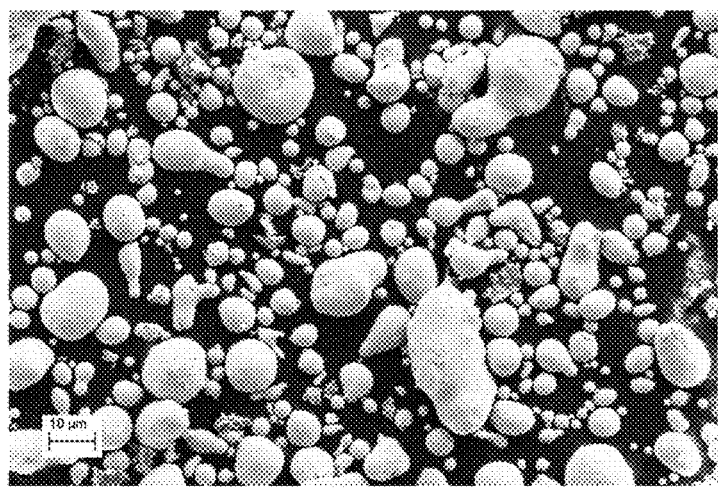
FIG. 2 shows an SEM image (8.6 mm WD, 9 KV EHT, SE2 detector) of mixed Ag (3 wt %) Ti (4 wt %) and Sn (93 wt %) powders.
Figure 7:
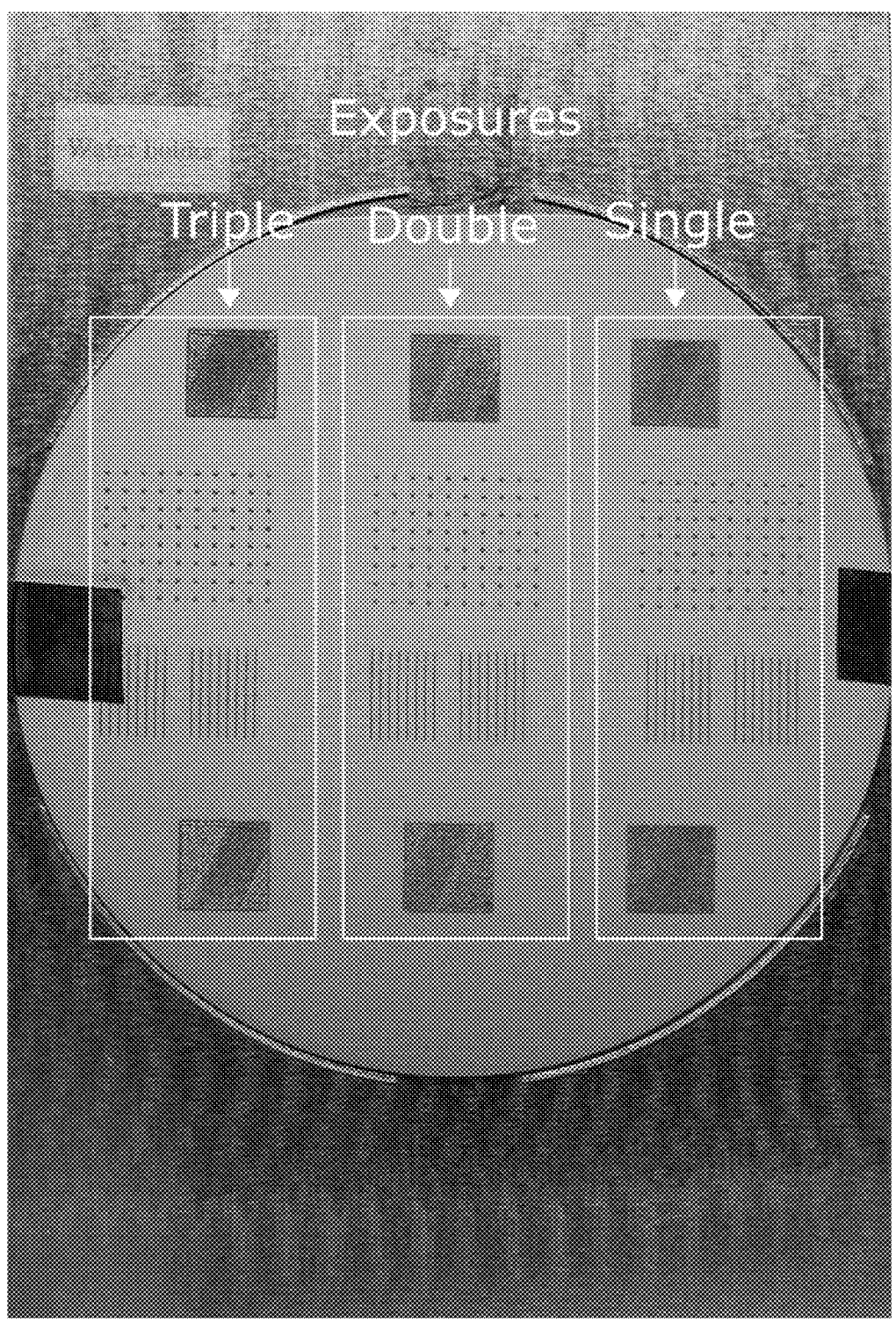
FIG. 7 shows a sample with different patterns printed under varying conditions. Surface property and mechanical strength were studied versus processing parameters, including number of exposures. Silicon is held in a wafer holder. Wafer can be held by a vacuum chuck or adhesive and the chuck can include powder skirts to prevent powder ingress into undesired areas.

A $Sn_3Ag_4Ti$ powder mixture is used as the bonding metal mixture, as it provides good bonding with Si via the Ti silicide formation, and also bonds to a broad range of other materials including graphite, Al, Cu, and Fe-based metals. This low melting point of this alloy (~250° C.) reduces the thermal stresses experienced after solidification upon cooling. Sn, Ag, and Ti powders (>99% purity) with respective average diameters of 40 µm, 5 µm, 10 µm were mixed with weight percentages of 93%, 3%, and 4% ($Sn_{87.55}Ag_{3.11}Ti_{9.34}$) (FIG. 2). Smaller powder sizes were chosen for the lower concentration metals to facilitate mixing and reduce diffusional resistance of the Ag and Ti in the Sn melt. FIG. 2 shows an SEM image (8.6 mm WD, 9 KV EHT, SE2 detector) of mixed Ag (3 wt %), Ti (4 wt %) and Sn (93 wt %) powders.

The process parameters for the first layer of bonding and subsequent layers were determined via conventional process mapping techniques [66-71]. The process parameters were identified in a high-throughput manner, where various powers ranging from 30 to 200 watts and scanning rates from 800 to 6500 mm/s with fixed hatch distance of 0.09 mm were printed in each build, to identify the exposure parameters that provide the best wetting and bonding strength between silicon and the alloy. At the extremes, it was observed that at a fixed scanning speed, low power will result in partial sintering behavior and high power causes high vapor flux and large recoil pressure which leads to splattering. One key difference with conventional processing is that the transformation is assisted by multiple laser exposers for each layer.

FIGS. 3A and 3B show SEM images (8.5 mm WD, 18 kV EHT, SE2 detector) of two samples at the interface of alloy and silicon with different exposure parameters. FIG. 3A shows partial melting, as opposed to FIG. 3B that shows complete melting and solidification. Sample 2 possesses an average composition as expected from the mixing weights, indicating sufficient mixing (FIG. 4) as quantified by electron dispersive spectroscopy (EDS). The properties used for the sample of FIG. 3B were close to ideal.

TABLE 1

| Sample | Power [W] | Scan speed [mm/s] | Exposure | Hatch distance [mm] | Layer thickness [µm] | Energy density [J/mm³] |
|---|---|---|---|---|---|---|
| 1 | 150 | 5250 | Double | 0.09 | 20 | 15.87 |
| 2 | 120 | 1700 | Double | 0.09 | 20 | 39.21 |

TABLE 2

| Element | Wt % - EDS | At % - EDS |
|---|---|---|
| Sn | 91.13 (L shell) | 83.14 (L shell) |
| Ti | 6.33 (K shell) | 14.30 (K shell) |
| Ag | 2.55 (L shell) | 2.56 (L shell) |

FIG. 4 shows quantitative measurement of elemental composition of alloy using EDS (DT between 30% to 40%). SEM image (8.2 mm WD, 15 kV EHT, SE2 detector). The specimen was polished up to 20 nm roughness.

This alloy-silicon bond can survive subsequent printing of high temperature metals, like stainless steel 316L (melting point≈1400° C.). The $Sn_3Ag_4Ti$ alloy forms an interlayer between silicon and the stainless steel that wets and bonds to both. A good bond was achieved by depositing three layers the alloy and from then on printing the stainless steel. Parts produced by this method are shown in FIGS. 5A and 5B, which show $Sn_3Ag_4Ti$ alloy deposited on silicon by SLM process. FIG. 5C Stainless steel Binghamton University logo built on 4" silicon wafer. 316L was selected because it demonstrates the temperature survivability. For heat transfer applications, high thermal conductivity metals, like Al and Cu can be used instead [72]. The choice of 316L stainless steel is to demonstrate robustness to hotter melting temperatures.

The reliability of the bond to thermal cycling was probed via thermal cycling. The Si—$Sn_3Ag_4Ti$-SS316L samples were thermal cycled in Thermotron chamber between −40° C. and 130° C. for 100 cycles (over 1 week of testing). The temperatures of the parts are monitored to confirm the parts reach the chamber setpoints each cycle. After the 100 cycles, the parts were visually examined for defects, such as delamination, along the perimeter where thermal stresses were greatest. All parts passed the visual test without any noticeable failure or defect. FIG. 1 shows stainless steel parts fabricated by SLM on silicon wafer after thermal cycling test (100 cycles from −40° C. to 130° C.). (Note, the steel plate used to secure the silicon to the build platform has rusted over the course of the thermal cycling.)

Characterization of Si-Alloy Interface

FIG. 2 shows a sample with different patterns printed under varying conditions. Surface property and mechanical strength were studied versus processing parameters, including number of exposures. Silicon is held in a wafer holder. Wafer can be held by a vacuum chuck or adhesive and the chuck can include powder skirts to prevent powder ingress into undesired areas The strength of the $Sn_3Ag_4Ti$—Si bond was destructive shear tested with a Nordson DAGE 4000 Plus on hemispherical balls with a mean diameter of 432. µm. The stylus is positioned 1 µm from the interface with top raster speed of 100 µm/s. During the test it is observed that the balls did not fracture at the interface and rather scraped from the alloy. This indicates that the bond at the interface is stronger than the shear strength of the alloy.

Figure 8:
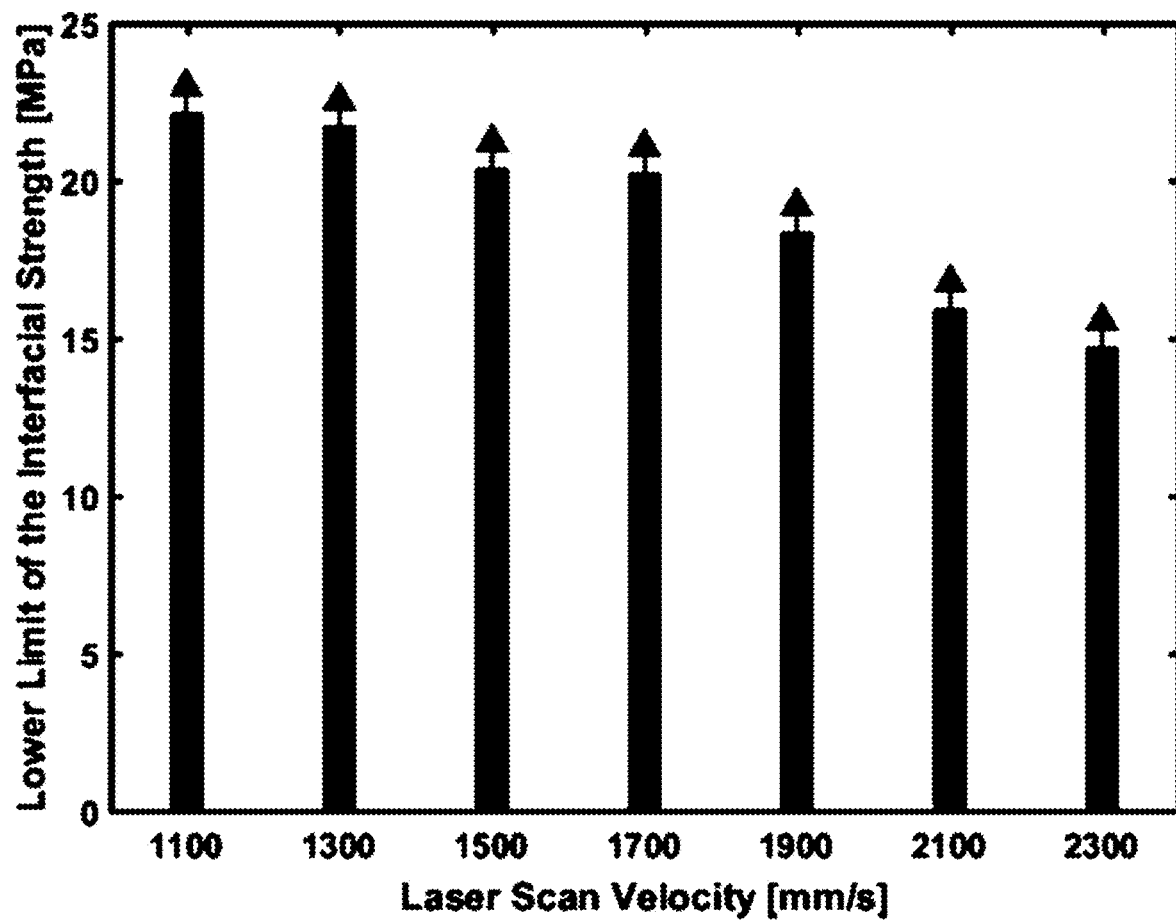
FIG. 8 shows the bond strength of the $Sn_3Ag_4Ti$-silicon fabricated by SLM technique (laser power 120 W, laser scan velocity 1100-2300 mm/s, double exposure).

FIG. 8 shows the bond strength of the $Sn_3Ag_4Ti$-silicon fabricated by SLM technique (laser power 120 W, laser scan velocity 1100-2300 mm/s, double exposure). Consequently, what is being reported in FIG. 8 is the lower limit of the interfacial strength. The obtained data show shear strengths between 14.7 to 22.1 MPa. This value was expected as shear strength of pure Sn is 17.7 MPa and Sn-3.5Ag is 31.7 MPa [73]. Each sample is repeated ten times with standard deviation of ~10%. A control test on the silicon wafer was also performed with 0 µm liftoff, and the frictional force was negligible compared to the force due to the alloy. The slower laser scan velocities have higher lower limits of the interfacial strength, indicating stronger alloy at these processing conditions. Balls fabricated by single exposure generally obtained lower interfacial strength compared to double exposure.

Figure 9A:
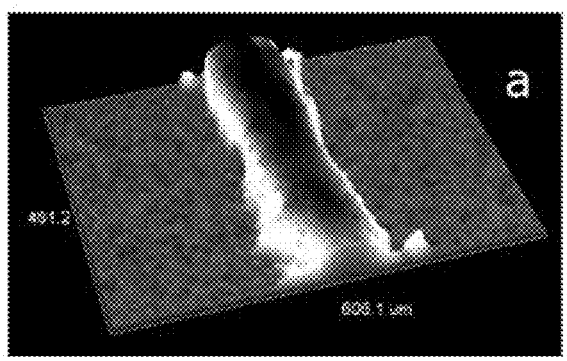
FIGS. 9A and 9B show examples of optical profilometry for a line of alloy on silicon created by 120 W, 1500 mm/s exposure parameter.
Figure 9B:
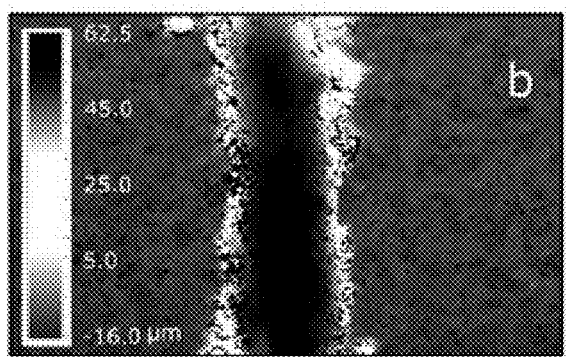
Figure 9C:
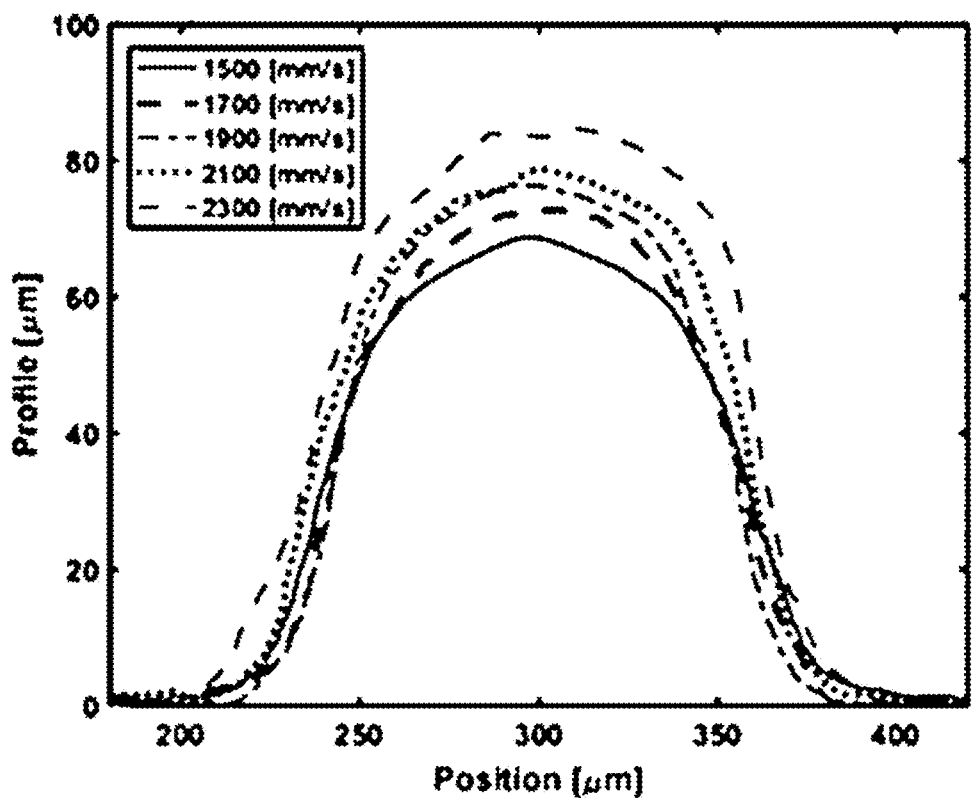
FIGS. 9C and 9D show equivalent contact angle measurement versus laser scan velocity based on optical profilometry.
Figure 9D:
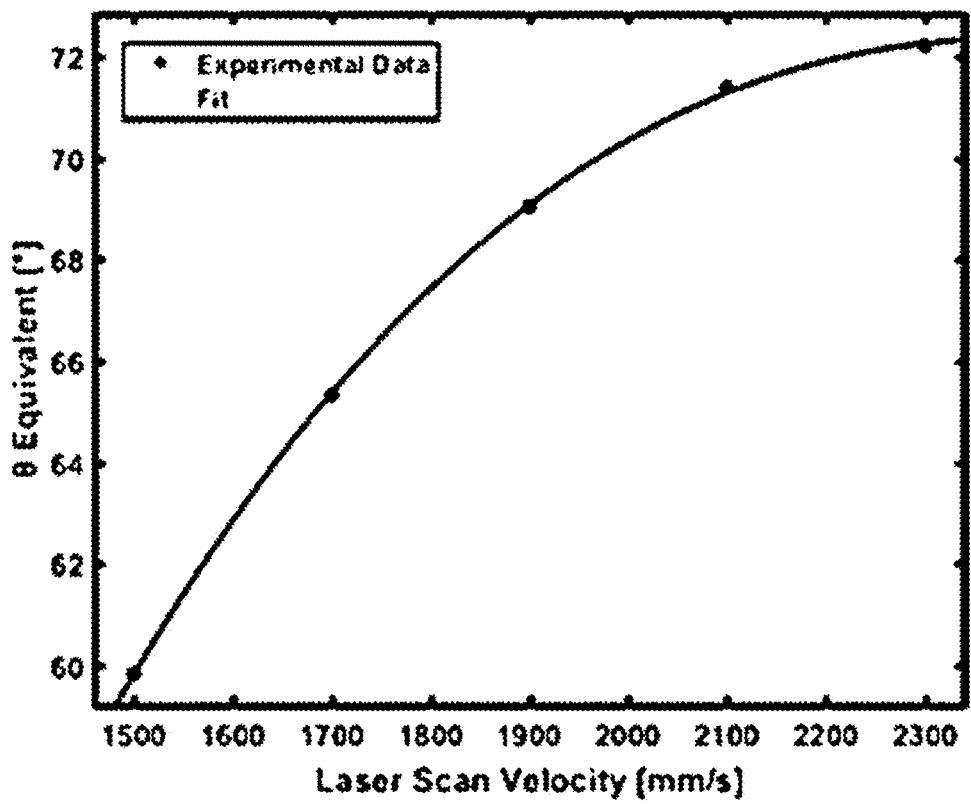

The solidified metal contact angle is a proxy for the interfacial bonding strength between the alloy and the silicon substrate. Better wetting implies a lower energy interface and stronger interfacial bonding [19]. In lieu of instantaneous contact angle measurements during selective laser melting, the contact angles of a solidified metal lines are studied (FIGS. 9A-9D) [74,75]. While the system is not in equilibrium during the transient cooling, the contact angle still provides insight and approximates the liquid contact angle [19]. The exposure parameters were varied, by varying scan rate from 1500 mm/s to 2300 mm/s while holding power at 120 W. Each solidified metal line was formed at a different laser exposure ranging from 1500 mm/s to 2300 mm/s and power of 120 watts. Afterwards the contact angles of each line were studied by optical profilometry and the height-to-diameter (H/D) ratio is used to extract the contact angle [19], $\theta_{equiv}$=2atan(2H/D). By lowering the velocity of scan, the laser heating period and maximum temperature increases, which improves the diffusion of reactants, assisting spreading. FIGS. 9A and 9B show examples of optical profilometry for a line of alloy on silicon created by 120 W, 1500 mm/s exposure parameter. FIGS. 9C and 9D show equivalent contact angle measurement versus laser scan velocity based on optical profilometry.

Based on the Si—Ti phase diagram, it is expected to observe titanium-silicides at the interface as they are energetically favored [76,77]. The growth and formation of the titanium silicide rapidly forms over the limited molten metal phase and is limited by diffusion of Ti. Hence, a very thin silicide forms just at the interface. This is visible form the electron dispersive spectroscopy (EDS) mapping of the interface. The concentration of Ti is seen to have a bright line near the interface, as pointed out in FIG. 10F. This titanium-silicide band appears about 1 µm wide, but this is an artifact of the EDS interaction volume being on the order of a 1 µm³ [78]. The actual titanium-silicide layer formed in this process is sub-µm. Noteworthy, the laser-processed silicide thickness and EDS maps are comparable to conventional brazing to silicon [18].

Figure 10A:
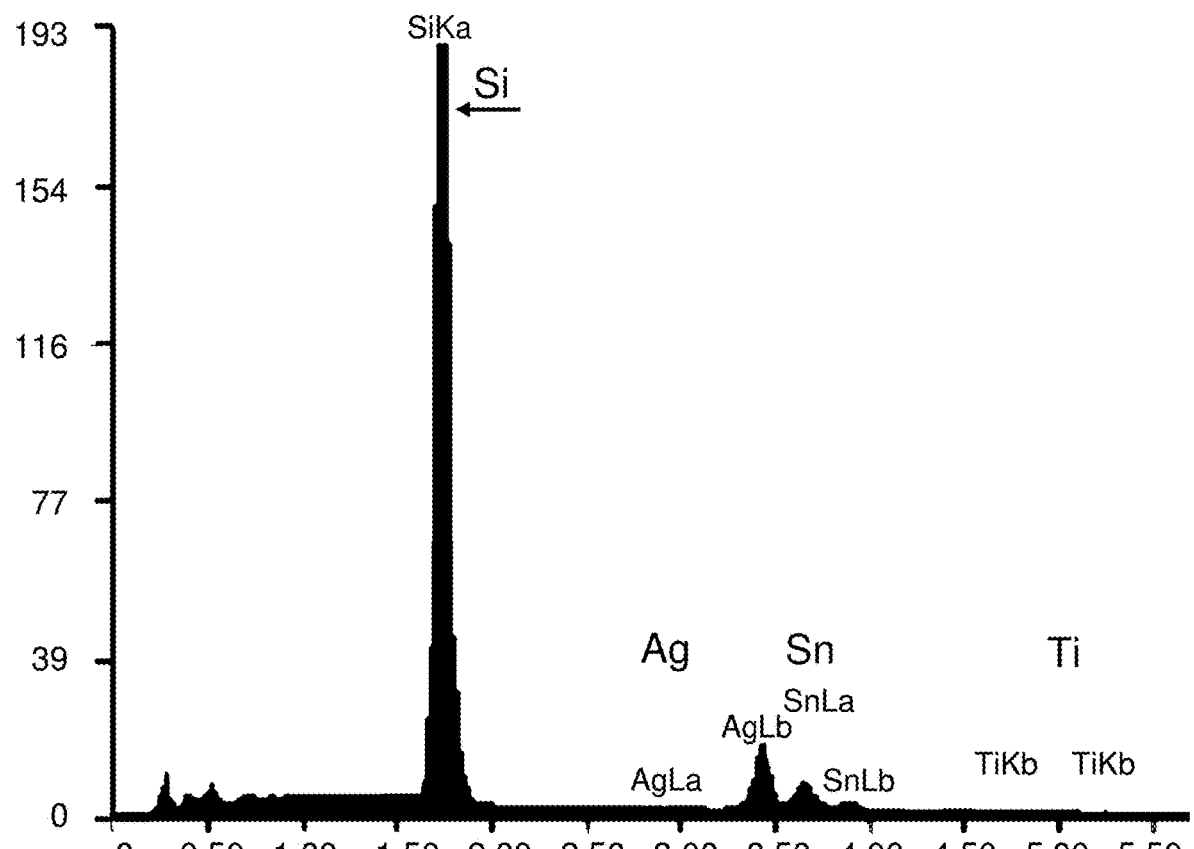
FIG. 10A shows representative EDS spectrum of the alloy-silicon interface (8.7 mm WD, 10 kV EHT, DT 20%). The scalebar is 1 μm.
Figure 10B:
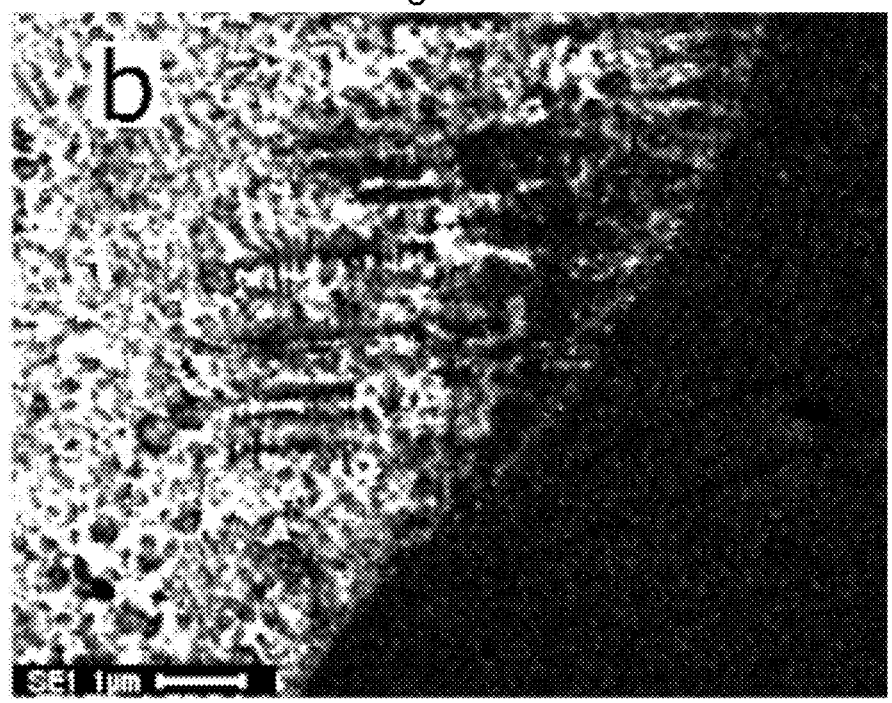
FIG. 10B shows back scatter detector scanning electron microscopy image of the interface shows light elements (i.e., Ti) darker than heavy elements (i.e., Sn, Ag) (8.7 mm WD, 10 kV EHT, RBSD detector). The scalebar is 1 μm.
Figure 10C:
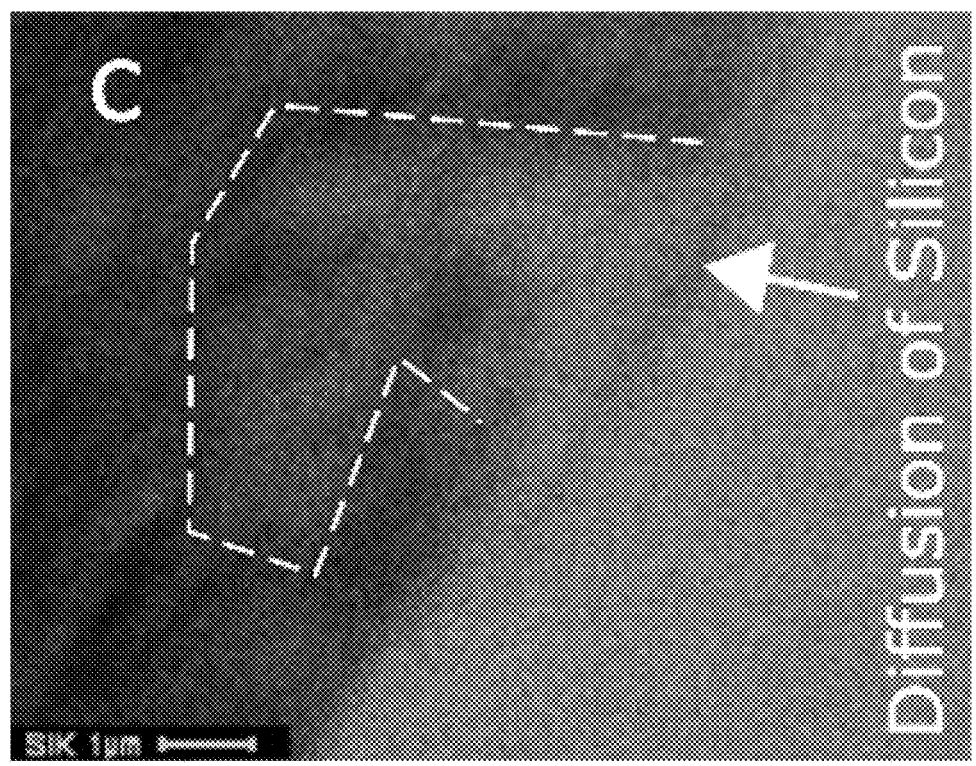
FIG. 10C-10F show EDS mapping of the SiK peak (10C), AgL peak (10D), SnL (10E) peak, and TiK (10F) peak.
Figure 10D:
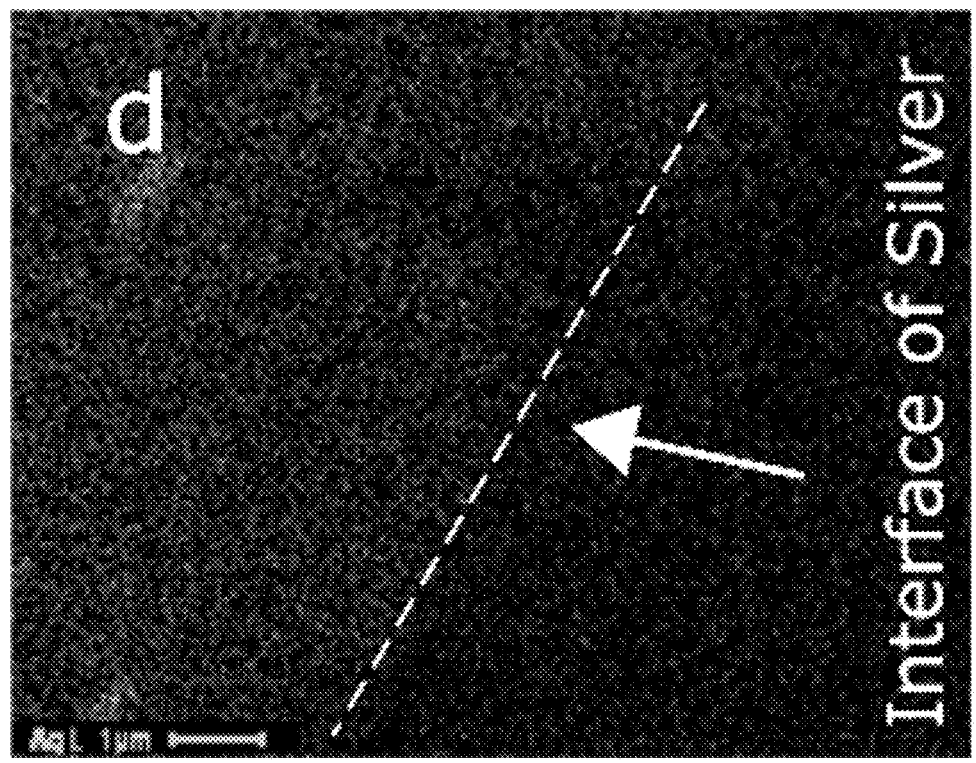
Figure 10E:
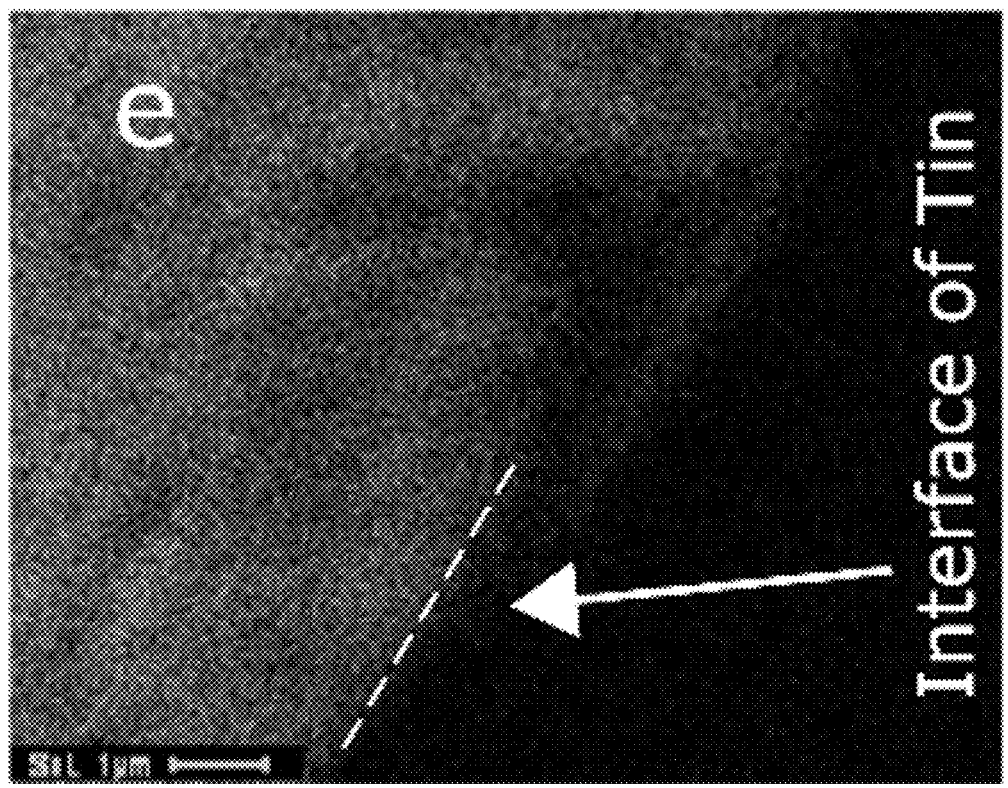
Figure 10F:
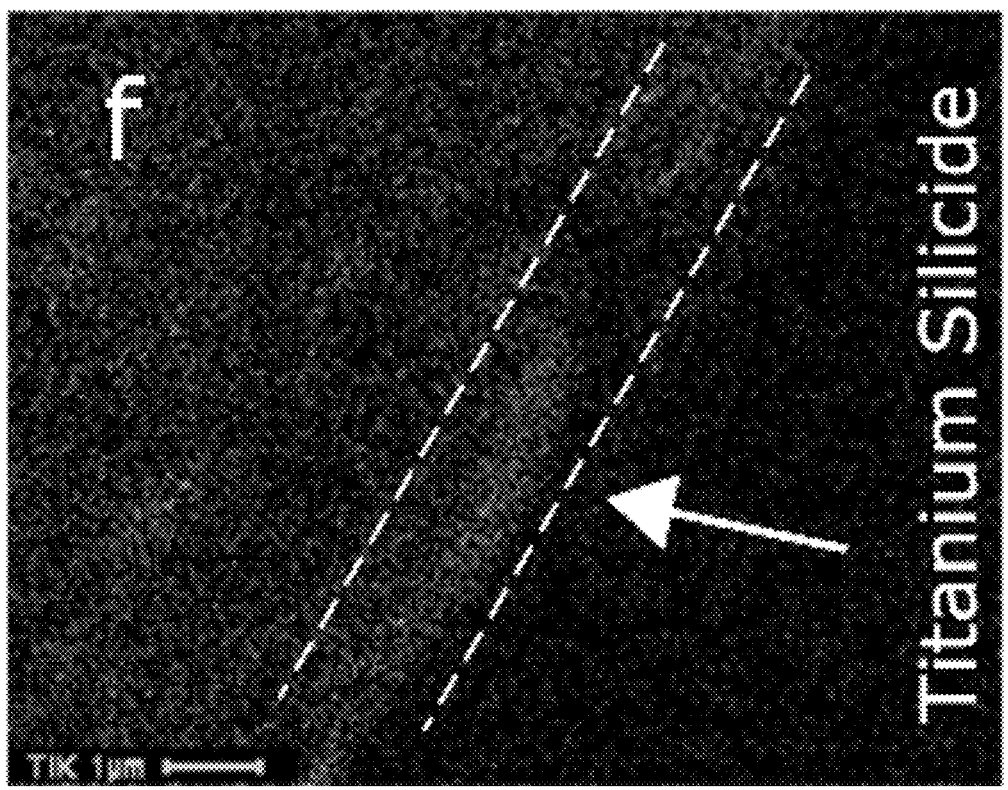

FIG. 10A shows a representative EDS spectrum of the alloy-silicon interface (8.7 mm WD, 10 kV EHT, DT 20%). FIG. 10B shows a back scatter detector scanning electron microscopy image of the interface shows light elements (i.e., Ti) darker than heavy elements (i.e., Sn,Ag) (8.7 mm WD, 10 kV EHT, RBSD detector). FIG. 10C shows EDS mapping of the SiK peak. FIG. 10D shows EDS mapping of the, AgL peak. FIG. 10E shows EDS mapping of the SnL peak. FIG. 10F shows EDS mapping of the TiK peak. The scalebar is 1 µm.

The energy barrier for diffusion and crystallization must be overcome with thermal energy, so the reaction rate is expected to have an Arrhenius rate equation, $\exp(-E_a/k_B T)$, where N is the nucleation rate, $E_a$ is the activation energy, $k_B$ is the Boltzmann constant, and T is absolute temperature [62]. Due to the rapid laser processing temperature, diffusion and nucleation can overcome the energy barrier more rapidly than conventional brazing and proceed more rapidly than reactions occurring just above the melting point of the metal, which explains why the bonding is rapid. Despite faster reaction rates, the rapid cooling rates are on the order of millions of degrees Celsius per second, which leads to quenching and non-equilibrium properties.

Properties of the Alloy on Si

Figures 11A, 11B, 11C:
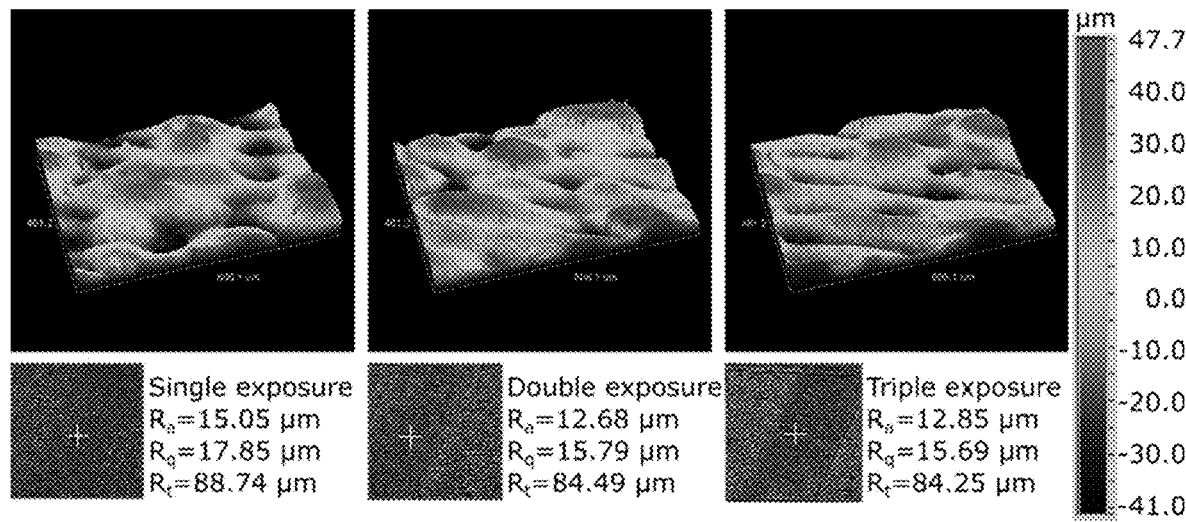
FIGS. 11A-11C show surface roughness study by optical profilometry on three samples with different number of rasters (120 W, 1700 mm/s, 0.09 hatch distance).

On the test designed for surface and interface properties, six rectangles were created with exposure parameters similar to sample 2 in terms of hatch distance, power and scan speed but with single, double and triple exposures (FIGS. 11A, 11B, an 11C). Surface optical profilometry reviled improvement on surface roughness from first to second exposure. However, the third exposure did not improve the surface properties any further. FIGS. 11A-11C show a surface roughness study by optical profilometry on three samples with different number of rasters (120 W, 1700 mm/s, 0.09 hatch distance).

Figure 12:
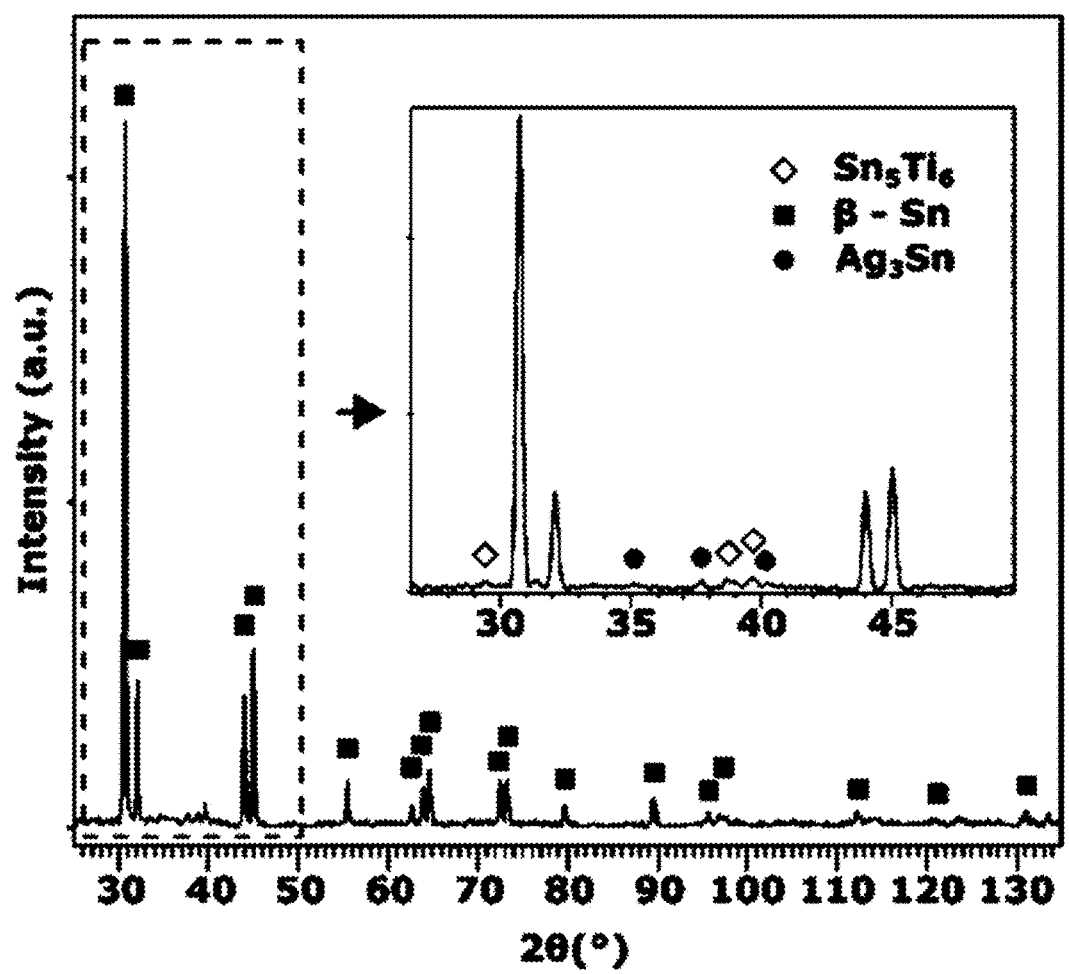
FIG. 12 shows phase identification of Sn—Ti—Ag alloy fabricated by SLM process using GIXRD (PANalytical X'Pert PRO High-Resolution X-ray Diffractometer).

Grazing incidence X-ray diffraction (GIXRD) was performed on a bulk $Sn_3Ag_4Ti$ sample to identify the compounds that appear in the laser processed alloy, and compare them to the conventionally processed braze. See FIG. 12, which shows phase identification of Sn—Ti—Ag alloy fabricated by SLM process using GIXRD (PANalytical X'Pert PRO High-Resolution X-ray Diffractometer). The dominant signal is from the β-Sn phase, as expected from the large concentration of Sn in the alloy. There are also weak, yet distinct peaks from the intermetallic compounds $Sn_5Ti_6$ and $Ag_3Sn$. These formations agree with what is thermodynamically expected from phase diagrams [79,80]. Moreover, this agrees with prior conventionally processed $Sn_3Ag_4Ti$ alloy phases, showing that laser processing and conventional brazing results in similar phases being formed [18,21].

Bonding to Graphite with $Sn_3Ag_4Ti$:

One of the key challenges in additively manufacturing metal parts is removing the printed part from build platform. Conventional platforms are made of the same material as the metal powder to achieve reliable bonding and resistance to thermal stress. Support or solid structures are used to provide required offset for the cutting blade to detach the part from building platform followed by detailed machining to achieve proper surface finish. This process adds additional machining, particularly challenging for difficult to machine metals, like titanium or stainless steel. Another downside of the current build plate paradigm is that current building platforms used in commercial metal printing devices are heavy. These blocks need to be removed each time the process completes. Since graphite is lightweight, graphite buildplates can help to make handling and post-machining easier and safer.

The graphite crystal structure consists of strong Graphene planes ($sp^2$ hybridization of carbon atoms) which are connected by π-orbitals resulting in weaker interplanar Van der Waals forces [81,82]. The thermal conductivity in the graphene plane is extraordinary (>1700 W/m–K) over eight times better than aluminum. Furthermore, graphite is 16% lighter than aluminum. Graphite also possesses beneficial properties for nuclear applications. The thermal conductivity of pyrolytic graphite makes it an attractive material for use as a heat spreader, especially when coupled with a heat pipe or heat exchanger that is additively printed.

Studying wetting of metal alloys on substrates of dissimilar material can provide valuable insights regarding bonding. However, there are debates regarding the mechanism of wetting in metal alloy systems at high temperatures. In non-reactive systems, it is hypothesized that wetting occurs by displacement of molecules of advancing front on adsorption sites of the substrate originated from surface tension. Interdiffusion and dissolution of the substrate directly affects the composition of the liquid and as a result solid-liquid interfacial energy [9]. For reactive systems, wetting is limited by the diffusion of reactive elements and local reaction kinetics [10].

The joining of dissimilar materials such as graphite to common metals employed in additive manufacturing is challenging due to these metals having contact angles greater than 130° (i.e., non-wetting) [81]. Reactive metals like Ti, Ta, Zr, and Nb have been bonded to graphite by employing carbides of the same metal as an interlayer. This process is done in furnace at temperatures around 1000° C. for 90 minutes [83]. The reason for wetting behavior is carbide formation at the interface by diffusive transport of reactive species which result in modification of specific surface energies of the system [81]. The bonding time in these conventional bonding techniques is very long (minutes to hours), compared to laser exposure time in additive manufacturing (~100 μs).

Previously, rods of Graphite and SUS304 Stainless Steel were joined using solid state diffusion bonding method under compressive pressure of 25 MPa, annealing temperature of 664° C. and duration of 120 minutes. Clearly, this methodology is not applicable in the present method as basic requirements such as annealing time and pressure cannot be satisfied [23]. In another study, brazed carbon-carbon composite was brazed to Stainless Steel 316L at a temperature of 1050° C. using BNi-7 (Ni-14Cr-10.5P-0.1Si) filler alloy. Observation of the microstructure confirmed the carbide formation. Joint shear strength of approximately 16 MPa reported at 1 mm thickness of Nb interlayer [24]. Sn—Ag—Ti alloys are considered as "active" alloys which makes them suitable candidate for bonding of metals to various materials such as ceramics and carbon materials at temperatures between 250° C. to 450° C. [15] Activity of elements under required thermodynamic condition is of interest as it influences the effectiveness of the bond between alloy and substrate. Based on a thermodynamics study on Sn—Ag—Ti filler alloys, the activity of Ti increases with weight percentage between 0 and 2.25 wt % at 450° C. The addition of silver at low mass fractions (e.g., 3 wt %) tends to increase the titanium activity at 450° C.[59]

The contact angle of Sn—Ti and Ag—Ti alloys on graphite was reduced to under 10° by adding approximately 2-5 wt % of titanium to the systems. As a result, it is expected to see acceptable wetting on graphite. Also in the case of using the alloy as interlayer to bond steel to graphite, the reactive wetting mechanism of Sn/Fe system can is described by dissolution of Fe and precipitation of $FeSn_2$ at the interface [25]. Similarly, intermetallics form with this alloy and Cu (e.g., $Cu_3Sn$, $Cu_6Sn_5$). Sn is also known to wet aluminum at 350-450° C.[25]

Superfine isomolded graphite with grade of GM-10 was purchased from Graphitestore.com and machined into samples 1"×1"×0.125" to fit experimental configuration. Similar performance can also be achieved on higher quality pyrolytic graphite with slightly adjusted processing parameters. Building on pyrolytic graphite may be desired for certain applications that demand high thermal conductivity and excellent heat spreading, as the in-plane thermal conductivity exceeding 1,700 W/m–K [84].

As initial test, stainless steel 316L was deposited on the graphite surface by various exposure parameters. The idea was that 316L steel has minimum 17 percent chromium content which might assist the bond by creating carbides at the interface [85]. The results indicated poor wetting in all tests, as shown in FIG. 13A, which presents an optical image of stainless steel 316L deposited on graphite exhibiting poor wetting. The fixture designed to hold graphite substrate on build platform of EOS M290 is shown in FIG. 13B.

As mentioned above, various elements are investigated to find a metal or alloy that can produce proper bond with carbon materials which can be applied in additive manufacturing. Sn—Ti—Ag alloy is chosen next as it provides good bonding between broad range of materials including carbon, aluminum and iron based metals in conventional brazing. Silver, titanium and tin powders with respective average diameters of 5 μm, 10 μm and 40 μm and purities of above 99% were mixed. Working with various diameter of powders show that size distribution has great importance in homogeneity and quality of uniform deposition on substrate.

The exposure power was set to 200 watts and a scan rate of 1000 mm/s was used to ablate a rectangular volume at the interface of two graphite pieces with RMS depth of 29.83 μm (measured by Veeco NT1100 optical profilometer). Three-dimensional Topography of the surface at the edge of exposed area to laser scan can be seen in FIG. 14, which shows optical profilometry of ablated graphite. The area scan size is 1.7×2.3 mm. Laser ablation was used to create a roughened surface for better adhesion, and to expose clean graphite surface. Also, for wetting liquids, increases in surface roughness can improve wetting behavior [86]. This step could possibly be omitted, though with weaker bonding.

Phase transformation and reactive wetting are dictated by laser matter interactions, transport and reactions during this process. Various powers ranging from 30 to 200 watts and scanning rates from 800 to 6500 mm/s and constant hatch distance of 0.09 mm were tested to find the exposure parameters that provide the highest wetting and bonding strength between graphite and the alloy. During this process, it is observed that at a fixed scanning speed, low power will result in partial sintering behavior and high power causes high vapor flux and large recoil pressure which leads to splattering. These process parameter trends with scan rate and power mostly agree with the general process parameters seen for other materials [61]. One key difference with regular stainless steel processing is that the mixed powder phase transformation is assisted by a double laser exposing each layer. The bonding appears to be a two-step process that requires a double exposure In an experiment, three layers of the alloy with thickness of 40 μm each are deposited on graphite surface by laser melting. Afterwards, two layers of powder mixed with 50 wt % of stainless steel 316L deposited with same exposure parameters on the surface to create an elemental gradient in the build normal direction. Afterwards, a "Binghamton University" logo was built on the alloy with SS316L material using support structure exposure parameters to study the applicability of the interlayer method. Since the alloy meting temperature is under 450° C., the graphite with the structure built on it then removed from the build platform and placed on a hot plate. By increasing the temperature of the hot plate to 400° C. for one minute, the part can be separated from the graphite substrate. FIG. 15A shows the stainless steel logo printed on graphite. FIG. 15B shows removal of the printed part using hot plate.

Figure 16A:
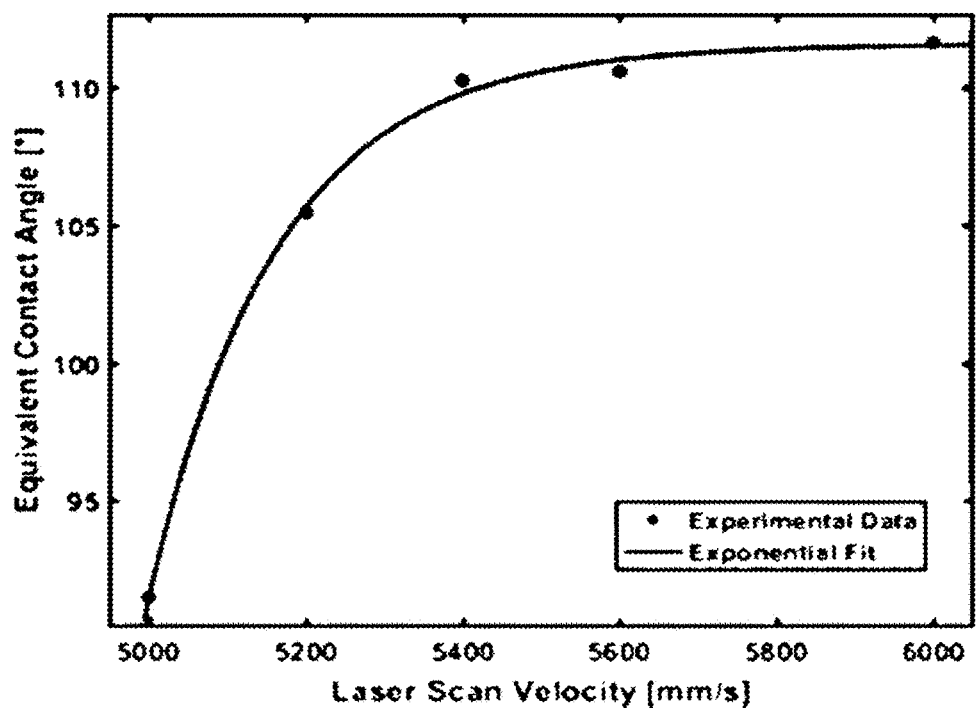
FIGS. 16A and 16B show spreading of the alloy on graphite substrate based on laser exposure parameters.
Figure 16B:
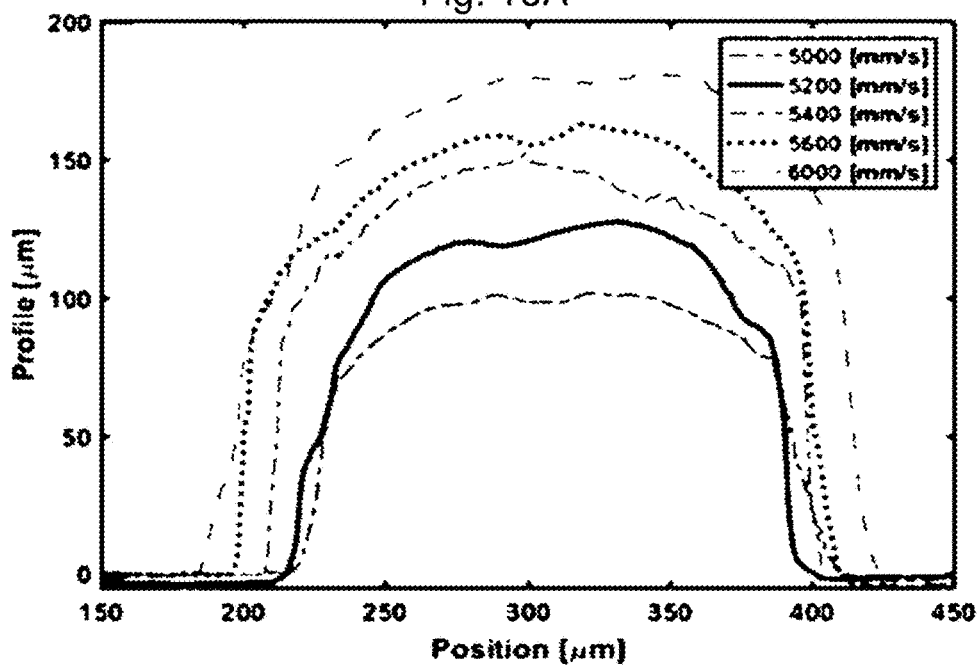

A sessile drop experiment is generally used for molten metal contact angle measurements. However, it is hard to accurately study instantaneous spreading process in case of selective laser melting, as phase change occurs fast. On the other hand, solidified sessile drop measurements can be used to give an estimate on the contact angle. However, since in SLM the molten metal drop solidifies before reaching its equilibrium state [74,75]. The contact angle can be estimated from the solidified droplet shape [87]. Studying the post-solidified triple contact line can in various exposure parameter provides information regarding the wetting mechanism during laser processing. Based on this ideology, an experiment is designed to create 5 lines of 120 μm width on graphite. Each line was scanned by a different laser exposure ranging from 5000 mm/s to 6000 mm/s and power of 150 watts. Afterwards the contact angles of each line are studied by optical profilometry. FIGS. 16A and 16B show spreading of the alloy on graphite substrate based on laser exposure parameters. The height-to-width (H/D) ratio is provided for each scanned line in order to have a better comparison. By lowering the velocity of scan, the laser heating period and maximum temperature increase, which improves the diffusion of reactants, assisting spreading.

The energy barrier for crystallization must be overcome with thermal energy, so the reaction rate is expected to have an Arrhenius rate equation, $N \propto \exp(-E_a/k_B T)$, where N is the nucleation rate, $E_a$ is the activation energy, $k_B$ is the Boltzmann constant, and T is absolute temperature [62]. Due to the rapid laser processing temperature, nucleation can overcome the energy barrier and proceed more rapidly than reactions just above the melting point of the metal, which explains why bonding occurs so rapidly. Despite faster reaction rates, the rapid cooling rates are on the order of millions of degrees Celsius per second, which leads to imperfect quenching of the interfacial layer with defects with respect to microstructure and surface coverage due to reaction and diffusion kinetics.

Figure 17:
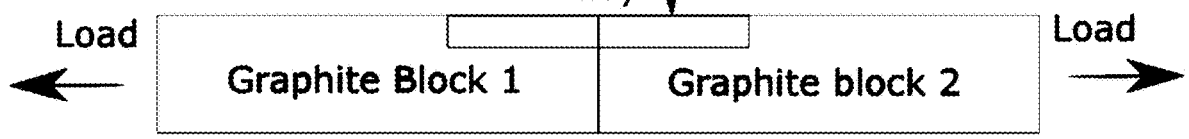
FIG. 17 shows a schematic of the designed shear lap test.

Since the bond is under combined normal and shear stresses imposed by the thermal stress inherent to SLM and the recoating blade of SLM machine, it is necessary to measure the bonding strength of the joint. The common approach is to perform tensile tests to calculate yield tensile strength and shear yield strength of the joint. However, these tests are designed for isotropic or homogenous materials, which are not the case at the interface [88,89]. Direct measurement of tensile load at the joint is not straight forward since there is not enough space to grip the deposited layer of metal. To characterize the joint, a lap shear test according to FIG. 17 is performed, where the alloy layer functions as a weld connecting two graphite blocks that are loaded under tensile load.

Figure 18A:
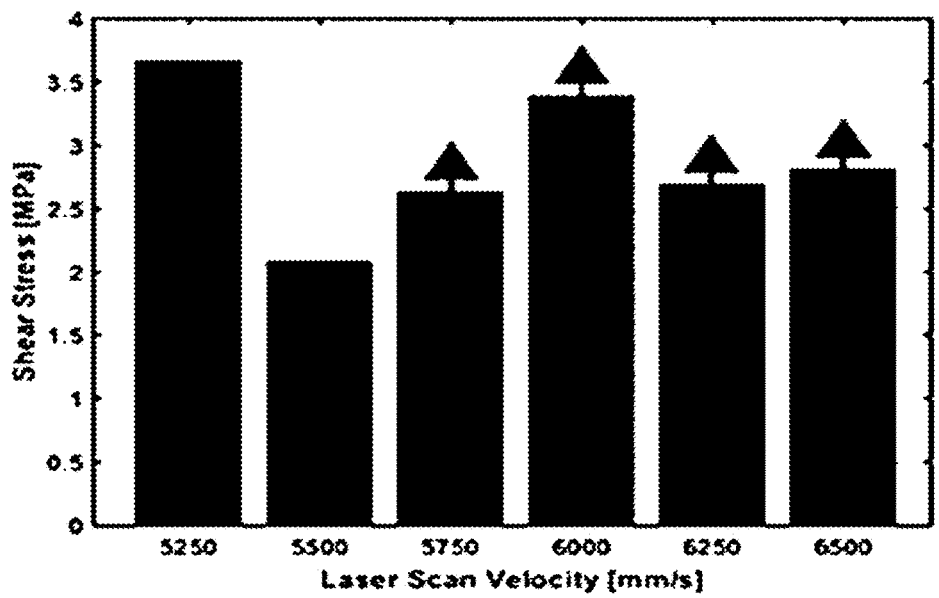
FIGS. 18A, 18B, and 18C show the interfacial strength of the graphite-metal bonding at various laser scan velocities (18A, 18B). Sample preparation for tensile test (18C).
Figure 18B:
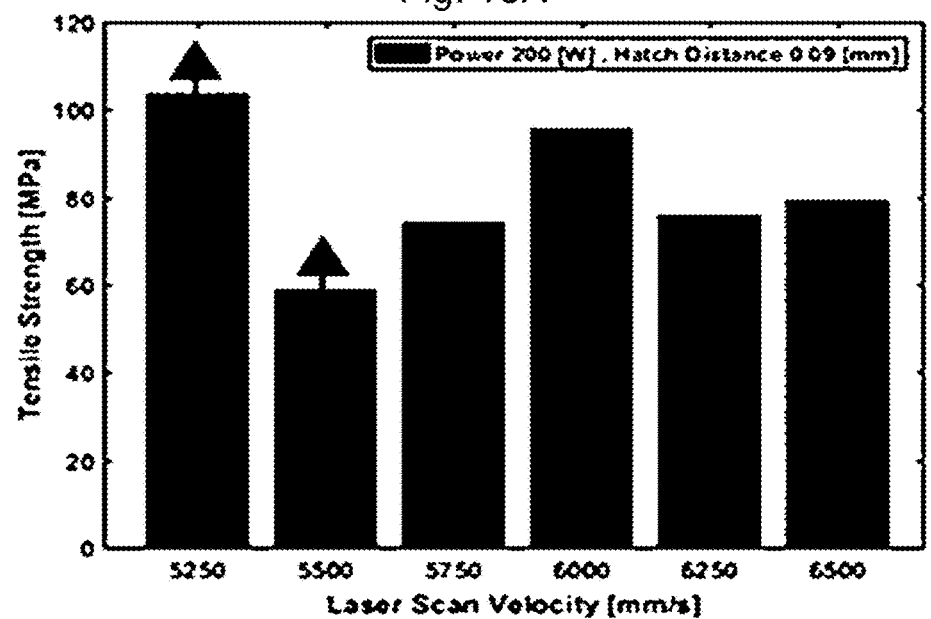
Figure 18C:
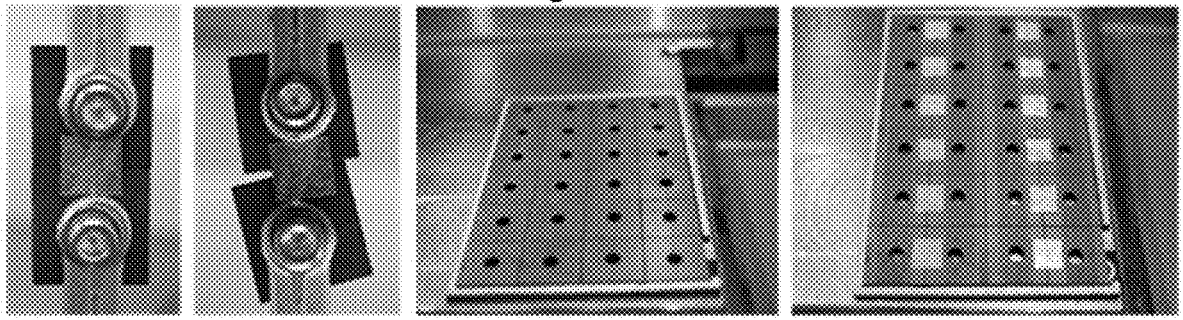

The designed mechanical testing reveals the lower limit of interfacial strength for the alloy in FIGS. 18A, 18B and 18C, which shows the Interfacial strength of the graphite-metal bonding at various laser scan velocities (FIGS. 18A and 18B). Sample preparation for tensile test (FIG. 18C). Since the fracture occurred in alloy for most of the samples rather than at the graphite-metal interface, only a lower limit of the interfacial strength can be estimated (shown by arrow).

Figure 19:
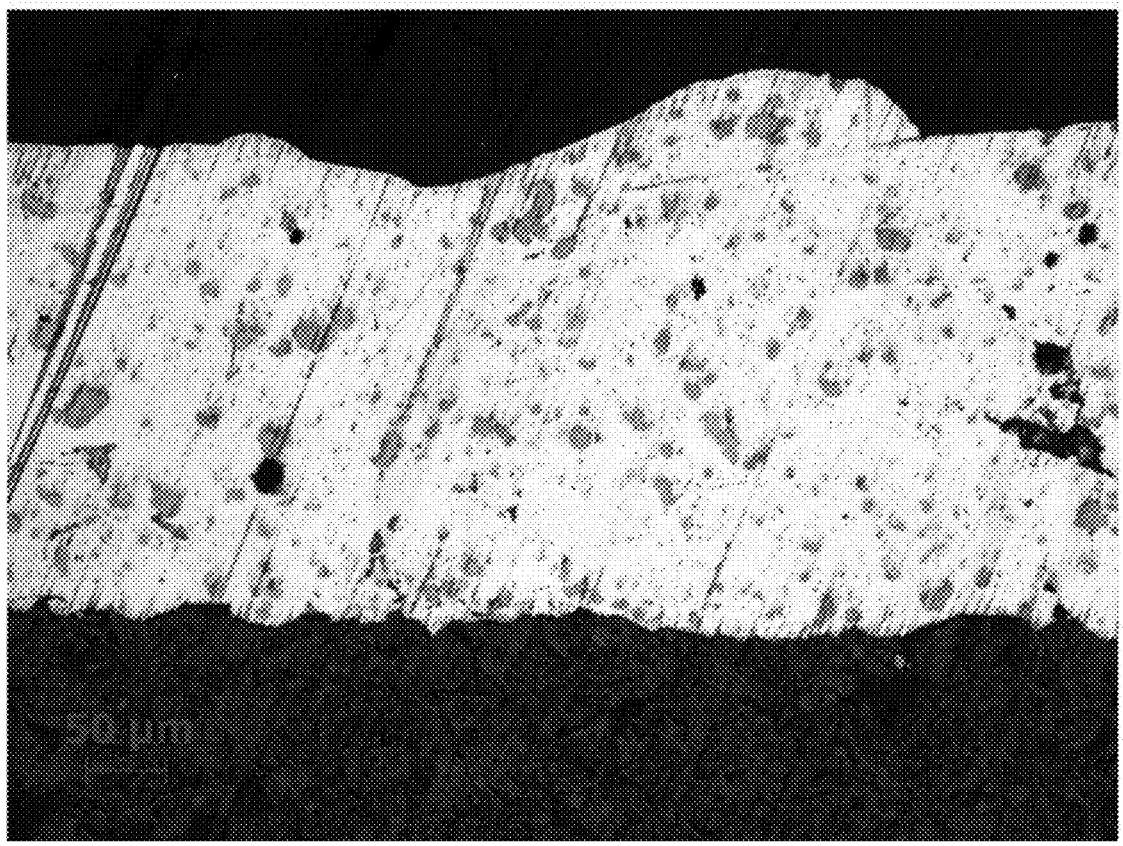
FIG. 19 shows an optical image of the Sn—Ag—Ti alloy laser bonded onto graphite.

FIG. 19 shows an optical image using a polarized light microscope of the Sn—Ag—Ti alloy laser bonded onto graphite.

Figure 20:
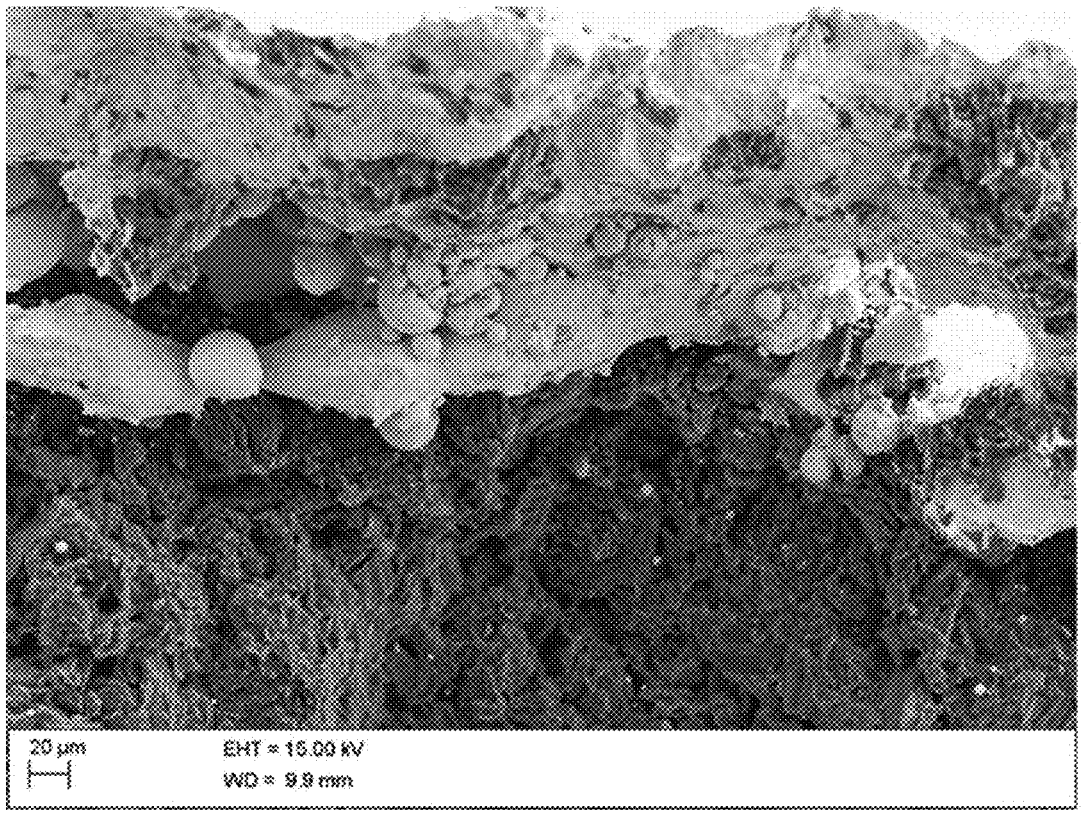
FIG. 20 shows an unpolished scanning electron microscopy of graphite-alloy interface.

FIG. 20 shows an unpolished scanning electron microscopy of graphite-alloy interface.

Figure 24:
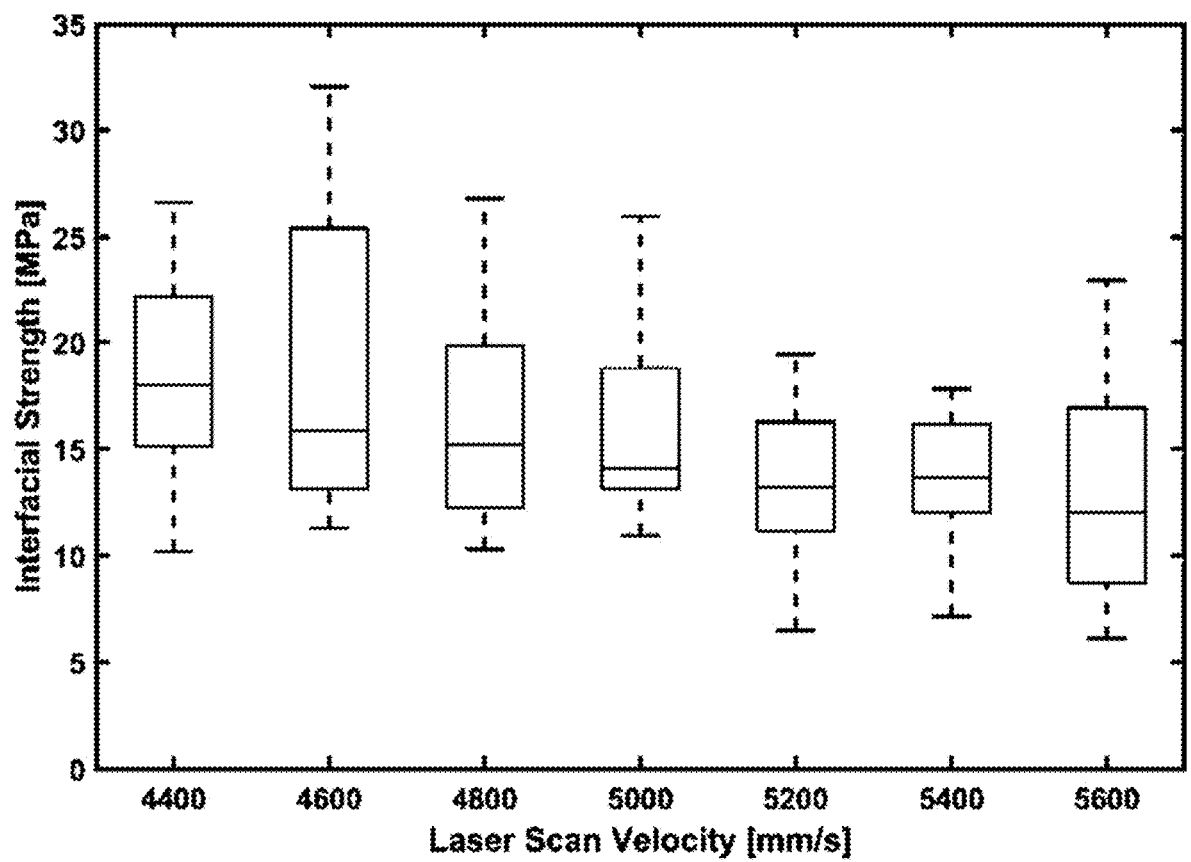
FIG. 24 shows ball shear testing is performed to measure interfacial strength of $Sn_3Ag_4Ti$ alloy additively deposited on HT grade high conductivity (1700 W/m–K at room temperature) pyrolytic graphite by laser processing.

Similar processing will work for printing onto pyrolytic graphite. FIG. 23 shows a print on a pyrolytic graphite sample. Pyroid® HT pyrolytic graphite substrate is thermally annealed in the manufacturing process to increase its thermal conductivity up to 1700 W/m-K at room temperature. Owing to the higher thermal conductivity of pyrolytic graphite, a greater energy density is required for bonding. This sample was made at laser scan speeds ranging from 4400 mm/s to 5600 mm/s and 150 W power and 20 μm layer thickness. Double exposure was applied to all samples. Ball shear testing is performed to measure interfacial strength of $Sn_3Ag_4Ti$ alloy deposited by different laser processing parameters on pyrolytic graphite as shown on FIG. 24. 4400 mm/s and 150 W process parameters provided highest bond strength.

Figure 21A:
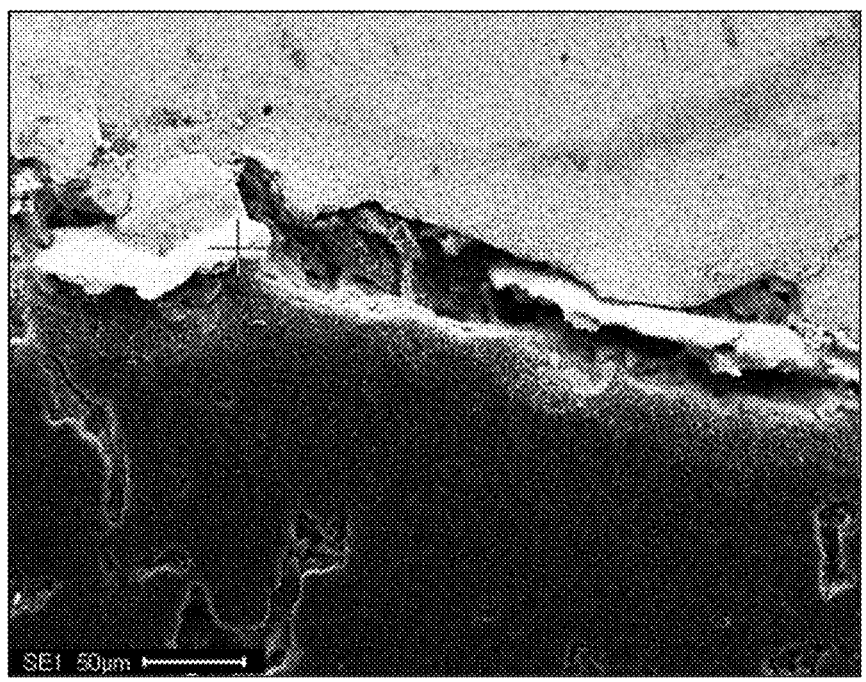
FIGS. 21A and 21B show the formation of carbide near the interface between graphite (bottom) and alloy (top).
Figure 21B:
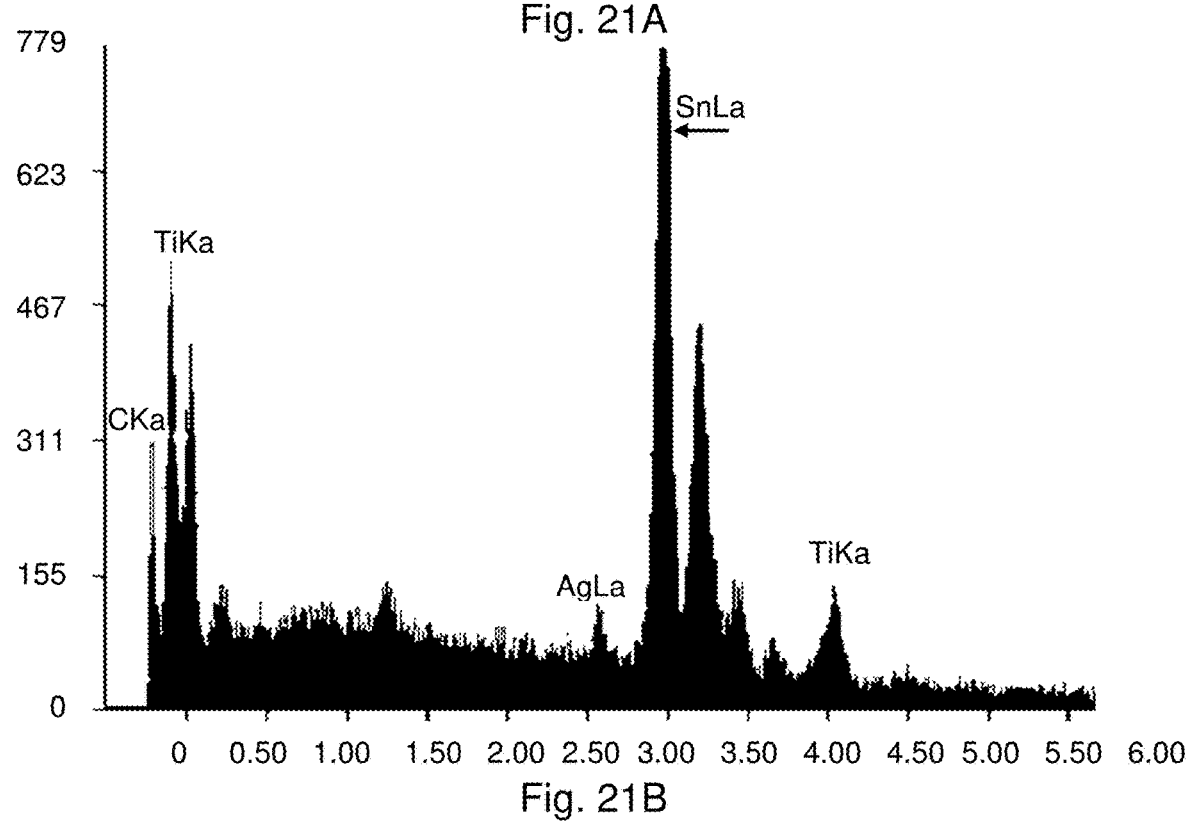

Energy-dispersive X-ray spectroscopy (EDS)/SEM 15 kV MAG 300 performed on the interface of the joint is shown in FIGS. 21A and 21B. A scan across the interface shows diffusion of Carbon into the alloy. Elemental compositions observed at the interface show a titanium-tin-carbide interlayer [90]. Carbide formation is observed near the interface between graphite (bottom) and alloy (top).

TABLE 3

| Element | C | Ag | Sn | Ti |
|---|---|---|---|---|
| At % | 25.85 | 00.00 | 61.92 | 12.22 |
| Wt % | 03.77 | 00.00 | 89.13 | 07.10 |

To examine the reliability of the bond in various thermal conditions, a thermal cycling test is performed. The bulk SS316L samples printed on graphite were tested using a Thermotron temperature chamber. During the test, the chamber temperature varied from −40° C. to 130° C. for 100 cycles. The temperatures of the parts are monitored. After the 100 cycles (over 1 week of testing), the parts were visually examined for defects, such as delamination, along the perimeter where thermal stresses are greatest. All parts passed the visual test without any noticeable failure or defects. FIGS. 22A and 22B show two stainless steel parts after the thermal cycling test.

This technology efficiently and effectively employs a focused energy additive manufacturing process capable of bonding metals onto to graphite. Parts produced by this method can help effectively spread heat and take advantage of the high in-plane thermal conductivity of pyrolytic graphite. Furthermore, graphite can be used as an alternative build platform which decreases the cost of printing with stainless steel or titanium since current metal additively manufactured parts require machining to remove support, which requires either manually machining the parts or computer-controlled machining (CNC), which are both expensive and time-consuming. There is no need to print support structures as the part can be printed directly on the build platform and separated from it after print by melting the alloy connecting the stainless to graphite, or by brittle fracturing the graphite plate.

Detailed Bonding to Silica-Based Compounds with $Sn_3Ag_4Ti$

Experiments were conducted using a laser-powder bed fusion EOS M290 tool having a 500 W 1064 nm Yb-fiber laser and high speed galvanometer mirror system (maximum raster speed of 7000 mm/s). The machine has a $N_2$ generator that maintains an $N_2$ gas atmosphere with $O_2$ concentrations of less than 1.5%. A special wafer tray is used to securely hold the silicon wafer.

A $Sn_3Ag_4Ti$ powder mixture is used as the bonding metal mixture, as it provides good bonding with silica and alumina via the Ti silicide and Ti oxide formation [58,91-93], and also bonds to a broad range of other materials including graphite, Al, Cu, and Fe-based metals. This low melting point of this alloy (~250° C.) reduces the thermal stresses experienced after solidification upon cooling. Sn, Ag, and Ti powders (>99% purity) with respective average diameters of 40 μm, 5 μm, 10 μm were mixed with weight percentages of 93%, 3%, and 4% ($Sn_{87.55}Ag_{3.11}Ti_{9.34}$) (FIG. 2). Smaller powder sizes were chosen for the lower concentration metals to facilitate mixing and reduce diffusional resistance of the Ag and Ti in the Sn melt. FIG. 2 shows an SEM image (8.6 mm WD, 9 KV EHT, SE2 detector) of mixed Ag (3 wt %), Ti (4 wt %) and Sn (93 wt %) powders.

Figure 25:
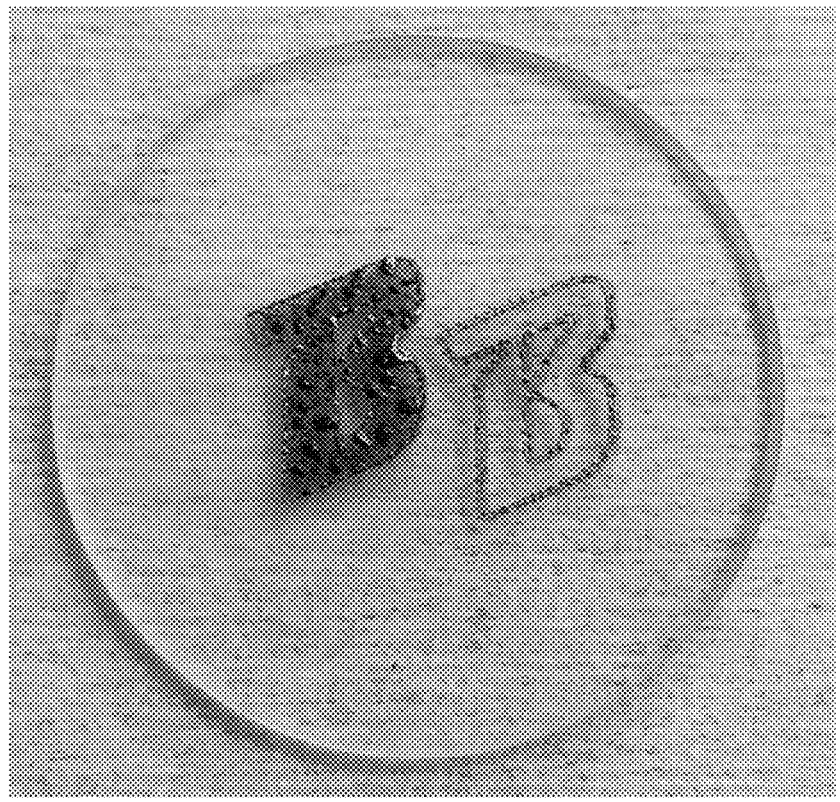
FIG. 25 shows a photograph of $Sn_3Ag_4Ti$ alloy deposited on Borosilicate glass.
Figure 26A:
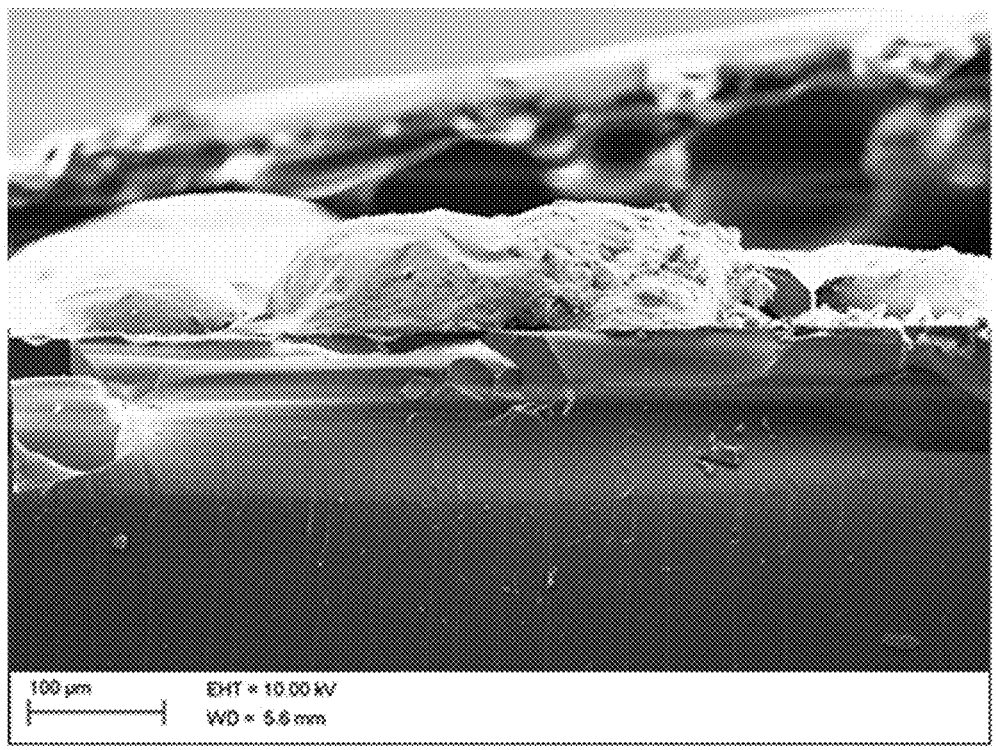
FIG. 26A shows an SEM image of $Sn_3Ag_4Ti$ alloy deposited on Borosilicate glass (5.6 mm WD, 10 kV EHT, SE2 detector).
Figure 26B:
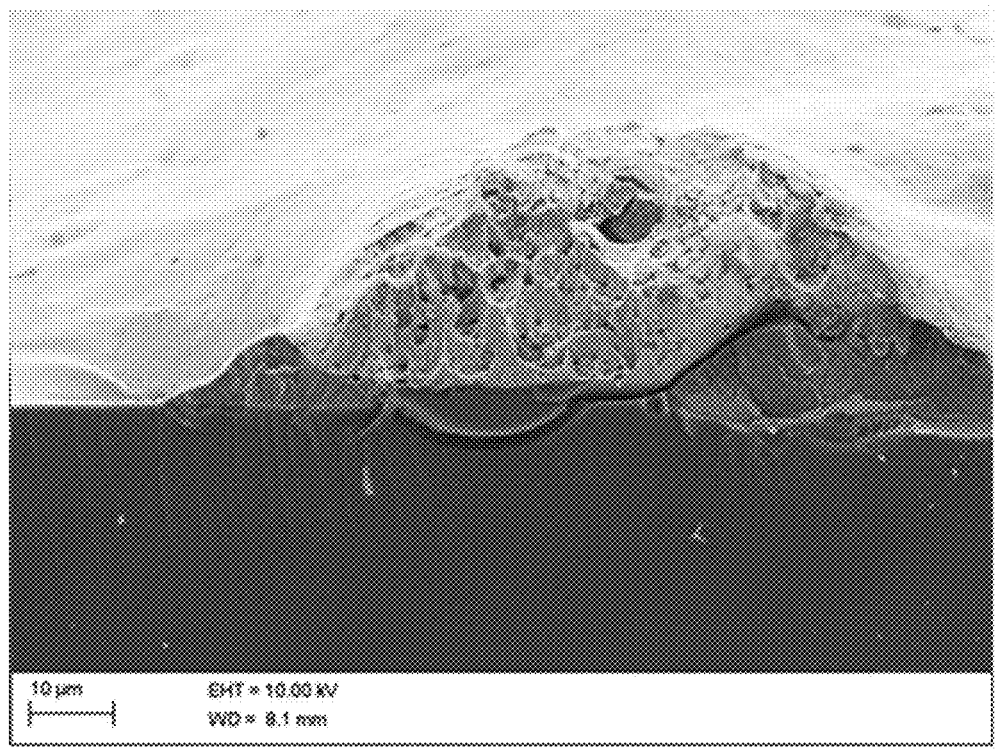
FIG. 26B shows an SEM image of $Sn_3Ag_4Ti$ alloy deposited on Borosilicate glass (8.1 mm WD, 10 kV EHT, SE2 detector).
Figure 27A:
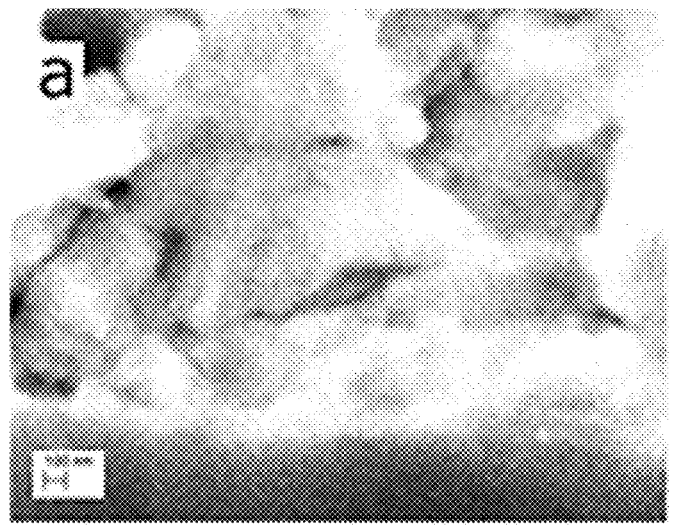
FIGS. 27A-27F shows EDS mapping of $Sn_3Ag_4Ti$ alloy deposited on Borosilicate glass 8.1 mm WD, 10 kV EHT, SE2 detector).
Figure 27B:
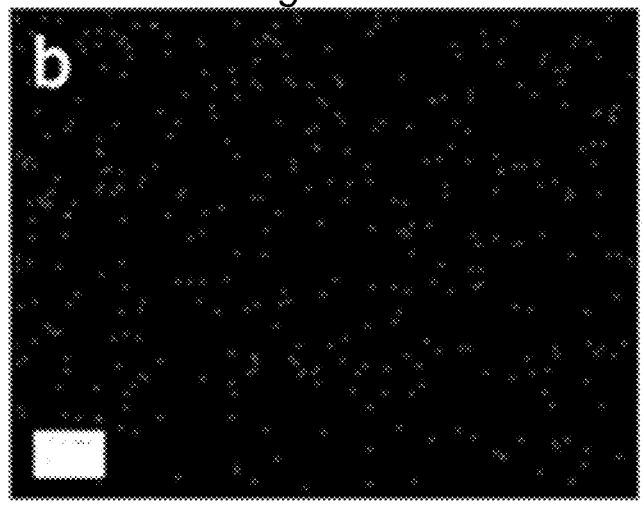
Figure 27C:
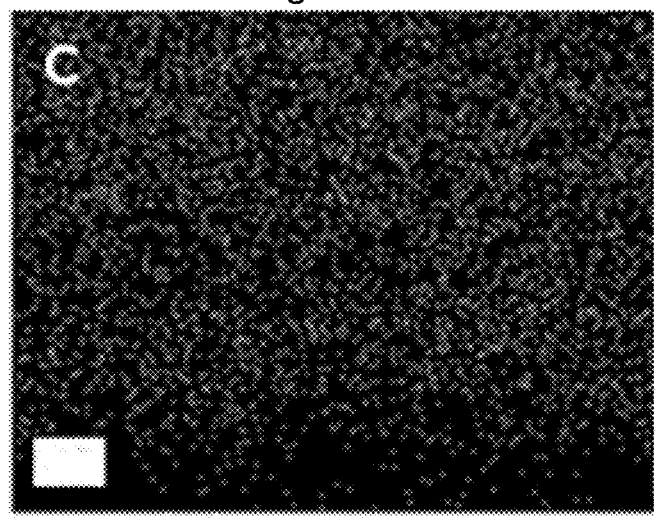
Figure 27D:
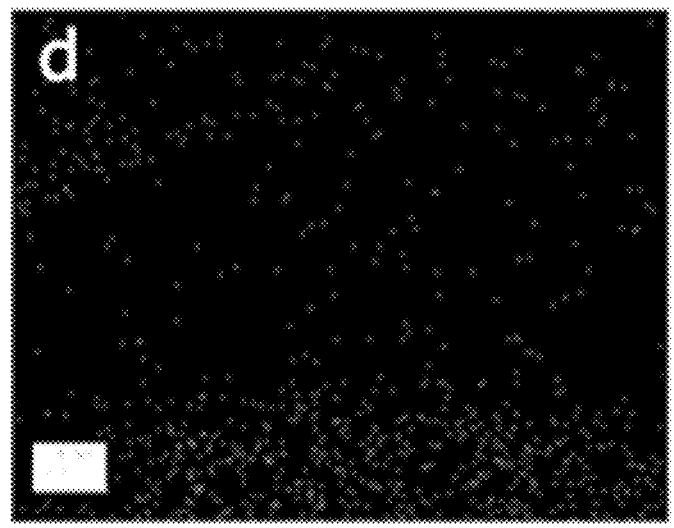
Figure 27E:
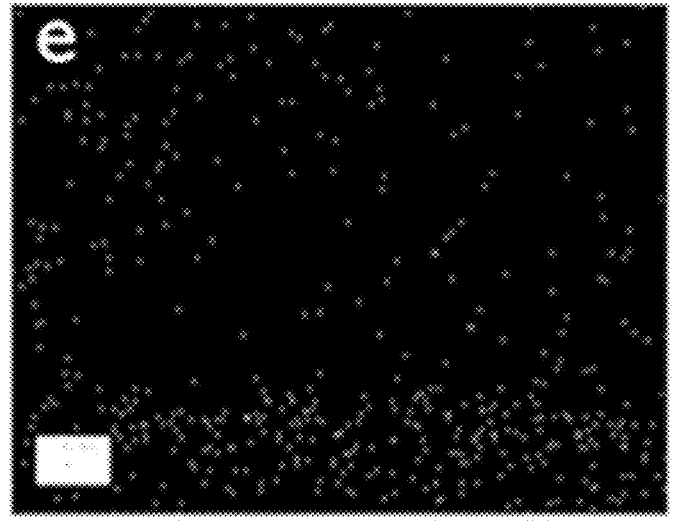
Figure 27F:
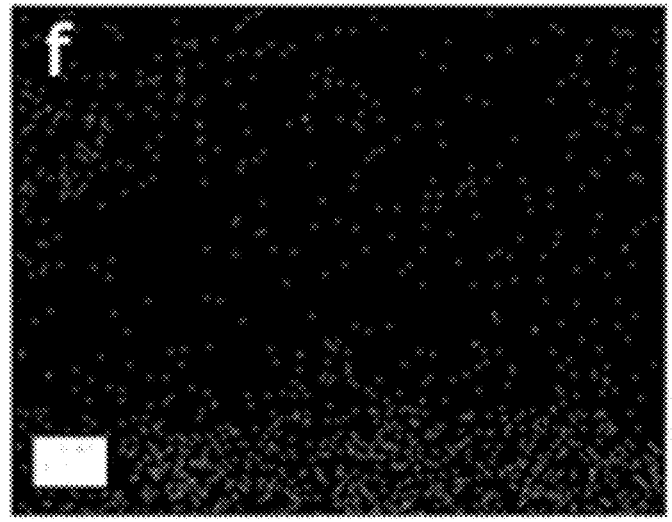

FIGS. 25 and 26A and 26B show optical and scanning electron microscopy images of the first layer of printing $Sn_3Ag_4Ti$ alloy onto a borosilicate glass substrate fractured at the interface. The laser processing parameters used for this deposition are given in table 4.

TABLE 4

| Sample | Power [W] | Scan speed [mm/s] | Exposure | Hatch distance [mm] | Layer thickness [μm] | Energy density [J/mm³] |
|---|---|---|---|---|---|---|
| 1 | 120 | 1700 | Double | 0.09 | 20 | 39.21 |

Energy dispersive X-ray spectroscopy mapping was applied at the interface of the sample with the $Sn_3Ag_4Ti$ alloy deposited onto borosilicate glass to investigate the bonding, as shown in FIGS. 27A-27F. During directed energy deposition by the laser, the titanium in the alloy reacts to silica and create titanium oxide and titanium silicide. Presence of similar patterns for Ti, Si and O in EDS elemental mapping supports titanium oxides forming at the interface.

Detailed Bonding to $Al_2O_3$-Based Compounds with $Sn_3Ag_4Ti$

Figure 28A:
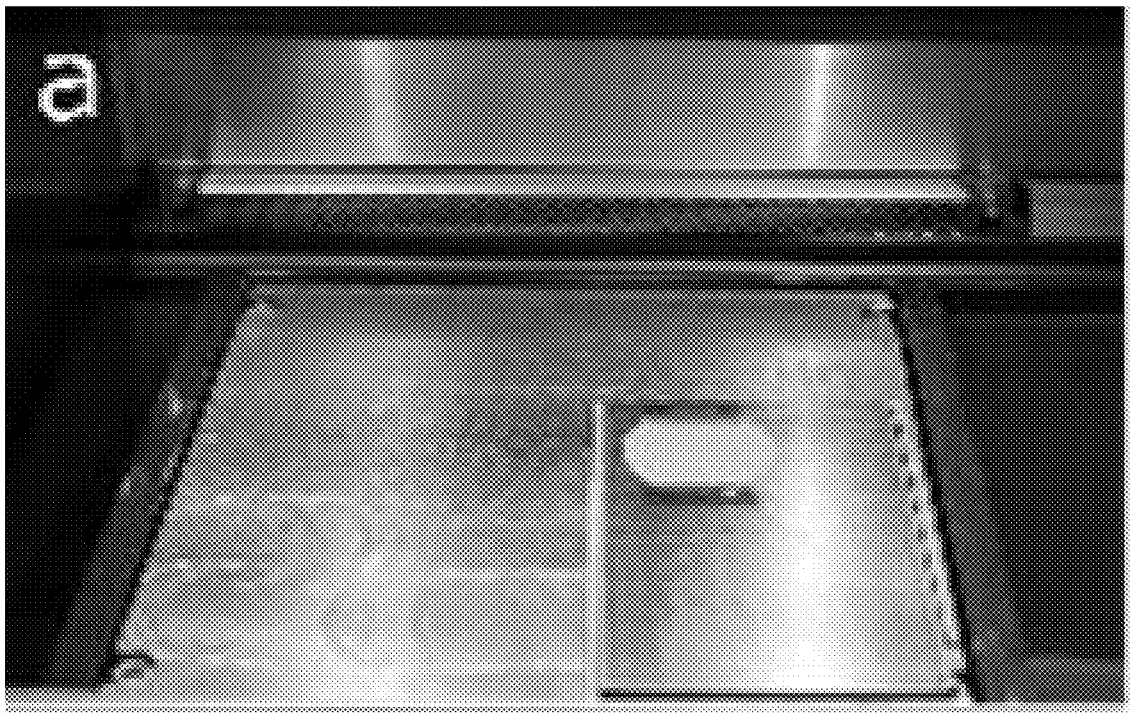
FIGS. 28A-28E shows the printing onto sapphire process mapping.
Figure 28B:
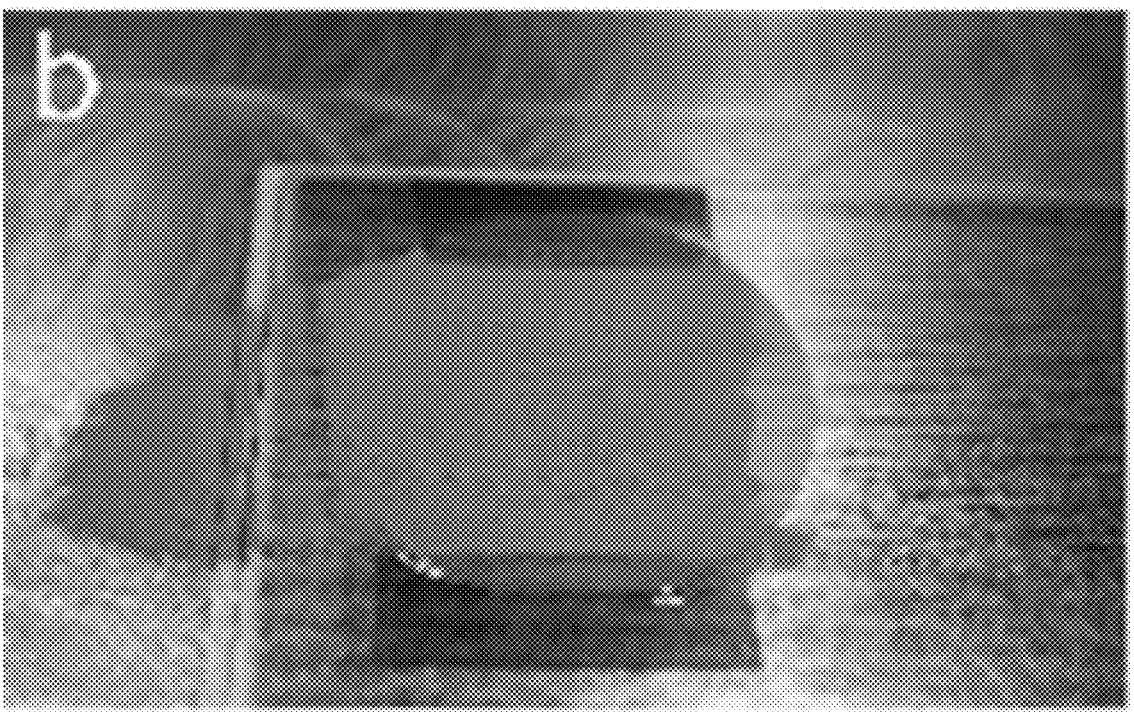
Figure 28C:
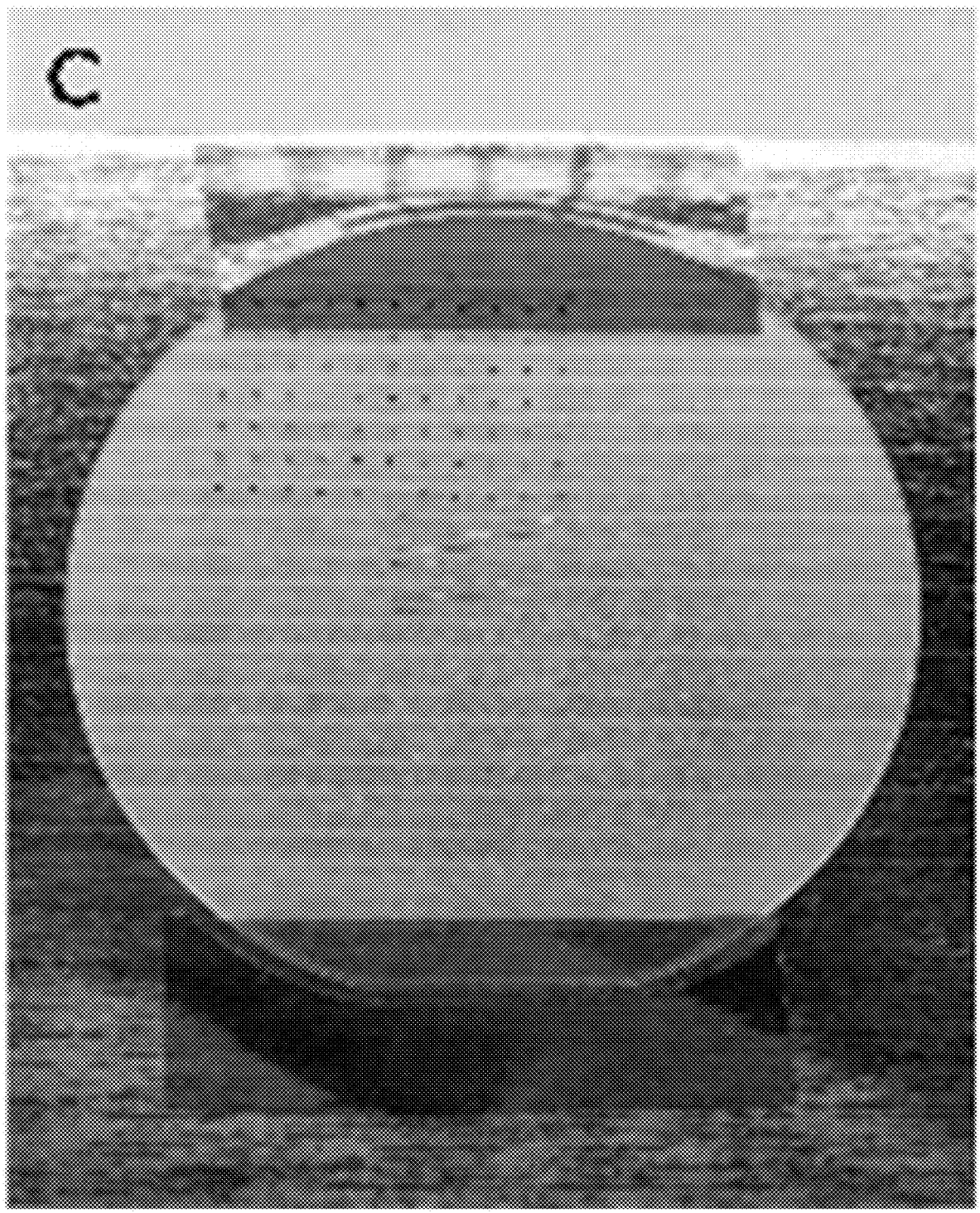
Figure 28D:
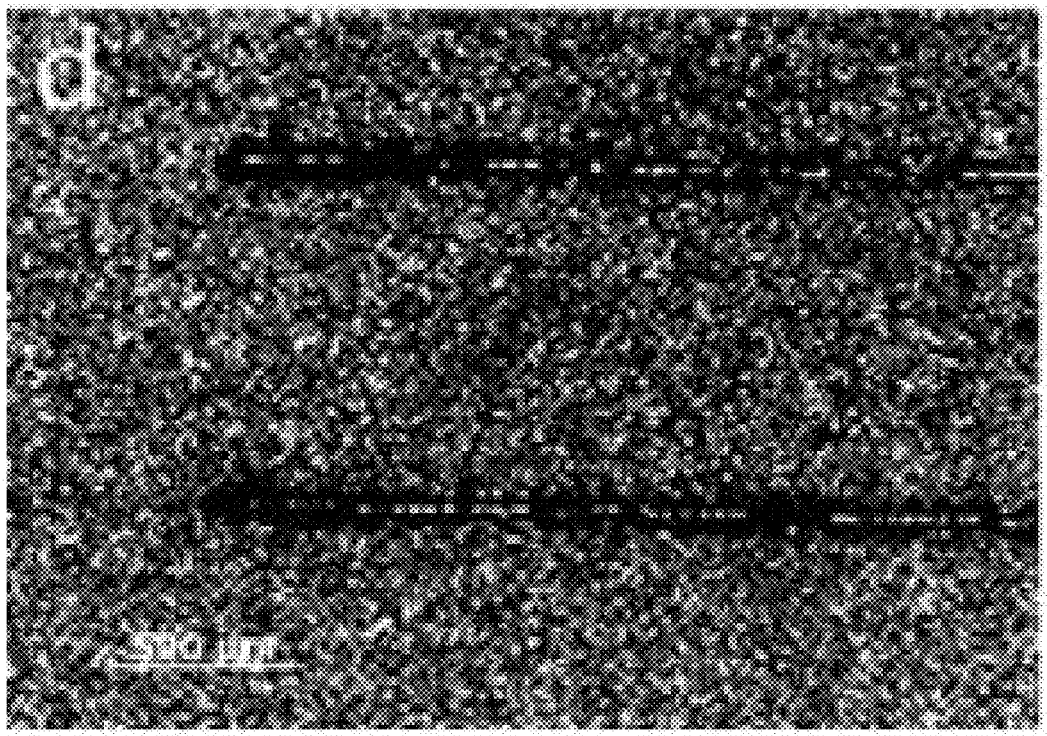
Figure 28E:
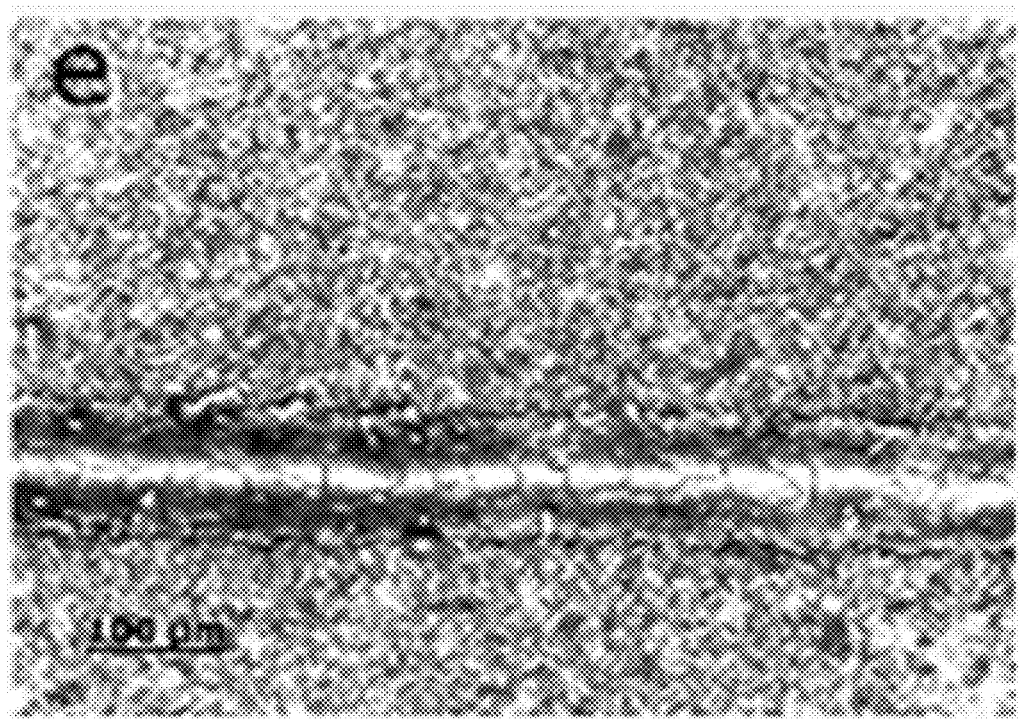

An EOS m290 system and $Sn_3Ag_4Ti$ alloy powder was used to print on D50×0.43 mm Sapphire wafer with <0001> orientation and single side polish, installed on a steel build platform using Kapton tape. FIG. 28A shows the powder mounted on the build platform. The sapphire is unpolished on the side that was printed on. FIG. 28B shows a thin single layer of approximately 54 μm (the thickness of the Kapton tape) of $Sn_3Ag_4Ti$ alloy powder, deposited on the unpolished surface with manual deposition. FIG. 28C shows the pattern of pillars and lines printed with this technique using a laser power of 150 W with scanning rate from 4400 to 5600 mm/s and a spot size of approximately 100 μm. As can be seen in the brightfield optical microscope images of FIG. 28D and FIG. 28E, good bonding can be achieved with a scan rate of 4400 mm/s and a power of 150 W. FIG. 28D shows bright field optical imaging at 5× of two lines, top with 150 W and 4400 mm/s and bottom with 150 W and 4600 mm/s. FIG. 28E shows bright field optical imaging at 20× magnification of 150 W 4400 mm/s line with Z-stack. Line thickness of 100 μm is achieved with edge exposure (single line raster).

Example 2

The present technology provides an alternate technique for direct fabrication of heat transfer devices onto the chip by additive manufacturing, by building on recent hybrid bonding literature for interconnect manufacturing [98-101]. Previously lead solders, and more recently non-lead solders, have been used extensively in the electronic packaging industry to form interconnects, etc. However, reliability concerns are pushing the industry to move away from solders, towards a concept called hybrid bonding [94-97]

which does not require solders. Hybrid bonding consists of multi-stage physical and chemical depositions onto a semiconductor device by employing photolithography-based techniques. This process produces a thin bonding layer via depositions that can then have features, like fins and microchannels, additively deposited via a powder-based laser melting process.

Figure 29:
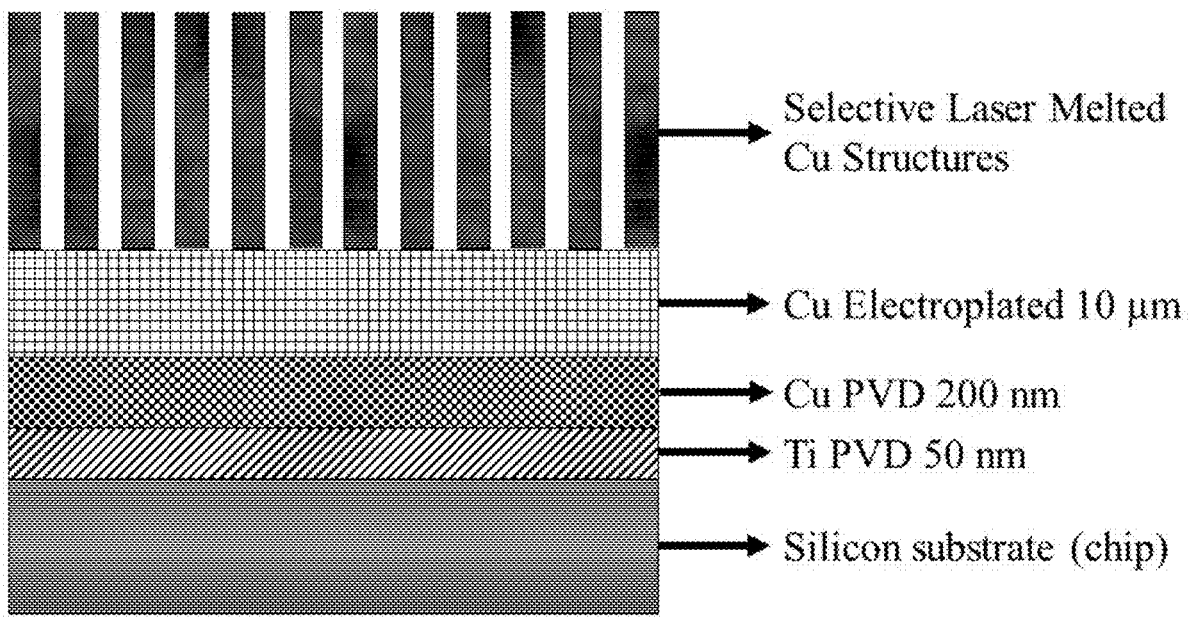
FIG. 29 shows schematic showing layers of a 3D printed heat removal device made on a metallized silicon substrate.

In this example, ~50 nm of titanium is deposited onto the back of the semiconductor die by physical vapor deposition (PVD), such as sputtering or evaporation as adhesion layer. This layer could be patterned or unpatterned. Then ~250 nm of copper is deposited on top with similar techniques. Afterwards, 5-40 μm of copper layer is grown by electrodeposition onto the seed layer. This process is illustrated in FIG. 29. After metallizing the silicon with Cu, it is possible to 3d metal print heat sink structures made of copper directly on the metalized surface. Alternative embodiments may choose to make features out of other high conductivity metals, like silver or aluminum. This technique has an interface from titanium to the silicon via titanium silicides, and the first interlayer to the copper via Ti—Cu intermetallic formation.

The disclosure has been described with reference to various specific embodiments and techniques. However, many variations and modifications are possible while remaining within the scope of the disclosure.

REFERENCES (EACH OF WHICH IS EXPRESSLY INCORPORATED HEREIN BY REFERENCE IN ITS ENTIRETY)

[1] S. M. Ameli, Additive Layer Manufactured Sinter-Style Aluminium/Ammonia Heat Pipes, (n.d.) 182.
[2] M. Ameli, B. Agnew, P. S. Leung, B. Ng, C. J. Sutcliffe, J. Singh, R. McGlen, A novel method for manufacturing sintered aluminium heat pipes (SAHP), Applied Thermal Engineering. 52 (2013) 498-504. doi:10.1016/j.applthermaleng.2012.12.011.
[3] S. M. Thompson, Z. S. Aspin, N. Shamsaei, A. Elwany, L. Bian, Additive manufacturing of heat exchangers; A case study on a multi-layered Ti-6Al-4V oscillating heat pipe, Additive Manufacturing. 8 (2015) 163-174. doi:10.1016/j.addma.2015.09.003.
[4] M. Wong, S. Tsopanos, C. J. Sutcliffe, I. Owen, Selective laser melting of heat transfer devices, Rapid Prototyping Journal. 13 (2007) 291-297. doi:10.1108/13552540710824797.
[5] M. Wong, I. Owen, C. J. Sutcliffe, A. Puri, Convective heat transfer and pressure losses across novel heat sinks fabricated by Selective Laser Melting, International Journal of Heat and Mass Transfer. 52 (2009) 281-288. doi:10.1016/j.ijheatmasstransfer.2008.06.002.
[6] Y. Li, Y. Shen, C.-H. Hung, M. C. Leu, H.-L. Tsai, Additive manufacturing of Zr-based metallic glass structures on 304 stainless steel substrates via V/Ti/Zr intermediate layers, Materials Science and Engineering; A. 729 (2018) 185-195. doi:10.1016/j.msca.2018.05.052.
[7] I. Tomashchuk, D. Grevey, P. Sallamand, Dissimilar laser welding of AISI 316L stainless steel to Ti6-Al4-6V alloy via pure vanadium interlayer, Materials Science and Engineering; A. 622 (2015) 37-45. doi:10.1016/j.msea.2014.10.084.
[8] M. K. Lee, J. G. Lee, Y. H. Choi, D. W. Kim, C. K. Rhee, Y. B. Lee, S. J. Hong, Interlayer engineering for dissimilar bonding of titanium to stainless steel, Materials Letters. 64 (2010) 1105-1108. doi:10.1016/j.matlet.2010.02.024.
[9] E. Saiz, A. P. Tomsia, Atomic dynamics and Marangoni films during liquid-metal spreading, Nature Materials. 3 (2004) 903-909. doi:10.1038/nmat1252.
[10] N. Eustathopoulos, Progress in understanding and modeling reactive wetting of metals on ceramics, Current Opinion in Solid State and Materials Science. 9 (2005) 152-160. doi:10.1016/j.cossms.2006.04.004.
[11] S. Sugihara, K. Okazaki, K. Suganuma, Wetting of silicon single crystal by silver and tin, and their interfaces, Journal of Materials Science. 28 (1993) 2455-2458. doi: 10.1007/BF01151679.
[12] F. Baudin, L. Di Cioccio, V. Delaye, N. Chevalier, J. Dechamp, H. Moriceau, E. Martinez, Y. Bréchet, Direct bonding of titanium layers on silicon, Microsystem Technologies. 19 (2013) 647-653. doi:10.1007/s00542-012-1664-0.
[13] J. Yu, Y. Wang, J.-Q. Lu, R. J. Gutmann, Low-temperature silicon wafer bonding based on Ti/Si solid-state amorphization, Applied Physics Letters. 89 (2006) 092104. doi:10.1063/1.2338574.
[14] K. Holloway, R. Sinclair, Amorphous Ti—Si alloy formed by interdiffusion of amorphous Si and crystalline Ti multilayers, Journal of Applied Physics. 61 (1987) 1359-1364. doi:10.1063/1.338114.
[15] R.W. Smith, Process of using an active solder alloy, U.S. Pat. No. 6,047,876A, 2000.
[16] Y. Tang, G. Li, Thermodynamic Study of Sn—Ag—Ti Active Filler Metals, Physics Procedia. 25 (2012) 30-35. doi:10.1016/j.phpro.2012.03.045.
[17] R. W. Smith, R. Redd, Electronic package formed using low-temperature active solder including indium, bismuth, and/or cadmium, EP1749315B1, 2009.
[18] R. Kolenak, Igor Kostolný, Martin Sahul, Direct bonding of silicon with solders type Sn—Ag—Ti, 28 (2016) 149-158. doi:doi.org/10.1108/SSMT-11-2015-0040.
[19] Nicolas Eustathopoulos, Michael G. Nicolas, Béatrice Drevet, eds., Wettability at High Temperatures, Pergamon, 1999.
[20] K. Holloway, K. B. Do, R. Sinclair, Interfacial reactions on annealing molybdenum-silicon multilayers, Journal of Applied Physics. 65 (1989) 474-480. doi:10.1063/1.343425.
[21] W.-L. Wang, Y.-C. Tsai, Microstructural characterization and mechanical property of active soldering anodized 6061 Al alloy using Sn-3.5Ag-xTi active solders, Materials Characterization. 68 (2012) 42-48. doi:10.1016/j.matchar.2012.03.007.
[22] M. Tashiro, A. Kasahara, Method of bonding graphite to metal, U.S. Pat. No. 5,904,287A, 1999.
[23] H. Sueyoshi, T. Nishida, Solid State Bonding of Graphite to SUS304 Steel, Materials Transactions, JIM. 41 (2000) 414-419. doi:10.2320/matertrans1989.41.414.
[24] J. Y. Liu, S. Chen, B. A. Chin, Brazing of vanadium and carbon-carbon composites to stainless steel for fusion reactor applications, Journal of Nuclear Materials. 212-215 (1994) 1590-1593. doi:10.1016/0022-3115(94)91095-2.
[25] Q. Lin, W. Zhong, F. Li, W. Yu, Reactive wetting of tin/steel and tin/aluminum at 350-450° C., Journal of Alloys and Compounds. 716 (2017) 73-80. doi:10.1016/j.jallcom.2017.05.036.
[26] T. H. Chuang, M. S. Yeh, Y. H. Chai, Brazing of zirconia with AgCuTi and SnAgTi active filler metals, Metall and Mat Trans A. 31 (2000) 1591-1597. doi: 10.1007/s11661-000-0169-0.

[27] E. Saiz, A. P. Tomsia, R. M. Cannon, Ridging effects on wetting and spreading of liquids on solids, Acta Materialia. 46 (1998) 2349-2361. doi:10.1016/S1359-6454(98)80016-5.

[28] K. Landry, C. Rado, R. Voitovich, N. Eustathopoulos, MECHANISMS OF REACTIVE WETTING; THE QUESTION OF TRIPLE LINE CONFIGURATION, Acta Materialia. 45 (1997) 3079-3085. doi:10.1016/S1359-6454(96)00372-2.

[29] D. Lu, C. P. Wong, eds., Materials for Advanced Packaging, Springer US, Boston, Mass., 2009. doi:10.1007/978-0-387-78219-5.

[30] F. J. Mesa-Martinez, M. Brown, J. Nayfach-Battilana, J. Renau, Measuring power and temperature from real processors, in; IEEE, 2008; pp. 1-5. doi:10.1109/IPDPS.2008.4536423.

[31] Y. H. Lin, C. M. Tsai, Y. C. Hu, Y. L. Lin, C. R. Kao, Electromigration-induced failure in flip-chip solder joints, Journal of Electronic Materials. 34 (2005) 27-33. doi:10.1007/s11664-005-0176-4.

[32] Z. Huang, R. E. Jones, A. Jain, Experimental investigation of electromigration failure in Cu—Sn—Cu micropads in 3D integrated circuits, Microelectronic Engineering. 122 (2014) 46-51. doi:10.1016/j.mee.2014.03.003.

[33] E. Le Bourhis, Glass; Mechanics and Technology, 2nd ed., Wiley-VCH, 2014.

[34] W. H. Zachariasen, The Atomic Arrangement In Glass, Journal of the American Chemical Society. 54 (1932) 3841-3851. doi:10.1021/ja01349a006.

[35] B. E. Warren, X-Ray Determination Of The Structure Of Glass, Journal of the American Ceramic Society. 17 (1934) 249-254. doi:10.1111/j.1151-2916.1934.tb19316.x.

[36] J. E. Shelby, Introduction to Glass Science and Technology:, 2nd ed., Royal Society of Chemistry, Cambridge, 2007. doi:10.1039/9781847551160.

[37] M. Hasanuzzaman, A. Rafferty, M. Sajjia, A.-G. Olabi, Properties of Glass Materials, in; Reference Module in Materials Science and Materials Engineering, Elsevier, 2016. doi:10.1016/B978-0-12-803581-8.03998-9.

[38] M. D. Ediger, Perspective; Highly stable vapor-deposited glasses, The Journal of Chemical Physics. 147 (2017) 210901. doi:10.1063/1.5006265.

[39] L. Yang, H. Y. Li, P. W. Wang, S. Y. Wu, G. Q. Guo, B. Liao, Q. L. Guo, X. Q. Fan, P. Huang, H. B. Lou, F. M. Guo, Q. S. Zeng, T. Sun, Y. Ren, L. Y. Chen, Structural responses of metallic glasses under neutron irradiation, Scientific Reports. 7 (2017). doi:10.1038/s41598-017-17099-2.

[40] D. Kundu, G. De, B. Karmakar, A. Patra, D. Ganguli, Sol-gel preparation of silica glass, Bulletin of Materials Science. 15 (1992) 453-457. doi:10.1007/BF02745295.

[41] K. Kihara, An X-ray study of the temperature dependence of the quartz structure, European Journal of Mineralogy. 2 (1990) 63-78. doi:10.1127/ejm/2/1/0063.

[42] K. Bettger, E. Brown, E. N. Boulos, D. H. Stark, Glass-to-metal bond structure, US20100119740A1, 2010.

[43] M. P. William, H. B. Pardam, P. Graham, Process of bonding glass or ceramic to metal, U.S. Pat. No. 3,220,815A, 1965.

[44] L. L. Hench, P. J. Buscemi, Method of bonding a bioglass to metal, U.S. Pat. No. 4,159,358A, 1979.

[45] R. W. Bruce, D. L. III, M. Kahn, A. W. Fliflet, S. H. Gold, Microwave assisted reactive brazing of ceramic materials, U.S. Pat. No. 7,022,198B2, 2006.

[46] C. Dresbach, A. Krombholz, M. Ebert, J. Bagdahn, Mechanical properties of glass frit bonded micro packages, Microsystem Technologies. 12 (2006) 473-480. doi:10.1007/s00542-005-0031-9.

[47] R. Knechtel, Glass frit bonding; an universal technology for wafer level encapsulation and packaging, Microsystem Technologies. 12 (2005) 63-68. doi:10.1007/s00542-005-0022-x.

[48] R. Knechtel, M. Wiemer, J. Frömel, Wafer level encapsulation of microsystems using glass frit bonding, Microsystem Technologies. 12 (2006) 468-472. doi:10.1007/s00542-005-0036-4.

[49] K. Nötzold, C. Dresbach, J. Graf, B. Böttge, Temperature dependent fracture toughness of glass frit bonding layers, Microsystem Technologies. 16 (2010) 1243-1249. doi:10.1007/s00542-010-1037-5.

[50] M. Petzold, C. Dresbach, M. Ebert, J. Bagdahn, M. Wiemer, K. Glien, J. Graf, R. Muller-Fiedler, H. Hofer, Fracture mechanical life-time investigation of glass frit-bonded sensors, in; Thermal and Thermomechanical Proceedings 10th Intersociety Conference on Phenomena in Electronics Systems, 2006. ITHERM 2006., IEEE, San Diego, Calif., 2006; pp. 1343-1348. doi:10.1109/ITHERM.2006.1645501.

[51] Z. Sun, D. Pan, J. Wei, C. K. Wong, Ceramics bonding using solder glass frit, Journal of Electronic Materials. 33 (2004) 1516-1523. doi:10.1007/s11664-004-0093-y.

[52] R. J. Churchill, U. Varshney, H. P. Groger, J. M. Glass, Laser brazing for ceramic-to-metal joining, U.S. Pat. No. 5,407,119A, 1995.

[53] Materials Science International Team MSIT®, Ag—Cu—Ti (Silver-Copper-Titanium), in; G. Effenberg, S. Ilyenko (Eds.), Non-Ferrous Metal Systems. Part 3, Springer Berlin Heidelberg, Berlin, Heidelberg, 2007; pp. 63-74. doi:10.1007/978-3-540-47004-5_10.

[54] H. Mizuhara, Silver-copper-titanium brazing alloy containing crust inhibiting element, U.S. Pat. No. 4,883,745A, 1989.

[55] M. L. Santella, J. A. Horton, J. J. Pak, Microstructure of Alumina Brazed with a Silver-Copper-Titanium Alloy, Journal of the American Ceramic Society. 73 (1990) 1785-1787. doi:10.1111/j.1151-2916.1990.tb09835.x.

[56] Y. Sechi, K. Nagatsuka, K. Nakata, Effect of composition of titanium in silver-copper-titanium braze alloy on dissimilar laser brazing of binder-less cubic boron nitride and tungsten carbide, IOP Conference Series; Materials Science and Engineering. 61 (2014) 012019. doi:10.1088/1757-899X/61/1/012019.

[57] A. Gasse, N. Eustathopoulos, Brazing composition and method for brazing parts made of alumina-based materials with said composition, U.S. Pat. No. 6,616,032B1, 2003.

[58] Y. S. Chaug, N. J. Chou, Y. H. Kim, Interaction of Ti with fused silica and sapphire during metallization, Journal of Vacuum Science & Technology A; Vacuum, Surfaces, and Films. 5 (1987) 1288-1291. doi:10.1116/1.574792.

[59] Y. Tang, G. Li, Thermodynamic Study of Sn—Ag—Ti Active Filler Metals, Physics Procedia. 25 (2012) 30-35. doi:10.1016/j.phpro.2012.03.045.

[60] S. A. Khairallah, A. Anderson, Mesoscopic simulation model of selective laser melting of stainless steel powder, Journal of Materials Processing Technology. 214 (2014) 2627-2636. doi:10.1016/j.jmatprotec.2014.06.001.

[61] S. A. Khairallah, A. T. Anderson, A. Rubenchik, W. E. King, Laser powder-bed fusion additive manufacturing; Physics of complex melt flow and formation mechanisms of pores, spatter, and denudation zones, Acta Materialia. 108 (2016) 36-45. doi:10.1016/j.actamat.2016.02.014.

[62] R. Lacmann, Crystallization, Third Edition. J. W. MULLIN, Butterworth-Heinemann, Oxford 1997, 527 Seiten, zahlr. Abb. and ISBN 0-7506-3759-5, Chemie Ingenieur Technik-CIT. 70 (1998) 1468-1468. doi: 10.1002/cite.330701126.

[63] B. D. Iverson, T. W. Davis, S. V. Garimella, M. T. North, S. S. Kang, Heat and Mass Transport in Heat Pipe Wick Structures, Journal of Thermophysics and Heat Transfer. 21 (2007) 392-404. doi:10.2514/1.25809.

[64] T. L. Bergman, F. P. Incropera, L. S. Adrienne, D. P. DeWitt, Introduction to heat transfer, John Wiley & Sons, 2011.

[65] S. Fürtauer, D. Li, D. Cupid, H. Flandorfer, The Cu—Sn phase diagram, Part I: New experimental results, Intermetallics. 34 (2013) 142-147. doi:10.1016/j.intermet.2012.10.004.

[66] J. P. Kruth, L. Froyen, J. Van Vaerenbergh, P. Mercelis, M. Rombouts, B. Lauwers, Selective laser melting of iron-based powder, Journal of Materials Processing Technology. 149 (2004) 616-622. doi:10.1016/j.jmatprotec.2003.11.051.

[67] J. P. Kruth, X. Wang, T. Laoui, L. Froyen, Lasers and materials in selective laser sintering, Assembly Automation. 23 (2003) 357-371. doi:10.1108/01445150310698652.

[68] L. Thijs, F. Verhaeghe, T. Craeghs, J. V. Humbeeck, J.-P. Kruth, A study of the microstructural evolution during selective laser melting of Ti-6Al-4V, Acta Materialia. 58 (2010) 3303-3312. doi:10.1016/j.actamat.2010.02.004.

[69] J. Beuth, N. Klingbeil, The role of process variables in laser-based direct metal solid freeform fabrication, JOM. 53 (2001) 36-39. doi:10.1007/s11837-001-0067-y.

[70] J. Gockel, J. Beuth, K. Taminger, Integrated control of solidification microstructure and melt pool dimensions in electron beam wire feed additive manufacturing of Ti-6Al-4V, Additive Manufacturing. 1-4 (2014) 119-126. doi:10.1016/j.addma.2014.09.004.

[71] N. K. Roy, O. G. Dibua, W. Jou, F. He, J. Jeong, Y. Wang, M. A. Cullinan, A Comprehensive Study of the Sintering of Copper Nanoparticles Using Femtosecond, Nanosecond, and Continuous Wave Lasers, Journal of Micro and Nano-Manufacturing. 6 (2017) 010903. doi: 10.1115/1.4038455.

[72] D. D. Chung, Materials for thermal conduction, Applied Thermal Engineering. 21 (2001) 1593-1605. doi:10.1016/S1359-4311(01)00042-4.

[73] T. Siewert, L. Stephen, S. David R., M. Juan Carlos, Database for Solder Properties with Emphasis on New Lead-free Solders, National Institute of Standards and Technology & Colorado School of Mines, 2002.

[74] T. Young, III. An essay on the cohesion of fluids, Phil. Trans. R. Soc. Lond. 95 (1805) 65-87. doi:10.1098/rstl1805.0005.

[75] M. E. Schrader, Young-Dupre Revisited, Langmuir. 11 (1995) 3585-3589. doi:10.1021/la00009a049.

[76] B. Predel, Si—Ti (Silicon-Titanium), in; O. Madelung (Ed.), Pu—Re—Zn—Zr, Springer-Verlag, Berlin/Heidelberg, 1998; pp. 1-3. doi:10.1007/10551312_2737.

[77] R. J. Kematick, C. E. Myers, Thermodynamics of the Phase Formation of the Titanium Silicides, Chemistry of Materials. 8 (1996) 287-291. doi:10.1021/cm950386q.

[78] J. I. Goldstein, D. E. Newbury, P. Echlin, D. C. Joy, C. E. Lyman, E. Lifshin, L. Sawyer, J. R. Michael, Scanning Electron Microscopy and X-ray Microanalysis, Springer US, Boston, Mass., 2003. doi:10.1007/978-1-4615-0215-9.

[79] Solder Systems in Phase Diagrams & Computational Thermodynamics, (n.d.). www.metallurgy.nist.gov/phase/solder/solder.html (accessed Jul. 18, 2018).

[80] I. Ansara, A. T. Dinsdale, M. H. Rand, eds., Thermochemical database for light metal alloys, EUR 18499 EN, European cooperation in the field of scientific and technical research, 1998.

[81] N. Eustathopoulus, M. G. Nicolas, B. Drevet, eds., Chapter 8 Wetting properties of metal/carbon systems, in; Pergamon Materials Series, Pergamon, 1999; pp. 317-338. doi:10.1016/S1470-1804(99)80010-8.

[82] H. Zabel, S. Solin, eds., Graphite Intercalation Compounds I, Springer Berlin Heidelberg, Berlin, Heidelberg, 1990. doi:10.1007/978-3-642-75270-4.

[83] M. Tashiro, A. Kasahara, Method of bonding graphite to metal, U.S. Pat. No. 5,904,287 A, 1999.

[84] G. A. Slack, Anisotropic Thermal Conductivity of Pyrolytic Graphite, Phys. Rev. 127 (1962) 694-701. doi: 10.1103/PhysRev.127.694.

[85] EOS Metal Materials for Additive Manufacturing, (n.d.). www.eos.info/material-m (accessed Nov. 28, 2017).

[86] N. Eustathopoulus, M. G. Nicolas, B. Drevet, eds., Chapter 1 Fundamental equations of wetting, in; Pergamon Materials Series, Pergamon, 1999; pp. 1-53. doi: 10.1016/S1470-1804(99)80003-0.

[87] N. Eustathopoulus, M. G. Nicolas, B. Drevet, eds., Chapter 3 Methods of measuring wettability parameters, in; Pergamon Materials Series, Pergamon, 1999; pp. 106-147. doi:10.1016/S1470-1804(99)80005-4.

[88] R. M. Christensen, A Two-Property Yield, Failure (Fracture) Criterion for Homogeneous, Isotropic Materials, J. Eng. Mater. Technol. 126 (2004) 45-52. doi: 10.1115/1.1631024.

[89] Y. Flom, 2—Strength and margins of brazed joints, in; D. P. Sekulić (Ed.), Advances in Brazing, Woodhead Publishing, 2013; pp. 31-54. doi:10.1533/9780857096500.1.31.

[90] Y. C. Zhou, H. Y. Dong, B. H. Yu, Development of two-dimensional titanium tin carbide (Ti2SnC) plates based on the electronic structure investigation, Materials Research Innovations. 4 (2000) 36-41. doi:10.1007/s100190000065.

[91] A. K. Podshivalova, I. K. Karpov, Thermodynamic analysis of the stability of titanium oxides in the TiO—TiO2 range, Russian Journal of Inorganic Chemistry. 52 (2007) 1147-1150. doi:10.1134/50036023607070273.

[92] H. B. Liu, L. X. Zhang, L. Z. Wu, D. Liu, J. C. Feng, Vacuum brazing of SiO2 glass ceramic and Ti-6Al-4V alloy using AgCuTi filler foil, Materials Science and Engineering; A. 498 (2008) 321-326. doi:10.1016/j.msea.2008.08.008.

[93] R. Gordon, Chemical vapor deposition of coatings on glass, Journal of Non-Crystalline Solids. 218 (1997) 81-91. doi:10.1016/S0022-3093(97)00198-1.

[94] R. A. Sosa, K. Mohan, L. Nguyen, R. Tummala, A. Antoniou, V. Smet, Cu Pillar with Nanocopper Caps; The Next Interconnection Node Beyond Traditional Cu Pillar, in; 2019 IEEE 69th Electronic Components and Technology Conference (ECTC), 2019; pp. 655-660.

[95] S. W. Ho, L. Ding, S. H. Lim, S. A. Sek, M. Yu, G. Q. Lo, Polymer-based fine pitch Cu RDL to enable cost-effective re-routing for 2.5D interposer and 3D-IC, in; 2013 IEEE 15th Electronics Packaging Technology Conference (EPTC 2013), IEEE, Singapore, 2013; pp. 435-439. doi:10.1109/EPTC.2013.6745758.

[96] C. Nair, F. Pieralisi, F. Liu, V. Sundaram, U. Muehlfeld, M. Hanika, S. Ramaswami, R. Tummala, Sputtered Ti—Cu as a superior barrier and seed layer for panel-based high-density RDL wiring structures, in; 2015 IEEE 65th Electronic Components and Technology Conference (ECTC), IEEE, San Diego, Calif., 2015; pp. 2248-2253. doi:10.1109/ECTC.2015.7159916.

[97] T. Takano, H. Kudo, M. Tanaka, M Akazawa, Submicron-Scale Cu RDL Pattering Based on Semi-Additive Process for Heterogeneous Integration, in; 2019 IEEE 69th Electronic Components and Technology Conference (ECTC), 2019; pp. 94-100.

[98] Z. R. Camacho, L. C. H. Tay, H. D. Bathan, J. D. Punzalan, Method of forming a wafer level package with RDL interconnection over encapsulant between bump and semiconductor die, U.S. Pat. No. 7,888,181B2, 2011.

[99] K. Suzuki, Method of forming low-resistivity recessed features in copper metallization, U.S. Pat. No. 7,704,879B2, 2010.

[100] P. R. Besser, D. M. Erb, S. Lopatin, Selective deposition process for passivating top interface of damascene-type Cu interconnect lines, U.S. Pat. No. 6,455,425B1, 2002.

[101] V. Dubin, Self-encapsulated copper metallization, U.S. Pat. No. 6,249,055B1, 2001.

[102] K. Hoshino, Semiconductor device using copper metallization, U.S. Pat. No. 4,985,750A, 1991.

[103] R. Khazaka, D. Martineau, T. Youssef, T. Long Le, S. Azzopardi, Direct Printing of Heat Sinks, Cases and Power Connectors on Insulated Substrate Using Selective Laser Melting Techniques, in; 2019 IEEE 69th Electronic Components and Technology Conference (ECTC), 2019; pp. 2173-2179.

[104] R Tummala, Fundamentals of Microsystems Packaging, McGraw-Hill, New York, 2001.

[105] A. Sakanova, C. F. Tong, A. Nawawi, R. Simanjorang, K. J. Tseng, A. K. Gupta, Investigation on weight consideration of liquid coolant system for power electronics converter in future aircraft, Applied Thermal Engineering, Vol. I 04, pp. 603-615, 2016.

[106] E. M. Dede, S. N. Joshi, F. Zhou, Topology Optimization, Additive Layer Manufacturing, and Experimental Testing of an Air-Cooled Heat Sink, Journal of Mechanical Design, Vol. 137, 2015, DOT; I 0.1115/1.4030989

[107] M. Wong, I. Owen, C. J. Sutcliffe, A. Puri, Convective heat transfer and pressure losses across novel heat sinks fabricated by Selective Laser Melting, International Journal of Heat and Mass Transfer, Vol. 52, pp. 281-288, 2009

[108] A. Syed-Khaja, A. Perinan Freire, C. Kaestle, J. Franke, Feasibility Investigations on Selective Laser Melting for the Development of Microchannel Cooling in Power Electronics, IEEE 67th Electronic Components and Technology Conference proceeding, 2017.

[109] R. Skuriat, J. F. Li, P. A. Agyakwa, N. Mattey, P. Evans, C. M. Johnson, Degradation of thermal interface materials for high-temperature power electronics applications, Microelectronics Reliability, Vol. 53, pp. 1933-1942,2013.

[110] R. Khazaka, L. Mendizabal, D. Henry, R. Hanna, "Survey of high-temperature reliability of power electronics packaging components", IEEE Transactions on Power Electronics, Vol. 30, No. 5, 2015.

[111] L Ventola, E Chiavazzo, F Calignano, D Manfredi, P Asinari, Heat Transfer Enhancement by Finned Heat Sinks with Micro-structured Roughness, Microtechnology and Thermal Problems in Electronics, Journal of Physics; Conference Series 494, 2014. doi:IO.I088/1742-6596/494/I/O 12009.

[112] Bey Vrancken, Study of residual stresses in Selective laser melting, PhD thesis at KU Leuven, Faculty of engineering science, 2016.

[113] N. C. DeJong, L. W. Zhang, A. M. Jacobi, S. Balachandar, O. K. Tafti, A complementary experimental and numerical study of the flow and heat transfer in offset strip-fin heat exchangers, Transactions of the ASME; Journal of Heat Transfer, Vol. 120, pp. 690-698, 1998.

[114] H. M. Joshi, R. L. Webb, Heat transfer and friction in the offset strip fin heat exchanger, International Journal of Heat and Mass Transfer, Vol. 30, pp. 69-84, 1987.

[115] R. S. Matos, J. V. C. Vargas, T. A. Laursen, F. E. M. Saboya, Optimization study and heat transfer comparison of staggered circular and elliptic tubes in forced convection, International Journal of Heat and Mass Transfer, Vol. 44, pp. 3953-3961,2001.

The invention claimed is:

1. A method for forming a structure, comprising:
providing a substrate having a surface;
depositing a first powder comprising components of a first melting temperature composition, having a composition that, when heated, chemically reacts with the surface of the substrate, the substrate being selected from the group consisting of a metal, an alloy, graphite, graphene, diamond, silicon, a silicide, a glass, gallium arsenide, a ceramic, a boride, a nitride, an oxide, and a sulfide;
locally heating the first powder, on the substrate, with a localized energy source to melt the first powder, and to chemically react the melted first melting temperature composition with the surface of the substrate, to form a first adherent interlayer; and
cooling the melted first powder to form a fused first melting temperature layer having a lower boundary defined by the first adherent interlayer and an upper surface formed of the first melting temperature composition.

2. The method according to claim 1, further comprising:
depositing a second powder comprising components of a second melting temperature composition on the upper surface of the fused first melting temperature layer;
heating the second powder, on the upper surface of the fused first melting temperature composition, with a localized energy source to regionally melt the second powder; and
cooling the melted second powder to form a patterned fused second melting temperature layer.

3. The method according to claim 2, wherein the second melting temperature composition, when heated by the localized energy source, chemically reacts with the first melting temperature composition to form a second adherent interlayer.

4. The method according to claim 2, further comprising:
heating the substrate to selectively soften one of the first and second melting temperature composition while maintaining the other of the first and second melting temperature composition as a solid; and
separating the solid from the substrate.

5. The method according to claim 1, wherein said heating is performed on selected portions of the first powder, and the fused first melting temperature layer is selectively formed in a pattern corresponding to the selected portions.

6. The method according to claim 1,
wherein said heating is performed by controlling a focused laser,
further comprising receiving feedback from at least one sensor, to determine:
an optimal laser processing power, and
an optimal scan rate.

7. The method according to claim 1, wherein said heating is performed by controlling a focused laser, and the structure comprises a plurality of layers formed on the fused first melting temperature layer in a selective pattern, further comprising optimizing a laser processing power, a laser scan rate, and a layer thickness for each respective layer.

8. A method for forming a structure bonded to a substrate, comprising:
providing a substrate having a surface, the substrate being selected from the group consisting of a metal, an alloy, graphite, graphene, diamond, silicon, a silicide, a glass, gallium arsenide, a ceramic, a boride, a nitride, an oxide, and a sulfide;
depositing a powder on the surface of the substrate;
locally heating a portion of the powder on the surface of the substrate with localized energy to form an interlayer resulting from a chemical reaction between the substrate and a metal layer, wherein the interlayer is adherent to the substrate; and
cooling the locally heated portion of the powder.

9. The method according to claim 8, further comprising:
depositing a metallic powder over the interlayer;
heating a portion of the deposited metallic powder with the localized energy to form a melted portion of the metallic powder, wherein the localized energy is dynamically controlled to regionally melt the portion of the deposited metallic powder while leaving an adjacent portion of the metallic powder unmelted, to form a deposited pattern from the melted portion, and without bringing the substrate underneath the melted region into thermal equilibrium; and
cooling the melted portion of the metallic powder to form a solid layer,
wherein said cooling occurs concurrently with heating of a different portion of the metallic powder deposited over the interlayer with the localized energy, to regionally melt the different portion of the metallic powder.

10. The method according to claim 9, wherein the localized energy is emitted by a localized energy source which is operated continuously and is dynamically repositioned over the surface, and the metallic powder consists essentially of a metal or metal alloy powder.

11. The method according to claim 8, wherein the chemical reaction product of the powder with the surface of the substrate forms at least one of an intermetallic compound, a metal carbide compound, a metal nitride compound, a metal boride compound, and a metal silicide compound.

12. The method according to claim 9, wherein a location of the heated portion of the deposited metallic powder is controlled over time to selectively melt the metallic powder into a predefined patterned layer having gaps between portions of the solid layer.

13. The method according to claim 9, wherein said heating comprises selective laser melting (SLM).

14. The method according to claim 8, wherein substrate comprises a semiconductor.

15. The method according to claim 8, wherein the surface of the substrate comprises an aluminum or copper layer.

16. The method according to claim 9, further comprising forming a stack of layers over the solid layer above the interlayer, by sequentially depositing a powder on an exposed surface and melting the powder to selectively define a pattern comprising at least one gap in at least one layer, in to form a three-dimensional structure which adheres to the substrate.

17. A method of forming a structure on a substrate, comprising:
providing the substrate having a surface, the substrate being selected from the group consisting of a metal, an alloy, graphite, graphene, diamond, silicon, a silicide, a glass, gallium arsenide, a ceramic, a boride, a nitride, an oxide, and a sulfide;
depositing a powder on the surface of the substrate;
locally heating the powder to a sufficient temperature to melt the powder with focused energy, having limited duration at a particular region to avoid heat-induced damage to the substrate distance from the surface; and
cooling the melted powder to form a solid layer,
wherein the melted powder forms an adherent bonding layer between the substrate and the solid layer, comprising a chemical reaction product of the surface and the powder, having a composition distinct from a composition of the surface and a composition of the solid layer.

18. The method according to claim 17, wherein the adherent bonding layer comprises an interlayer selected from the group consisting of an intermetallic compound, a metal silicide, a metal carbide, a metal boride, and a metal nitride, and the solid layer comprises a metal or metal alloy.

19. The method according to claim 17, further comprising forming a stack of additional solid layers over the solid layer in a regional pattern to form a three dimensional structure having at least one gap between portions of a respective additional solid layer over the substrate, while avoiding heat-induced functional damage to the integrated circuit, while avoiding heat-induced damage to structures underlying the surface of the substrate.

20. The method according to claim 17, wherein the substrate comprises a semiconductor electronic device, and said locally heating the powder avoids heat-induced functional damage to the electronic device, the powder is a metal powder, and the adherent bonding layer is formed as at least one of an intermetallic, a metal carbide, a metal nitride, a metal boride, and a metal silicide reaction product of the metal powder and the semiconductor.

21. The method according to claim 17, wherein the substrate comprises an integrated circuit device having electronic devices, and said locally heating the powder avoids heat-induced functional damage to the electronic devices of the integrated circuit, the powder is a metal powder, and the adherent bonding layer is formed as at least one of an intermetallic, a metal carbide, a metal nitride, a metal boride, and a metal silicide reaction product of the metal powder and a surface of the integrated circuit.

* * * * *